US009405671B2

(12) United States Patent
Tanaka et al.

(10) Patent No.: US 9,405,671 B2
(45) Date of Patent: Aug. 2, 2016

(54) PROCESS EXECUTION CONTROL BASED ON THE INTERNAL STATES OF FLASH MEMORIES AND POWER SUPPLY CIRCUIT INFORMATION

(71) Applicant: PANASONIC CORPORATION, Osaka (JP)

(72) Inventors: Takayuki Tanaka, Osaka (JP); Keisuke Sakai, Kyoto (JP); Makoto Matsumoto, Kyoto (JP); Toshiki Mori, Osaka (JP); Yasuhiro Tomita, Osaka (JP); Seiji Yamahira, Kyoto (JP)

(73) Assignee: PANASONIC CORPORATION, Osaka (JP)

( * ) Notice: Subject to any disclaimer, the term of this patent is extended or adjusted under 35 U.S.C. 154(b) by 569 days.

(21) Appl. No.: 13/732,089

(22) Filed: Dec. 31, 2012

(65) Prior Publication Data

US 2013/0124888 A1  May 16, 2013

Related U.S. Application Data

(63) Continuation of application No. PCT/JP2011/003581, filed on Jun. 23, 2011.

(30) Foreign Application Priority Data

Jun. 29, 2010 (JP) ................................. 2010-147849
Jul. 7, 2010 (JP) ................................. 2010-155264

(51) Int. Cl.
*G06F 1/32* (2006.01)
*G06F 12/02* (2006.01)
(Continued)

(52) U.S. Cl.
CPC .......... *G06F 12/0246* (2013.01); *G06F 1/3225* (2013.01); *G11C 16/06* (2013.01); *G11C 16/30* (2013.01); *G11C 16/34* (2013.01)

(58) Field of Classification Search
CPC ...... G06F 1/266; G06F 1/3275; G06F 3/0679; G06F 12/0246; G11C 11/4074; G11C 16/30
See application file for complete search history.

(56) References Cited

U.S. PATENT DOCUMENTS 5,544,356 A    8/1996  Robinson et al.
7,196,940 B1 *  3/2007  Vadi et al. ................ 365/189.02
(Continued)

FOREIGN PATENT DOCUMENTS

JP    06-139140 A    5/1994
JP    07-093499 A    4/1995
(Continued)

OTHER PUBLICATIONS

International Search Report mailed Sep. 20, 2011 issued in corresponding International Application No. PCT/JP2011/003581.
(Continued)

*Primary Examiner* — Thomas Lee
*Assistant Examiner* — Danny Chan
(74) *Attorney, Agent, or Firm* — McDermott Will & Emery LLP

(57) ABSTRACT

Disclosed is a nonvolatile storage system including: a memory block having a plurality of flash memories; a flash memory power supply circuit outside of the memory block; and a flash memory controller. The flash memory power supply circuit has a plurality of types of power supply circuits for process execution, the power supply circuits for process execution generating and supplying power at a plurality of voltage levels needed to execute processes in the flash memories. The flash memory controller monitors changes of the internal states of the flash memories by communicating with the flash memories, thereby controlling the power supply circuits for process execution and the flash memories.

6 Claims, 88 Drawing Sheets

(51) Int. Cl.
*G11C 16/06* (2006.01)
*G11C 16/30* (2006.01)
*G11C 16/34* (2006.01)

(56) References Cited

U.S. PATENT DOCUMENTS

| | | | |
|---|---|---|---|
| 7,702,935 B2 * | 4/2010 | Cornwell et al. | 713/320 |
| 2002/0114184 A1 | 8/2002 | Gongwer et al. | |
| 2004/0145931 A1 * | 7/2004 | Lin et al. | 363/147 |
| 2005/0223126 A1 * | 10/2005 | Chu et al. | 710/22 |
| 2006/0139069 A1 * | 6/2006 | Frank et al. | 327/143 |
| 2008/0068067 A1 | 3/2008 | Govindu et al. | |
| 2008/0080103 A1 | 4/2008 | Paillet et al. | |
| 2008/0219078 A1 | 9/2008 | Kamiyama | |
| 2008/0263266 A1 * | 10/2008 | Sharon et al. | 711/103 |
| 2009/0125784 A1 | 5/2009 | Oshima | |
| 2009/0154257 A1 | 6/2009 | Fujioka et al. | |
| 2009/0222620 A1 * | 9/2009 | Kanai | 711/104 |
| 2010/0049905 A1 * | 2/2010 | Ouchi | 711/103 |
| 2010/0169690 A1 * | 7/2010 | Mundada et al. | 713/340 |
| 2012/0030420 A1 * | 2/2012 | Ware | G06F 13/1636 711/106 |
| 2012/0221769 A1 * | 8/2012 | Ware | G06F 13/1694 711/103 |

FOREIGN PATENT DOCUMENTS

| | | | |
|---|---|---|---|
| JP | 10-214496 | A | 8/1998 |
| JP | 11-242632 | A | 9/1999 |
| JP | 11-296430 | A | 10/1999 |
| JP | 11-297086 | A | 10/1999 |
| JP | 2004-526239 | A | 8/2004 |
| JP | 2004-531801 | A | 10/2004 |
| JP | 2007-5776 | A | 1/2007 |
| JP | 2008-004196 | A | 1/2008 |
| JP | 2008-217147 | A | 9/2008 |
| JP | 2009-22909 | A | 6/2009 |
| JP | 2009-146541 | A | 7/2009 |
| JP | 2009-211153 | A | 9/2009 |
| WO | WO-02/067269 | A2 | 8/2002 |
| WO | WO-02/075744 | A2 | 9/2002 |

OTHER PUBLICATIONS

U.S. Office Action issued in U.S. Appl. No. 13/940,161 dated Jul. 30, 2015.

U.S. Office Action dated Feb. 10, 2016 issued in U.S. Appl. No. 13/940,161.

* cited by examiner

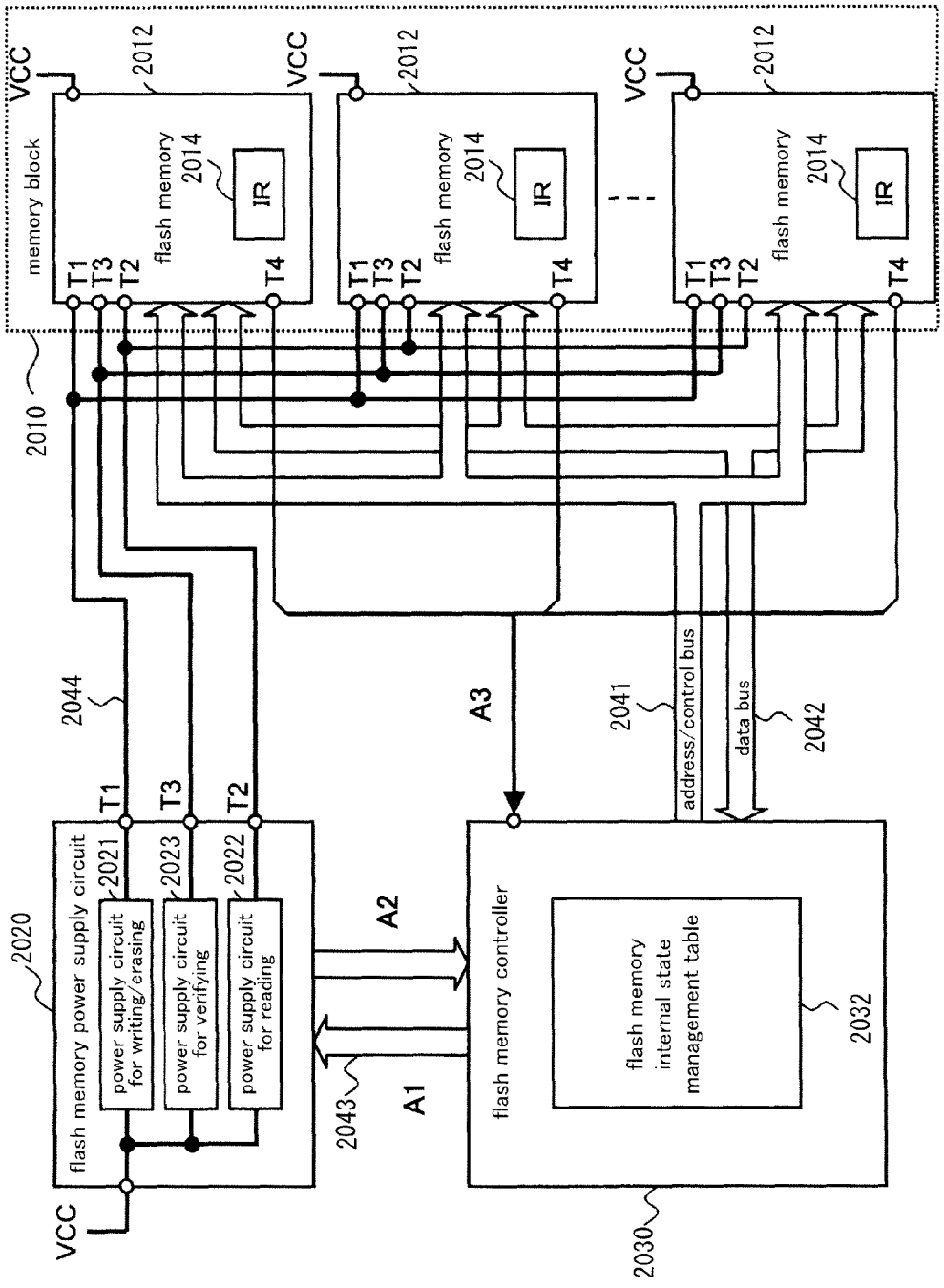
F I G. 1

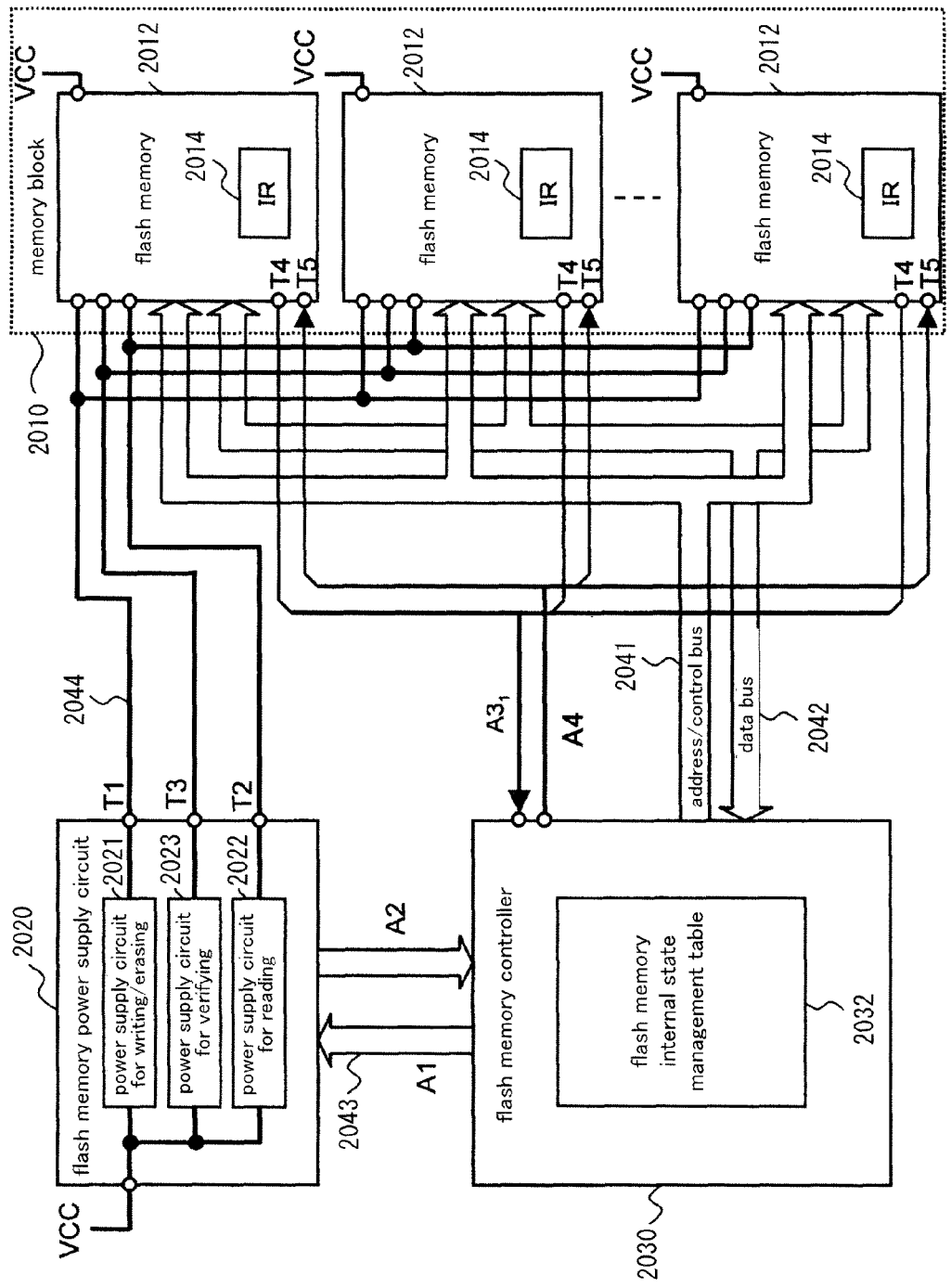
F I G. 2

F I G. 3 A

| flash memory | internal state | applied voltage information storage | | | voltage application time information storage | | | load power information storage | | |
|---|---|---|---|---|---|---|---|---|---|---|
| | | data reading | data writing/ erasing | verifying | number of times of verifying | pulse width | pulse interval | data reading | data writing/ erasing | verifying |
| 1 | standby | 5.1V | 20.1V | 10.1V | 5 | 10μs | 15μs | 2mA | 30mA | 3mA |
| 2 | standby | 5V | 20V | 10.2V | 2 | 11μs | 16μs | 2mA | 30mA | 3mA |
| 3 | data writing | 4.8V | 19.8V | 9.8V | 1 | 10μs | 15μs | 4mA | 35mA | 5mA |
| 4 | data writing | 5V | 20V | 10V | 4 | 9μs | 10μs | 5mA | 30mA | 5mA |
| 5 | standby | 4.5V | 19V | 9V | 0 | 10μs | 12μs | 3mA | 30mA | 3mA |
| 6 | standby | 5.3V | 20.2V | 10.4V | 7 | 13μs | 15μs | 3mA | 40mA | 4mA |
| 7 | data-write verifying | 5.5V | 20.5V | 10.5V | 10 | 15μs | 20μs | 5mA | 50mA | 5mA |
| ≀ | ≀ | ≀ | ≀ | ≀ | ≀ | ≀ | ≀ | ≀ | ≀ | ≀ |
| N | standby | 5V | — | — | — | — | — | 5mA | 45mA | 5mA |

2032

F I G. 3B

| internal state | power supply for reading | power supply for verifying | power supply for writing/erasing |
|---|---|---|---|
| standby | – | – | – |
| data reading | ○ | – | – |
| data writing | – | – | ○ |
| data-write verifying | – | ○ | – |
| data erasing | – | – | ○ |
| data-erase verifying | – | ○ | – |

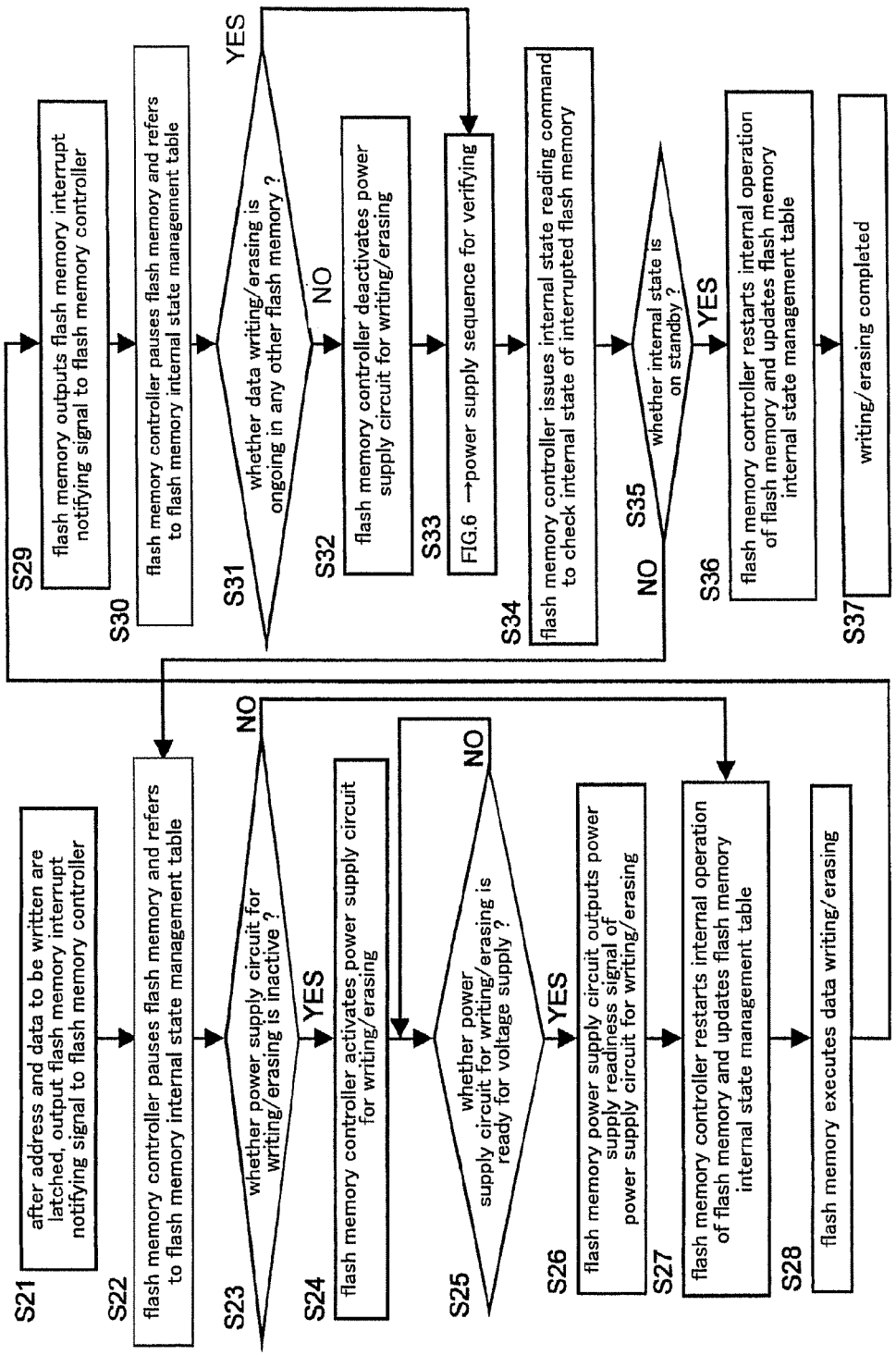

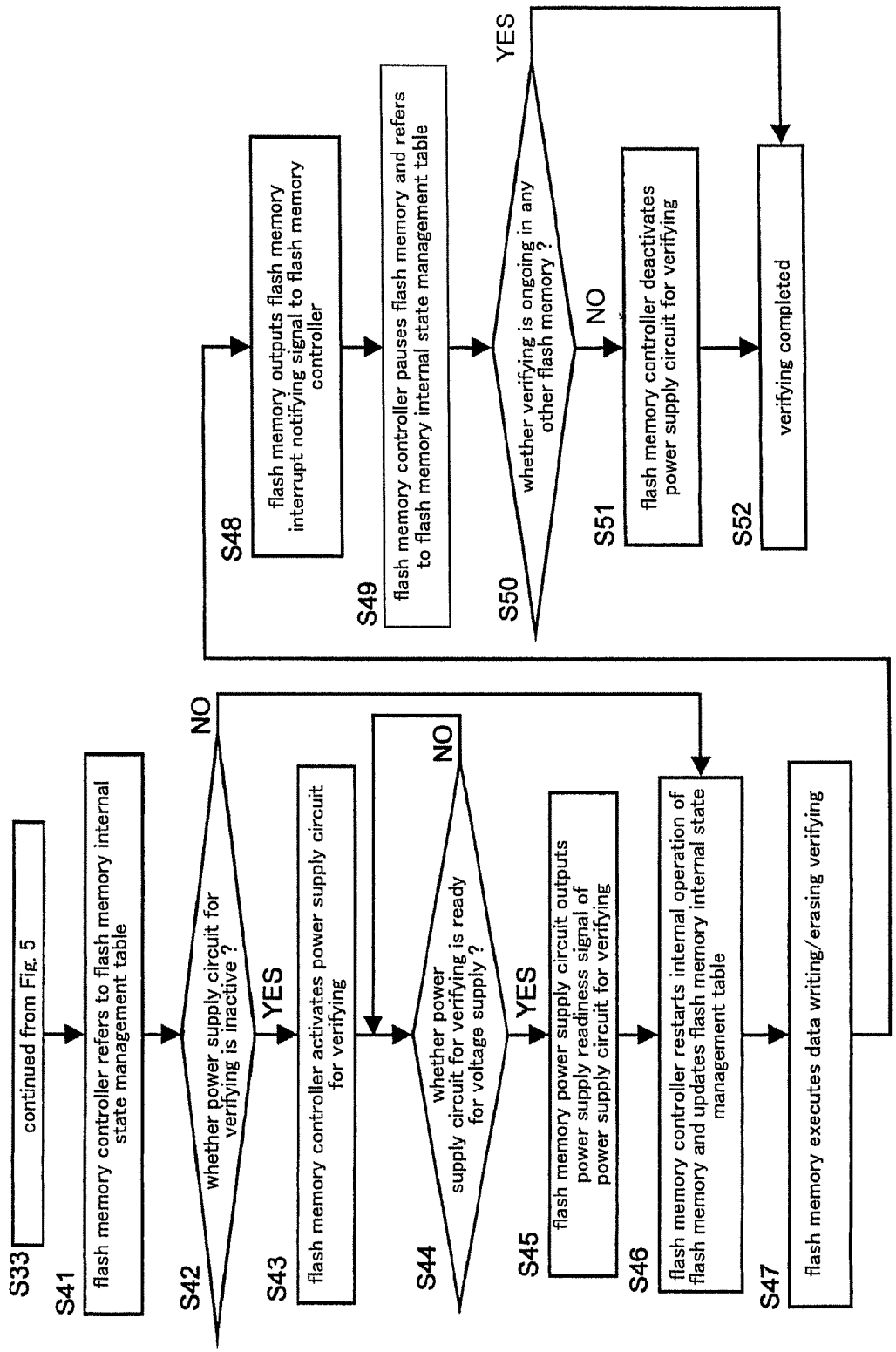

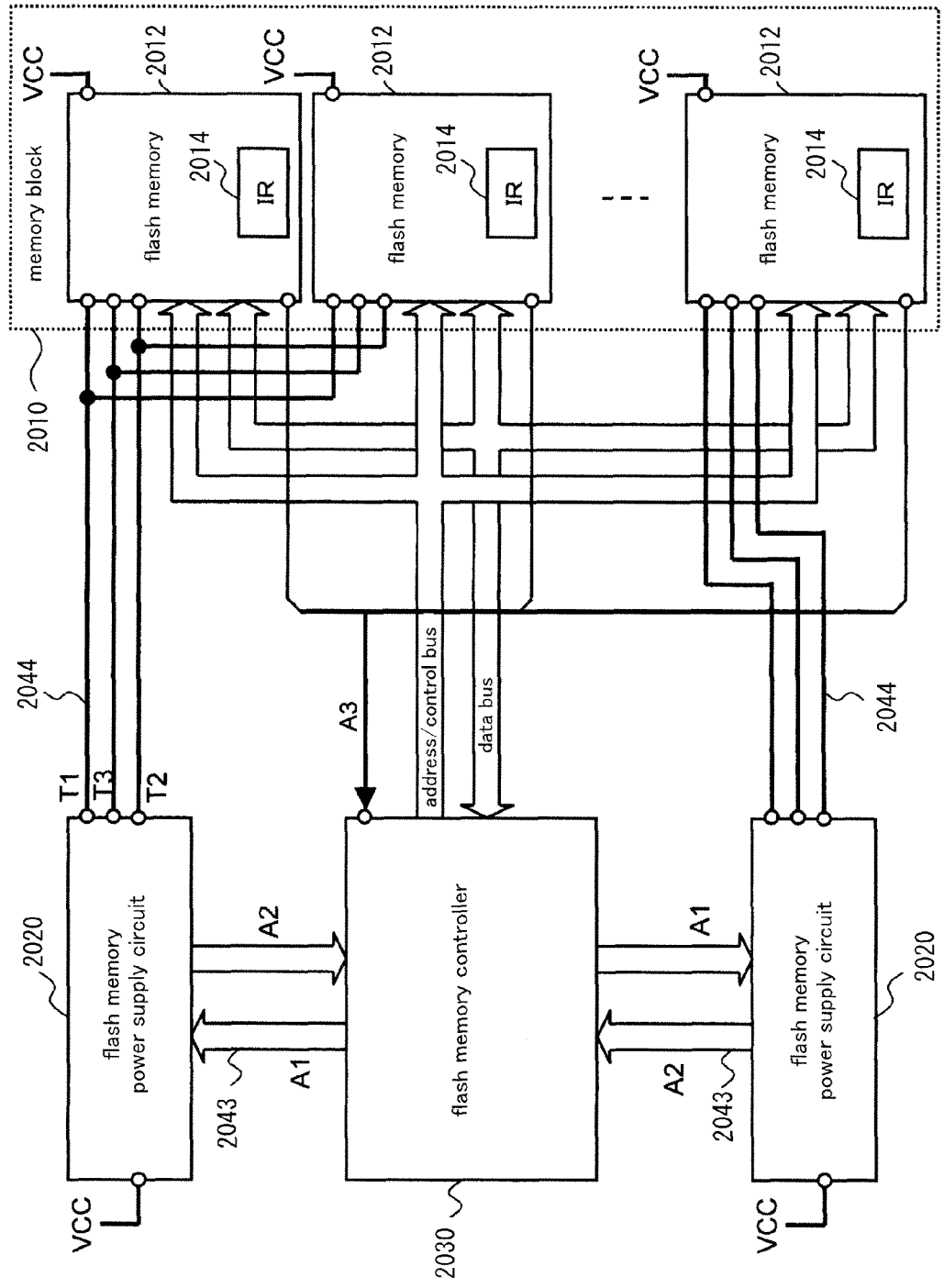
F I G. 26

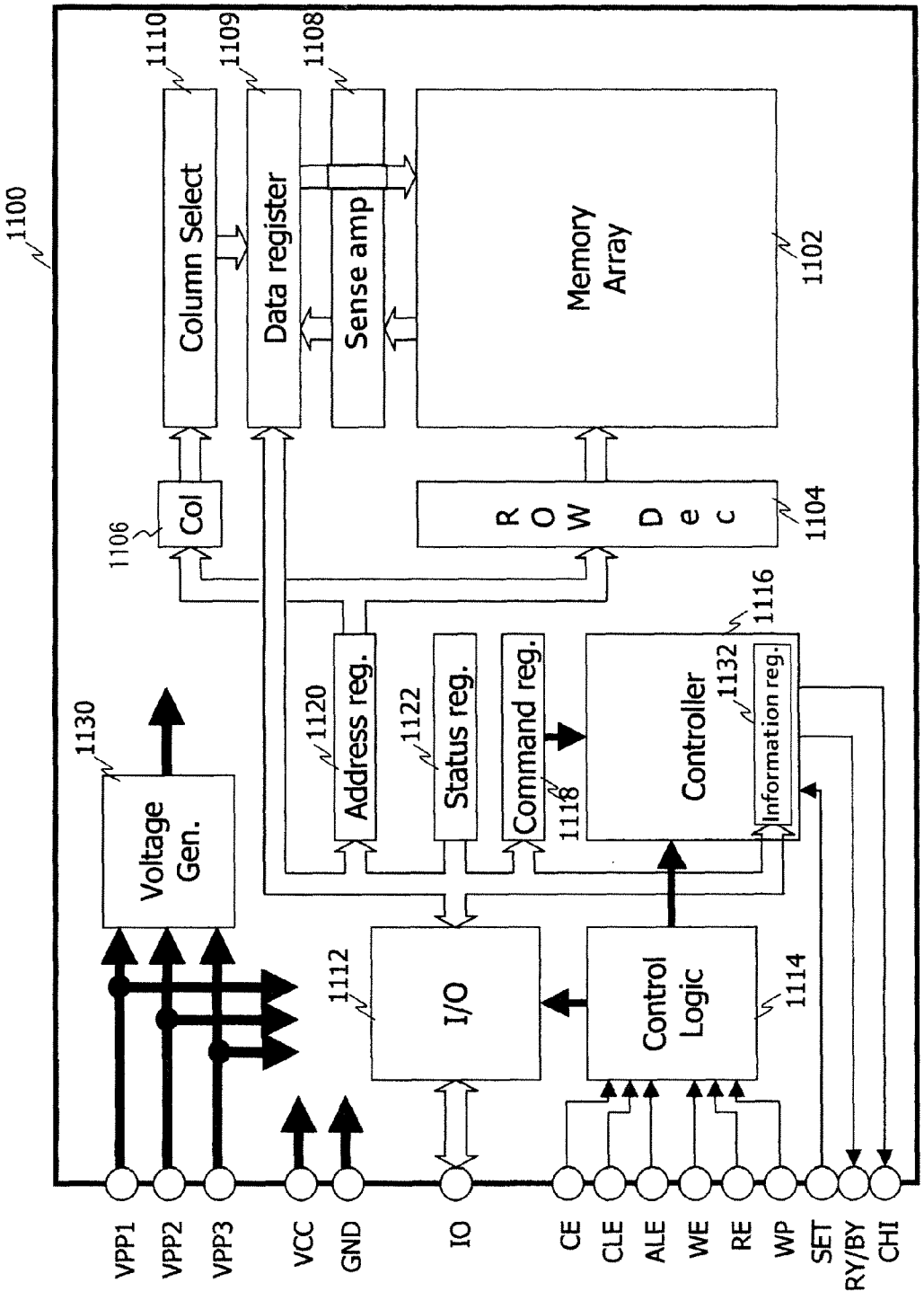
F I G. 27

F I G. 28

| | Byte1 information contents | Byte2 information contents | Byte3 information contents | Byte4 information contents | Byte5 information contents |
|---|---|---|---|---|---|
| I/O | | | | | |
| I/O1 | 000:Read 001:Read Standby | | | | |
| I/O2 | 010:Program 011:Program verify 100:Erase 101:Erase verify | voltage value | pulse width | pulse interval | error bit number |
| I/O3 | | | | | |
| I/O4 | | | | | |
| I/O5 | number of times of repeating | | | | |
| I/O6 | | | | | |
| I/O7 | | | | | |
| I/O8 | | | | | |

FIG. 30

| | operation / number of times of repeating | voltage value | pulse width | pulse interval | error bit number |
|---|---|---|---|---|---|
| 1304 | Program verify / 0 | 6 | - | | - |
| 1320-1 | Program / 1 | 10 | 20 | 40 | 8192 |
| 1330-1 | Program verify / 1 | 6 | - | | - |
| 1320-2 | Program / 2 | 10.2 | 20 | 40 | 6280 |
| 1330-2 | Program verify / 2 | 6 | - | | - |
| 1320-25 | Program / 25 | 15 | 20 | 40 | 126 |
| 1330-25 | Program verify / 25 | 6 | - | | - |
| 1320-26 | Program / 26 | 15.1 | 20 | 40 | 32 |
| 1332 | Read Standby / - | 5 | - | - | - |

F I G. 3 2

| command name | first cycle | second cycle | acceptable command during Busy period |
|---|---|---|---|
| serial data input | 80h | - | |
| auto program | 10h | - | |
| reading address input | 00h | - | |
| column address change | 06h | - | |
| reading start | 30h | - | |
| column address change | E0h | - | |
| auto block erasing | 60h | D0 | |
| ID reading | 90h | - | |
| status reading | 70h | - | O |
| reset | FFh | - | O |
| information reading | 50h | - | O |

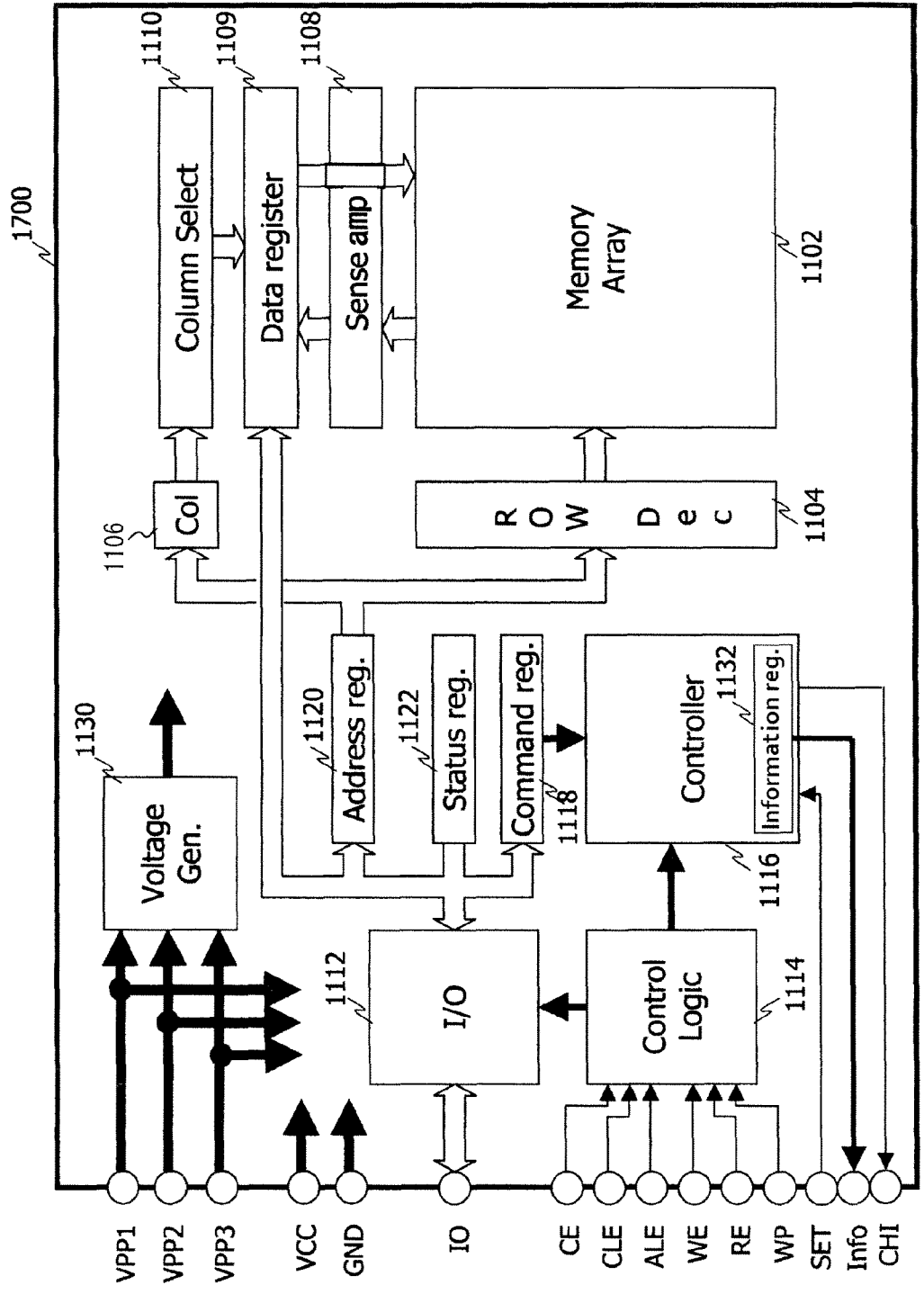
F I G. 33

F I G. 35

| | Byte1 information contents | Byte2 information contents | Byte3 information contents | Byte4 information contents | Byte5 information contents |
|---|---|---|---|---|---|
| | current consumption for data reading | current consumption for program | current consumption for program verifying | current consumption for data erasing | current consumption for data-erase verifying |

FIG.39

| priority order ranking | ID | state | (current consumption) | process starting order |
|---|---|---|---|---|
| 8 | flash memory A | writing | 50mA | 1 |
| 7 | flash memory B | erasing | 50mA | 2 |
| 6 | flash memory C | writing | 50mA | 3 |
| 5 | flash memory D | erasing | 50mA | 4 |
| 4 | flash memory E | writing | 50mA | 5 |
| 3 | flash memory F | erasing | 50mA | 6 |
| 2 | flash memory G | erasing | 50mA | 7 |
| 1 | flash memory H | writing | 50mA | 8 |
| 0 | flash memory I | pausing | 50mA | 0 |
| 0 | flash memory J | pausing | 50mA | 0 |

12

F I G. 4 4

| priority order ranking | ID | state | power level | process starting order |
|---|---|---|---|---|
| 9 | flash memory A | writing | 1 | 1 |
| 8 | flash memory B | erasing | 2 | 2 |
| 7 | flash memory C | writing | 2 | 3 |
| 6 | flash memory D | erasing | 2 | 4 |
| 5 | flash memory E | writing | 3 | 5 |
| 4 | flash memory F | erasing | 3 | 6 |
| 3 | flash memory G | erasing | 3 | 7 |
| 2 | flash memory H | writing | 3 | 8 |
| 1 | flash memory I | pausing | 0 | 0 |
| 0 | flash memory J | pausing | 0 | 0 |

| priority order ranking | ID | priority level ranking | state | power level | process starting order |
|---|---|---|---|---|---|
| 9 | flash memory A | 1 | writing | 1 | 1 |
| 8 | flash memory B | 1 | erasing | 2 | 2 |
| 7 | flash memory E | 1 | writing | 2 | 5 |
| 6 | flash memory F | 1 | erasing | 2 | 6 |
| 5 | flash memory C | 2 | writing | 3 | 3 |
| 4 | flash memory G | 2 | erasing | 3 | 7 |
| 3 | flash memory D | 3 | erasing | 3 | 4 |
| 2 | flash memory H | 3 | writing | 3 | 8 |
| 1 | flash memory J | 3 | erasing | 3 | 9 |
| 0 | flash memory I | 0 | pausing | 0 | 0 |

F I G. 4 7
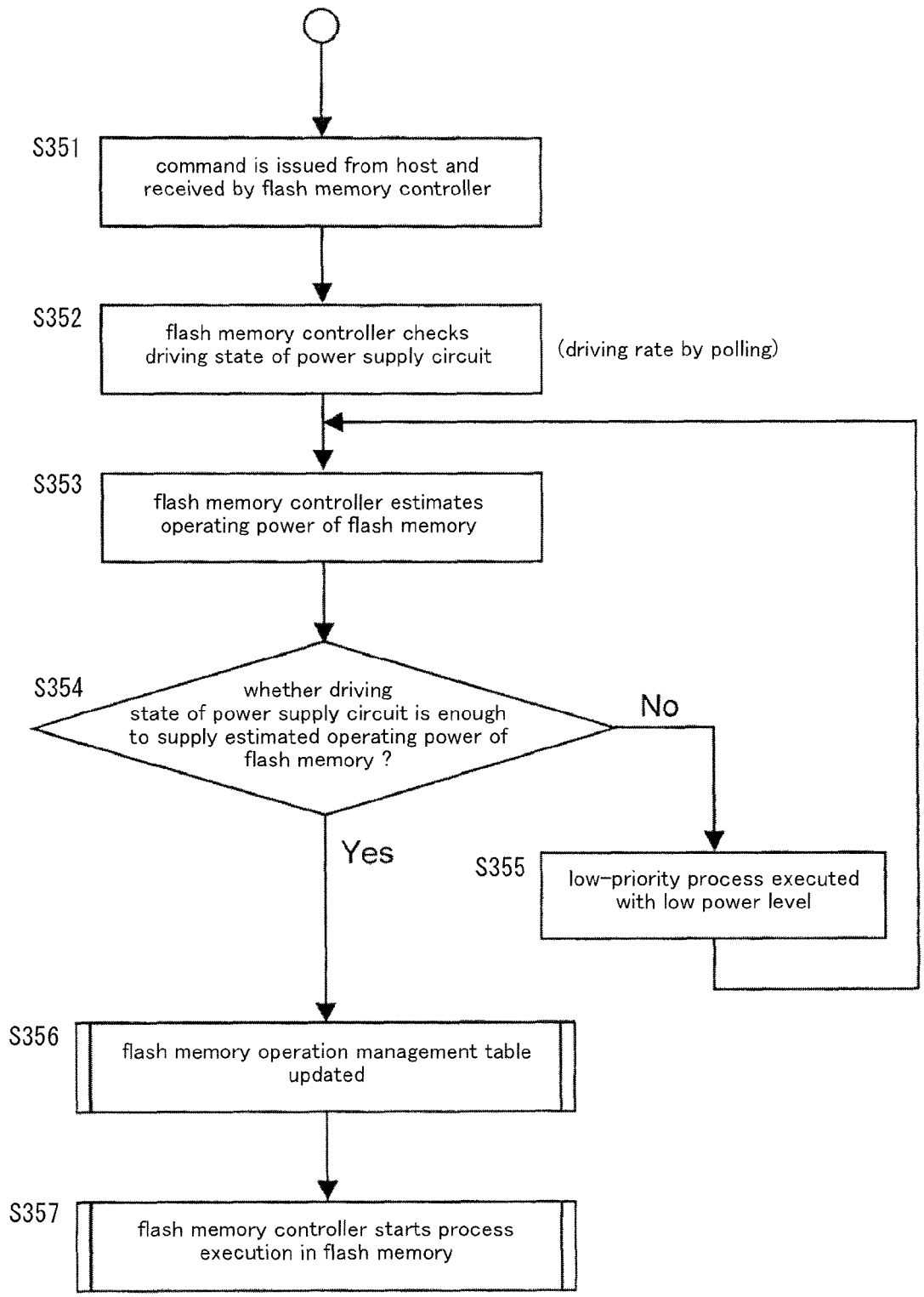

FIG. 48

| priority order ranking | ID | priority level ranking | state | power level | process starting order |
|---|---|---|---|---|---|
| 10 | flash memory A | 1 | writing | 1 | 1 |
| 9 | flash memory B | 1 | erasing | 2 | 2 |
| 8 | flash memory E | 1 | writing | 2 | 5 |
| 7 | flash memory F | 1 | erasing | 2 | 6 |
| 6 | flash memory C | 2 | writing | 3 | 3 |
| 5 | flash memory G | 2 | erasing | 3 | 7 |
| 4 | flash memory I | 3 | writing | 3 | 0 |
| 3 | flash memory D | 3 | erasing | 3 | 4 |
| 2 | flash memory H | 3 | writing | 3 | 8 |
| 1 | flash memory J | 3 | erasing | 3 | 9 |

FIG. 49

| priority order ranking | ID | priority level ranking | state | power level | process starting order |
|---|---|---|---|---|---|
| 10 | flash memory A | 1 | writing | 1 | 2 |
| 9 | flash memory B | 1 | erasing | 1 | 3 |
| 8 | flash memory E | 1 | writing | 2 | 6 |
| 7 | flash memory F | 1 | erasing | 2 | 7 |
| 6 | flash memory C | 2 | writing | 3 | 4 |
| 5 | flash memory G | 2 | erasing | 3 | 8 |
| 4 | flash memory I | 3 | writing | 3 | 1 |
| 3 | flash memory D | 3 | erasing | 3 | 5 |
| 2 | flash memory H | 3 | writing | 3 | 9 |
| 1 | flash memory J | 3 | erasing | 3 | 10 |

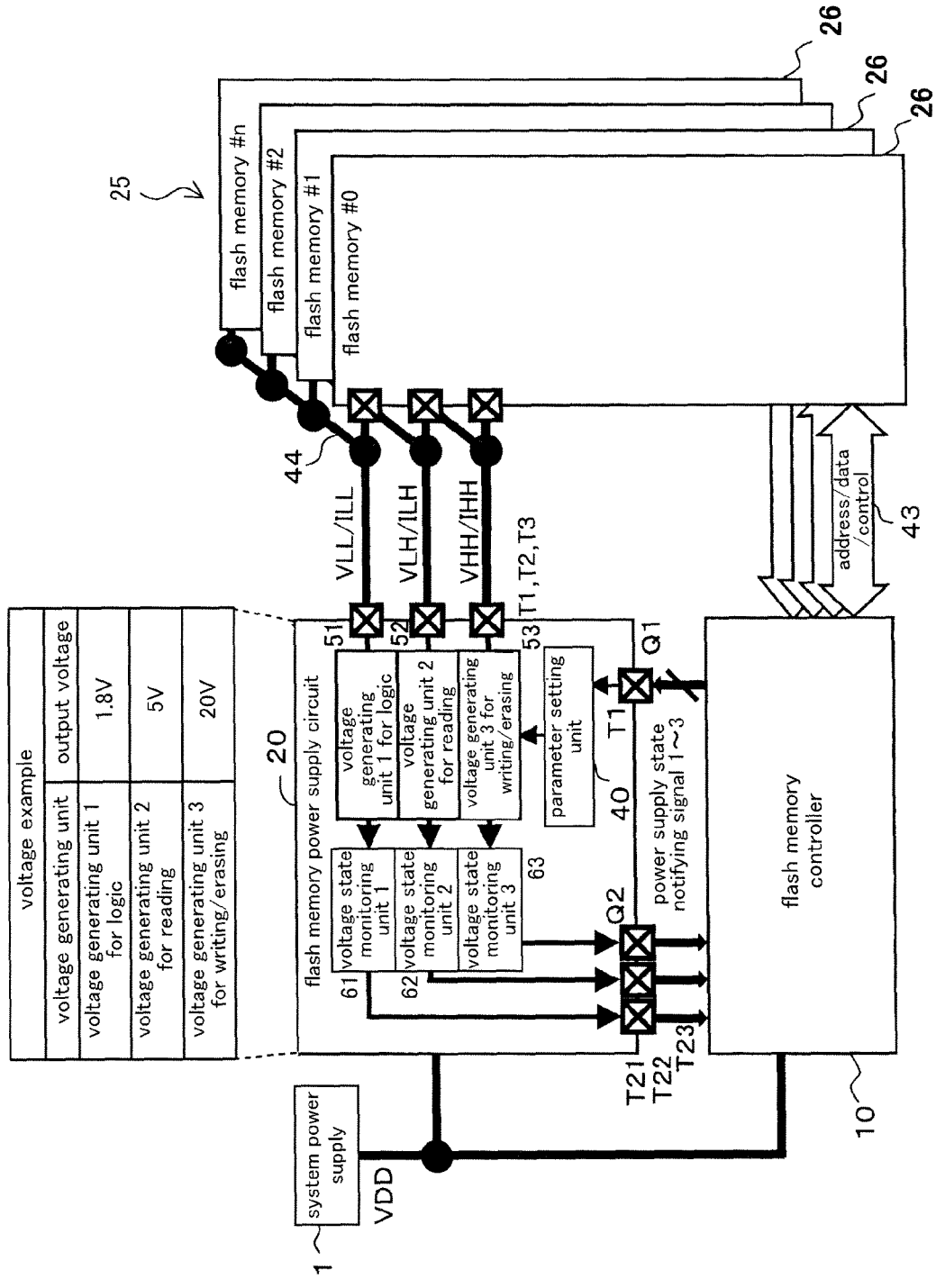
F I G. 5 8

F I G. 6 4
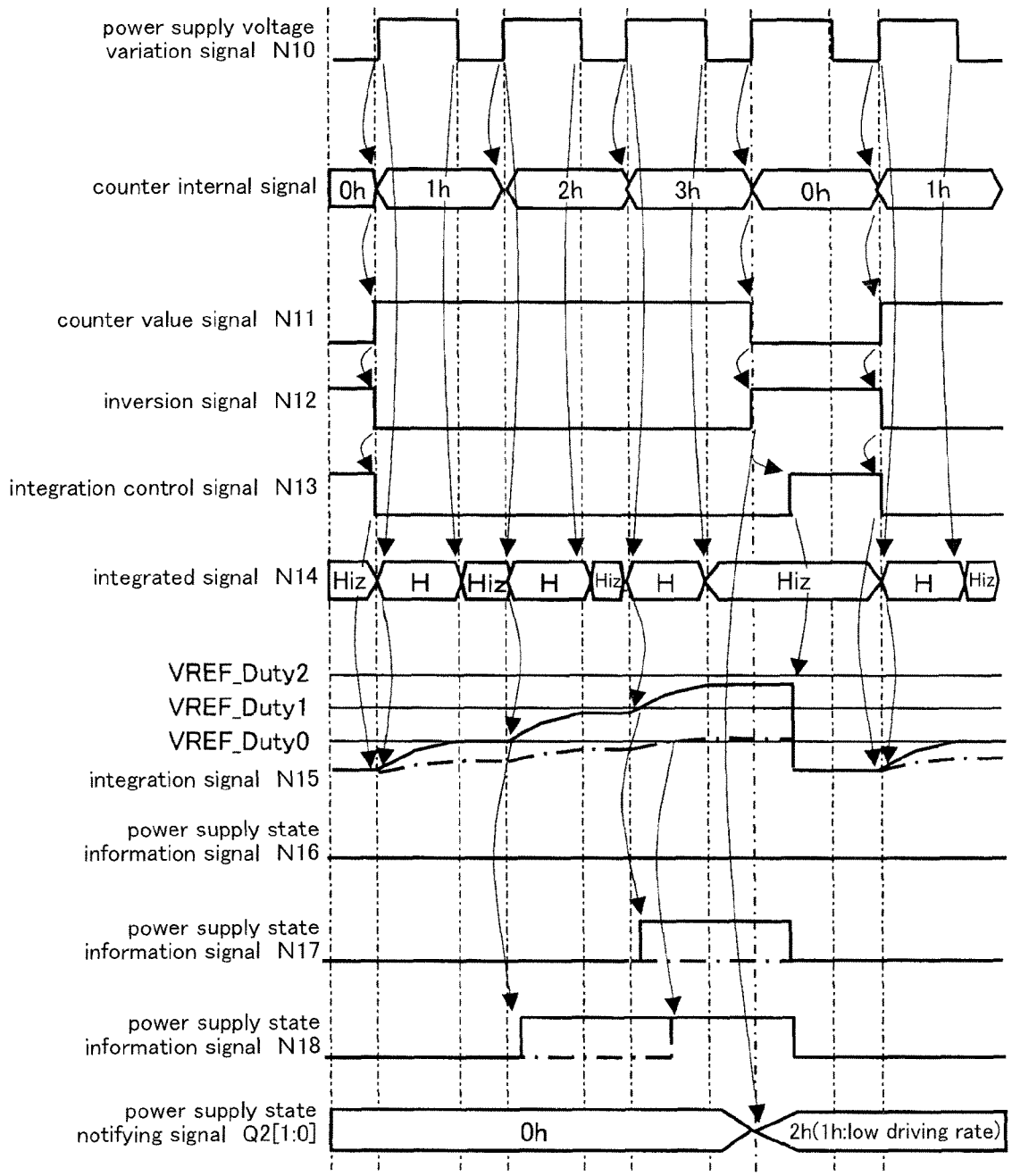

F I G. 7 4
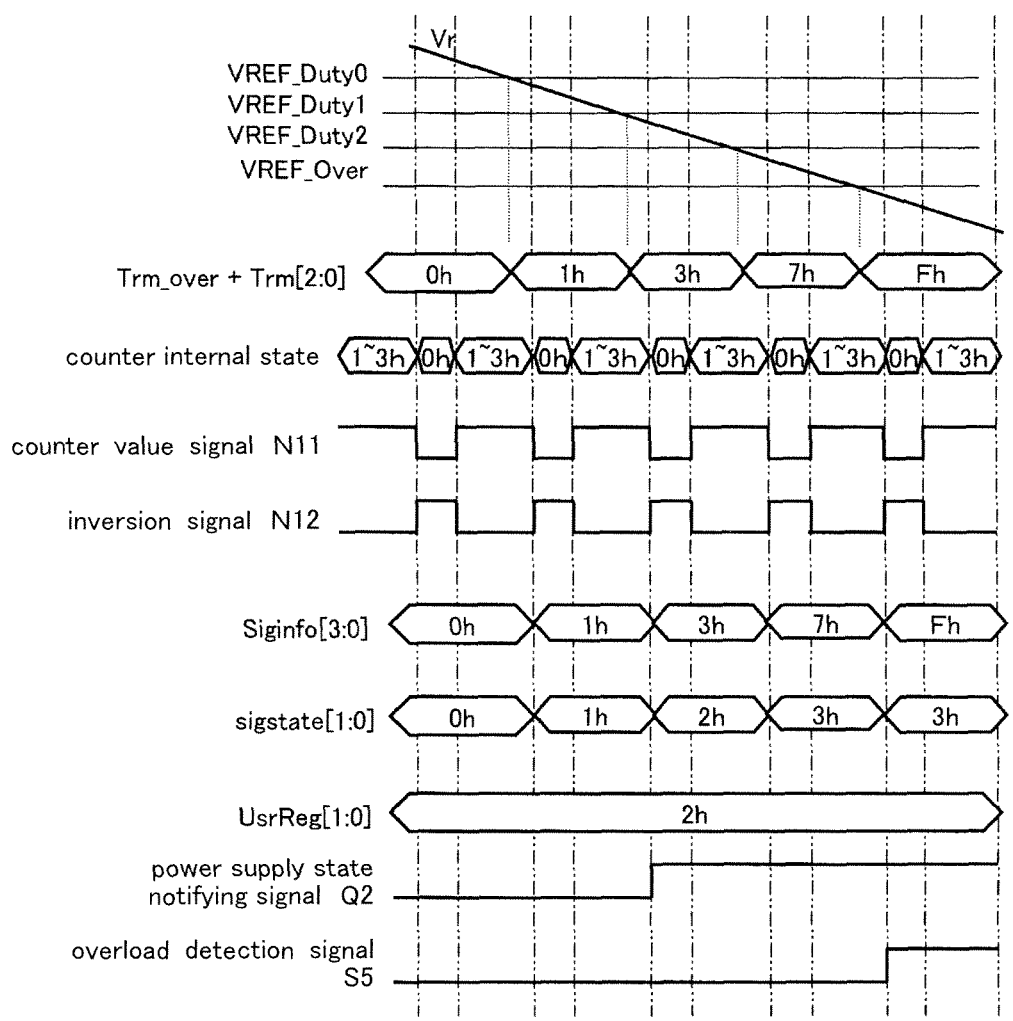

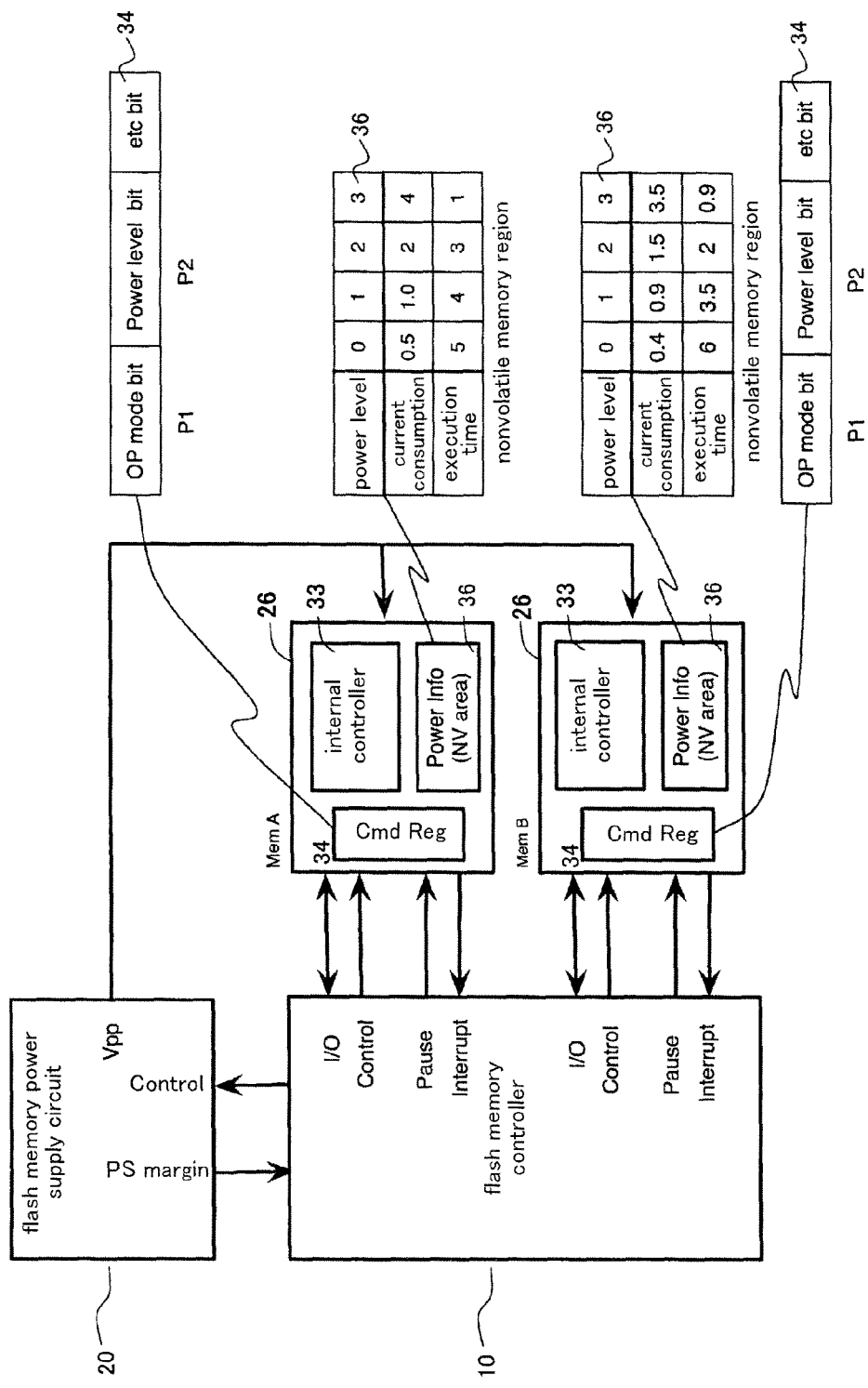
F I G. 78

F I G. 7 9
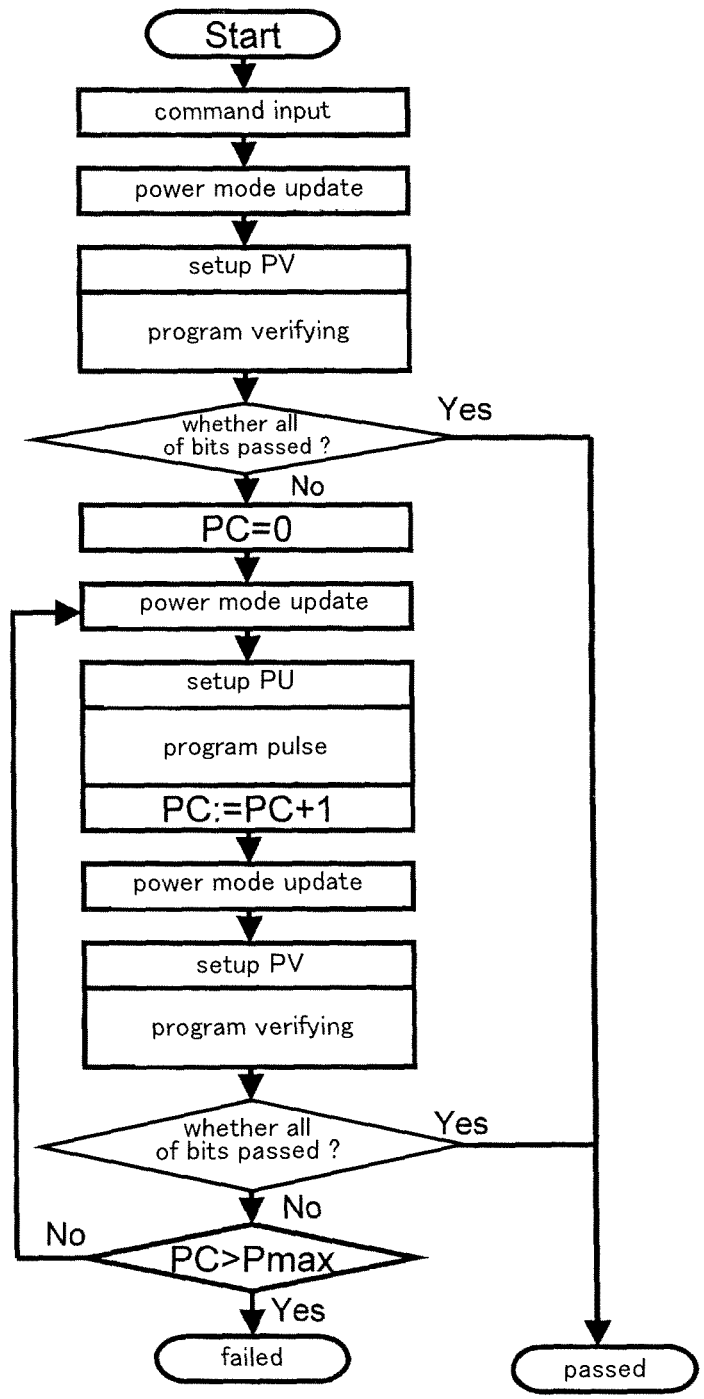

F I G. 81A
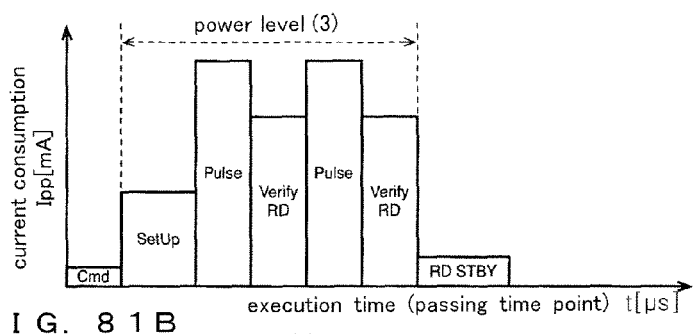
F I G. 81B
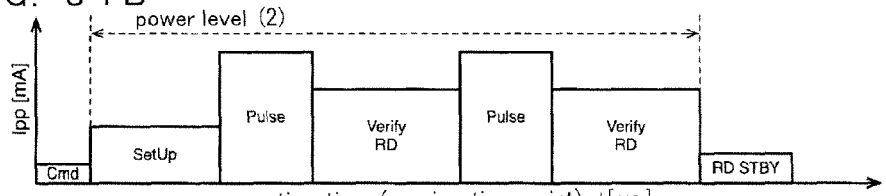
F I G. 81C
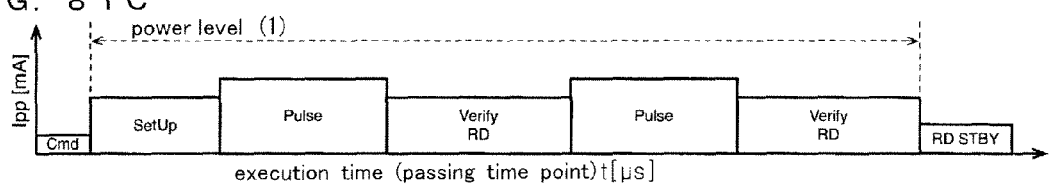

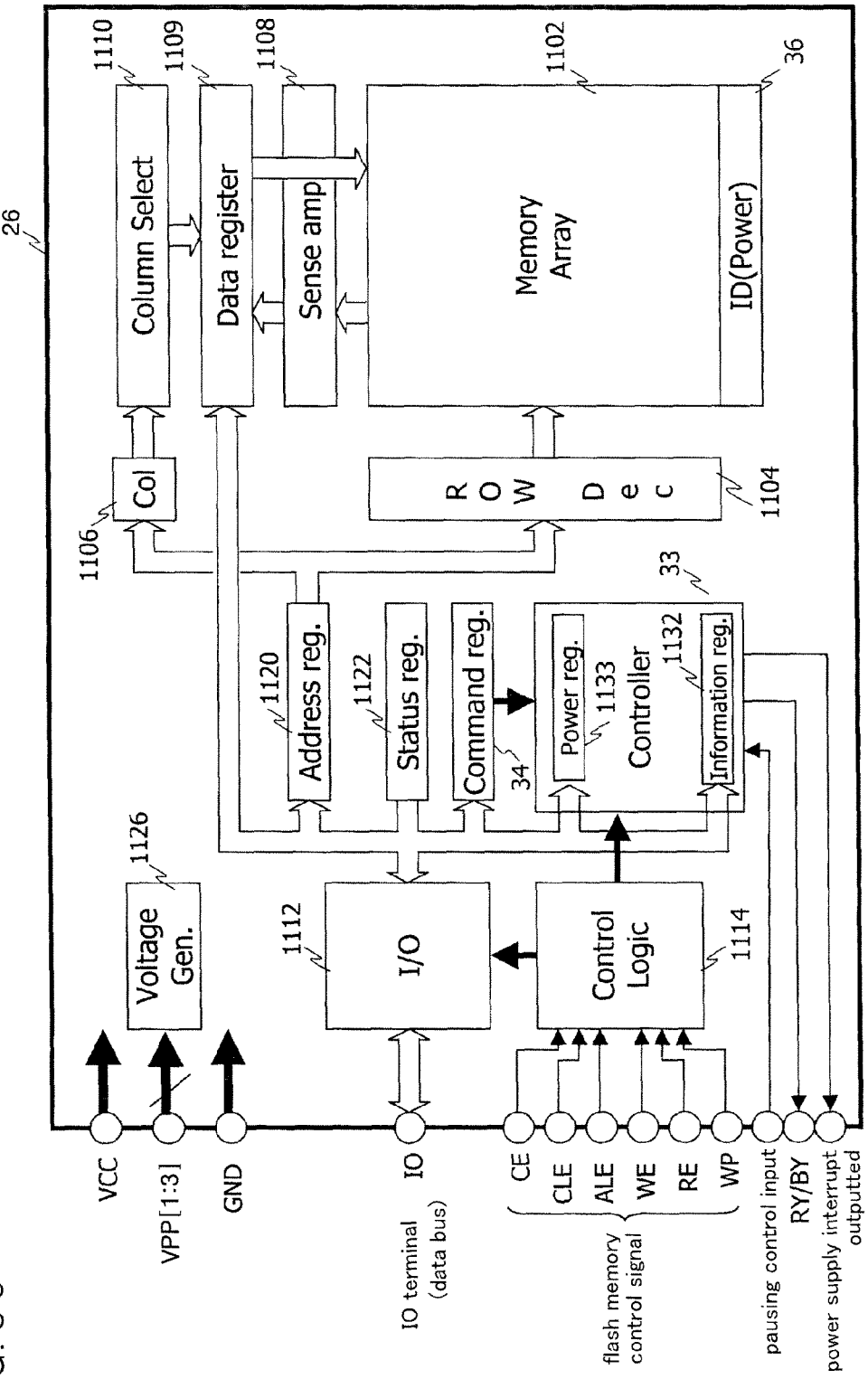
F I G. 83

F I G. 8 4

| power supply level setting bit | 00 | 01 | 10 | 11 |
|---|---|---|---|---|
| maximum current consumption | 0mA (pause) | 30mA | 60mA | 120mA |
| | power level 0 | power level 1 | power level 2 | power level 3 |

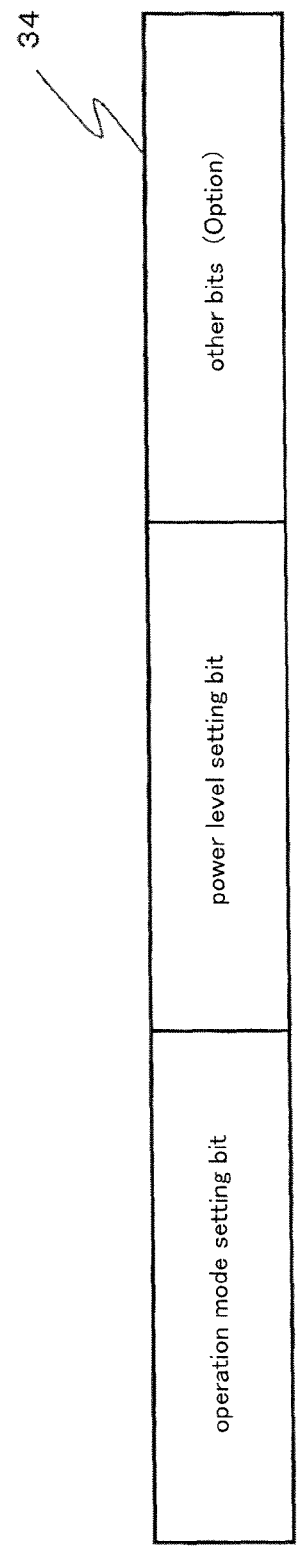
F I G. 85

PROCESS EXECUTION CONTROL BASED ON THE INTERNAL STATES OF FLASH MEMORIES AND POWER SUPPLY CIRCUIT INFORMATION

RELATED APPLICATIONS

This application is a U.S. Continuation of International Application No. PCT/JP2011/003581, filed on Jun. 23, 2011, which in turn claims the benefit of Japanese Application No. 2010-147849, filed on Jun. 29, 2010, and Japanese Application No. 2010-155264, filed on Jul. 7, 2010 the disclosures of which Applications are incorporated by reference herein.

TECHNICAL FIELD

The invention relates to a nonvolatile storage system provided with a nonvolatile storage device such as a SSD (Solid State Drive) or SD (Secure Digital) memory card in which a plurality of flash memories are used. The invention more particularly relates to a technology for reducing power consumption in a more advantageous manner in such an operating environment that running states of processes in a plurality of flash memories are dynamically changing, the invention further relating to a technology for ensuring a high data reliability through an operational stability by avoiding system crash caused by unfavorable events, such as overload, in a power supply circuit for memory system where a state of power supply is undergoing dynamic changes.

BACKGROUND ART

In recent years, storage devices configured for fast data processes, for example, SD memory card and memory stick, are becoming increasingly popular among consumers. These nonvolatile storage devices, in which a plurality of flash memories are provided as nonvolatile storage cells, are used in hosts of personal computers, PDA (Personal Digital Assistant), mobile telephones, digital cameras, audio players, and automotive navigation systems.

The ongoing price reductions of the flash memories are accelerating the widespread of SSD (Solid State Drive) mounted with a large number of flash memories as an alternative to hard disc drives in personal computers and data centers.

The SSD is a drive device in which flash memories are used as a storage medium. The SSD having the same connection interface as that of the hard disc drive (HDD) (for example, ATA) is used as an alternative to hard discs. The SSD may be called flash drive or flash memory drive. The SSD having no mechanically driven parts is very resistant to vibrations during reading and writing processes. The SSD enables the data reading and writing to be processed at high speeds because of no need for time for a reader (head) to move on a rotating disc (seek time) or time for waiting any wanted data on the rotating disc to arrive at a head position (search time).

A flash memory storage device system has a plurality of flash memories and a flash memory controller which controls the flash memories. The flash memory controller is connected to the flash memories by a control bus and a data bus. The flash memory controller selects arbitrary one of the flash memories to read data from and write/erase data in the selected flash memory in response to commands received from the host of the storage device.

For example, a required power supply voltage for data reading is 5V at a maximum, a required power supply voltage for data writing/erasing is 20V at a maximum, and a required power supply voltage for verifying is 10V at a maximum. Because of these differently required voltages, a power supply circuit for feeding the flash memories with power is provided with power supply circuits for process execution which respectively generate a plurality of different voltage levels needed to enable a plurality of different processes to be executed. The power supply circuits for process execution are more specifically a power supply circuit for reading, a power supply circuit for writing/erasing, and a power supply circuit for verifying. These power supply circuits for process execution include booster circuits. The processes are executed in the flash memories by each page or block of a memory cell array. However, it hardly succeeds to complete the processes respectively executed in the target cells in a single attempt by simply injecting and withdrawing electric charges to and from floating gates. Therefore, it is verified in each data writing or erasing whether the data is properly written or erased. The verifying process is repeated until the data is properly written or erased with the power supply voltages being adjusted. A controller provided in the flash memory controls a sequence of processes.

In a storage device used in a host or a slave device, it is necessary to access a plurality of flash memories at once to improve a processing speed. These days, peak currents of external equipments are becoming higher because of large increases of an operating current in each flash memory as a result of the ongoing miniaturization of flash memories and needs for higher operation speeds of the external equipments to keep abreast of hosts increasingly speeding up. A markedly high current capacity is now demanded to feed the flash memories with power, which is largely different to current capacities averagely required. Further, there are other problems to be solved; system crash and degraded data reliability in the flash memories due to overload due to current supply beyond a designed capacity.

PRIOR ART DOCUMENTS

Patent References

Patent Reference 1: JP Patent Application Publication No. 2008-4196
Patent Reference 2: JP Patent Application Publication No. 11-296430
Patent Reference 3: PCT Japan National Publication No. 2004-526239
Patent Reference 4: PCT Japan National Publication No. 2004-531801
Patent Reference 5: JP Patent Application Publication No. 11-242632
Patent Reference 6: JP Patent Application Publication No. 07-93499
Patent Reference 7: JP Patent Application Publication No. 2009-122909

SUMMARY OF THE INVENTION

Problems to be Solved by the Invention

In some storage devices conventionally available, a power supply circuit for flash memory is embedded in a flash memory to generate a voltage needed for each flash memory, wherein a flash memory controller is irrelevant to control of the power supply circuit in the flash memory but in charge of controlling the processes of the flash memory alone such as data reading, writing, and erasing. In these storage devices which are not designed to meticulously control power consumption in a whole system, large power consumption is a huge problem. A solution for the problem is to control consumption of power consumed in voltage increases when the power supply circuits for process execution are activated.

In recent years, an increasing number of nonvolatile storage systems are equipped with a large number of flash memories to enable a larger data capacity and a faster processing speed. In these storage systems, wherein a plurality of flash memories should be accessed simultaneously to increase the processing speed, reduction of power consumption in a whole system is a solution.

According to some inventions disclosed so far (for example, Patent References 1 and 2), a power supply circuit for flash memory is provided outside of the flash memory to reduce an area dimension of the flash memory on a chip.

It is suggested by some disclosed inventions that a plurality of different power supplies are provided for the flash memories by a power supply circuit provided outside of the flash memories (for example, Patent References 3 and 4). The power supplies of the flash memories and the power supply circuit externally provided are connected by a power supply bus to feed power in turns.

These days, there is an increasing demand for a higher operating current each flash memory as a result of the ongoing miniaturization of flash memories and higher operation speeds of external equipments to keep abreast of hosts increasingly speeding up. In a high-speed nonvolatile storage system, plural flash memories are accessed at once to achieve a higher processing speed.

The current consumption increases as a memory block has more flash memories. Also, the current consumption increases as more different types of and/or a larger number of power supply circuits for process execution are provided in a flash memory power supply circuit. The more complicated a circuit configuration is, the more difficult it is to control the power supply. This problem is more apparent particularly in SSD surging these days because of its large data capacity and high operation speed.

The ongoing miniaturization of semiconductor technologies is significantly increasing the current consumption of a flash memory, and the demand for a higher data processing speed is significantly increasing the number of flash memories to be accessed at once. Under the circumstances, power supply circuits used having large power outputs (power supply capacities) are often used as a power supply circuit for memory system. This is more apparent in SSD recently widespread, and various studies and researches are under way.

To ensure stability in the operation of a flash memory, additional improvements are necessary, for example, providing a power supply circuit for memory system having an overly high power supply capacity. Otherwise, the data reliability is undermined by the occurrence of an operational instability and/or system crash due to overload.

However, any solutions have certain limits as far as they simply follow the conventional techniques. The occurrence of overload in the power supply circuit for memory system unfavorably invites an operational instability and/or system crash, causing unanticipated data loss or data garbling.

The invention was accomplished to solve these conventional technical problems. The invention provides a nonvolatile storage system that exerts a high power consumption reducing effect, successfully dealing with a larger data capacity, a higher processing speed, and any complexity resulting from large-scale structures. The invention further aims at avoiding an operational instability and/or system crash due to problems such as overload in a structure where a power supply circuit for memory system having a relatively small power capacity is used and as many flash memories as possible are accessible at once. In other words, the invention carefully observes how the flash memories can be efficiently controlled with a relatively small operating current or in a minimum range of capacity, thereby ensuring a high data reliability.

Means for Solving the Problem

All of numbers recited in the brackets < > in a description hereinafter given respectively correspond to the claim numbers when the application documents of the invention were filed. The bracketed numbers are not serially organized.

<1> A nonvolatile storage system according to the invention includes a memory block having a plurality of flash memories, a flash memory power supply circuit, and a flash memory controller. These three structural elements are physically and spatially independent from one another and communicate with one another through a wiring system including signal lines and buses connecting them. To the point, the flash memory controller and the flash memory power supply circuit are provided outside of the flash memories, and the flash memory power supply circuit is provided outside of the flash memory controller. There is no contradiction between locating these structural elements apart from one another and mounting two of all of the structural elements on a chip. These structural elements may be mounted on different chips or may be mounted on the same chip.

The flash memory power supply circuit includes power supply circuits for process execution for generating a plurality of different voltage levels necessary to execute a plurality of different processes in the flash memories. The power supply circuits for process execution are available for the shared use by the plurality of flash memories. Though a power supply outputted from one of the power supply circuits for process execution is possibly supplied to more than one flash memory at once or supplied to only one of the flash memories, it is not possible that different powers of the power supply circuits for process execution are supplied to one flash memory at once.

It is the role of the flash memory controller to decide which of the power supply circuits for process execution is connected for power supply to any of the flash memories and by what timing they are connected.

The flash memories respectively notify the flash memory controller of their internal states constantly changing. The flash memory controller stores therein the newly received internal states and constantly updates the internal states stored therein. It is arbitrary decided what type of and how many internal states of the flash memories are stored. There are a variety of internal states thus stored and updated.

The flash memory controller receives operation commands from a host externally provided and accordingly accesses the memory block to check the internals states of the flash memories. Based on the obtained internal state of the flash memory, the flash memory controller activates any of the power supply circuits for process execution of the flash memory power supply circuit appropriate for the received operation command. Thus, the power supply circuit for process execution to be selected is decided in a fine-tuned manner. In principle, whether to activate or not to activate the power supply circuit is decided at points under the unit of command issued to the flash memory.

The number of the flash memories operating at once may be one, two, or three or more, constantly changing depending on different situations. The invention is premised on that more than one flash memory is possibly active at once.

Supposing that a power supply circuit for process execution necessary for an operating state of a flash memory is activated, and any power supply circuit for process execution necessary for an operating state of another flash memory is activated concurrently, a power supply circuit for process execution may be connected to the flash memories or different power supply circuits for process execution may be connected thereto. A combination of the operating state of flash memory and the power supply circuit for process execution to feed power to the flash memory constantly changes at all times depending on different situations. The combination changes in a complicated manner.

The combination of the operating state of the flash memory and the power supply circuit for process execution to feed power to the flash memory have more complicated patterns as more flash memories constitute the memory block and/or a more different types of wider variety of power supply circuits for process execution (more different types of operating states of the flash memories) are provided.

When, for example, a flash memory is newly accessed, the flash memory controller determines based on the internal state of the accessed flash memory whether any power supply circuit for process execution suitable for a process to be executed in the accessed flash memory is inactive or already active for a process to be executed in another flash memory. The power supply circuit for process execution, when determined as inactive, is activated. The flash memory controller skips the activation step when the power supply circuit for process execution is already active. It takes a certain amount of time for a startup operation to be stabilized to activate the power supply circuit for process execution, while it saves the startup time to skip the activation step, contributing to a faster operation and less power consumption.

When the process of the accessed flash memory is completed, the flash memory controller determines based on the internal states of the flash memories whether the same process as that of the process-completed flash memory is being executed in any other flash memory. The power supply circuit for process execution is deactivated in the absence of such a flash memory, while the power supply circuit for process execution continues to be active when such a flash memory is found. This operation continuance is technically equivalent to skipping the activation step described earlier when any other flash memory is newly accessed. The "any other flash memory" is any flash memory but the flash memory continuously operating and may include any flash memory that just completed the process.

To activate the power supply circuit for process execution, the operation of the flash memory is paused beforehand to avoid current inrush at the time of startup or prevent the flash memory from starting to operate before an intended power supply voltage is supplied thereto, failing to correctly write or read data therein. When the power supply circuit for process execution is already operating, the operation of the flash memory is restarted. The power supply circuit for process execution, when determined as inactive, is activated. After an enough voltage rise stabilizes the power output of the power supply circuit, the operation of the flash memory is restarted.

To deactivate the power supply circuit for process execution, the operation of the flash memory is paused beforehand to avoid any current variation when the power supply circuit is deactivated. Then, the operation of the flash memory is restarted when any other flash memory is already using the targeted power supply circuit for process execution. The power supply circuit for process execution, if not currently used by any other flash memory, is deactivated to restart the operation of the flash memory. In a sequence of processes described so far, the flash memory controller controls the flash memories and the flash memory power supply circuit in a realistic, dynamic and fine-tuned manner.

Summarizing the description given so far, the nonvolatile storage system recited in <1> includes:

a memory block having a plurality of flash memories;

a flash memory power supply circuit provided outside of the memory block; and a flash memory controller for controlling the flash memory power supply circuit and the plurality of flash memories, wherein the flash memory power supply circuit includes a plurality of types of power supply circuits for process execution for generating a plurality of different voltage levels necessary to execute a plurality of different processes in the flash memories for power supply to the flash memories, and the flash memory controller communicates with the plurality of flash memories to monitor changes of internal states of the flash memories to control the operations of the power supply circuits for process execution of the flash memory power supply circuit and processes of the flash memories based on the monitored internal states of the flash memories.

According to the nonvolatile storage system thus characterized, the following technical advantages are exerted. The flash memory power supply circuit having the plurality of types of power supply circuits for process execution is provided outside of the flash memories (memory block) for the shared use by the plural flash memories. This is advantageous for reduction of a circuit area dimension (substrate area). It contributes to reduction of power consumption that the plurality of types of power supply circuits for process execution are shared by the plural flash memories as compared to providing and using a power supply circuit for each flash memory. Conventionally, plural flash memories are each provided with a plurality of types of power supply circuits for process execution. This conventional structure feeds power to any flash memory currently inactive, wasting power. The sharing technique according the invention avoids such a waste of power.

The flash memory controller communicates with each of the flash memories to be notified of the internal state of the flash memory (on standby or currently operating), what type of process (type of the power supply circuit for process execution currently used) is executed in the flash memory, and any changes of such information. Based on the internal states of the flash memories being monitored when the operation command is received, the flash memory controller controls the target flash memory and the power supply circuit for process execution. Thus, whether to activate or deactivate the power supply circuit for process execution is meticulously controlled in response to active-inactive switchover of the flash memory and the type of process to be executed. This minimizes any useless power consumption. A particular advantage is to reduce voltages rises at the time of startup of the power supply circuit for process execution, greatly reducing relatively large power consumption generated during the voltage rises. The power supply circuit for process execution for the flash memory currently unused is deactivated unless any other flash memory is currently operating. This avoids wasting power by supplying power to any flash memory currently unused.

This enables a dynamic control that responds to ongoing changes in the operation of the nonvolatile storage system. Such a dynamic control, which flexibly deals with different processes to be executed that are constantly changing, for example, data writing and reading, individual differences of the flash memories, changing running states of the processes, and internal states of the flash memory power supply circuit, is carried out in a dynamic, realistic, and fine-tuned manner. The control technique thus characterized has never been disclosed so far, and it is a novel technique that cannot be anticipated from any prior arts. This is the distinctive technical advantage of the invention. The invention accomplishes such a flexible control that immediately responds to any changes of the internal states of the flash memories, thereby greatly reducing power consumption.

<50> Functionally describing the main structural elements of the nonvolatile storage system according to the invention, provided are: a memory block having a plurality of flash memories provided as a nonvolatile storage device; a flash memory controller for controlling execution of a process in each of the plurality of flash memories; and a power supply circuit for supplying the plurality of flash memories with power to enable operations of the flash memories. It is the minimum requirement to provide three structural elements (memory block, flash memory controller, and power supply circuit). According to the invention, the nonvolatile storage system per se is equipped with the power supply circuit for memory system. Thus, the nonvolatile storage system is different to any conventional system designed to receive power from a host-side power supply circuit. The power supply circuit for memory system provided outside of the memory block, which is different to any conventional system where each flash memory has therein a power supply circuit.

Some flash memories are configured for data reading, writing, and erasing, while some flash memories are further configured for verifying whether data is written or erased. The invention imposes no restrictions on the spec of the flash memory.

The internal circuit configuration of the power supply circuit for memory system conforms to the spec of the flash memory. The power supply circuit for memory system may include a power supply circuit for reading and also a power supply circuit for writing/erasing. The power supply circuit for memory system may further include a power supply circuit for verifying data writing/erasing. The invention imposes no restrictions on the internal circuit configuration.

In the nonvolatile storage system wherein the power supply circuit for memory system is shared by the plural flash memories and the plural flash memories are all controlled by the flash memory controller, it is necessary to contrive an effective way of controlling these three structural elements provided apart from one another which are the flash memory, power supply circuit for memory system, and the flash memories, so that any flash memory to be accessed can stably execute a process within the range of a rated power supply capacity of the power supply circuit for memory system.

The power supply circuit of the nonvolatile storage system according to the invention has a function to detect and retain its own state of power supply and notify the flash memory controller of the detected state of power supply in the form of a power supply state information. The flash memory controller has a function to determine whether any access-target flash memories can properly execute a process within the range of the rated power supply capacity of the power supply circuit for memory system based on the power supply state information received from the power supply circuit for memory system and control the operations of a part of the access-target flash memories so that power usage is lessened when determined that the processes are not properly executable. As a result of these functions, any access-target flash memories will be able to properly execute the processes over time within the range of the rated power supply capacity of the power supply circuit for memory system.

"To control the operations of a part of the access-target flash memories so that power usage is lessened" is a broad technical concept. The operation of the access-target flash memory may be paused to be postponed, or the access-target flash memory may be subjected to a mode change (reduction of operating current) so as to operate in an operation mode that requires less power than a normal mode. In either way, power used by the target flash memory is lessened.

The power supply circuit for memory system may notify the flash memory controller of the power supply state information in response to polling by the flash memory controller (inquiry at regular or irregular intervals) or interrupt as a result of transition of the internal state of the power supply circuit for memory system.

The flash memory controller that received an operation command from the host receives the power supply state information from the power supply circuit for memory system. Then, whenever determining based on the received power supply state information that the access-target flash memories are unable to properly execute the processes within the range of the rated power supply capacity of the power supply circuit for memory system, a part of the access-target flash memories are controlled so that the processes are executable within the range of the rated power supply capacity.

Summarizing the description given so far, the nonvolatile storage system according to the invention recited in <50> includes: a memory block having a plurality of flash memories provided as a nonvolatile storage device; a flash memory controller for controlling execution of a process in each of the plurality of flash memories; and a power supply circuit for supplying the plurality of flash memories with power to enable operations of the flash memories, wherein the power supply circuit notifies the flash memory controller of its own state of power supply in the form of a power supply state information, and when it is determined based on the received power supply state information that the access-target flash memories are unable to properly execute the processes within the range of the rated power supply capacity of the power supply circuit for memory system, the flash memory controller controls the access-target flash memories to lessen power usage so that the processes are executable within the range of the rated power supply capacity of the power supply circuit.

The nonvolatile storage system recited in <50> is characterized in that the flash memories are controlled based on the power supply state information received from the power supply circuit for memory system so that the processes are executable within the range of the rated power supply capacity of the power supply circuit.

The access-target flash memory may be controlled when the command is just outputted thereto and the process is yet to start or may be controlled while the process is being executed.

To control the access-target flash memory so that the process is executable within the range of the rated power supply capacity, the process currently executed in the target flash memory may be paused, or the operation mode of the target flash memory currently executing the process may be changed to a low power mode.

The flash memory controller may receive the power supply state information from the power supply circuit in response to polling by the flash memory controller to the power supply circuit or interrupt as a result of transition of the internal state of the power supply circuit.

According to the nonvolatile storage system according to the invention recited in <50>, the flash memory controller receives the power supply state information from the power supply circuit. When it is determined based on the received power supply state information that the processes are not properly executable within the range of the rated power supply capacity of the power supply circuit, the flash memory controller reduces power usage in the flash memories, thereby allowing the processes to be executed within the range of the rated power supply capacity. This avoids an operational instability and/or system crash due to such problems as overload, thereby providing a better data reliability.

The power required in the access-target flash memories is compared to a power currently supplied by the power supply circuit to determine whether the power supply circuit currently has a power supply capacity that can afford the required power. Whenever the power supply capacity is determined as not enough, the flash memories are controlled to ensure an enough power supply. This enables a dynamic control that responds to ongoing changes in the operation of the nonvolatile storage system. Such a dynamic control, which flexibly deals with different processes to be executed that are constantly changing, for example, data writing and reading, individual differences of the flash memories, changing running states of the processes, and internal states of the flash memory power supply circuit, is carried out in a dynamic, realistic, and fine-tuned manner. The control technique thus characterized has never been disclosed so far, and it is a novel technique that cannot be anticipated from any prior arts. This is the distinctive technical advantage of the invention.

<62> Next, a power supply circuit for nonvolatile storage system according to the invention is described. The power supply circuit supplies the plural flash memories of the memory block with power to enable operations of the flash memories. Further, signals are transmitted and received to and from the power supply circuit and the flash memory controller so that the flash memory controller is notified of the state of power supply (driving rate or affordability) of the power supply circuit. Further, the power output of the power supply circuit is controlled as requested by the flash memory controller. The structural elements of the power supply circuit are a voltage generating unit and a voltage state monitoring unit.

A power supply control signal outputted from the flash memory controller is inputted to the voltage generating unit. The voltage generating unit has a function to generate and output a power supply voltage for the operation of each flash memory depending on information (parameters) indicated by the power supply control signal. Moreover, the voltage generating unit generates a power supply voltage variation signal indicating changes of the generated power supply voltage and outputs the generated signal to the voltage state monitoring unit.

The voltage state monitoring unit receives the power supply voltage variation signal from the voltage generating unit and generates a power supply state notifying signal indicating the state of power supply (driving rate or affordability) of the voltage generating unit based on the received power supply voltage variation signal and outputs the generated signal to the flash memory controller. The driving rate represents a driving state relative to how frequently the voltage generating unit is activated or the operational capacity of the voltage generating unit. The affordability represents a degree of tolerance relative to how frequently the voltage generating unit is activated or the operational capacity of the voltage generating unit.

The power supply circuit provided with the voltage generating unit and the voltage state monitoring unit may be a functional block independent from the memory block and combined with or independent from the flash memory controller. The power supply circuit provided as an independent functional block has the following terminals for connection with equipments externally provided; a power supply control terminal to which the power supply control signal is inputted from the flash memory controller externally provided, a power supply output terminal from which the power supply voltage generated by the voltage generating unit is outputted to the memory block (plural flash memories), and a power supply state notifying terminal from which the power supply state notifying signal is outputted from the voltage state monitoring unit to the flash memory controller.

Summarizing the description given so far, the power supply circuit for nonvolatile storage system recited in <62> includes:

a voltage generating unit for generating and outputting a power supply voltage for an operation of each flash memory depending on information indicated by a power supply control signal inputted thereto from a flash memory controller externally provided, the voltage generating unit further generating a power supply voltage variation signal indicating changes of the generated power supply voltage; and a voltage state monitoring unit for receiving the power supply voltage variation signal from the voltage generating unit and generating a power supply state notifying signal indicating a state of power supply (driving rate or affordability) of the voltage generating unit based on the received power supply voltage variation signal, the voltage state monitoring unit further outputting the generated signal to the flash memory controller.

The technical advantages exerted by the power supply circuit for nonvolatile storage system according to the invention are described below. The state of power supply of the voltage generating unit which is driven based on the information indicated by the power supply control signal received from the flash memory controller is monitored by the voltage stage monitoring unit, and a monitoring result thereby obtained is outputted to the flash memory controller in the form of the power supply state notifying signal indicating the state of power supply (driving rate or affordability) of the voltage generating unit. Accordingly, the flash memory controller can accurately know the state of power supply (driving rate or affordability) of the voltage generating unit and update the power supply control signal depending on the state of power supply to set a renewed instruction in the voltage generating unit.

The power supply voltage to be generated by the power supply circuit is controlled by the flash memory controller. The power supply circuit constantly monitors its own internal state and sends the monitoring result to the flash memory controller as the driving rate. Then, the flash memory controller controls the power supply circuit based on the driving rate or affordability. Though the state of power supply indicated by the power supply state notifying signal is described as the driving rate, the same technical advantages can be obtained when the affordability relative to the deactivating frequency or the maximum operational capacity limit of the voltage generating unit is used in place of the driving rate. Such a cyclic control flow, which repeats feedback control and feedforward control in turns, is carried out in a dynamic, realistic, and fine-tuned manner.

In the nonvolatile storage system provided with such a power supply circuit, it is unnecessary to arrange an overly high power supply capacity. As a result, any useless power consumption is effectively minimized A flash memory according to the invention is a flash memory operated under control by a flash memory controller externally provided, the flash memory including:

a register for indicating a level of power used by the flash memory in each of operation modes of the flash memory; and a controller for notifying the flash memory controller of the level of power indicated by the register.

The technical advantages of the flash memory according to the invention thus characterized are described below. An operating power (current) load of an outside power supply is adjustable by any wanted timings, enabling management of power transmission for a plurality of flash memories and reduction of current consumption. The external power supply does not need an overly high power supply capacity (for example, high peak currents). When the level of power is set when or before a reading or rewriting command is inputted, a power to be supplied by the outside power supply for executing the command can be reserved in advance.

The controller of the flash memory according to the invention preferably transmits and receives a command containing a field indicating the level of power to and from the flash memory controller. Then, the power load is known when the command is issued by setting the power field in any command requiring power control (readout, programs, erasing), which facilitates the power control (in a host). Further, a command for changing the level of power alone can be set. These advantages make it unnecessary to directly set the level of power in any command requiring power control, hardly affecting a data transfer bandwidth for command input (IO in NAND flash).

The operation modes of the flash memory according to the invention preferably include an operation pause mode. Then, the introduction of a pause level defines a minimum power load and ensures a large adjustable range of the operating power (current) load of the outside power supply. In the event of any instability of the outside power supply, the operation of the flash memory can be paused so that the flash memory is prevented from malfunctioning.

The flash memory according to the invention preferably further includes a control terminal used to set the level of power in the operation pause mode. Using a dedicated pin as the control terminal used to set the level of power, the operation of the flash memory can pause speedily (for example, by designating levels) by timings asynchronous with command accesses, and the flash memory can speedily restart to operate.

The controller of the flash memory according to the invention preferably allows accesses to the register while the flash memory is operating during the operation pause mode. Then, a level of power after the release of pause (not only the level of power set by the register but also an arbitrary state of the register after the pause is released) can be set during the pause. As a result, a period of time during the pose is effectively used, and a processing time for the setting is thereby reduced.

The flash memory according to the invention preferably further includes a first storage which is a storage for a first information indicating an operating power value of power consumed by the flash memory at the level of power, wherein the controller reads the first information corresponding to the level of power from the first storage and outputs the read first information to the flash memory controller. This enables to handle any product variability of the flash memory operating power (manufacturing process variability) as a simple command format irrelevant to actual current values (common standard irrespective of product types).

The flash memory according to the invention preferably further includes a second storage which is a storage for a second information indicating a processing speed of the flash memory at the level of power, wherein the controller reads the second information corresponding to the level of power from the second storage and outputs the read second information to the flash memory controller. This enables to handle any product variability of the flash memory processing speed (manufacturing process variability) as a simple command format irrelevant to actual current values (common standard irrespective of product types). When information of the processing speed is thus involved in the power control, the operating power (current load) of the outside power supply can be predicted, and the power control of the host system is more sophisticated.

The controller of the flash memory according to the invention preferably knows the level of power by referring to a signal inputted from outside to the flash memory in place of the level of power indicated by the register. Accordingly, the level of power is changeable by, for example designating levels by timings asynchronous with command accesses.

A flash memory controller according to the invention is a flash memory controller for controlling execution of a process in each of a plurality of flash memories, wherein the flash memory controller controls any of the plurality of access-target flash memories based on a power supply state information received from a power supply circuit for supplying the plurality of flash memories with power. The flash memory controller according to the invention thus characterized is most suitably configured for the nonvolatile storage system according to the invention described so far. The flash memory controller accomplishes technical advantages similar to those of the nonvolatile storage system according to the invention.

Effect of the Invention

According to the invention, the flash memory controller dynamically controls the flash memories and the power supply circuits for process execution depending on the internal states of the flash memories and ongoing changes in the operation of the nonvolatile storage system. Thus, the flash memories are controlled in a fine-tuned manner, and power consumption is thereby reduced. As a result, a power consumption reducing effect is remarkably improved against a larger data capacity, a higher processing speed, and complexity of a large-scale structure.

The technology provided by the invention more effectively exerts the power consumption reducing effect as the memory block has more flash memories, or more different types of or a larger number of power supply circuits for process execution are provided in the flash memory power supply circuit. The power consumption reducing effect exerted is further improved when the invention is applied to SSD (Solid State Drive) having a large data capacity and capable of operating at a high speed.

According to the invention relating to the nonvolatile storage system, the flash memory controller controls the flash memories based on the power supply state information from the power supply circuit for memory system so that the flash memories operate within the range of the rated power supply capacity. This enables a dynamic, realistic, and fine-tuned control flexibly responding to different processes to be executed constantly changing, for example, data writing and reading, individual differences of the flash memories, changing states of execution of processes, and changing internal states of the power supply circuits. This successfully avoids an operational instability and/or system crash due to such problems as overload, providing a better data reliability.

According to the invention relating to the nonvolatile storage system, the internal states are monitored at all times, and the monitoring result is sent to the flash memory controller so that the power supply voltage is controlled by the flash memory controller. Such a cyclic control flow, which repeats feedback control and feedforward control in turns, is carried out in a dynamic, realistic, and fine-tuned manner.

According to the invention relating to the flash memory, power transmission for a plurality of flash memories is more accurately controlled.

These various technical advantages make it unnecessary to arrange an overly high power supply capacity to ensure an operational stability, effectively minimizing any useless power consumption in the system.

BRIEF DESCRIPTION OF THE DRAWINGS

FIG. 1 is a block diagram illustrating structural characteristics of a nonvolatile storage system according to a working example 1 of the invention.

FIG. 2 is a block diagram illustrating structural characteristics of a nonvolatile storage system according to a modified example of the working example 1.

FIG. 3A is a flash memory internal state management table according to the working example 1.

FIG. 3B is a table of internal states and power supplies to be used.

FIG. 5 is a flow chart illustrating a power supply sequence for writing/erasing of the nonvolatile storage system according to the working example 1.

FIG. 6 is a flow chart illustrating a power supply sequence for verifying of the nonvolatile storage system according to the working example 1.

FIG. 26 is a flow chart illustrating structural characteristics of a nonvolatile storage system according to a working example 14 of the invention.

FIG. 27 is a structural example of a flash memory block according to a working example 15 of the invention.

FIG. 28 illustrates an example of information contents to be stored in an information register.

FIG. 30 illustrates an example of information contents to be stored in the information register during the auto program sequence.

FIG. 32 is a table showing a list of commands.

FIG. 33 is a configuration of a flash memory block according to a working example 16 of the invention.

FIG. 35 illustrates an example of information contents to be stored in a power information storage region.

FIG. 39 is a flash memory operation management table of the nonvolatile storage system according to the working example 19.

FIG. 44 is a flash memory operation management table of the nonvolatile storage system according to a working example 22 of the invention.

FIG. 46 is a flash memory operation management table of the nonvolatile storage system according to a working example 23 of the invention.

FIG. 47 is a flow chart illustrating an operation of the nonvolatile storage system according to the working example 23.

FIG. 48 is a flash memory operation management table of the nonvolatile storage system according to the working example 23.

FIG. 49 is a flash memory operation management table of the nonvolatile storage system according to the working example 23.

FIG. 58 is a block diagram illustrating structural characteristics of a power supply circuit for nonvolatile storage system according to a working example 30 of the invention.

FIG. 64 is a timing chart illustrating an operation of the power supply circuit for nonvolatile storage system according to the working example 33.

FIG. 74 is a timing chart illustrating an operation of the power supply circuit for nonvolatile storage system according to the working example 38.

FIG. 78 is an illustration of storage of power parameters stored in a flash memory according to the working examples of the invention.

FIG. 79 is a flow chart illustrating a power mode change of a program sequence in the flash memory according to the working examples of the invention.

FIG. 81A illustrates a first example of power level setting for command execution in the flash memory according to the working examples of the invention.

FIG. 81B illustrates a second example of power level setting for command execution in the flash memory according to the working examples of the invention.

FIG. 81C illustrates a third example of power level setting for command execution in the flash memory according to the working examples of the invention.

FIG. 83 is a structural example of a flash memory according to a working example of the invention.

FIG. 84 is an illustration of a power register according to a working example of the invention.

FIG. 85 is an illustration of a command register according to a working example of the invention.

EMBODIMENTS FOR CARRYING OUT THE INVENTION

Figure 4:
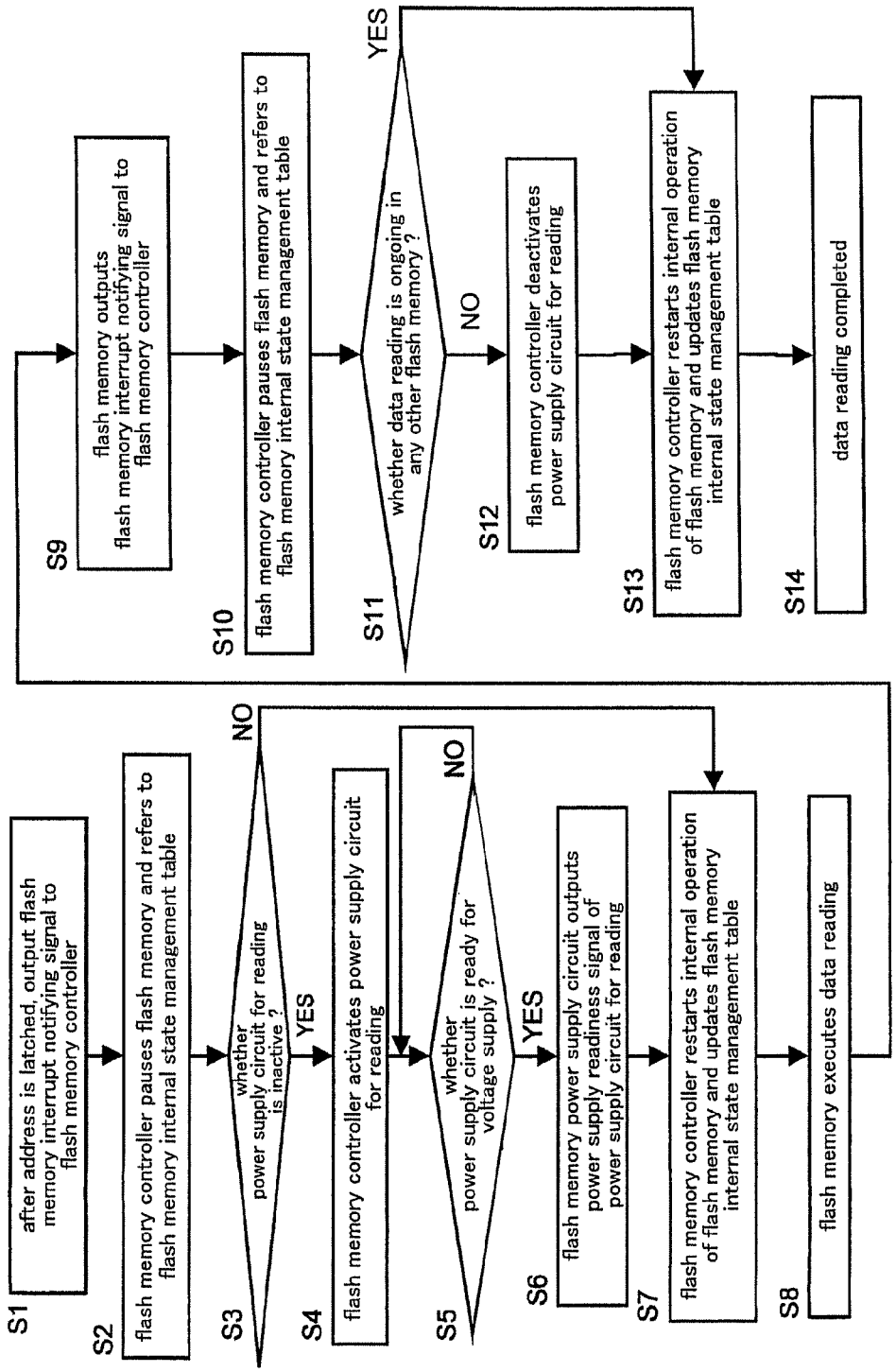
FIG. 4 is a flow chart illustrating a power supply sequence for reading of the nonvolatile storage system according to the working example 1.

The non-volatile storage system according to the invention recited in <1> becomes more technically advantageous according the following embodiments.

<2> In the non-volatile storage system recited in <1>, the flash memory controller preferably includes a flash memory internal state management unit. In each of the flash memories, an internal state information of the flash memory is generated and stored. The flash memory internal state management unit fetches the internal state information of each flash memory that the flash memory controller obtains by communicating with the flash memory and records therein the obtained internal state information. The recorded information is updated in accordance with changing situations.

Each of the plural flash memories outputs the internal state thereof to the flash memory controller as the operating state of the flash memory changes. The flash memory controller updates the received internal state and records the updated internal state in the flash memory internal state management unit.

In response to an operation command received from a host externally provided, the flash memory controller accesses the memory block and refers to the flash memory internal state management unit to obtain the internal state information of any target one of the flash memories. Based on the obtained internal state of the flash memory, the flash memory controller starts the operation of any target one of the power supply circuits for process execution of the flash memory power supply circuit in accordance with the operation command.

<3> In the non-volatile storage system recited in <2>, the internal state information of the flash memory includes an identification information to determine whether the flash memory is currently in a standby state or in an operating state and information of type of the processes to be executed. Describing the standby state, the flash memory is pausing with no process currently executed therein. Describing the operating state, any of the data reading, data writing, data erasing, data-write verifying, and data-erase verifying is currently executed in the flash memory. The type of the processes to be executed includes any of the data reading, data writing, data erasing, data-write verifying, and data-erase verifying. Depending on which of the processes is executed, which of the power supply circuit for process execution should be driven is decided. Depending on whether any other flash memories are already operating, the flash memory controller differently controls the flash memories and the flash memory power supply circuit. These informations are constantly managed by the flash memory controller as the internal informations of the flash memories. Based on the informations thus managed, the flash memory controller controls the flash memories and the flash memory power supply circuit. In this manner, the flash memories and the flash memory power supply circuit are meticulously controllable, and power consumption is thereby effectively reduced.

<4> According to a mode of <3>, the information of type of the processes to be executed includes information of reading and writing/erasing processes. Accordingly, the type of processes to be executed in the flash memories are the reading and writing/erasing processes, and the flash memory power supply circuit includes a power supply circuit for reading and a power supply circuit for writing/erasing.

<5> According to another mode of <3>, the information of the type of the processes to be executed includes information of reading, writing/erasing, and data-write/data-erase verifying processes. Accordingly, the type of the processes to be executed in the flash memories are the reading, writing/erasing, and data-write/data-erase verifying processes, and the flash memory power supply circuit includes a power supply circuit for reading, a power supply circuit for writing/erasing, and a power supply circuit for verifying.

The non-volatile storage systems recited in <1>-<5> become more technically advantageous according the following embodiments.

<6> The internal state of the flash memory is provided in the form of a flash memory interrupt notifying signal. The flash memory interrupt notifying signal is generated when the operating state of the flash memory changes and transmitted to the flash memory controller.

For example, the internal state of the flash memory is one of a standby state, a data reading state, a data writing/erasing state, and a data-write/data-erase verifying state. When these states change to one another, the flash memory generates the interrupt notifying signal indicating the change and transmits the generated interrupt notifying signal to the flash memory controller through, for example, a bus line. The internal state changes in a variety of different manners.

In a flash memory configured for the reading and writing/erasing processes, the internal state changes as follows.

standby state→data reading state
    standby state→data writing state
    standby state→data erasing state
    data reading state→standby state
    data writing state→standby state
    data erasing state→standby state In a flash memory further configured for the verifying process, the internal state changes as follows in addition to the foregoing changes.

data writing state→data-write verifying state
    data erasing state→data-erase verifying state It accomplishes a fine-tuned control flexibly responding to the changing internal states of the flash memory to notify the internal state of the flash memory in the form of the flash memory interrupt notifying signal, more effectively reducing power consumption.

<7> The flash memory internal state management unit was described in <2>. In <7> is described the use of the internal state information of each flash memory updated and recorded in the flash memory internal state management unit. <7> is applicable to <2> to <6>.

The flash memory controller is configured for executing a sequence of operations described below when an operation command is received from a host externally provided.

[1] The flash memory controller pauses the operation of a command target flash memory corresponding to a command target in the operation command.

In the case where a command target power supply circuit for process execution corresponding to the command target in the operation command is activated while the command target flash memory is active, the flash memory starts to operate before a power supply voltage originally intended is supplied thereto, causing current inrush or resulting in failure to correctly write or read data. The temporary suspension of the operation prevents these unfavorable events from happening.

[2] Then, the flash memory controller refers to the internal states of the flash memories in the flash memory internal state management unit to determine an ongoing status of the command target power supply circuit for process execution corresponding to the command target in the operation command.

[3-1] When it is determined in [2] that the command target power supply circuit for process execution is currently inactive, the flash memory controller activates the command target power supply circuit for process execution. Because the operation of the command target flash memory was paused before the command target power supply circuit for process execution is activated, there is no concern for current inrush to the command target flash memory.

[4] Then, the flash memory waits for the power supply to be stabilized and proceeds to [5].

[3-2] When it is determined in [2] that the command target power supply circuit for process execution is currently operating to be used for the operation of any other flash memory, the flash memory controller skips [3-1] and [4] and then proceeds to [5].

[5] Then, the flash memory controller restarts the operation of the command target flash memory and updates the internal state of the command target flash memory in the flash memory internal state management unit.

The command target power supply circuit for process execution, as far as it is currently inactive, is activated. Otherwise, the activation step is skipped because of no need to activate the command target power supply circuit for process execution already operating. Whenever the command target power supply circuit for process execution is activated, a certain amount of time is necessary for the startup operation to be stabilized. Skipping the activation step, the amount of time is saved, which contributes to a faster operation (reduction of power consumption).

<8> In <8> is similarly described the use of the internal state information of each flash memory updated and recorded in the flash memory internal state management unit. <8> is applicable to <7>. The flash memory controller is configured for executing a sequence of operations described below when an operation command is received from the host.

[1] The operation of the command target flash memory which completed the process is paused. In the case where the command target power supply circuit for process execution currently feeding power is deactivated while the process-completed command target flash memory is still operating, adverse influences are generated by current variation generated at the time of deactivation. The temporary suspension of the operation avoids such adverse influences.

[2] Then, the internal states of the flash memories in the flash memory internal state management unit are checked to determine a status of use of the command target power supply circuit for process execution currently feeding power to the process-completed command target flash memory.

[3-1] When it is determined in [2] that the command target power supply circuit for process execution feeding power is not currently used by any other flash memory, the command target power supply circuit for process execution currently feeding power is deactivated, and the flash memory controller proceeds to [4]. No adverse influences are generated in the process-completed command target flash memory when the command target power supply circuit for process execution is deactivated because the process-completed command target flash memory is already paused in [1].

[3-2] When it is determined in [2] that the command target power supply circuit for process execution feeding power is currently used by any other flash memory, the deactivation of [3-1] is skipped, and the flash memory controller proceeds to [4].

[4] Then, the flash memory controller restarts the operation of the process-completed command target flash memory after deactivating the command target power supply circuit for process execution currently feeding power and updates the internal states of the flash memories in the flash memory internal state management unit.

The command target power supply circuit for process execution feeding power, unless it is currently used by any other flash memory, is deactivated. It is unnecessary to deactivate the command target power supply circuit for process execution feeding power as long as it is currently used by any other flash memory, skipping the deactivation step. It takes a certain amount of time for any influences caused by the deactivation to be settled. Skipping the deactivation step, the amount of time is saved, which contributes to a faster operation (reduction of power consumption).

<9> The processes to be executed in <9> include a verifying process. When the writing/erasing process shifts to the verifying process, the flash memory controller determines a status of use of the command target power supply circuit for process execution in accordance with the internal states of the flash memories in the flash memory internal state management unit. When the command target power supply circuit for process execution is currently inactive, the flash memory controller activates the inactive command target power supply circuit for process execution and restarts the operation of the command target flash memory after the power supply by the command target power supply circuit for process execution is stabilized. Further, the flash memory controller updates the internal states of the flash memories in the flash memory internal state management unit. On the other hand, the flash memory controller skips the activation step when the command target power supply circuit for process execution is already active, and then updates the internal states of the flash memories.

<10> This section, <10>, relates to <9>. The flash memory controller, when notified by the flash memory of completion of the verifying process executed in the flash memory, pauses the operation of the verifying-completed flash memory. Then, the flash memory controller determines the status of use of the power supply circuit for process execution currently feeding power for verifying to the verifying-completed flash memory based on the internal states of the flash memories in the flash memory internal state management unit. When it is determined that the power supply circuit for process execution feeding power for verifying is currently unused by any other flash memory, the flash memory controller deactivates the power supply circuit for process execution currently feeding power for verifying. When it is determined that the power supply circuit for process execution feeding power for verifying is currently used by any other flash memory, the flash memory controller skips the deactivation step.

The technical characteristics of <1>-<10> are hereinafter described in further detail as a working example 1 of the invention.

Working Example 1

FIG. 1 is a block diagram illustrating structural characteristics of a nonvolatile storage system according to a working example 1 of the invention. The nonvolatile storage system according to the working example includes a memory block 2010 having a plurality of flash memories 2012, a flash memory power supply circuit 2020, and a flash memory controller 2030. The flash memory power supply circuit 2020 and the flash memory controller 2030 may be different semiconductor devices independent from each other or may be semiconductor devices integrally mounted on a chip.

The flash memory controller 2030 is connected to the flash memories 2012 by an address/control bus 2041 and a data bus 2042. The flash memory controller 2030 is connected to the flash memory power supply circuit 2020 by a control bus 2043. The flash memory power supply circuit 2020 is connected to the flash memories 2012 by power supply lines 2044.

None of the flash memories 2012 is embedded with a power supply circuit for writing/erasing, reading, or verifying, which is conventionally provided in a flash memory per se. The flash memories 2012 are each provided with a power supply terminal T1 for writing/erasing, a power supply terminal T2 for reading, and a power supply terminal T3 for verifying. The flash memory power supply circuit 2020 provided outside of the flash memories 2012 (memory block 2010) feeds voltage supplies to these terminals.

The power supply terminal T1 for writing/erasing may concurrently serve as the power supply terminal T3 for verifying, in which case a voltage for writing/erasing (for example, 20V) is lowered in the flash memory 2012 to generate a voltage for verifying (for example, 10V). The power supply terminal T1 for writing/erasing may concurrently serve as the power supply terminal T2 for reading and the power supply terminal T3 for verifying, in which case the voltage for writing/erasing is lowered in the flash memory 2012 to generate the voltages for verifying and reading. Such a shared use of the power supply terminals structurally simplifies the nonvolatile storage system. In the presence of a data-reading flash memory and a data-writing flash memory at the same time, for example, the data-reading flash memory is supplied with an overly high voltage for data writing. This reduces an effect of power saving originally expected from a fine-tuned power control.

The flash memory 2012 has an information register (IR) 2014 for indicating an operating state thereof carried out by an internal controller of the flash memory (not illustrated in the drawing), and a terminal T4 for outputting a flash memory internal state notifying signal A3 to notify the other structural elements outside of the memory block of the operating state. The flash memory internal state notifying signal A3 is outputted to the flash memory controller 2030.

The flash memory internal state notifying signal A3 may be defined as described in A to E.

A) A notifying method is an interrupt from the flash memory 2012 or by polling (inquiry at regular or irregular intervals) from the flash memory controller 2030.

B) The interrupt is generated when the operating state of the flash memory 2012 changes so that the flash memory controller 2030 is notified of the change of the operating state.

C) The flash memory controller 2030 monitors by polling the flash memory internal state notifying signal A3 at predefined time intervals to check whether the operating state changes.

D) A data output method may be a parallel output method or a serial output method. The data indicating the internal state contains information of a plurality of bits. The parallel output method uses as many buses as the number of bits, while the serial output method uses a data line for outputting serial data and two signals including a transfer clock.

E) The data bus 2042 of the flash memories 2012 may be used to output the data.

The flash memory internal state notifying signal A3 is outputted to notify changes of the internal state alone. The data indicating the internal state per se is read through the address/control bus 2041 conventionally provided in the flash memory 2012 when requested by a command to read the internal state outputted from the flash memory controller 2030.

The flash memory internal state notifying signal A3 according to the working example 1 is a signal which notifies that the internal state changed by interrupt (flash memory interrupt notifying signal $A3_1$). The readout of the internal state of the flash memory 2012 is described with reference to an example in which the flash memory controller issues an internal state reading command and the internal state is read from the information register 2014 through the data bus 2042 of the flash memories 2012.

In a nonvolatile storage system illustrated in FIG. 2 according to a modified example of the working example 1, the flash memory 2012 further includes a terminal T5 for inputting a flash memory internal operation control signal A4 that functions to pause or restart the operation of the internal controller (not illustrated in the drawing). The terminal T5 is connected to the flash memory controller 2030 to enable the flash memory controller 2030 to directly control the operation of the internal controller of the flash memory 2012.

There are two methods of use of the flash memory internal operation control signal A4, which are described below.

The flash memory 2012 outputs the flash memory internal state notifying signal A3 (interrupt notifying signal), and the flash memory controller 2030 that received the flash memory internal state notifying signal A3 pauses the operation of the internal controller by using the flash memory internal operation control signal A4 and restarts the operation after an intended operation is completed.

The flash memory 2012 outputs the flash memory internal state notifying signal A3 (interrupt notifying signal) and pauses the internal controller thereof at the same time, and then waits for the operation thereof to be restarted by the flash memory internal operation control signal A4.

The flash memory internal operation control signal A4 according to the working example is described with reference to [1]. The flash memory controller 2030 outputs a writing, erasing, or reading command and relevant address information to each flash memory 2012 through the address/control bus 2041 and writes, reads, or erase data through the data bus 2042.

The flash memory controller 2030 receives the flash memory internal state notifying signal A3 outputted from the flash memory 2012. The flash memory internal state notifying signal A3 according to the working example is an interrupt notifying signal indicating that the internal state of the flash memory 2012 changed. Being interrupted by the signal, the flash memory controller 2030 can know which of the flash memories 2012 had the internal state changed.

The flash memory controller 2030 has a flash memory internal state management table 2032 used for the management of the internal states of the flash memories 2012 connected thereto. The flash memory internal state management table 2032 stores therein the internal states of the flash memories 2012 at the time. FIGS. 3A and 3B illustrate detailed contents of the flash memory internal state management table 2032 and ongoing states of power supply corresponding thereto. The flash memory controller 2030 outputs the flash memory internal operation control signal A4, which pauses/restarts the operation of the internal controller provided in the flash memory 2012, to the flash memory 2012.

The flash memory controller 2030 outputs a flash memory power supply control signal A1 to the flash memory power supply circuit 2020 through the control bus 2043.

The flash memory power supply control signal A1 is generated to control the operations of power supply circuits 2021, 2022, and 2023 of the flash memory power supply circuit 2020 independently from one another. The flash memory power supply control signal A1 can control the operation, deactivation, generated voltage, and power supply capacity of each power supply circuit. In response to the outputted flash memory power supply control signal A1, the flash memory controller 2030 makes the power supply circuits 2021, 2022, and 2023 of the flash memory power supply circuit 2020 respectively operate at targeted voltages within intended power supply capacities. When the power supply circuit 2021, 2022, 2023 is activated and ready to feed power, a power supply readiness signal A2 is outputted from the power supply circuit 2021, 2022, 2023 and then received by the flash memory controller 2030 through the control bus 2043.

The flash memory power supply circuit 2020 has a power supply circuit 2021 for writing/erasing, a power supply circuit 2022 for reading, and a power supply circuit 2023 for verifying, wherein these power supply circuits include booster circuits respectively provided to generate a voltage for writing/erasing, a voltage for reading, and a voltage for verifying of the flash memory 2012 from a power supply VCC to be supplied to the whole system, and output circuits capable of changing their own power supply capacities. The voltage supplies from the power supply circuits 2021, 2022, and 2023 are connected to the power supply terminals T1, T2, and T3 of the plural flash memories 2012 through the power supply lines.

In response to the flash memory power supply control signal A1 outputted from the flash memory controller 2030, the flash memory power supply circuit 2020 activates and deactivates the power supply circuit 2021 writing/erasing, power supply circuit 2022 reading, and power supply circuit 2023 verifying, and switches to and from different voltages generated by the booster circuits of the respective power supplies and different power supply capacities of the output circuits of the respective power supplies.

An example of controlling the voltage generated by the booster circuit is to provide a booster circuit that can set a plurality of different voltages within a certain range of voltages, for example, is used to generate a most suitable voltage from given plural-bit information of setting voltages.

To switch to and from the different power supply capacities of the output circuits, for example, transistors in different sizes are provided in final stages of the output circuits, and one of the transistors most suitable for the given plural-bit information of setting voltage.

The flash memory circuit 2020 controls the power supply circuits 2021, 2022, and 2023 based on the flash memory power supply control signal A1 outputted from the flash memory controller 2030. When these power supply circuits are ready for power supply, the flash memory circuit 2020 outputs the power supply readiness signal A2 to the flash memory controller 2030.

In the case of the flash memory 2012 where the power supply terminal T1 for writing/erasing concurrently serves as the power supply terminal T3 for verifying, it is unnecessary to provide the power supply circuit 2023 for verifying. In the case of the flash memory 2012 where power supply terminal T1 for writing/erasing concurrently serves as the power supply terminal T2 for reading and the power supply terminal T3 for verifying, neither of the power supply circuit 2022 for reading nor the power supply circuit 2023 for verifying is necessary.

<Power Supply Sequence for Reading>

Immediately after the system is turned on, the power supply VCC, which is a power supply for the whole system, is supplied to the flash memory controller 2030, flash memory power supply circuit 2020, and VCC power supply terminals of the flash memories 2012. The power supply terminal VCC of the flash memory 2012 mostly feeds power to an IO (input/output terminal) and a logic circuit (not illustrated in the drawings) of the flash memory 2012. The power supply terminal VCC is ready to receive commands from the flash memory controller 2030. In the flash memory power supply circuit 2020, the power supply circuits 2021, 2022, and 2023 are still inactive, and the power supply terminal T1 for writing/erasing, power supply terminal T2 for reading, and power supply terminal T3 for verifying are yet to be supplied with power.

With reference to a flow chart illustrated in FIG. 4, processing steps of a power supply sequence for reading are described.

In Step S1, a command is received from the host, and the flash memory controller 2030 starts to access the flash memory 2012. When a data reading command is issued from the flash memory controller 2030, the flash memory 2012 latches a reading address and starts to read data from the target memory cell array, and then outputs the flash memory interrupt notifying signal $A3_1$ to notify the flash memory controller 2030 that the data reading process started.

In Step S2, the flash memory controller 2030 that received the flash memory interrupt notifying signal $A3_1$ from the flash memory 2012 pauses the operation of the flash memory 2012 based on the flash memory internal operation control signal A4.

In Steps S2 and S3, the flash memory controller 2030 refers to the flash memory internal state management table 2032 and determine whether the power supply circuit 2022 for reading of the flash memory power supply circuit 2020 is still inactive or already active.

When determined that the power supply circuit 2022 for reading is inactive, the flash memory controller 2030 proceeds to Step S4 to activate the power supply circuit 2022 for reading of the flash memory power supply circuit 2020 based on the flash memory power supply control signal A1. The flash memory power supply circuit 2020 that activated the power supply circuit 2022 waits in Step S5 for the power supply circuit 2022 to be ready for power supply.

When the power supply circuit 2022 for reading is ready to feed power with an enough rise of the power supply voltage thereof, the flash memory power supply circuit 2020 outputs in Step S6 the power supply readiness signal A2 of the power supply circuit 2022 for reading to the flash memory controller 2030.

In Step S7, the flash memory controller 2030 that received the power supply readiness signal A2 for data reading restarts the internal operation of the flash memory 2012 based on the flash memory internal operation control signal A4. Also, the flash memory controller 2030 updates the state of the flash memory 2012 currently accessed in the flash memory internal state management table 2032 from "standby" to "reading".

On the other hand, when determined in Step S3 that the power supply circuit 2022 for reading is already active, the flash memory controller 2030 proceeds to Step S7 to immediately restart the internal operation of the flash memory 2012 based on the flash memory internal operation control signal A4, and updates the state of the flash memory 2012 currently accessed in the flash memory internal state management table 2032 from "standby" to "reading".

Because the flash memory 2012 is already supplied with power for data reading, data is read from the memory cell array in Step S8 after the flash memory internal operation control signal A4 is received.

When the data reading process to the memory cell array ends, in Step S9, the flash memory 2012 outputs the flash memory interrupt notifying signal $A3_1$ to the flash memory controller 2030 to notify that the data reading process is completed.

In Step S10, the flash memory controller 2030 that received the flash memory interrupt notifying signal $A3_1$ from the flash memory 2012 pauses the operation of the flash memory 2012 based on the flash memory internal operation control signal A4 and refers to the flash memory internal state management table 2032. In Step S11, the flash memory controller 2030 determines based on information obtained from the table whether any other flash memory 2012 is currently executing the data reading process.

When determined that none of the other flash memories 2012 is currently executing the data reading process and the power supply circuit 2022 for reading can be deactivated, the flash memory controller 2030 proceeds to Step S12 to deactivate the power supply circuit 2022 for reading of the flash memory power supply circuit 2020 based on the flash memory power supply control signal A1.

In Step S13, the flash memory controller 2030 restarts the internal operation of the flash memory 2012 based on the flash memory internal operation control signal A4, and updates the state of the flash memory 2012 currently accessed in the flash memory internal state management table 2032 from "reading" to "standby".

When determined in Step S11 that any one of the other flash memories 2012 is currently executing the data reading process and the power supply circuit 2022 for reading cannot be deactivated yet, the flash memory controller 2030 skips Step S12 and proceeds to Step S13 to immediately restart the internal operation of the flash memory 2012 based on the flash memory internal operation control signal A4. Further, the flash memory controller 2030 updates the state of the flash memory 2012 currently accessed in the flash memory internal state management table 2032 from "reading" to "standby".

<Power Supply Sequence for Writing/Erasing>

With reference to a flow chart illustrated in FIG. 5, processing steps of a power supply sequence for writing/erasing are described. When a data writing/erasing command is issued from the flash memory controller 2030, in Step S21, the flash memory 2012 latches a writing/erasing address and data to be written and then writes or erases data in the target memory cell array. Also, the flash memory 2012 outputs the flash memory interrupt notifying signal $A3_1$, which notifies that the data writing or erasing process started, to the flash memory controller 2030.

In Step S22, the flash memory controller 2030 that received the flash memory interrupt notifying signal $A3_1$ from the flash memory 2012 pauses the operation of the flash memory 2012 based on the flash memory internal operation control signal A4 and refers to the flash memory internal state management table 2032. In Step 23, the flash memory controller 2030 determines based on information obtained from the table whether the power supply circuit 2021 for writing/erasing of the flash memory power supply circuit 2020 is still inactive or already active.

When determined that the power supply circuit 2021 for writing/erasing is inactive, the flash memory controller proceeds to Step S24 to activate the power supply circuit 2021 for writing/erasing of the flash memory power supply circuit 2020 based on the flash memory power supply control signal A1. The flash memory power supply circuit 2020 activates the power supply circuit 2021 for writing/erasing and waits for the power supply circuit 2021 to be ready for power supply.

When determined in Step S25 that the power supply circuit 2021 for writing/erasing is ready to feed power with an enough rise of the power supply voltage thereof, the flash memory controller 2030 proceeds to Step S26 to output the power supply readiness signal A2 of the power supply circuit 2021 for writing/erasing to the flash memory controller 2030.

In Step S27, the flash memory controller 2030 that received the power supply readiness signal A2 for data writing/erasing restarts the internal operation of the flash memory 2012 based on the flash memory internal operation control signal A4. Further, the flash memory controller 2030 updates the state of the flash memory 2012 currently accessed in the flash memory internal state management table 2032 from "standby" to "writing" or "erasing".

On the other hand, when determined in Step S23 that the power supply circuit 2021 for writing/erasing is already active, the flash memory controller 2030 proceeds to Step S27 to immediately restart the internal operation of the flash memory 2012 based on the flash memory internal operation control signal A4, and updates the state of the flash memory 2012 currently accessed in the flash memory internal state management table 2032 from "standby" to "writing" or "erasing".

Because the flash memory 2012 is already supplied with power from the power supply circuit 2021 for writing/erasing, data is written in or erased from the memory cell array in Step S28 after the flash memory internal operation control signal A4 is received.

When the data writing/erasing process to the memory cell array is over, in Step S29, the flash memory 2012 outputs the flash memory interrupt notifying signal $A3_1$ to the flash memory controller 2030 to notify that the data writing/erasing process is completed.

In Step S30, the flash memory controller 2030 that received the flash memory interrupt notifying signal $A3_1$ from the flash memory 2012 pauses the operation of the flash memory 2012 based on the flash memory internal operation control signal A4 and refers to the flash memory internal state management table 2032. In Step S31, the flash memory controller 2030 determines based on information obtained from the table whether any other flash memory 2012 is executing the data writing/erasing process.

When determined that the power supply circuit 2021 for writing/erasing can be deactivated with no other flash memory 2012 currently executing the data writing/erasing process, the flash memory controller 2030 proceeds to Step S32 to deactivate the power supply circuit 2021 for writing/erasing of the flash memory power supply circuit 2020 based on the flash memory power supply control signal A1. Then, in Step S33, the flash memory controller proceeds to a power supply sequence for verifying.

When determined in Step S31 that the power supply circuit 2021 for writing/erasing cannot be deactivated in the presence of any other flash memory 2012 currently executing the data writing/erasing process, the flash memory controller 2030 skips Step S32 and proceeds to Step S33 to immediately shift to the power supply sequence for verifying.

After the power supply sequence for verifying is over, in Step S34, the flash memory controller 2030 issues the internal state reading command for the flash memory 2012 to check the internal state of the interrupted flash memory (when the verifying process is over). When determined in Step S35 that the internal state is writing/erasing, the flash memory controller 2030 returns to Step S22 to execute the power supply sequence for writing/erasing again.

When determined in Step S35 that the internal state is standby, the flash memory controller 2030 proceeds to Step S36 to restart the internal operation of the flash memory 2012 based on the flash memory internal operation control signal A4. Also, the flash memory controller 2030 updates the state of the flash memory 2012 currently accessed in the flash memory internal state management table 2032 from "data-write verifying" or "data-erase verifying" to "standby".

<Power Supply Sequence for Verifying>

With reference to a flow chart illustrated in FIG. 6, processing steps of a power supply sequence for verifying are described. The flow chart illustrated in FIG. 6 continues from Step S33 of FIG. 5. After the writing/erasing process is over, in Step S41, the flash memory controller 2030 refers to the flash memory internal state management table 2032. In Step S42, the flash memory controller 2030 determines based on information obtained from the table whether the power supply circuit 2023 for verifying of the flash memory power supply circuit 2020 is still inactive or already active.

When determined in Step S42 that the power supply circuit 2023 for verifying is inactive, the flash memory controller 2030 proceeds to Step S43 to activate the power supply circuit 2023 for verifying of the flash memory power supply circuit 2020 based on the flash memory power supply control signal A1. The flash memory power supply circuit 2020 activates the power supply circuit 2023 for verifying. In Step S44, flash memory power supply circuit 2020 waits for the power supply circuit 2023 for verifying to be ready for power supply.

When the power supply circuit 2023 for verifying is ready to feed power with an enough rise of the power supply voltage thereof, in Step S45, the flash memory power supply circuit 2020 outputs the power supply readiness signal A2 of the power supply circuit 2023 for verifying to the flash memory controller 2030.

In Step S46, the flash memory controller 2030 that received the power supply readiness signal A2 for verifying restarts the internal operation of the flash memory 2012 based on the flash memory internal operation control signal A4. Also, the flash memory controller 2030 updates the state of the flash memory 2012 currently accessed in the flash memory internal state management table 2032 from "writing" or "erasing" to "data-write verifying" or "data-erase verifying".

Because it is determined in Step S42 that the flash memory 2012 is already supplied with power from the power supply circuit 2023 for verifying, the flash memory controller 2030 receives in Step S46 the flash memory internal operation control signal A4. Then, in Step S47, the data writing/erasing in the memory cell array is verified.

After the data writing/erasing in the memory cell array is verified, in Step S48, the flash memory 2012 outputs the flash memory interrupt notifying signal $A3_1$ to the flash memory controller 2030 to notify that the data-write/data-erase verifying process is completed.

In Step S49, the flash memory controller 2030 that received the flash memory interrupt notifying signal $A3_1$ from the flash memory 2012 pauses the operation of the flash memory 2012 based on the flash memory internal operation control signal A4 and refers to the flash memory internal state management table 2032. In Step S50, the flash memory controller 2030 determines based on information obtained from the table whether any other flash memory 2012 is executing the data-write/data-erase verifying process.

When determined that the power supply circuit 2023 for verifying can be deactivated with no other flash memory 2012 currently executing the data-write/data-erase verifying, in Step S51, the flash memory controller 2030 deactivates the power supply circuit 2023 for verifying of the flash memory power supply circuit 2020 based on the flash memory power supply control signal A1. In Step S52, the flash memory controller 2030 ends the power supply sequence for verifying and returns to Step S34 of the power supply sequence for writing/erasing.

When determined in Step S50 that any one of the other flash memories 2012 is currently executing the data-write/data-erase verifying process and the power supply circuit 2023 for verifying cannot be deactivated, the flash memory controller skips Step S51 and proceeds to Step S52 to immediately end the power supply sequence for verifying, and then returns to Step S34 of the power supply sequence for writing/erasing.

According to the working example, the flash memory controller 2030 can accurately know the internal operation of the flash memory 2012 based on the flash memory internal state notifying signal A3, enabling to control the outside power supply depending on the internal operation. This efficiently feeds power required by the flash memories 2012, thereby reducing power consumption of the whole system.

<11> [Notifying Applied Voltage (Power Supply Control)]

A description hereinafter given relates to <1> to <10>. The flash memory controller hereinafter described includes an applied voltage control circuit functionally characterized as described below. The applied voltage control circuit obtains, as the internal state of the flash memory, an applied voltage information of each of the plurality of types of power supply circuits for process execution. The applied voltage information is specific to each of the flash memories and notified by the flash memory. The flash memory controller controls the operation of any intended one of the power supply circuits for process execution based on the obtained applied voltage information.

There are individual differences among the flash memories, which are generated by, for example, manufacturing tolerances. Each of the flash memories has an applied voltage specific thereto depending on the plurality of types of power supply circuits for process execution and retains therein information of the applied voltage. The flash memory controller accesses any intended one of the flash memories to read and obtain the applied voltage information from the accessed flash memory. The applied voltage information is pertinent to the power supply circuit for process execution for any process to be executed and specific to each of the flash memories. The applied voltage control circuit controls any intended one of the power supply circuits for process execution based on the obtained applied voltage information. Therefore, the applied voltage control circuit controls the intended power supply circuit for process execution so that an applied voltage adequately low is applicable to any one of the flash memories whose applied voltage optimally required is lower than a reference voltage due to an individual difference thereof and an applied voltage adequately high is applicable to any one of the flash memories whose applied voltage optimally required is higher than the reference voltage due to an individual difference thereof.

Though the same power supply circuit for process execution is shared by a plurality of flash memories respectively in which the optimal applied voltages are thus different from one another, the voltages are finely controlled depending on the characteristics of the respective flash memories. This more effectively reduces power consumption.

<12> A description hereinafter given relates to <11>.

The applied voltage control circuit hereinafter described, when the applied voltage information of the same power supply circuit for process execution is received from the plural flash memories, controls the operation of the same power supply circuit for process execution so that a highest one of a plurality of applied voltages indicated by the obtained applied voltage informations is applied.

The plurality of types of power supply circuits for process execution loaded in the flash memory power supply circuit are shared by the plural flash memories of the memory block. Any of the power supply circuits for process execution may feed power to at least two flash memories at once as far as the same process is executed in the flash memories. An optimal applied voltage of a flash memory may be different to an optimal applied voltage of another flash memory.

Such a situation raises a question; what level of applied voltage should be supplied to the shared power supply circuit for process execution. The applied voltage control circuit described here employs a highest one of a plurality of applied voltages indicated by the applied voltage informations transmitted from at least two flash memories, thereby preventing the plural flash memories both currently operating from running short of expected levels. This technical approach is based on a point of view that any adverse influences caused by high voltages are less damaging than any operation failures due to the shortage of applied voltages. Analyzing the approach from a different angle, when just one flash memory is to be power-supplied, the power supply circuits for process execution employ an optimal applied voltage to the flash memory. The applied voltage thus decided is not an overly high applied voltage but is most suitable for the flash memory among all of the applied voltages that can be employed by the power supply circuits for process execution. Such a control method is effective for further reduction of power consumption A specific example of <11> and <12> is hereinafter described as a working example 2 of the invention.

Working Example 2

Figure 7:
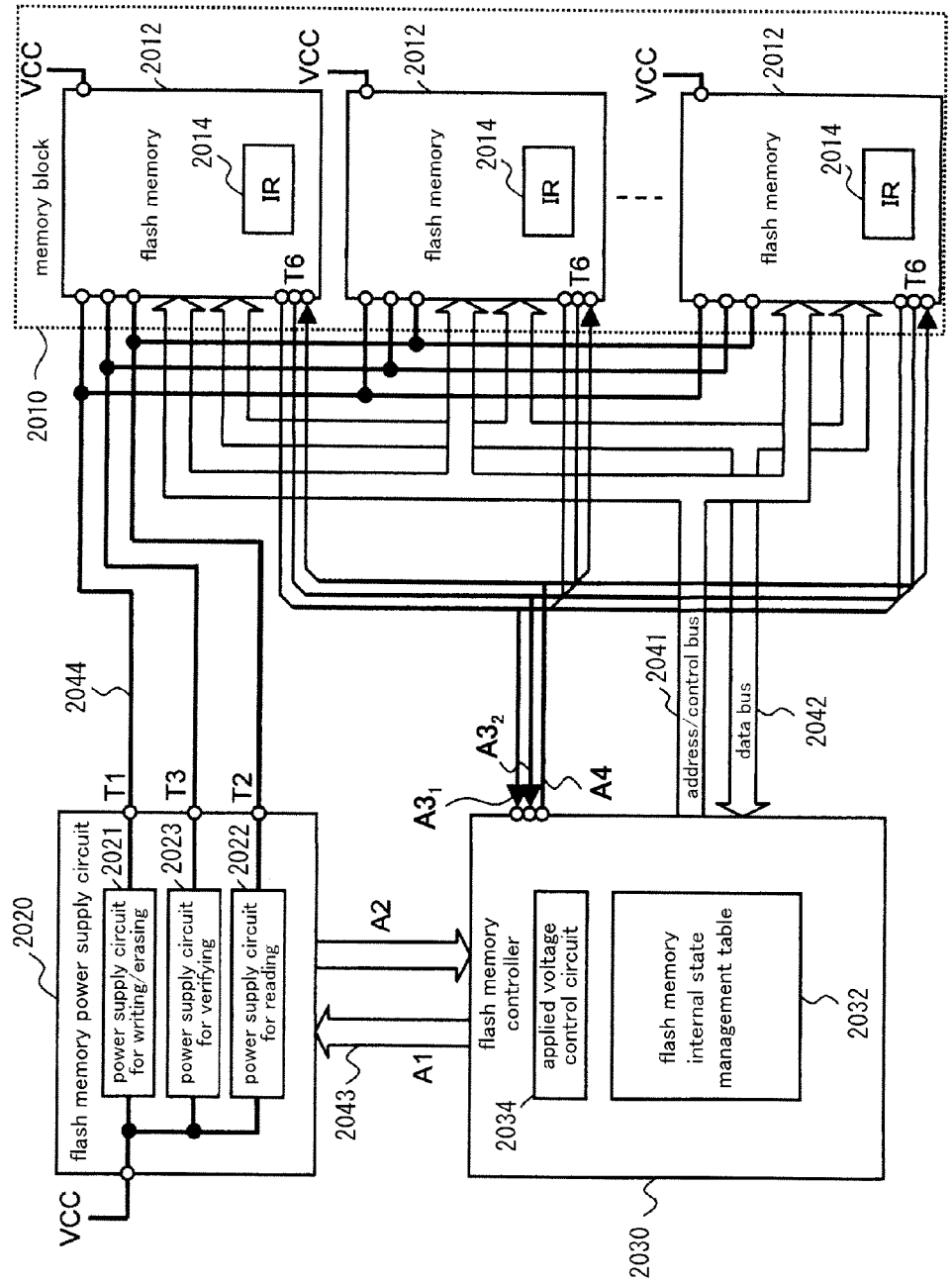
FIG. 7 is a block diagram illustrating structural characteristics of a nonvolatile storage system according to a working example 2 of the invention.

FIG. 7 is a block diagram illustrating structural characteristics of a nonvolatile storage system according to a working example 2 of the invention. The information indicated by an information register 2014 of the flash memory 2012 includes, in addition to the operating state (process being executed) currently executed by the internal controller (not illustrated in the drawing) of the flash memory 2012, information of power supply voltages for reading, writing/erasing, and verifying. This information indicates the power supply voltages necessary for the flash memory 2012 to operate. The flash memories 2012 each has an optimal power supply voltage information. There are individual differences among the flash memories, which are generated by, for example, manufacturing tolerances.

To notify the applied voltage information, an applied voltage notifying signal $A3_2$, for example, is used. This signal may be directly connected to the flash memory controller 2030. T6 is an output terminal of the flash memory 2012 for outputting the applied voltage notifying signal $A3_2$.

The flash memory controller 2030 according to the working example further includes an applied voltage control circuit 2034. The applied voltage control circuit 2034 compares the applied voltage information of the flash memory 2012 to a present applied voltage and uses one of these applied voltages higher than the other as an applied voltage for the power supply circuit 2021, 2022, 2023 of the flash memory power supply circuit 2020.

Figure 8:
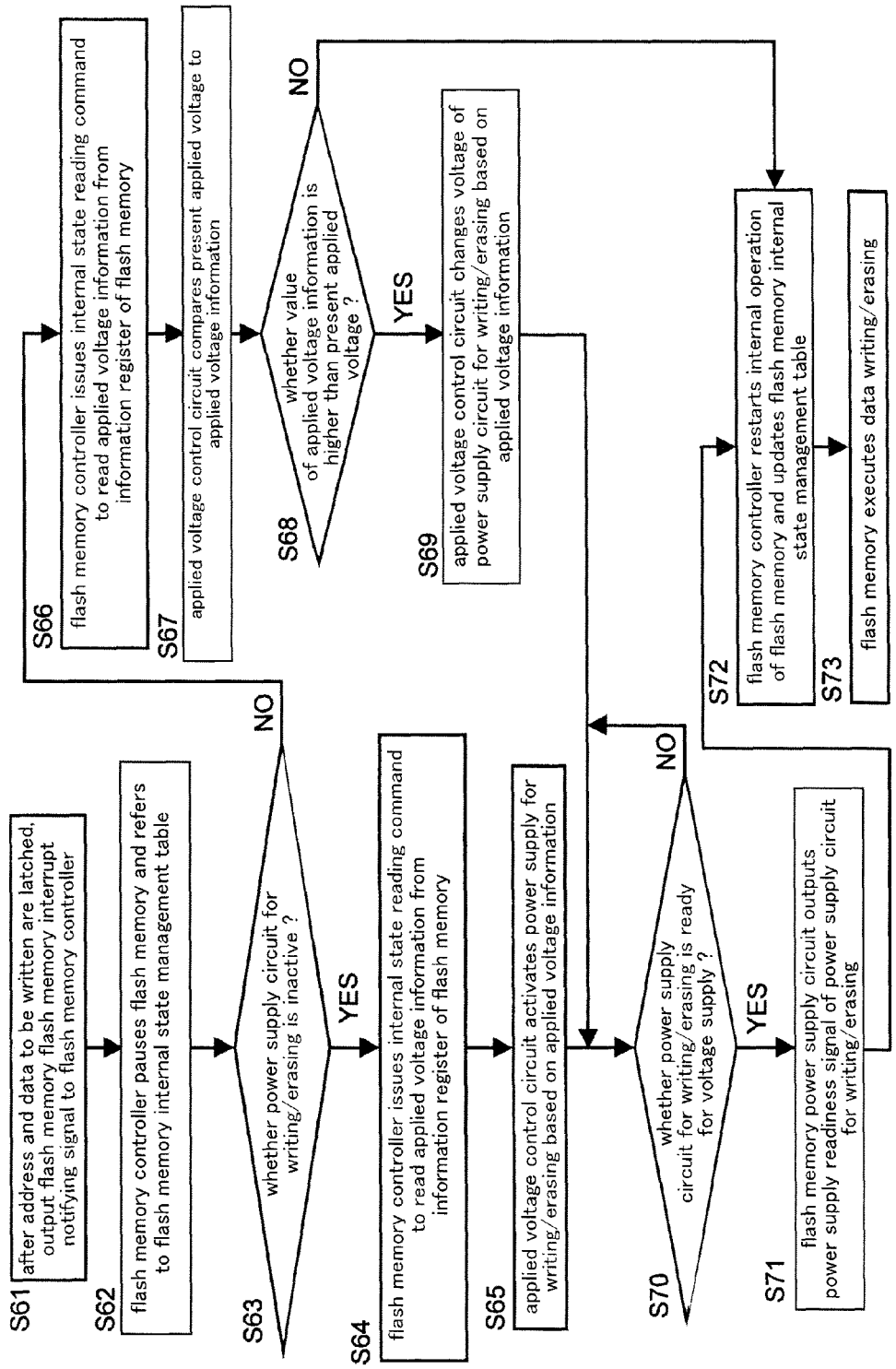
FIG. 8 is a flow chart illustrating an applied voltage control sequence of the nonvolatile storage system according to the working example 2.

With reference to a flow chart illustrated in FIG. 8, processing steps of an applied voltage control sequence are described. Steps S61 to S63 are similar to Steps S21 to S23 of FIG. 5 according to the working example 1. When the power supply circuit 2021 for writing/erasing is inactive during the writing sequence, in Step S64, the flash memory controller 2030 issues the internal state reading command for the flash memory 2012 to read the applied voltage information of the power supply for writing of the interrupted flash memory (when verifying is over) from the information register 2014 of the flash memory 2012 and transmits the read information to the applied voltage control circuit 2034.

In Step S65, the applied voltage control circuit 2034 activates the power supply circuit 2021 for writing/erasing based on the received applied voltage information. Steps S70 to S73 are similar to Steps S25 to S28 of FIG. 5 according to the working example 1. When determined in Step S63 that the power supply circuit 2021 for writing/erasing is currently operating, in Step S66, the flash memory controller 2030 issues the internal state reading command for the flash memory 2012 to read the applied voltage information of the power supply for writing of the interrupted flash memory (when verifying is over) from the information register 2014 of the flash memory 2012 and transmits the read information to the applied voltage control circuit 2034.

In Step S67, the applied voltage control circuit 2034 compares the read applied voltage information to a present applied voltage of the power supply circuit 2021 for writing/erasing. When determined in Step S68 that the read applied voltage information indicates a higher voltage than the present applied voltage, in Step S69, the flash memory controller 2030 changes the power supply voltage of the power supply circuit 2021 for writing/erasing based on the applied voltage information, and then proceeds to Step S70.

When the applied voltage control circuit 2034 compares the read applied voltage information to the present applied voltage of the power supply circuit 2021 for writing/erasing and thereby determines in Step S68 that the read applied voltage information indicates a lower voltage than the present applied voltage, the flash memory controller 2030 retains the power supply voltage of the power supply circuit 2021 for writing/erasing and then proceeds to Step S72.

According to the working example, when the plural flash memories which respectively require different power supply voltages are operating at the same time, the flash memory controller 2030 can know the power supply voltages of the respective flash memories, thereby controlling the voltages of the power supply circuits externally provided. This leads to efficient supply power that requires no voltage rises unnecessarily high, reducing power consumption of the whole system.

13> [Notifying Applied Voltage (Selection of a Memory)]

A description hereinafter given relates to <11>. The flash memory controller further includes an applied voltage information storage used as a storage unit of the applied voltage informations received from the plural flash memories. The flash memory controller refers to the applied voltage informations stored in the applied voltage information storage to decide any ones of the flash memories to be selected.

The applied voltage information storage can store therein the applied voltage informations of all of the flash memories. More specifically, the applied voltage information storage can store therein the applied voltage information of not only the flash memory to be accessed then but also any other flash memories, and also the past (latest) applied voltage information of any flash memory left on standby then. These applied voltage informations may include the applied voltage informations regarding the plurality of types of power supply circuits for process execution.

When the flash memory controller receives an operation command from, for example, the host, it is necessary to decide which of the flash memories should be accessed. To select the flash memory to be accessed, the flash memory controller refers to the applied voltage informations of all of the flash memories regarding all of the plurality of types of power supply circuits for process execution stored in the applied voltage information storage to decide one flash memory to be accessed. This greatly contributes to reduction of power consumption.

<14> A description hereinafter given relates to <13>.

When a plurality of ones of the flash memories to be accessed have an enough vacant memory space, the flash memory controller refers to the applied voltage informations stored in the applied voltage information storage and accordingly decides the flash memory having a lowest applied voltage as the flash memory to be selected.

By thus deciding the flash memory having a lowest applied voltage as the flash memory to be selected among the plural flash memories to be accessed having an enough vacant memory space, execution of a process requires less power. The different applied voltages can be thus compared because the applied voltage informations regarding all of the plurality of types of power supply circuits for process execution read from all of the flash memories are stored in the applied voltage information storage. When the flash memory having the lowest applied voltage is used, reduction of power consumption becomes more effective.

A specific example of <13> and <14> is hereinafter described as a working example 3 of the invention.

Working Example 3

Figure 9:
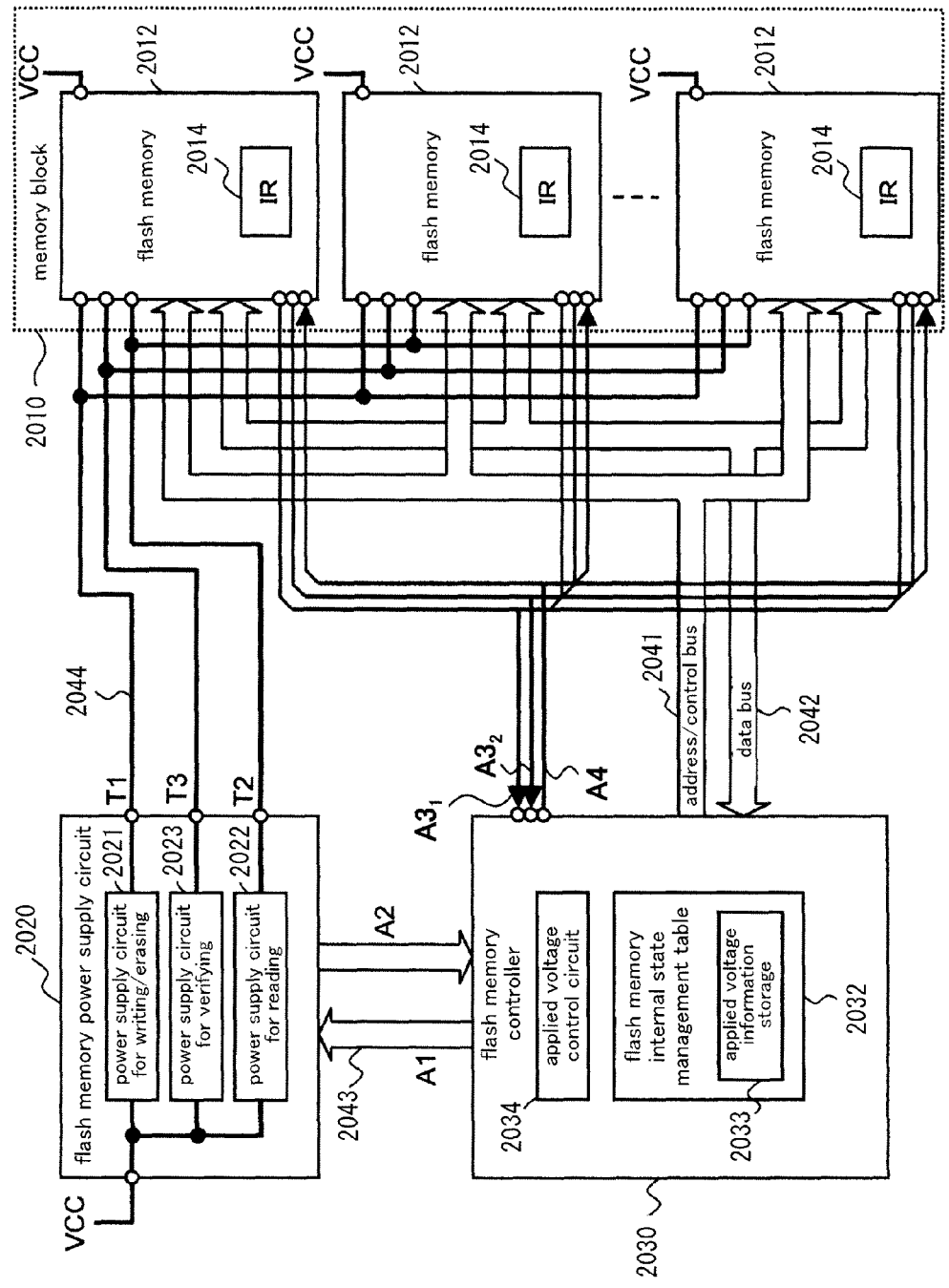
FIG. 9 is a block diagram illustrating structural characteristics of a nonvolatile storage system according to a working example 3 of the invention.

FIG. 9 is a block diagram illustrating structural characteristics of a nonvolatile storage system according to a working example 3 of the invention. The flash memory internal state management table 2032 of the flash memory controller 2030 is provided with an applied voltage information storage 2033, in which the applied voltage informations of the flash memories 2012 are stored. The applied voltage informations may be collected in the flash memory internal state management table 2032 by issuing the internal state reading command for all of the flash memories 2012 at the time of startup of the system, or the voltage applied information of each flash memory 2012 may be collected every time when the flash memory 2012 is accessed and stored in the flash memory internal state management table 2032.

Figure 10:
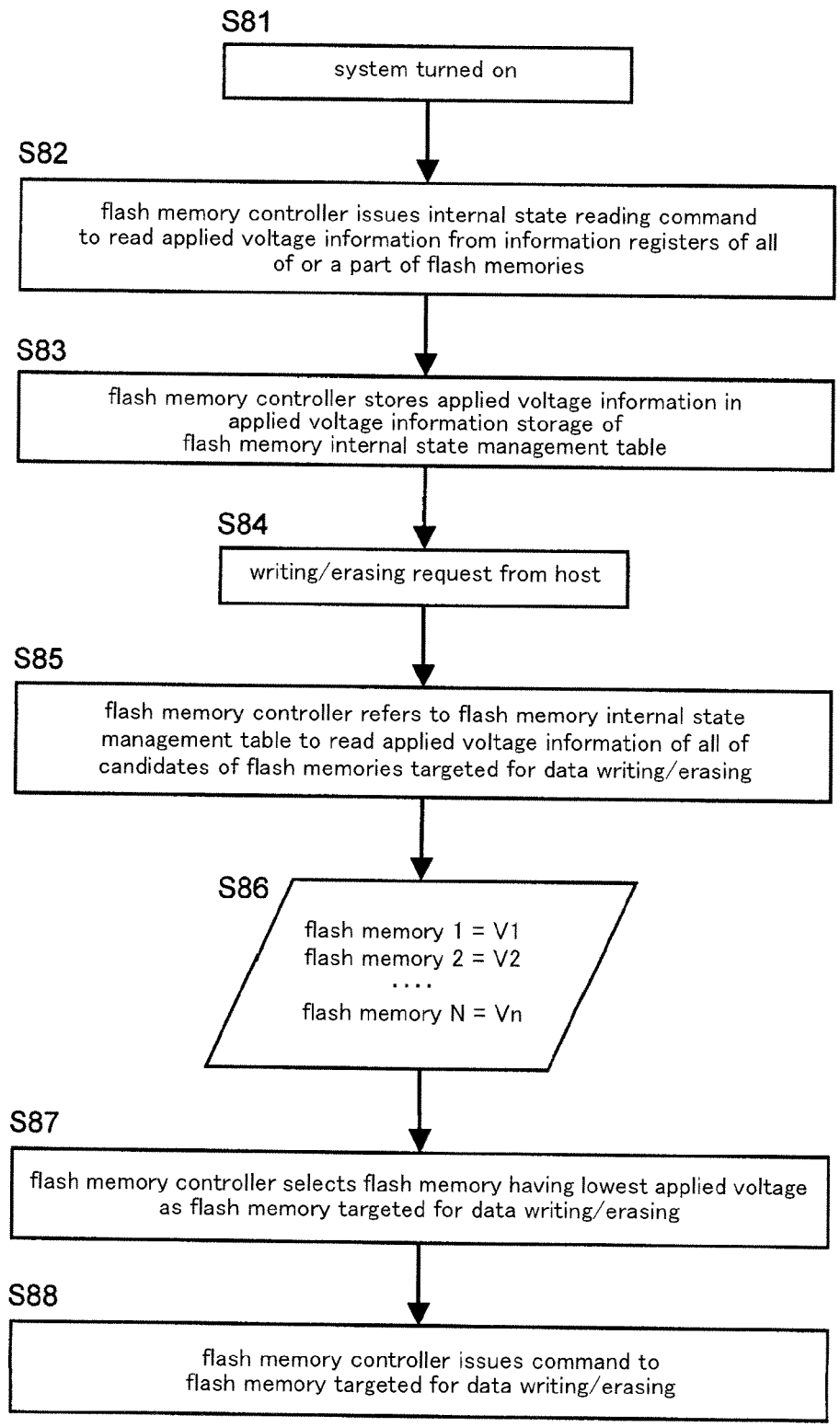
FIG. 10 is a flow chart illustrating a flash memory selection sequence of the nonvolatile storage system according to the working example 2.

According to the working example, all of the applied voltage informations are read at once at the time of startup of the system. With reference to a flow chart illustrated in FIG. 10, processing steps of the flash memory selection are described.

In Step S81, the nonvolatile storage system is turned on, and the flash memory controller 2003 is activated. In Step S82, the flash memory controller 2030 issues the internal state reading command for all of or a part of the flash memories 2012 connected thereto to read the applied voltage informations from the information registers 2014 of these flash memories 2012.

In Step S83, the read applied voltage informations are stored in the applied voltage information storage 2033 of the flash memory internal state management table 2032.

When a writing request is received from the host in Step S84, the flash memory controller 2030 selects in Step S85 any one of the flash memory 2012 having an enough vacant memory space for data to be written therein.

With more than one selectable flash memory 2012, in Step S86, the flash memory controller 2030 refers to the applied voltage information storage 2033 to read therefrom the applied voltage informations of these flash memories 2012.

In Step S87, the flash memory controller 2030 compares the read applied voltage informations to select one of the flash memories 2012 having a lowest applied voltage.

In Step S88, the flash memory controller 2030 issues a process execution command to the selected flash memory 2012.

According to the working example, the applied voltage informations needed for the flash memories 2012 are stored in advance in the applied voltage information storage 2033 and compared to one another to select one of the flash memories 2012 whose applied voltage is at the lowest level over any other flash memories. This lessens the burden of voltage rises in the flash memory power supply circuit 2020, thereby reducing power consumption of the whole system.

<15> A description hereinafter given to [Notifying Applied Voltage (Selection of a Plurality of Memories)] relates to <14>.

Assuming that the plural flash memories are accessed at once in parallel and these flash memories are supplied with power from one power supply circuit for process execution, the flash memory controller refers to the applied voltage informations stored in the applied voltage information storage to select the flash memories having a smaller difference between the applied voltages thereof as the flash memories to be selected in priority to the other flash memories.

For easier understanding of the technical characteristics, a description is given below with reference to an example. Trying to access two flash memories at the same time with three flash memories, for example, currently available to be accessed, an applied voltage difference between first and second flash memories is $\Delta E12$, an applied voltage difference between second and third flash memories is $\Delta E23$, and an applied voltage difference between third and first flash memories is $\Delta E31$. When the $\Delta E12$ shows a smallest value among the three applied voltage differences $\Delta E12$, $\Delta E23$, and $\Delta E31$, the combination of the first and second flash memories is selected. Likewise, the combination of the second and third flash memories is selected when the $\Delta E23$ shows a smallest value, and the combination of the third and first flash memories is selected when the $\Delta E31$ shows a smallest value.

By thus selecting the flash memories having a smaller difference between the applied voltages thereof over the other flash memories, any unnecessary voltage rises are avoidable during the control, enabling efficient power supply. As a result, power consumption of the whole system can be reduced.

A specific example of <15> is hereinafter described as a working example 4 of the invention.

Working Example 4

Figure 11:
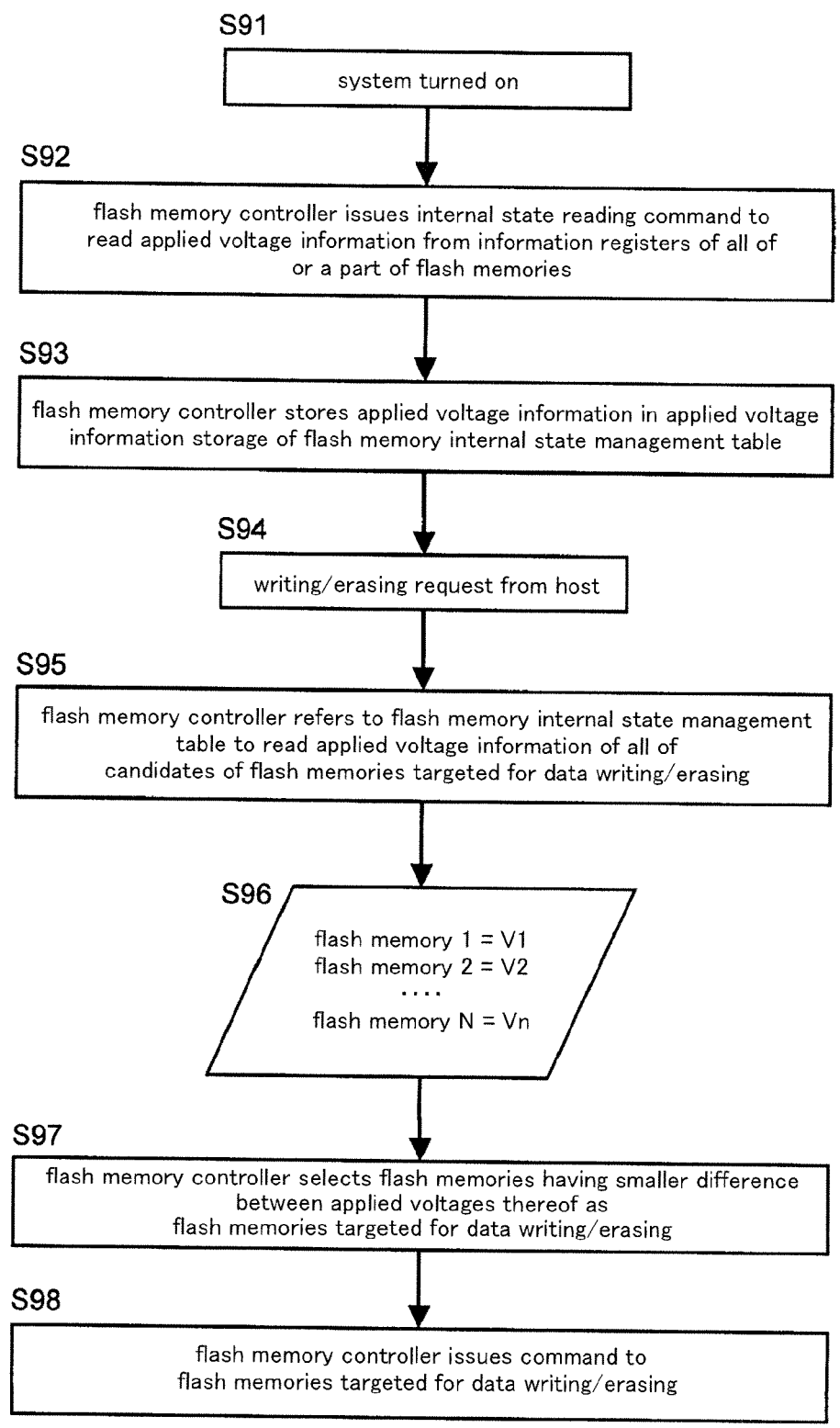
FIG. 11 is a flow chart illustrating a flash memory selection sequence (for selecting a plurality of flash memories) of a nonvolatile storage system according to a working example 4 of the invention.

FIG. 11 is a flow chart illustrating a flash memory selection sequence (for selecting a plurality of flash memories) of a nonvolatile storage system according to a working example 4 of the invention. Steps S91 to S96 and S98 are similar to Steps S81 to S86 and S88 of FIG. 10. The only difference between the flow charts of these drawings is Step S97.

Similarly to the working example 3, the flash memory controller 2030 selects any one of the flash memory 2012 having an enough vacant memory space when a writing request is received from the host. In the case where the system is configured to execute the writing/erasing process in the plural flash memories 2012 in parallel to increase a processing speed, the flash memory controller 2030, similarly to the working example 3, refers to the applied voltage information storage 2033 to read therefrom the applied voltage informations of the flash memories 2012 to be selected.

In Step S97, the flash memory controller 2030 compares the applied voltage informations to selectively combine the flash memories having a smaller difference between the applied voltages thereof in priority to the other selectable flash memories 2012.

According to the working example, the applied voltage informations of the flash memories 2012 are stored in advance so that the flash memories 2012 having a smaller difference between the applied voltages thereof are selectively combined. This leads to efficient supply power that requires no voltage rises unnecessarily high, reducing power consumption of the whole system <16> [Notifying Applied Voltage]*[Notifying Number of Times of Verifying (Power Supply Control)]

A description hereinafter given relates to a nonvolatile storage system including the applied voltage control circuit in the flash memory controller recited in <11>.

The applied voltage control circuit obtains a verifying number-of-times information of each flash memory notified by the flash memory as the flash memory internal state, and controls the operation of any intended one of the power supply circuit for process execution taking into account the obtained verifying number-of-times information as additional information. The verifying relating to the verifying number-of-times information is at least one of the data-write verifying and the data-erase verifying. The verifying number-of-times information indicates number of times of the writing/erasing processes repeatedly executed until data writing/erasing is completed in the flash memory.

As the number of times of verifying is larger, the flash memory includes more cells degraded or having poor characteristics in which the writing/erasing process is difficult to be executed. Any flash memory including such a cell degraded or having poor characteristics has a better chance of succeeding in the writing/erasing process when the applied voltage for writing/erasing is increased to be larger than a reference voltage value. Therefore, the verifying number-of-times information is taken into account as additional information to adjust the applied voltage so that the number of times of verifying decreases. This consequently leads to a shorter power supply time, more effectively reducing power consumption.

<17> A description hereinafter given relates to <16>.

To control the operation of any intended one of the power supply circuits for process execution based on the obtained applied voltage information, the applied voltage control circuit of the flash memory controller, using the obtained applied voltage as a reference voltage, controls the power supply circuit for process execution within the range of a corrected applied voltage obtained by an arithmetic operation of [reference voltage], [obtained number of times of verifying], and [predefined correction voltage].

Accordingly, there is a better chance of succeeding in the writing/erasing process when the adjustment range of the applied voltage is increased depending on the number of times of verifying. As a result, power consumption can be more effectively reduced.

The arithmetic operation of [reference voltage], [obtained number of times of verifying], and [predefined correction voltage] is a typical expression of preferable arithmetic operations. In a broader sense, the applied voltage is generated by a method that can be expressed by the function of number of times of verifying.

A specific example of <16> and <17> is hereinafter described as a working example 5 of the invention.

Working Example 5

Figure 12:
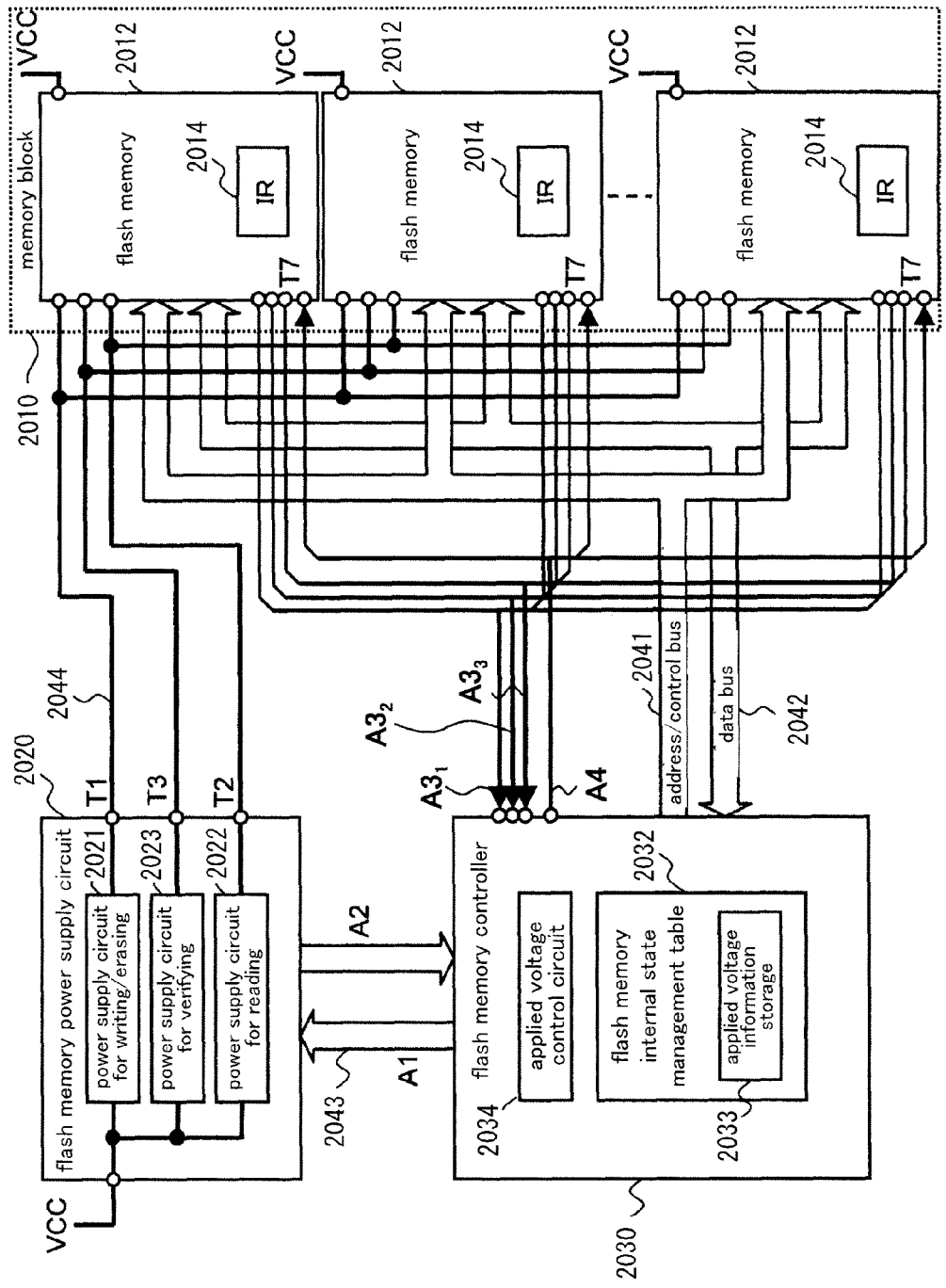
FIG. 12 is a block diagram illustrating structural characteristics of a nonvolatile storage system according to a working example 5 of the invention.

FIG. 12 is a block diagram illustrating structural characteristics of a nonvolatile storage system according to a working example 5 of the invention. The information indicated by the information register 2014 of the flash memory 2012 includes the verifying number-of-times information in addition to the operating state (process to be executed) currently executed by the internal controller (not illustrated in the drawing) of the flash memory 2012 and information of power supply voltages for reading, writing/erasing, and verifying. The verifying number-of-times information indicates number of times when written data is read to determine whether the writing/erasing process of the flash memory 2102 succeeded. The verifying number-of-times information relating to data-write verifying is generated by each writing unit, while the verifying number-of-times information relating to data-erase verifying is generated by each erasing unit. This information is stored in the flash memory 2012 at the time of a most recent writing/erasing process. The verifying number-of-times information may not be written in the information register 2014 but may be written in a redundant region of the flash memory 2012.

To notify the number of times of verifying, a verifying number-of-times notifying signal $A3_3$ may be generated and directly connected to the flash memory controller 2030. A reference symbol T7 is an output terminal of the flash memory 2012 for outputting the verifying number-of-times notifying signal $A3_3$.

Figure 13:
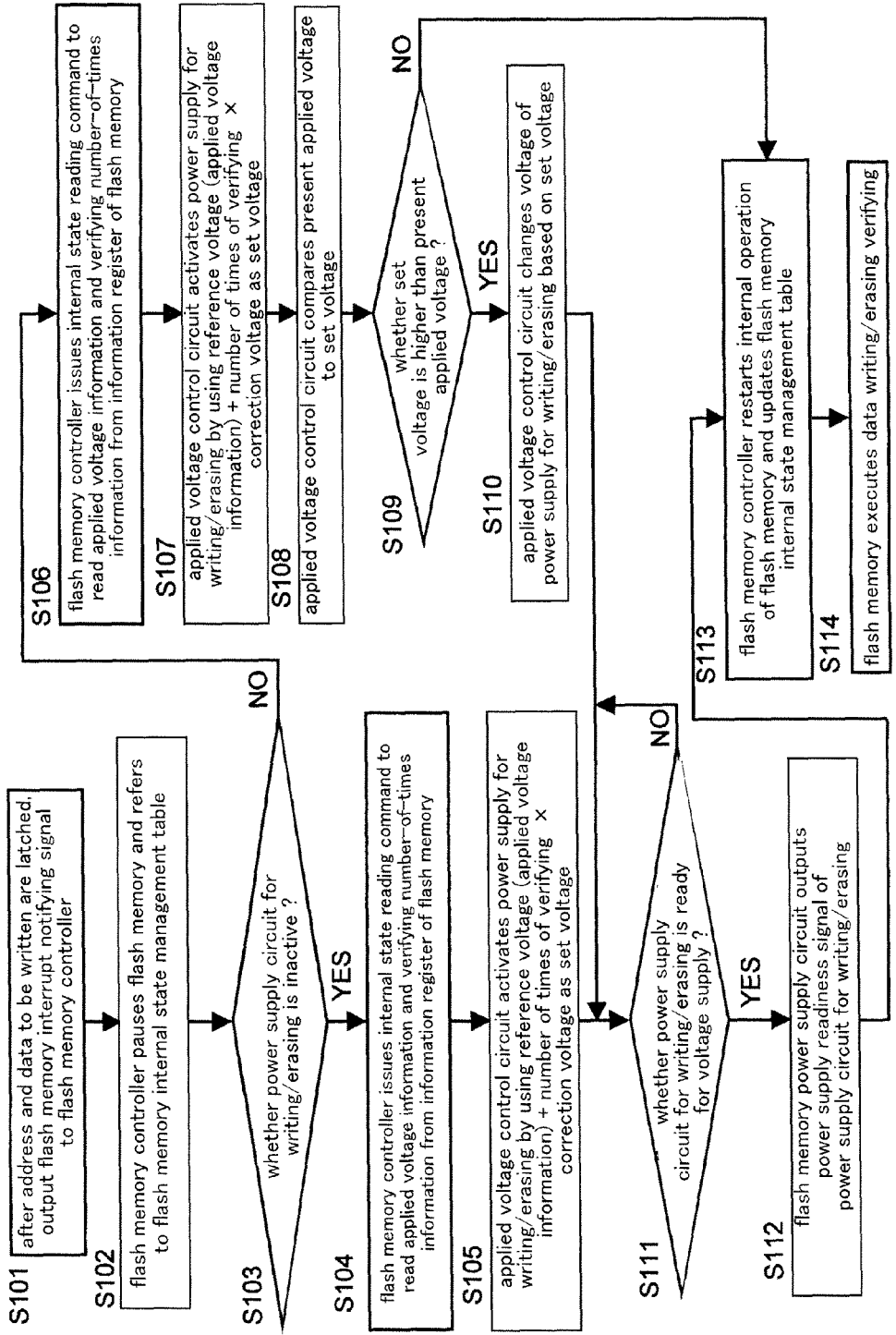
FIG. 13 is a flow chart illustrating an applied voltage control sequence of the nonvolatile storage system according to the working example 5.

With reference to a flow chart illustrated in FIG. 13, processing steps of an applied voltage control sequence are described. Steps S101 to S103 are similar to Steps S61 to S63 of FIG. 8 according to the working example 2, and Steps S109, S111, S112, S113, and S114 are similar to Steps S68, S70, S71, S72, and S73 of FIG. 8.

When determined in Step S103 that the power supply circuit 2021 for writing/erasing is inactive, in Step S104, the flash memory controller 2030 issues the internal state reading command for the flash memory 2012 to read the applied voltage information of the power supply for writing and the verifying number-of-times information per writing unit of the interrupted flash memory 2012.

In Step S105, the applied voltage control circuit 2034, using the applied voltage information as a reference voltage, sets [reference voltage]+[number of times of verifying]×[correction voltage] as a voltage to be generated, and accordingly activates the power supply circuit 2021 for writing/erasing. The correction voltage is a fixed voltage set by the flash memory controller 2030.

The flash memory controller 2030 may retain a specification-defined value as the correction voltage, or such data may be set in the flash memory 2012 and read and used by the flash memory controller 2030 at the time of startup of the system. The method of calculating the voltage to be generated according to the working example is just an example. In a broader sense, the applied voltage is generated by a method that can be expressed by the function of number of times of verifying.

When the power supply circuit 2021 for writing/erasing is operating during the writing sequence, in Step S106, the flash memory controller 2030 issues the internal state reading command for the flash memory 2012 to read the applied voltage information of the power supply for writing and verifying number-of-times information per writing unit of the interrupted flash memory 2012.

In Step S107, the applied voltage control circuit 2034, using the applied voltage information as a reference voltage, sets [reference voltage]+[number of times of verifying]×[correction voltage] as a voltage to be generated.

In Step S108, the flash memory controller 2030 compares the set voltage to a present applied voltage of the power supply circuit 2021 for writing/erasing. When determined in Step S109 that the set voltage is higher than the other, in Step S110, the applied voltage control circuit 2034 changes the power supply voltage of the power supply circuit 2021 for writing/erasing based on the set voltage.

When the set voltage is compared to the present applied voltage of the power supply circuit 2021 for writing/erasing and determined that the set voltage is lower higher than the other, the applied voltage control circuit 2034 retains the present power supply voltage of the power supply circuit 2021 for writing/erasing.

According to the working example, as the number of times of verifying is larger, the flash memory includes more cells degraded or having poor characteristics in which the writing/erasing process is difficult to be executed. Any flash memory including such a cell degraded or having poor characteristics has a better chance of succeeding in the writing/erasing process when the voltage for writing/erasing is increased by [number of times of verifying]×[correction voltage] to reduce the number of times of verifying. This leads to a shorter power supply time, thereby reducing power consumption of the whole system.

<18> [Notifying Applied Voltage]*[Notifying Number of Times of Verifying]*[Notifying Pulse Width/Interval (Selection of a Memory)]

In the nonvolatile storage system recited in <16>, the flash memory controller further includes a voltage application time information storage as a storage unit of a voltage application time information. The voltage application time information is obtained as described below. The flash memory controller receives the verifying number-of-times information and information of pulse widths and pulse intervals of the voltage application during the writing/erasing process from the plural flash memories. Then, the flash memory controller obtains the voltage application time information by an arithmetic operation of the verifying number-of-times informations and the information of pulse widths and pulse intervals of the voltage application and stores the obtained voltage application time information in the voltage application time information storage. The flash memory controller refers to the voltage application time informations stored in the voltage application time information storage to decide the flash memory to be selected.

The information of pulse widths and pulse intervals of the voltage application is kept in the flash memory and transmitted to the flash memory controller with the verifying number-of-times information. The flash memory controller calculates a voltage application time based on the received pulse widths and pulse intervals of the voltage application and number of times of verifying. The pulse widths and pulse intervals of the voltage application during the writing/erasing process including the verifying process equals to one cycle of the writing/erasing process. Then, the voltage application time actually needed in the writing/erasing process is obtained from the one cycle and number of times of verifying. The obtained voltage application time information is stored in the voltage application time information storage with the number of times of verifying, pulse widths, and pulse intervals. The voltage application time information storage can store therein these informations of all of the flash memories.

When the flash memory controller receives an operation command from, for example, the host, it is necessary to decide which of the flash memories should be accessed. To select the flash memory to be accessed, the flash memory controller refers to the voltage application time informations of all of the flash memories stored in the voltage application time information storage to decide one flash memory to be accessed. This greatly contributes to reduction of power consumption.

<19> In the nonvolatile storage system recited in <18>, when a plurality of candidates of the flash memories to be accessed have an enough vacant memory space exist in the plurality of the access-target flash memories, the flash memory controller refers to the voltage application time informations stored in the voltage application time information storage to select one of the flash memories having a shortest voltage application time.

By thus selecting a flash memory having a shortest voltage application time from the candidates of the access-target flash memories having an enough vacant memory space, the processes of the same type can be executed with less power. The different voltage application times can be thus compared because the voltage application time informations of all of the flash memories are stored in the voltage application time information storage. Any one of the flash memories having a short voltage application time is used to operate the power supply circuit for process execution within a minimum required time. As a result, reduction of power consumption reduction can be further improved.

A specific example of <18> and <19> is hereinafter described as a working example 6 of the invention.

Working Example 6

Figure 14:
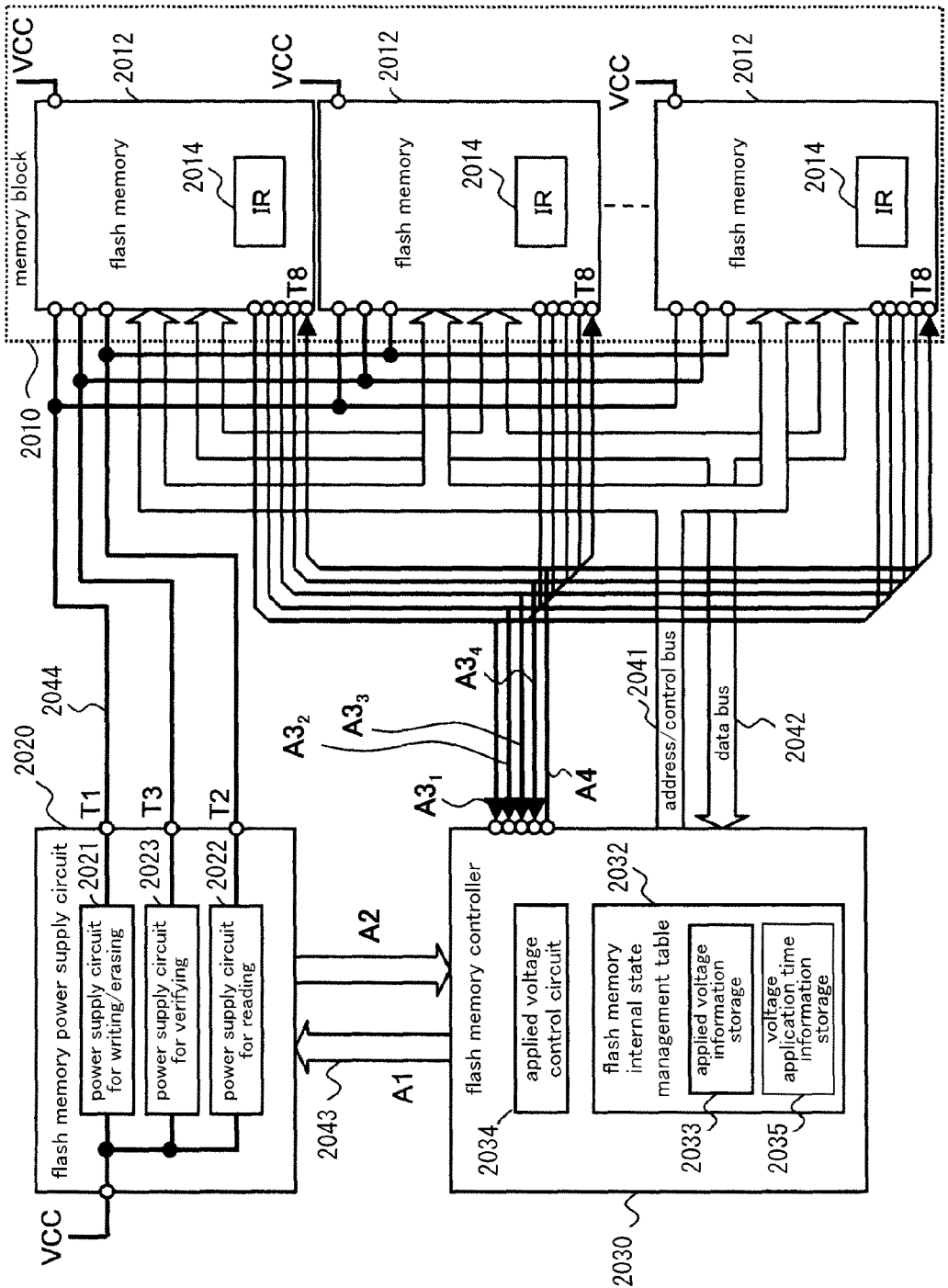
FIG. 14 is a block diagram illustrating structural characteristics of a nonvolatile storage system according to a working example 6 of the invention.

FIG. 14 is a block diagram illustrating structural characteristics of a nonvolatile storage system according to a working example 6 of the invention. The information indicated by the information register 2014 of the flash memory 2012 includes a pulse width/interval information in addition to the operating state currently executed by the internal controller (not illustrated in the drawing) of the flash memory 2012, information of the applied voltages of the power supplies for reading, writing/erasing, and verifying, and verifying number-of-times information. The pulse width information indicates an interval length during which the power supply voltage for writing is actually applied during the writing/erasing process, and the pulse interval information indicates an interval length before the next writing process starts, in other words, an interval length of the data-write or data-erase verifying.

A pulse width/interval notifying signal $A3_4$, which is a means for notifying the pulse width/interval information, may be directly connected to the flash memory controller 2030. A reference symbol T8 is an output terminal of the flash memory 2012 for outputting the pulse width/interval notifying signal. The flash memory internal state management table 2032 of the flash memory controller 2030 further includes a voltage application time information storage 2035 used as a storage unit of the verifying number-of-times information and the pulse width/interval information of each flash memory 2012. The voltage application time is calculated by [pulse width+pulse interval]×[number of times of verifying]. The voltage application time information relating to writing is generated by each writing unit, while the voltage application time information relating to erasing is generated by each erasing unit. These informations are recorded in the flash memory 2012 at the time of a most recent writing/erasing process.

The voltage application information may be collected and stored in the flash memory internal state management table 2032 by issuing the internal state reading command for the flash memories 2012 at the time of startup of the system, or the voltage application time informations of the flash memories 2012 once accessed may be stored in the flash memory internal state management table 2032 every time when the accesses are made.

Figure 15:
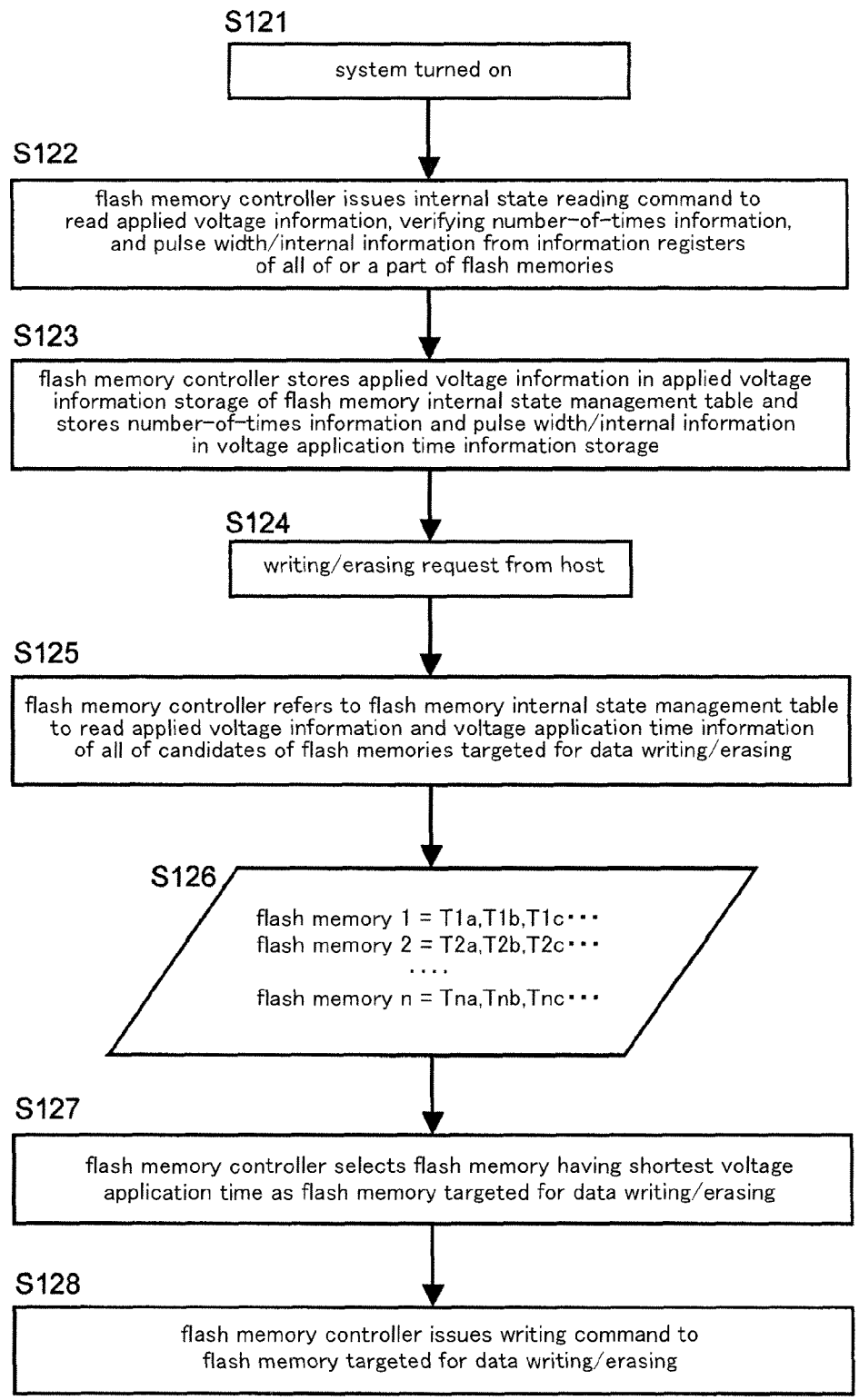
FIG. 15 is a flow chart illustrating a flash memory selection sequence of the nonvolatile storage system according to the working example 6.

The working example 6 is described with reference to an example where the voltage application time informations are read at once at the time of startup of the system. With reference to a flow chart illustrated in FIG. 15, processing steps of the flash memory selection are described. In Step S121, the nonvolatile storage system is turned on and the flash memory controller 2030 is activated. In Step S122, the flash memory controller 2030 issues the internal state reading command for all of or a part of the flash memories 2012 connected thereto to read the applied voltage information, verifying number-of-times information, and pulse width/interval information from the information registers 2014 of these flash memories 2012.

In Step S123, the read informations are stored in the applied voltage information storage 2033 and the voltage application time information storage 2035 of the flash memory internal state management table 2032. When a writing request is received from the host in Step S124, the flash memory controller 2030, in Step S125, selects any of the flash memories 2012 having an enough vacant memory space for data to be written therein.

In the event of a plurality of ones of the flash memories 2012 are to be selected, in Step S126, the flash memory controller 2030 refers to the applied voltage information storage 2033 and the voltage application time information storage 2035 to read therefrom the applied voltage informations and the voltage application time informations of the flash memories 2012.

In Step S127, the flash memory controller 2030 compares the voltage application time informations of the flash memories to select one of the flash memories to be selected having a shortest voltage application time. In Step S128, the flash memory controller 2030 controls the flash memory power supply circuit 2020 based on the applied voltage information.

The working example previously reads the number of times of verifying and the pulse widths/intervals and stores the voltage application time informations to select one of the flash memories 2012 having a shortest voltage application time over the other flash memories to minimize the operating time of the flash memory power supply circuit 2020. As a result, power consumption of the whole system can be reduced.

<20> [Notifying Applied Voltage]*[Notifying Number of Times of Verifying]*[Notifying Pulse Width/Interval (Selection of a Plurality of Memories)]

When a plurality of ones of the flash memories are accessed at once in parallel in the nonvolatile storage system recited in <19>, the flash memory controller refers to the voltage application time informations stored in the voltage application time information storage to select the flash memories having a smaller difference between the applied voltage thereof in priority to the other flash memories as flash memories to be supplied with power from same power supply circuit for process execution.

For easier understanding of the technical characteristics, a description is given with reference to an example. Trying to access two flash memories at the same time with three candidates of the access-target flash memories, for example, currently available to be accessed, a voltage application time difference between first and second flash memories is ΔT12, a voltage application time difference between second and third flash memories is ΔT23, and a voltage application time difference between third and first flash memories is ΔT31. When the ΔT12 shows a smallest value among the three voltage application time differences ΔT12, ΔT23, and ΔT31, the combination of the first and second flash memories is selected. Likewise, the combination of the second and third flash memories is selected when the ΔT23 shows a smallest value, and the combination of the third and first flash memories is selected when the ΔT31 shows a smallest value.

By thus selecting the flash memories having a smaller difference between the voltage application times thereof over the other flash memories, the power supply can be efficient without unnecessarily increasing the voltage application time. As a result, power consumption of the whole system can be reduced.

A specific example of <20> is hereinafter described as a working example 7 of the invention.

Working Example 7

Figure 16:
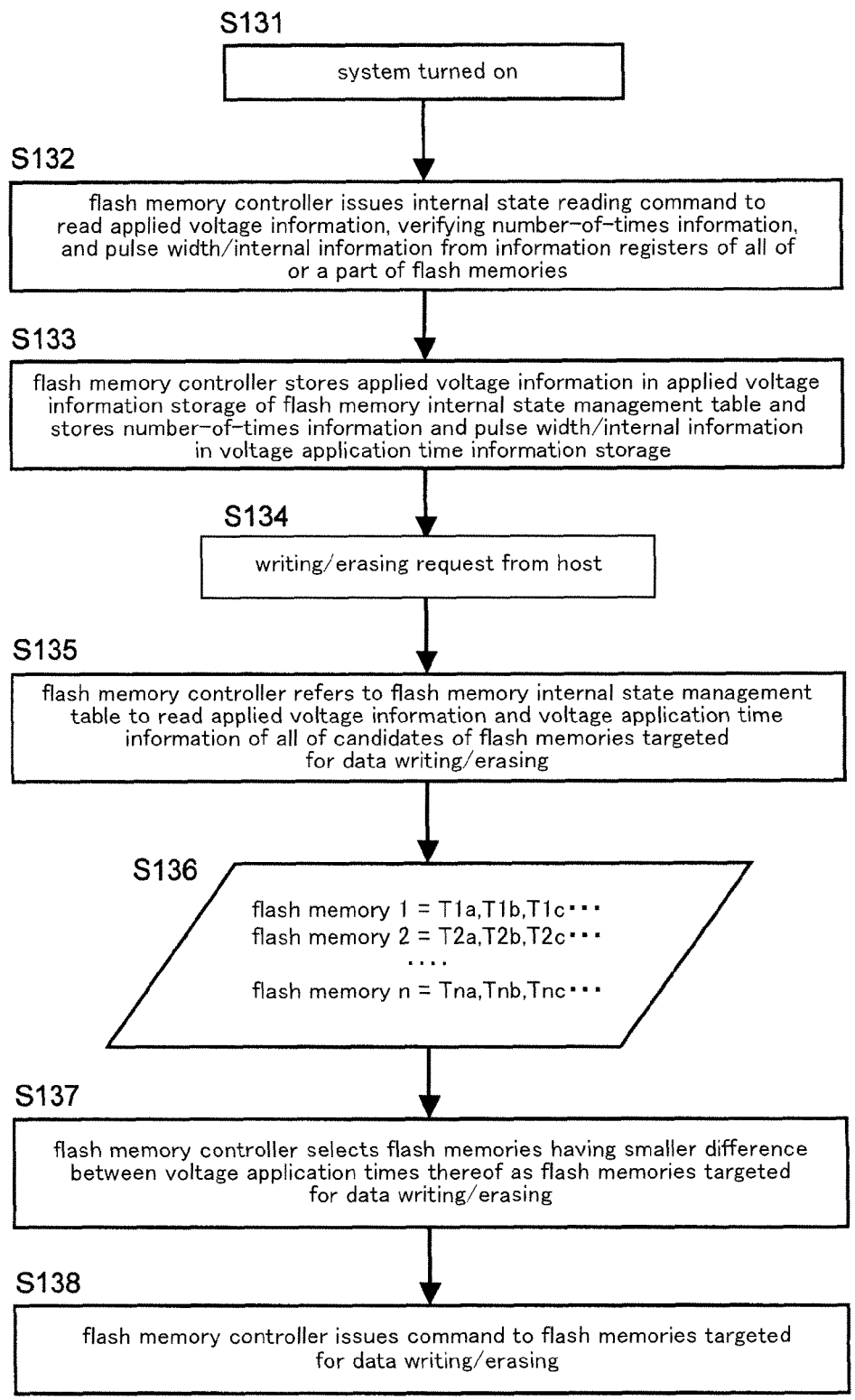
FIG. 16 is a flow chart illustrating a flash memory selection sequence (for selecting a plurality of flash memories) of a nonvolatile storage system according to a working example 7 of the invention.

FIG. 16 is a flow chart illustrating a flash memory selection sequence (for selecting a plurality of flash memories) of a nonvolatile storage system according to a working example 7 of the invention. Steps S131 to S136 and S138 are similar to Steps S121 to S126 and S128 of FIG. 15. The only difference between the flow charts of these drawings is Step S136.

Similarly to the working example 6, the flash memory controller 2030 selects the flash memories 2012 having an enough vacant memory space when a writing request is received from the host. In the case where the system is configured to execute the writing/erasing process in the plural flash memories 2012 in parallel to increase a processing speed, the flash memory controller 2030, similarly to the working example 6, refers to the applied voltage information storage 2033 and the voltage application time information storage 2035 to read therefrom the applied voltage informations and the voltage application time informations of the flash memories 2012 to be selected.

In Step S137, the flash memory controller 2030 compares the voltage application time informations to selectively combine the flash memories having a smaller difference between the voltage application times thereof in priority to the other selectable flash memories 2012.

According to the working example, the applied voltage informations of the flash memories 2012 are stored in advance so that the flash memories 2012 having a smaller difference between the voltage application times thereof are selectively combined. As a result, the power supply can be efficiently performed without unnecessarily increasing the voltage application time, and power consumption of the whole system can be reduced.

21> [Notifying Applied Voltage]*[Notifying Number of Times of Verifying]*[Notifying Pulse Width/Interval (No Pulse Overlap)]

When a plurality of ones of the flash memories are accessed at once in parallel in the nonvolatile storage system recited in <18>, the flash memory controller refers to the voltage application time informations stored in the voltage application time information storage to prevent the processes from being executed in the plural flash memories concurrently.

When the flash memory controller accesses the plural flash memories in parallel, the flash memory controller controls the flash memories in a manner that timings are not overlapped with each other. This prevents a peak of power consumption of the flash memories from being overly high, thereby enabling to feed power efficiently. As a result, power consumption of the whole system can be reduced.

A specific example of <21> is hereinafter described as a working example 8 of the invention.

Working Example 8

Figure 17:
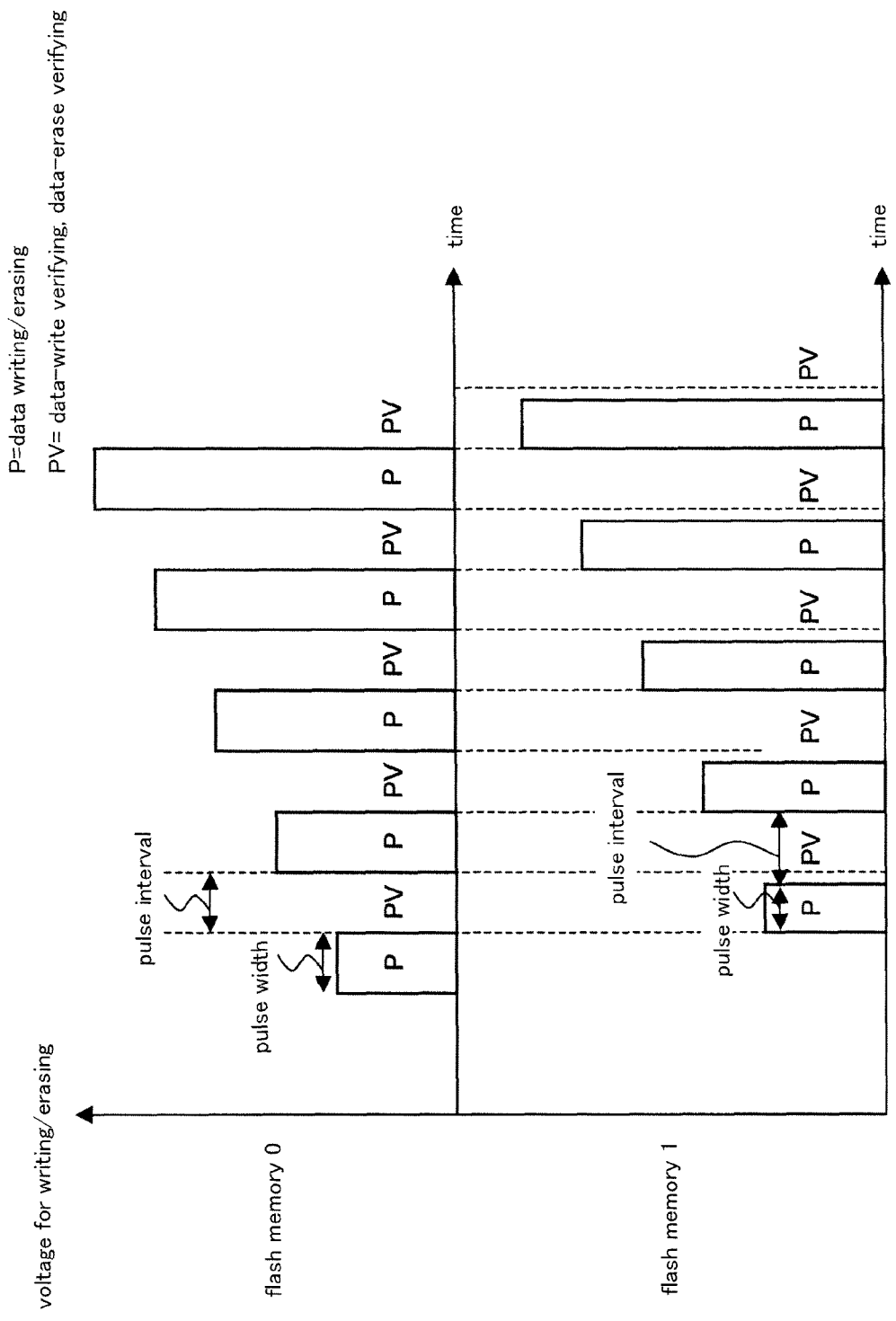
FIG. 17 is a graphical illustration of functions of a nonvolatile storage system (writing/erasing voltage characteristic chart) according to a working example 8 of the invention.

FIG. 17 is a graphical illustration of functions of a nonvolatile storage system (writing/erasing voltage characteristic chart) according to a working example 8 of the invention. Similarly to the working example 6, the flash memory controller 2030 selects any one of the flash memory 2012 having an enough vacant memory space when a writing request is received from the host. In the case where the system is configured to execute the writing/erasing process in the plural flash memories 2012 in parallel to increase a processing speed, the flash memory controller 2030, similarly to the working example 6, refers to the applied voltage information storage 2033 and the voltage application time information storage 2035 to read therefrom the applied voltage informations and the voltage application time informations of the flash memories 2012 to be selected.

The flash memory controller 2030 compares the pulse widths and the pulse intervals of the voltage application time informations and numbers of times of verifying. As illustrated in FIG. 17, the flash memory controller 2030 selects a combination of the plural flash memories 2012 where there is no overlap of pulses during the repeated verifying processes and makes the selected plural flash memories execute the writing/erasing process and the data-write/data-erase verifying process by different timings.

According to the working example, the plural flash memories 2012 are operated with no overlap between the writing/erasing pulses thereof so that a peak of power consumption of the flash memories is prevented from being overly high, thereby enabling to feed power efficiently. As a result, power consumption of the whole system can be reduced.

<22> [Notifying Load Power (Power Supply Control]

In the nonvolatile storage system recited in <1>, the plurality of types of power supply circuits for process execution respectively having different voltage levels are each configured to change an output electric energy. The plural flash memories respectively notify the flash memory controller of a load power information indicating an electric energy needed by the power supply circuit for process execution specific to each flash memory. The flash memory controller further includes a power supply control circuit. The power supply control circuit controls the output electric energy of the power supply circuit for process execution based on the received load power information.

The power supply circuit for process execution relating to the load power information may be any one of the power supply circuit for reading, power supply circuit for writing/erasing, and power supply circuit for verifying, or may be a combination of at least two power supply circuits arbitrarily selected.

The power supply control circuit controls the output electric energy of any intended one of the power supply circuits for process execution based on the notified load power, and any intended one of the flash memories is accurately supplied with power having an optimal electric energy requested by the flash memory. As a result, reduction of power consumption can be further improved.

<23> In the nonvolatile storage system recited in <22>, when the power supply control circuit obtains the load power information of one power supply circuit for process execution from more than one flash memory, the power supply control circuit controls the operation of the power supply circuit for process execution so that power equal to or larger than a plurality of load powers in total indicated by the obtained load power informations.

Accordingly, an enough power that allows the plural flash memories to operate at once in parallel is supplied by the power supply circuit for process execution driving these flash memories. This consequently contributes to reduction of power consumption.

A specific example of <22> and <23> is hereinafter described as a working example 9 of the invention.

Working Example 9

Figure 18:
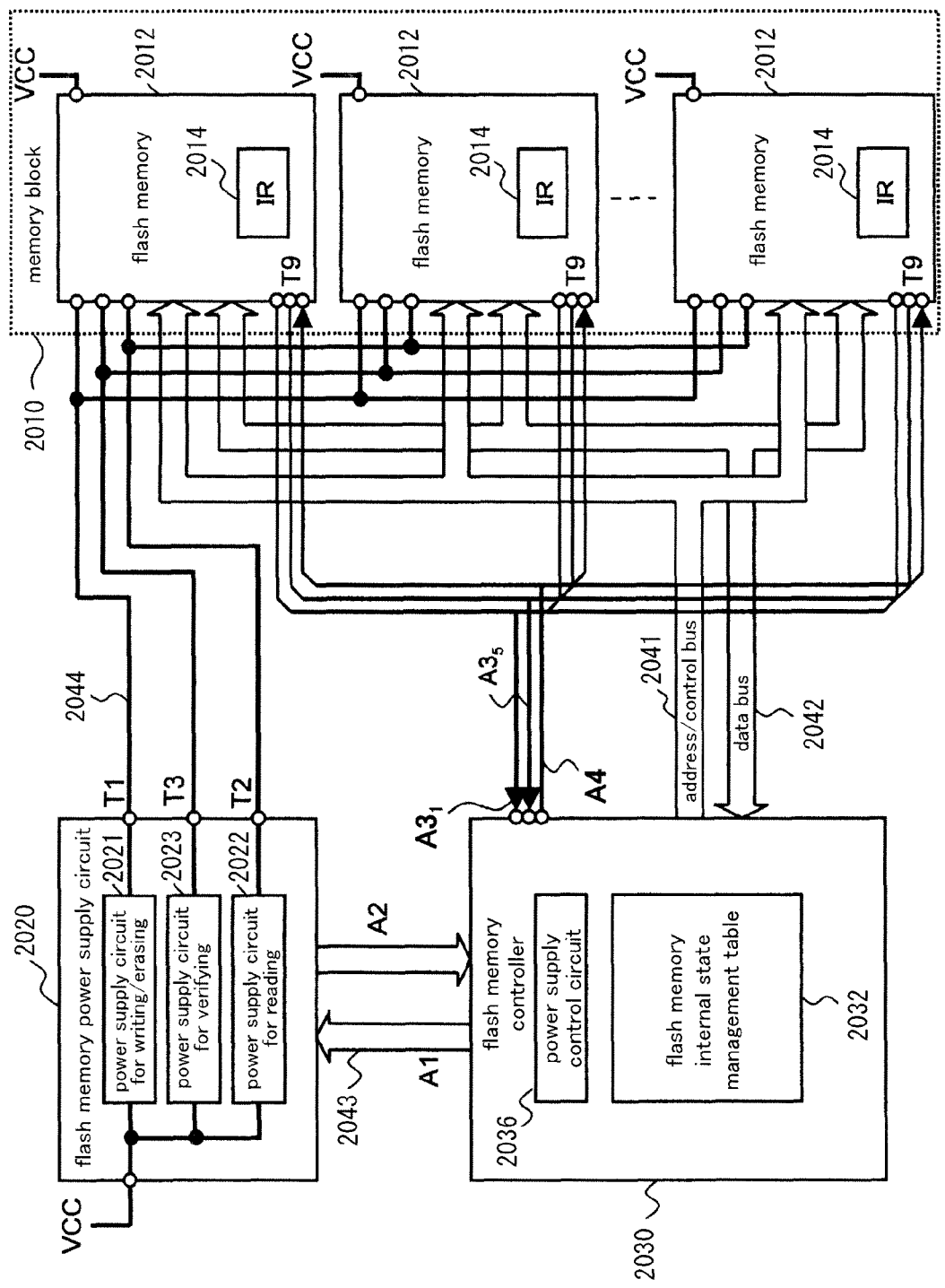
FIG. 18 is a block diagram illustrating structural characteristics of a nonvolatile storage system according to a working example 9 of the invention.

FIG. 18 is a block diagram illustrating structural characteristics of a nonvolatile storage system according to a working example 9 of the invention. The information indicated by the information register 2014 of the flash memory 2012 includes a load power information of the power supply voltages for reading, writing/erasing, and verifying in addition to the operating state currently executed by the internal controller (not illustrated in the drawing) of the flash memory 2012. This information indicates the electric energy necessary for the flash memory 2012 to operate. The flash memories 2012 each has an optical power supply voltage information. There are individual differences among the flash memories, which are generated by, for example, manufacturing tolerances.

A means for notifying the load power information is a load power notifying signal $A3_5$. The load power notifying signal $A3_5$ may be directly connected to the flash memory controller 2030. A reference symbol T9 is an output terminal of the flash memory 2012 for outputting the load power notifying signal $A3_5$.

The flash memory controller 2030 further includes a power supply control circuit 2036. The power supply control circuit 2036 compares the load power information of the flash memory 2012 to a power currently supplied and controls the power supply circuits 2021, 2022, and 2023 of the flash memory power supply circuit 2020 so that the power currently supplied exceeds the load power.

Figure 19:
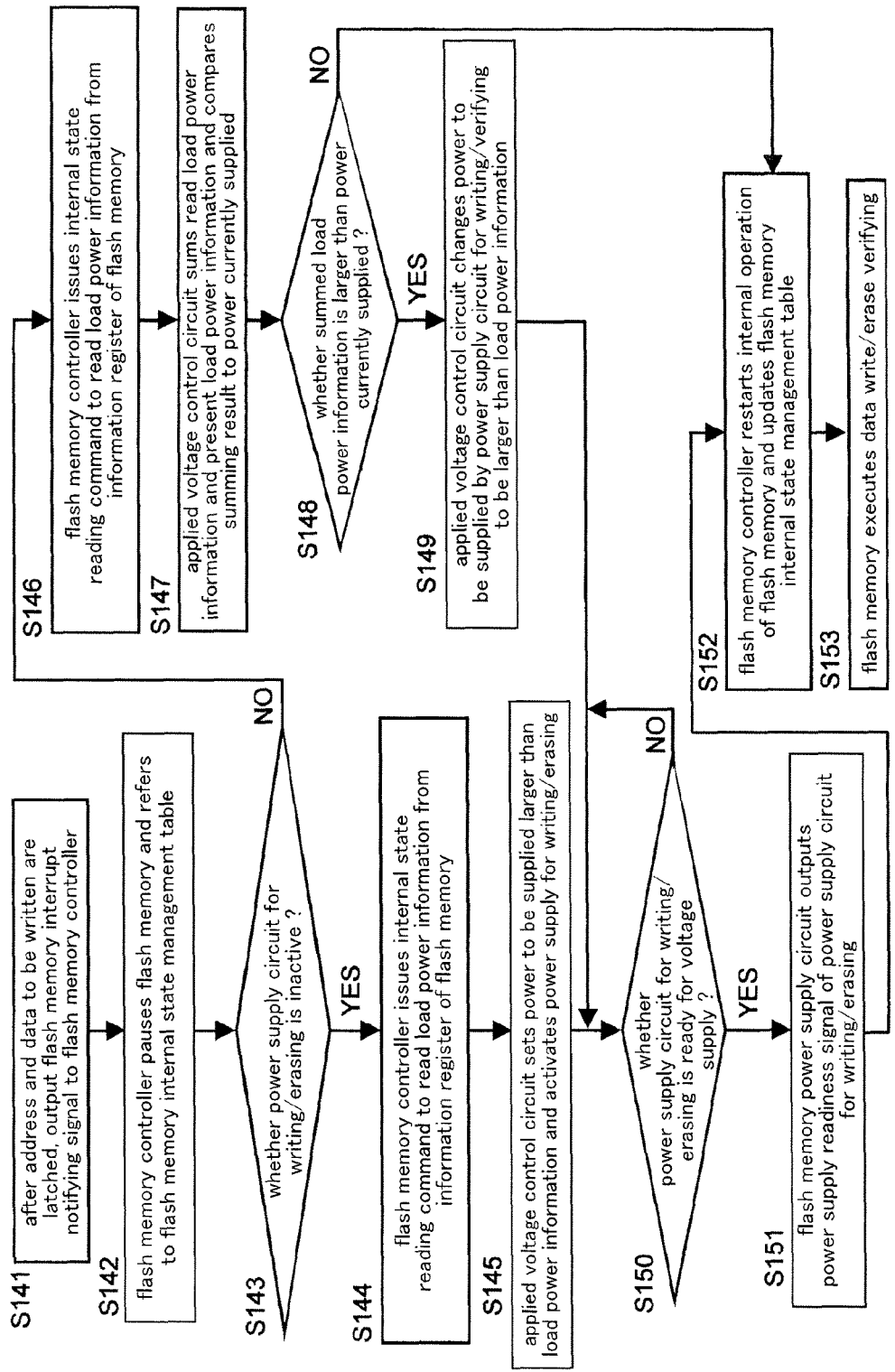
FIG. 19 is a flow chart illustrating a load power control sequence of the nonvolatile storage system according to the working example 9.

FIG. 19 is a flow chart illustrating a load power control sequence of the nonvolatile storage system according to the working example 9. Steps S141 to S143 are similar to Steps S101 to S103 of FIG. 13 according to the working example 5, and Steps S150 to S153 are similar to Steps S111 to S114 of FIG. 13.

When determined in Step S143 that the power supply circuit 2021 for writing/erasing is currently inactive, in Step S144, the flash memory controller 2030 issues the internal state reading command for the flash memory 2012 to read the load power information of the power supply for writing of the interrupted flash memory 2012 (when the verifying process is over).

In Step S145, the power supply control circuit 2036 sets a power to be supplied larger than the load power information and accordingly activates the power supply circuit 2021 for writing/erasing.

When determined in Step S143 that the power supply circuit 2021 for writing/erasing is currently active, in Step S146, the flash memory controller 2030 issues the internal state reading command for the flash memory 2012 to read the load power information of the power supply for writing of the interrupted flash memory 2012 (when the verifying process is over).

In Step S147, the power supply control circuit 2036 sums the read load power information and the present load power information and compares the summed load power information to the power currently supplied by the power supply circuit 2021 for writing/erasing.

When determined in Step S148 that the summed load power information is larger than the other, in Step S149, the power supply control circuit 2036 changes the power currently supplied by the power supply circuit 2021 for writing/erasing to be larger than the summed load power information.

When the power supply control circuit 2036 sums the read load power information and the present load power information and compares the summed load power information to the power currently supplied by the power supply circuit 2021 for writing/erasing and determines that the summed load power information is smaller than the other, in Step S152, the power supply control circuit 2036 retains the power currently supplied by the power supply circuit 2021 for writing/erasing.

According to the working example, wherein the load power information indicating the power consumed by the flash memory 2012 is notified, the required power can be exactly supplied from the power source externally provided. This enables to efficiently feed power, thereby reducing power consumption of the whole system.

<24> [Notifying Load Power (Selection of a Memory)]

In the nonvolatile storage system recited in <22>, the flash memory controller further includes a load power information storage as a storage unit of the load power informations received from the plural flash memories. The flash memory controller decides the flash memory to be selected by referring to the load power informations stored in the load power information storage.

The load power information is stored in the flash memory and transmitted to the flash memory controller. The load power informations received by the flash memory controller are stored in the load power information storage. The load power information storage can store therein the load power informations of all of the flash memories.

When the flash memory controller receives an operation command from, for example, the host, it is necessary to decide which of the flash memories should be accessed. To select the flash memory to be accessed, the flash memory controller refers to the load power informations of all of the flash memories stored in the load power information storage to decide one flash memory to be accessed. This greatly contributes to reduction of power consumption.

<25> In the nonvolatile storage system recited in <24>, when a plurality of candidates of the flash memories to be accessed have an enough vacant memory space exist in the plurality of the access-target flash memories, the flash memory controller refers to the load power informations stored in the applied voltage information storage to select the flash memory having a smallest load power.

When the flash memory having a smallest load power is selected from all of the candidates of the flash memories to be accessed having an enough vacant space, execution of a process requires less power. The different load powers can be thus compared because the load power informations of all of the flash memories are stored in the load power information storage. As a result, reduction of power consumption is more effectively improved.

A specific example of <24> and <25> is hereinafter described as a working example 10 of the invention.

Working Example 10

Figure 20:
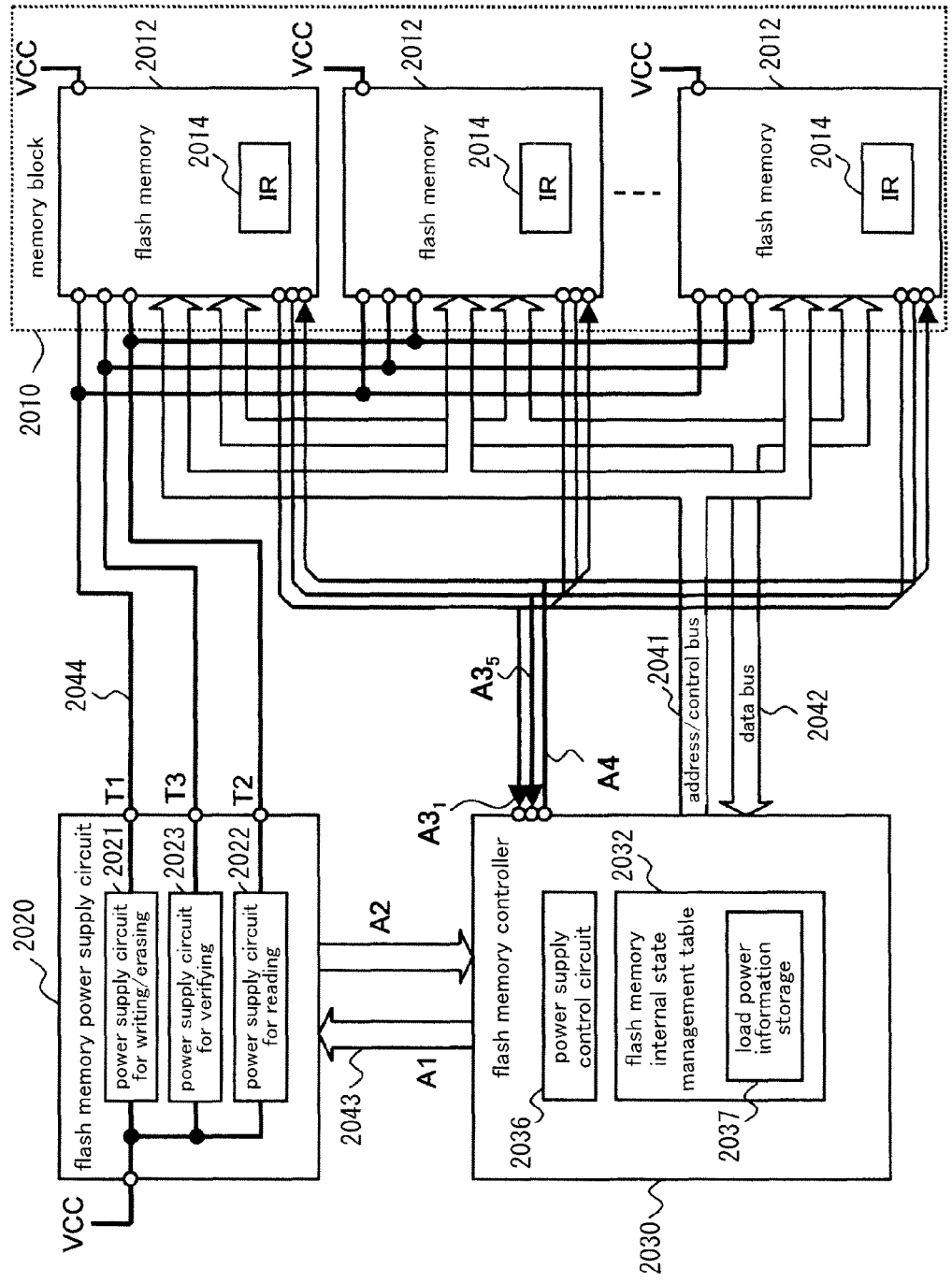
FIG. 20 is a block diagram illustrating structural characteristics of a nonvolatile storage system according to a working example 10 of the invention.

FIG. 20 is a block diagram illustrating structural characteristics of a nonvolatile storage system according to a working example 10 of the invention. The flash memory internal state management table 2032 of the flash memory controller 2030 further includes a load power information storage 2037 used as a storage unit of the load power information of each of the flash memories 2012. The load power information may be collected by issuing the internal state reading command for all of the flash memories 2012 at the time of startup of the system and registered in the load power information storage 2037, or the load power informations of the flash memories 2012 once accessed may be collected every time when the accesses are made and stored in the load power information storage 2037. In the present example hereinafter described, the load power informations are read at once at the time of startup of the system.

Figure 21:
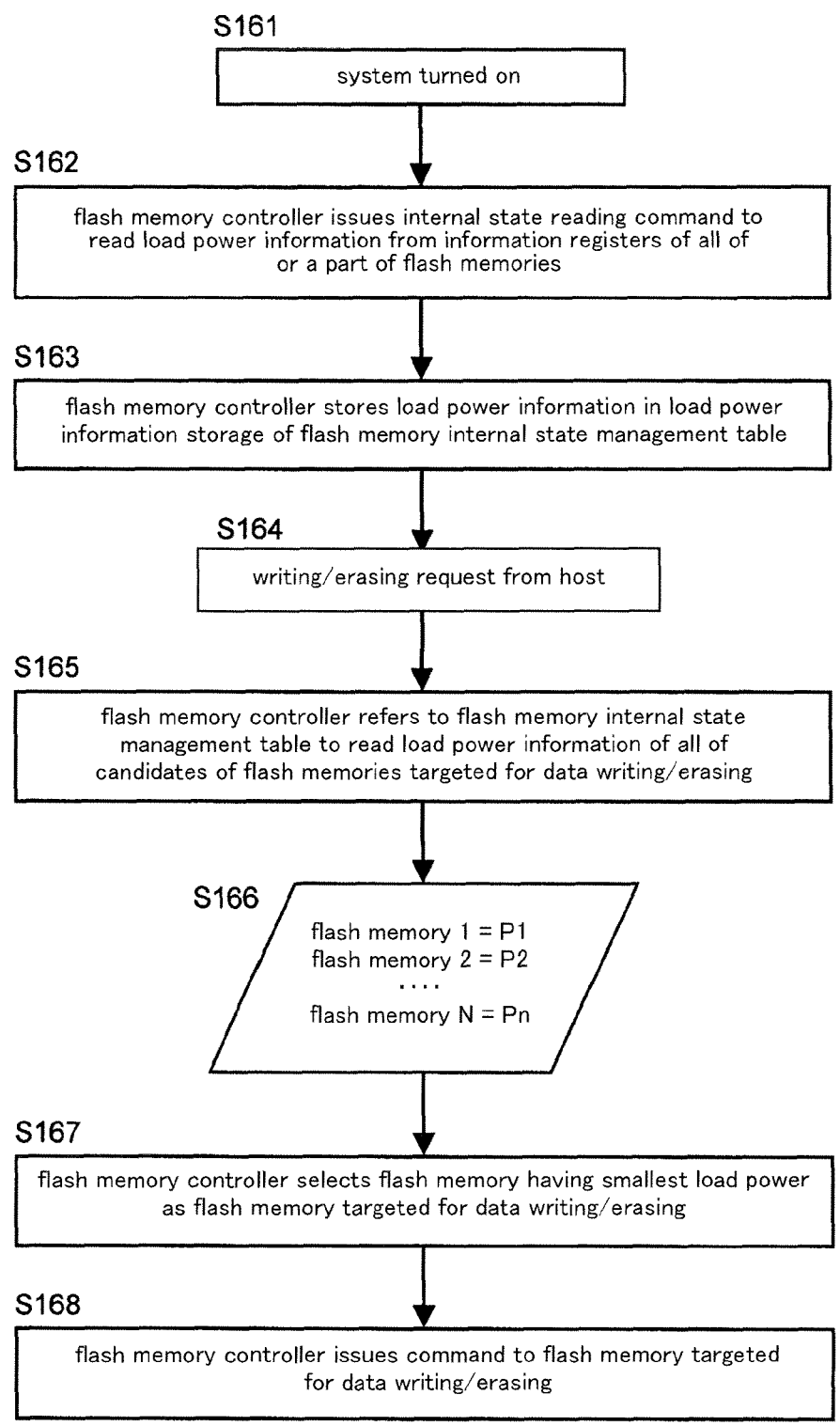
FIG. 21 is a flow chart illustrating a flash memory selection sequence of the nonvolatile storage system according to the working example 10.

With reference to a flow chart illustrated in FIG. 21, processing steps of a flash memory selection sequence are described. In Step S161, the nonvolatile storage system is turned on, and the flash memory controller 2030 is activated. In Step S162, the flash memory controller 2030 issues the internal state reading command for all of or a part of the flash memories 2012 connected thereto to read the load power informations from the information registers 2014 of these flash memories 2012.

In Step S163, the read load power informations are stored in the load power information storage 2037 of the flash memory internal state management table 2032. When a writing/erasing request is received from the host in Step S164, the flash memory controller 2032 selects in Step S165 any one of the flash memories 2012 having an enough vacant memory space for data to be written therein.

When a plurality of ones of the flash memories 2012 are selectable, in Step S166, the flash memory controller 2030 refers to the load power information storage 2037 to read therefrom the load power informations of the respective flash memories 2012. In Step S167, the flash memory controller 2030 compares the load power informations to select one of the selectable flash memories having a smallest load power. In Step S168, the flash memory controller 2030 issues a process execution command to the selected flash memory 2012.

According to the working example, the load power informations of the flash memories 2012 are stored in the load power information storage 2037 in advance and used to select the flash memory having a smallest load power in priority to the other flash memories. This effectively lowers the power supply of the flash memory power supply circuit, thereby reducing power consumption of the whole system.

<26> [Notifying Load Power (Selection of a Plurality of Memories)]

In the nonvolatile storage system recited in <25>, when a plurality of ones of the flash memories are accessed at once in parallel, the flash memory controller refers to the load power informations stored in the load power information storage 2037 to select the flash memories having a smaller load power in total in priority to the other flash memories as the flash memories to be power-supplied by same one power supply circuit for process execution.

For easier understanding of the technical characteristics, a description is given with reference to an example. Trying to access two flash memories at the same time with three flash memories, for example, currently available to be accessed, a summed load power of first and second flash memories is P12, a summed load power of second and third flash memories is P23, and a summed load power of third and first flash memories is P31. When the P12 shows a smallest value among the three applied voltage differences P12, P23, and P31, the combination of the first and second flash memories is selected. Likewise, the combination of the second and third flash memories is selected when the P23 shows a smallest value, and the combination of the third and first flash memories is selected when the P31 shows a smallest value.

By thus selecting the flash memories having a smaller load power in total over the other flash memories, the power supply can be efficiently performed without unnecessarily increasing the load power. As a result, power consumption of the whole system can be reduced.

A specific example of <26> is hereinafter described as a working example 11 of the invention.

Working Example 11

Figure 22:
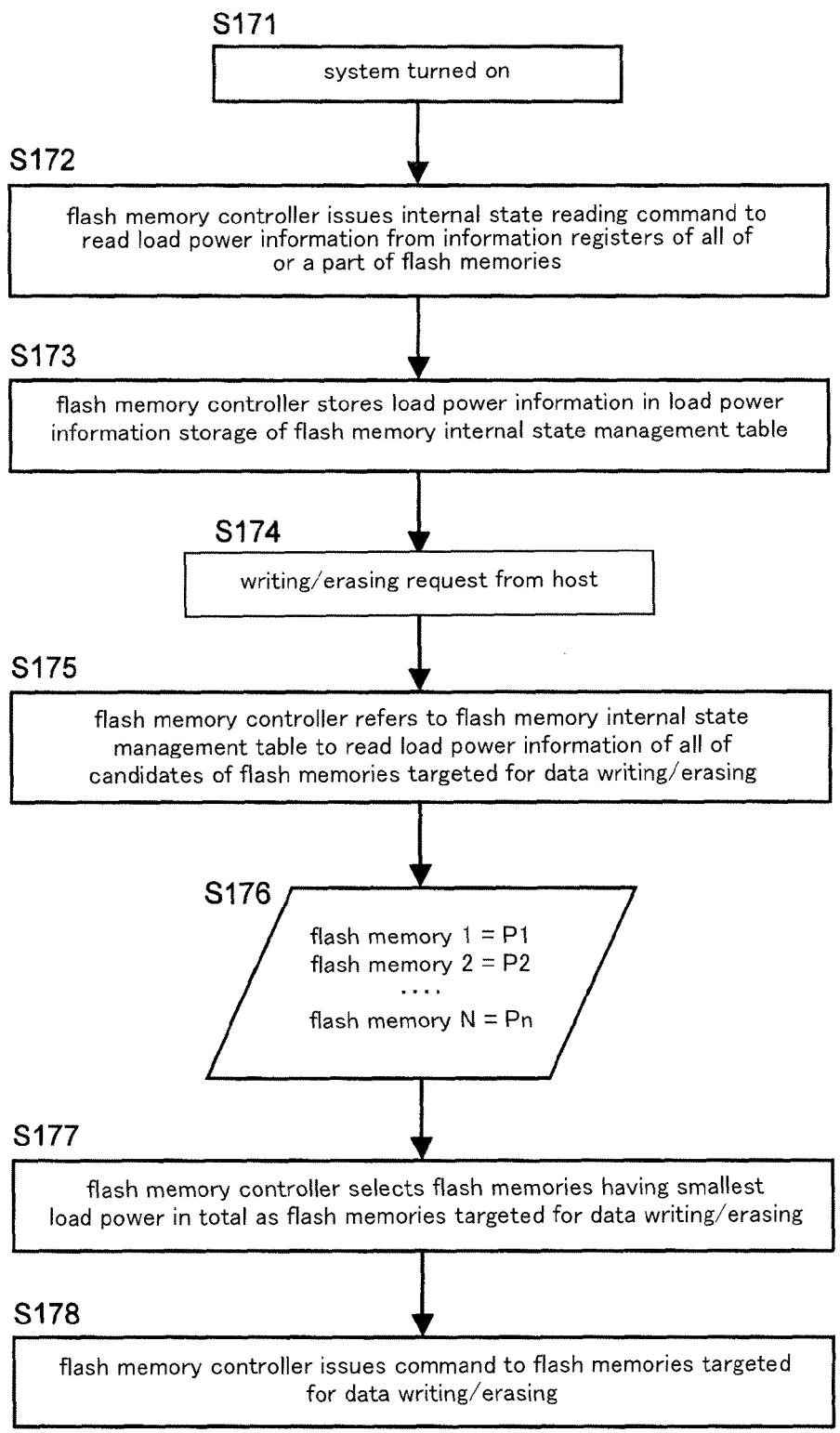
FIG. 22 is a flow chart illustrating an operation of a nonvolatile storage system according to a working example 11 of the invention.

FIG. 22 is a flow chart illustrating a flash memory selection sequence of a nonvolatile storage system according to a working example 11 of the invention. Steps S171 to S176 and S178 are similar to Steps S161 to S167 and S168 of FIG. 21. The only difference between the flow charts of these drawings is Step S176.

Similarly to the working example 10, the flash memory controller 2030 selects any ones of the flash memories 2012 having an enough vacant memory space when a writing request is received from the host. In the case where the system is configured to execute the writing/erasing process in the plural flash memories 2012 in parallel to increase a processing speed, the flash memory controller 2030, similarly to the working example 10, refers to the load power information storage 2037 to read therefrom the load power informations of the flash memories 2012 to be selected.

In Step S177, the flash memory controller 2030 compares the load power informations to selectively combine the flash memories 2012 having a smallest load power in total among the flash memories 2012 to be selected.

According to the working example, the load power informations of the flash memories 2012 are stored in advance to selectively combine the flash memories 2012 having a smaller load power in total. This enables to efficiently feed power, thereby reducing power consumption of the whole system.

27> [Notifying Load Power (Different Timings)]

In the nonvolatile storage system recited in <25>, when a plurality of ones of the flash memories are accessed at once in parallel and a load power in total of these plural flash memories exceeds a power supply capacity of the power supply circuit for process execution, the flash memory controller controls the plurality of ones of the flash memories in a manner that timings of executing the processes in the plurality of ones of the flash memories are not overlapped with each other by referring to the load power informations stored in the load power information storage.

When a plurality of ones of the flash memories are accessed at once in parallel and a load power in total of these plural flash memories exceeds the power supply capacity of the power supply circuit for process execution, the flash memory controller controls the plural flash memories in a manner that timings are not overlapped with each other. This prevents a peak of power consumption of the flash memories from being overly high, thereby enabling to efficiently feed power. As a result, power consumption of the whole system can be reduced.

A specific example of <27> is hereinafter described as a working example 12 of the invention.

Working Example 12

Figure 23:
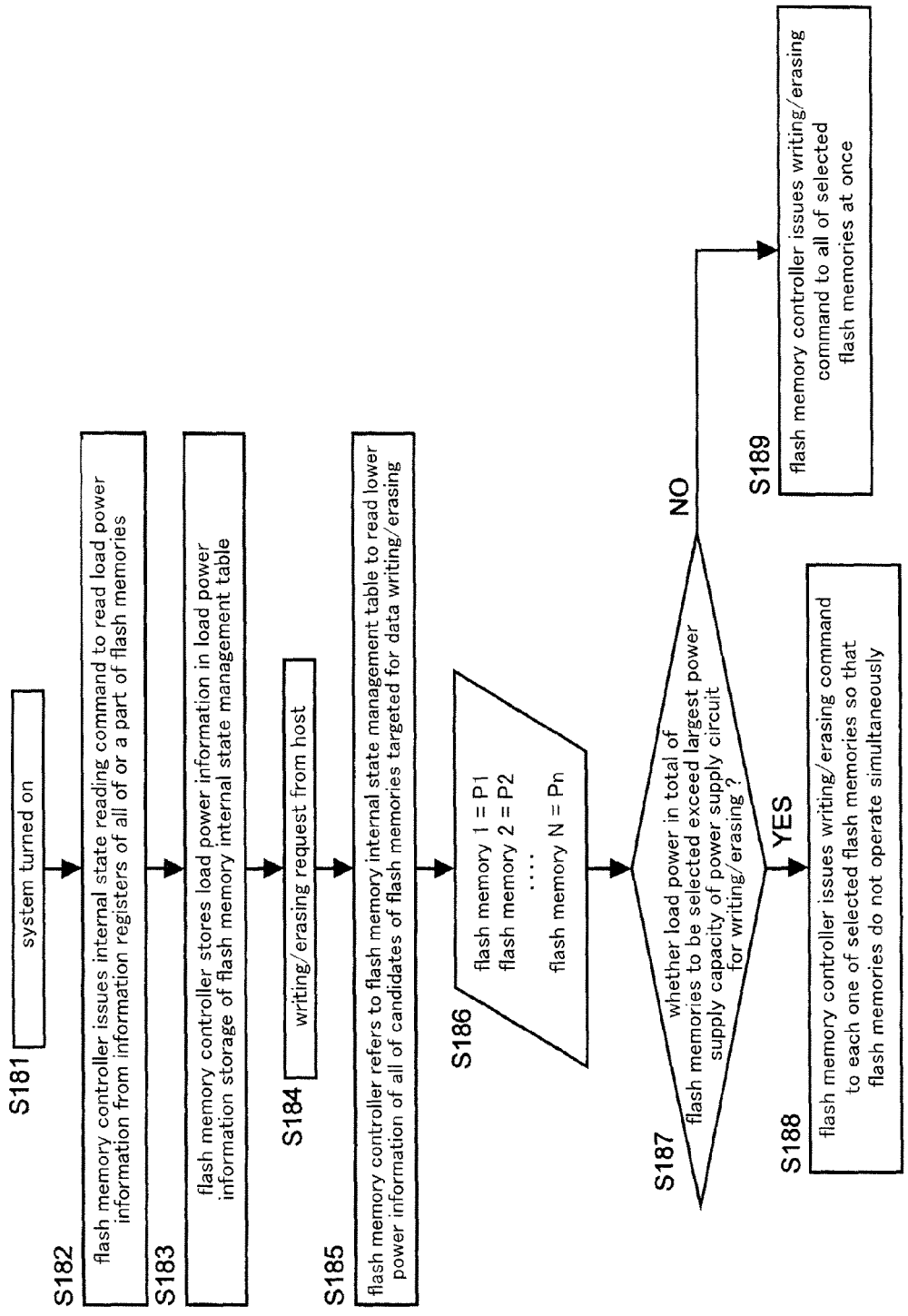
FIG. 23 is a flow chart illustrating an operation of a nonvolatile storage system according to a working example 12 of the invention.

FIG. 23 is a flow chart illustrating a flash memory selection sequence of a nonvolatile storage system according to a working example 12 of the invention. Steps S181 to S186 are similar to Steps S171 to S176 of FIG. 22. The flow charts of these drawings are different in Steps S187 to S189.

Similarly to the working example 10, the flash memory controller 2030 selects any ones of the flash memories 2012 having an enough vacant memory space when a writing request is received from the host. In the case where the system is configured to execute the writing/erasing process in the plural flash memories 2012 in parallel to increase a processing speed, the flash memory controller 2030, similarly to the working example 10, refers to the load power information storage 2037 to read therefrom the load power informations of the flash memories 2012 to be selected.

In Step S187, the flash memory controller 2030 compares the read power load informations. When determined that the power load in total of the flash memories 2012 to be selected exceeds a largest power supply capacity of the power supply circuit 2021 for writing/erasing, in Step S188, the flash memory controller 2030 makes the writing/erasing process be executed serially in the selected flash memories 2012 in a manner that the operations of the selected flash memories 212 are not overlapped with each other. When determined that the power load in total of the flash memories 2012 to be selected does not exceed the largest power supply capacity of the power supply circuit 2021 for writing/erasing, in Step S189, the flash memory controller makes the writing/erasing process be executed simultaneously in the selected flash memories 2012.

According to the working example, the load power informations of the flash memories 2012 are stored in advance, and the flash memories 2012 are serially operated by different timings in the case where the total load power of these flash memories exceeds the power supply capacity. As a result, power consumption of the whole system can be reduced.

<28> [Notifying Failed Bit Number]

In the nonvolatile storage system recited in <1>, the flash memory controller receives a failed bit number information at the time of verifying from the plural flash memories and controls the processes executed in the flash memories based on the received failed bit number informations.

<29> In the nonvolatile storage system recited in <28>, the flash memory controller pauses the operations of the flash memories as soon as the notified bit numbers are equal to or smaller than a predefined value.

A nonvolatile storage system conventionally has an error correcting function for any read data, which is often exerted by the flash memory controller. Therefore, it is not necessary to correct all of writing errors. As far as the verifying process corrects some errors, reducing the failed bit number to the predefined value or below, any further verifying processes are unnecessary because the error correcting function can deal with any errors left uncorrected. Therefore, when the notified failed bit number is as small as the predefined value or below, the operation of the flash memory is immediately paused. As a result, data rewriting processes, which are often unnecessary, are lessened, and reduction of consumption reduction is more effectively improved.

<29> A specific example of <28> is hereinafter described as a working example 13 of the invention.

Working Example 13

Figure 24:
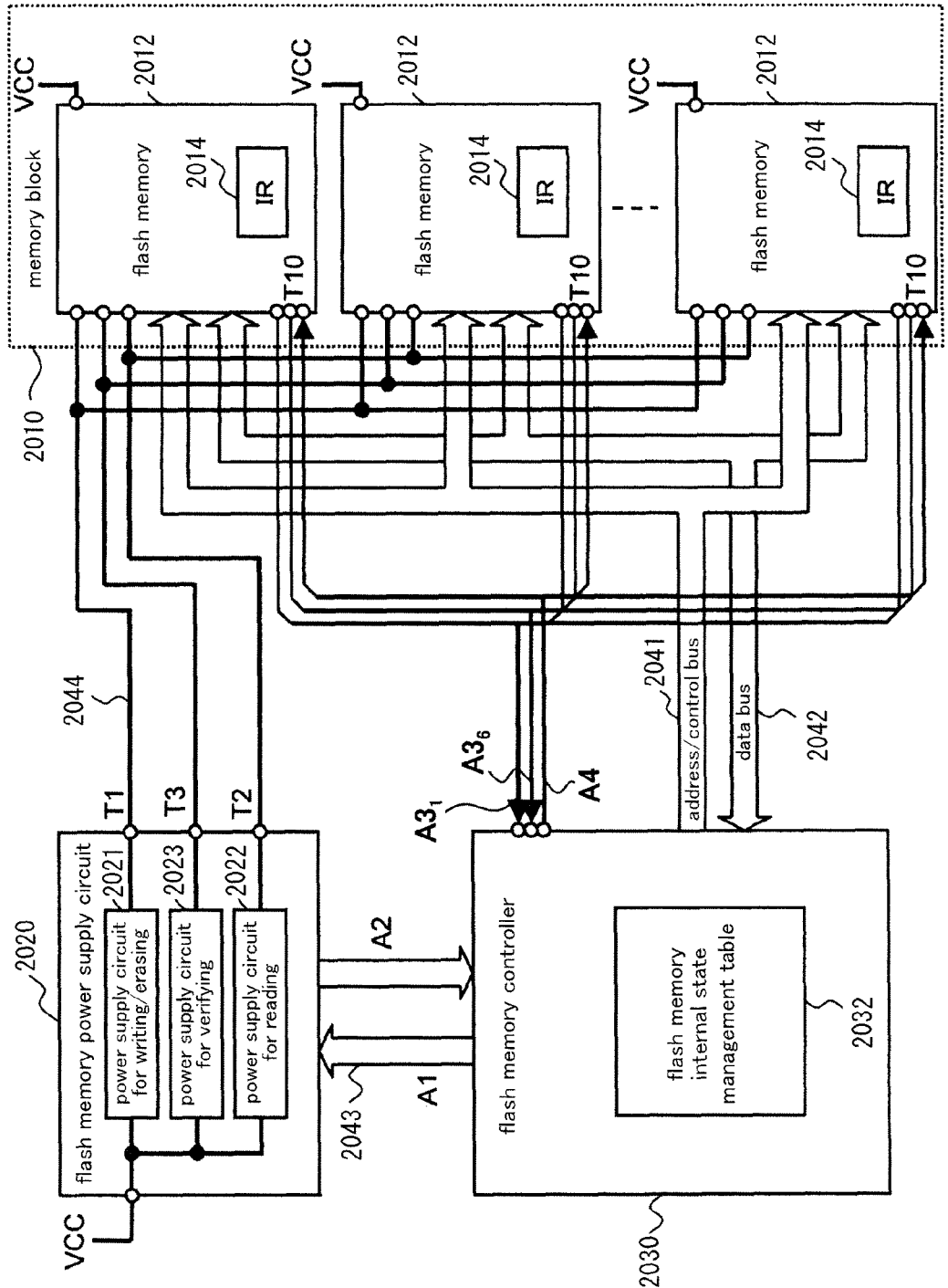
FIG. 24 is a flow chart illustrating structural characteristics of a nonvolatile storage system according to a working example 13 of the invention.

FIG. 24 is a flow chart illustrating structural characteristics of a nonvolatile storage system according to a working example 13 of the invention. The information indicated by the information register 2014 of the flash memory 2012 includes, in addition to the operating state currently executed by the internal controller (not illustrated in the drawing) of the flash memory 2012, a failed bit number information. The failed bit number information indicates a bit number that failed to be written or erased during the data-write verifying or data-erase verifying process. A means for notifying the failed bit number information is a failed bit number notifying signal $A3_6$, which may be directly connected to the flash memory controller

2030. A reference symbol T10 is an output terminal of the flash memory 2012 for outputting the failed bit number notifying signal $A3_6$.

Figure 25:
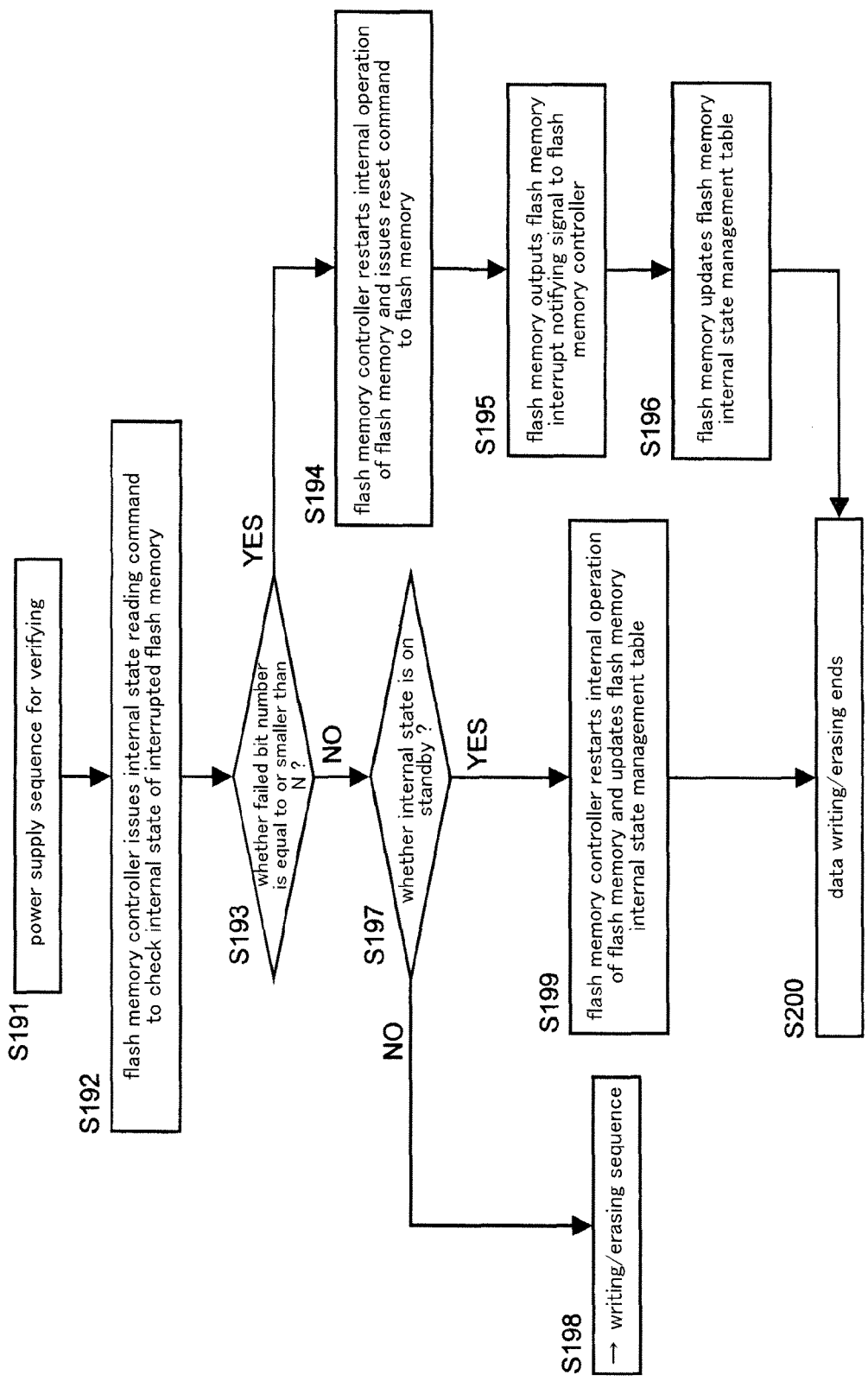
FIG. 25 is a flow chart illustrating an operation of the nonvolatile storage system according to the working example 13.

FIG. 25 is a flow chart illustrating an operation of the nonvolatile storage system according to the working example 13. In Step S191, the power supply sequence for verifying in the sequence of the power supply circuit 2021 for writing/erasing ends. In Step S192, the flash memory controller issues the internal state reading command and checks the internal state of the interrupted flash memory 2012. In Step S192, the flash memory controller 2030 refers to the failed bit number information to check the internal state of the interrupted flash memory 2012.

When the failed bit number is larger than a predefined number N, the flash memory controller 2030 proceeds to Step S197 and then Step S198 to continue the power supply sequence for writing/erasing. When the failed bit number is equal to or smaller than the predefined number N, in Step S194, the flash memory controller 2030 restarts the internal operation of the flash memory and issues a reset command to the flash memory to forcibly shift the internal operation of the flash memory 2012 to standby.

In Step S195, the flash memory 2012 on standby outputs the flash memory interrupt notifying signal $A3_1$ to the flash memory controller 2030.

In Step S196, the flash memory controller 2030 receives the flash memory interrupt notifying signal $A3_1$ from the flash memory 2012 and updates the state of the flash memory 2012 currently accessed in the flash memory internal state management table 2032 from "data-write verifying" or "data-erase verifying" to "standby".

The predefined number N of the failed bit number is provided because the flash memory controller 2030 has a data-read error correcting function, which helps to avoid any reading errors when the writing process is completed as far as any writing errors stay in a range of tolerance. As a result, data rewriting processes, which are often unnecessary, are lessened.

The predefined number N of the failed bit number may be a value defined by a program of the flash memory controller 2030 or a value preset in a redundant region of each flash memory 2012 and read by the flash memory controller 2030 every time on a case-by-case basis.

According to the working example, the controller is notified of the failed bit number at the time of data-write/erase verifying of the flash memory 2012 so that any data rewriting processes to be desirably avoided are lessened. This effectively reduces power consumption of the whole system.

<30> [A Plurality of Power Supply Blocks]

In the nonvolatile storage systems recited in <1> to <29>, the flash memory power supply circuit may be divided in a plurality of groups, in which case the plural flash memories are also divided in a plurality of groups. The flash memory power supply circuit and the flash memories are divided in an equal number of groups. An ith group of flash memories is associated with an ith group of flash memory power supply circuits. The respective groups of flash memories are independently associated with the different groups of flash memory power supply circuits. This is an advantageous structural feature in the case where a sizable number of flash memories are provided.

<31> When a plurality of ones of the flash memories are accessed in the nonvolatile storage system recited in <30>, the flash memory controller selects a group of flash memories sharing the same power supply in priority to the other flash memories.

Thus selectively using the flash memories sharing the same power supply, any other flash memory power supply circuits currently unused can be deactivated. As a result, power consumption of the whole system can be reduced.

A specific example of <30> and <31> is hereinafter described as a working example 14 of the invention.

Working Example 14

FIG. 26 is a block diagram illustrating structural characteristics of a nonvolatile storage system according to a working example 14 of the invention. The nonvolatile storage system is provided with a plurality of flash memory power supply circuits 2020, wherein the flash memories 2012 are respectively connected to the flash memory power supply circuits 2012 divided in different groups.

Similarly to the working example 1, the flash memory controller 2030 controls the plural flash memories based on the flash memory internal state notifying signal A3 transmitted from each of the flash memories 2012. The flash memory controller 2030 knows which one of the flash memories 2012 belongs to which one of the power supply groups.

While one of the flash memories 2012 is currently active when the flash memory controller 2030 is trying to execute the writing/erasing process in another one of the flash memories 2012, the flash memory controller 2030 selects the flash memory 2012 to be data-written or erased from the power supply group of the flash memory 2012 currently active.

When the writing/erasing process needs to be executed in the plural flash memories 2012 at the same time to increase a processing speed, the flash memory controller 2030 trying to execute the writing/erasing process selects a plurality of ones of the flash memories from the same power supply group.

According to the working example, the different power supply groups are formed by the plural flash memory power supply circuits 2020, and the flash memories 2012 belonging to the same power supply group are selected over the other flash memories. Therefore, any flash memory power supply circuits 2020 of the power supply groups currently unused can be deactivated. As a result, power consumption of the whole system can be reduced.

Working Example 15

In any systems where a sizable number of flash memory chips are used such as a flash memory storage system, large power consumption for operating the storage systems is a problem to be solved. Particularly, when a program operation is executed in a plurality of plural flash memory chips at the same time for a better program performance, a large current consumption leads to cost increases in power supply and heat release in the systems. It is a task to be desirably achieved to reduce current consumption during the operation of the flash memories.

In a booster circuit configured to generate such a high voltage as 20V or more has a poor power efficiency, power consumption in program and erasing operations is a few times larger than power needed to change memory cell thresholds. In any systems where a sizable number of flash memory chips are used such as a flash memory storage system where such a booster circuit is provided in each flash memory chip, power consumption is huge when the program and erasing operations are carried out in the plural chips at the same time, causing troubles in designing power supplies of these system.

A solution for solving the problem of power consumption is to provide a power supply circuit which generates a high voltage outside of the flash memory chip as disclosed in the prior art documents. However, the program and erasing operations in the flash memories are carried out in response to inputted commands, and it can be known from outside of the flash memories that the operations are completed by outputting completion-notifying signals or by way of status registers. Therefore, it is necessary for the power supply circuit to constantly generate the maximum voltage of 20V from the start to finish of the program and erasing operations.

On the contrary, a nonvolatile semiconductor storage device according to the invention controls the operation of a power supply circuit externally provided in response to receipt of an operation execution command in accordance with an operation sequence of an internal controller. The nonvolatile semiconductor storage device thus characterized can operate with less power and brings remarkable advantages to power reductions and performance improvements when applied to, for example, any systems where a large number of nonvolatile semiconductor storage devices are used such as storage systems.

The working example describes a first example of the nonvolatile semiconductor storage device according to the invention which is illustrated in FIG. 27. A memory cell array 1102 for data storage has memory cells arranged in an array, wherein information is stored by changing thresholds of the memory cells. The thresholds of the memory cells can be increased for the program operation, while the thresholds of the memory cells can be decreased for the erasing operation. The memory cell array 1102 is accessed per page for the program operation and data reading and accessed per block for the erasing operation.

The page is specified by a specific word line selected by a row decoder. To read data, data stored in the memory cell on the specified page is decided by a sense amplifier 1108 and transferred to a data register 1109. The data transferred to the data register 1109 is read from a predefined start point to a serial input/output circuit 1112 and then outputted to an input/output terminal IO.

To write data, data inputted through the input/output terminal I/O is fetched from a start point specified by a column decoder 1106 and fetched into the data register 1109 in a serial data input mode. Then, the fetched data is transferred to the specified page.

To erase data from the memory cell array 1102, a voltage for erasing is applied to a block specified by a plurality of word lines selected by a row decoder 1104 to set the memory cells in the block to be ready for erasing.

The operations, such as program and erasing operations, are executed in a flash memory 1100 in response to operation commands inputted through the IO terminal. FIG. 32 illustrates a list of operation commands. The flash memory 1100 has a VCC voltage terminal for receiving the voltage of, for example, 3V supplied to the sense amplifier 1108 and logic circuit, and also has VPP1, VPP2, and VPP3 high voltage power supply terminals for receiving higher voltages than VCC. The VPP1, VPP2, and VPP3 power supply terminals for receiving, for example, voltages for program/erasing, verifying, and reading.

An internal circuit block of the flash memory 1100 is operated by the voltages received by the VPP1, VPP2, and VPP3 high voltage power supply terminals or a voltage generated by a voltage generator circuit 1130 from the voltages received by the VPP1, VPP2, and VPP3 high voltage power supply terminals.

The flash memory 1100 receives an auto program or auto block erasing command, and a controller 1116 executes a program sequence and an erasing sequence. An information register 1132 is provided to store running states of these sequences.

In the information register 1132 are set such informations as an operation mode currently in execution, number of times of voltage application when the auto program or auto block erasing sequence is in execution (number of times of verifying), applied voltage values, voltage application pulse widths and intervals, and error bit numbers at the time of verifying.

Accordingly, the internal operating state generated by the controller (information register value) can be transmitted outside in the flash memory where the operation sequence is executed by the internal controller in response to the receipt of the operation execution command. The technical feature enables to control the high voltage generator circuit depending on the internal operating state of the flash memory in the storage system provided with the flash memory controller and the high voltage generator circuit, so that the high voltage generator circuit necessary for the operation of the flash memory alone is activated but any other power supply circuits unnecessary for the internal operation are left inactive. As a result, unnecessary current consumption can be avoided, which enables to operate the system with less power consumption. Further, the voltages depending on the operation modes of the flash memory can be generated by the high voltage generator circuits outside of the flash memory, which enables to reduce power consumption of the storage system.

Figure 29:
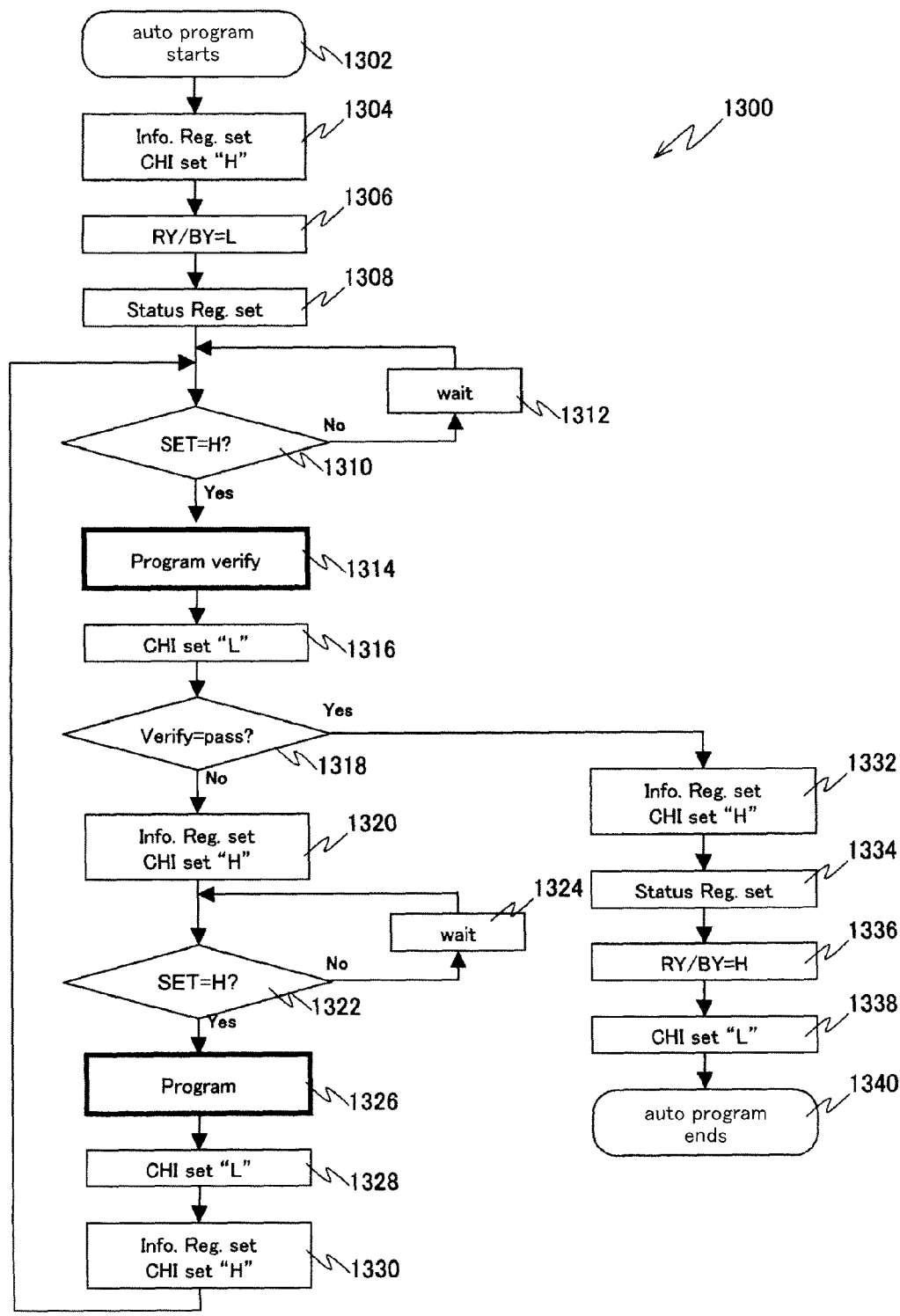
FIG. 29 is a flow chart of an auto program sequence.

FIG. 29 illustrates a sequence when the auto program is executed. When the auto program sequence starts in response to the receipt of an auto program command (1302), an operation for the program starts with verifying of the program (1314), however, any necessary settings are set before the program verifying is executed.

In Step (1304), necessary information is set in the information register 1132 and an information register change notifying signal CHI is set to "H" to notify outside of the flash memory that contents of the information register 1132 were changed. Then, a ready/busy RY/BY signal indicating that the flash memory is currently active is set to "L" (1306) and also set to a value indicating that contents of a status register 1122 currently active (1308).

FIG. 30 illustrates contents of the information register 1132 set in the program sequence. In Step (1304) of the program sequence, values, which indicate that the program verifying is scheduled to be executed, number of times of repeating is 0, and an applied voltage to the word line is 6V, are set.

As the information register change notifying signal CHI changed, indicating that the contents of the information register 1132 were changed, the flash memory controller (not illustrated in FIG. 27) which controls the flash memory 1100 in the storage system reads the contents of the information register 1132 so as to set a voltage necessary for the program verifying.

Accordingly, the flash memory controller outside of the flash memory can know an accurate timing of reading the internal operating state (information register value), which can be used as an interrupt signal for the flash memory controller. This facilitates the control by the flash memory controller.

When the voltage necessary for executing the program verifying is generated and supplied to the high voltage power supply terminal VPP2, the flash memory controller sets a signal SET indicating completion of voltage setting to "H" as the flash memory internal operation control signal A4. The power supply voltages supplied to the other high voltage power supply terminals VPP1 and VPP3, which are not used in the flash memory 1100, are not necessarily so high and may be equal to VCC. Therefore, it is unnecessary to activate the high voltage generator circuit to supply the voltages to VPP1 and VPP3 outside of the flash memory 1100. This enables to control the generation of high voltages outside of the flash memory depending on the operation sequence of the flash memory, thereby further reducing power consumption in the storage system.

Step (1310) of the program sequence confirms whether a signal inputted to a SET terminal is set to "H". The signal, if not yet set to "H", is still at an intermediate position on a loop via wait (1312). As soon as the SET signal is set to "H", the program verifying (1314) is executed, and the information register change notifying signal CHI is set to "L" in a following step (1316). This enables to determine a timing of controlling the operation sequence by the controller embedded in the flash memory, facilitating the control of the system.

Step (1318) checks an error bit number of any memory cell where the threshold has not reached a target value and determines whether the program verifying passed an acceptance criteria depending whether the error bit number is zero. If the program verifying failed because of any error bit, in Step (1320), values, which indicate that the program operation is scheduled to be executed, number of times of repeating is 1, an applied voltage to the word line is 10V, pulse widths are 20 us, pulse intervals are 40 us, and an error bit number in the previous program verifying is 8,192 bits, are set in the information register 1132 to execute the program operation, and the information register change notifying signal CHI is set to "H".

In response to the change of the information register change notifying signal CHI, the flash memory controller reads the contents of the information register 1132 to perform a voltage control so that a voltage necessary for the program operation is set. When the voltage necessary for the program operation is generated and supplied to the high voltage power supply terminal VPP1, the flash memory controller sets the signal SET indicating completion of voltage setting to "H" as the flash memory internal operation control signal A4. The power supply voltages supplied to the other high voltage power supply terminals VPP2 and VPP3, which are not used in the flash memory 1100, are not necessarily so high and may be equal to VCC. Therefore, it is unnecessary to activate the high voltage generator circuit to supply the voltages to VPP2 and VPP3 outside of the flash memory 1100.

In Steps (1322, 1324) of the program sequence, it is confirmed that the signal inputted to the SET terminal is set to "H", and the program operation (1326) is executed after the setting to "H". Then, in Step (1328), the information register change notifying signal CHI is set to "L".

After the execution of the program operation (1326), the program verifying needs to be executed. In Step (1330), values indicating that the program verifying is scheduled to be executed, number of times of repeating is 1, and an applied voltage to the word line is 6V are set in the information register 1132 as illustrated in FIG. 30 (1330-1), and the information register change notifying signal CHI is set to "H".

In response to the change of the information register change notifying signal CHI indicating that the contents of the information register 1132 changed, the flash memory controller reads the contents of the information register 1132 to perform a voltage control so that a voltage necessary for the program verifying is set, and then activates the circuit which generates a voltage to be supplied to the high voltage power supply terminal VPP2 alone.

In Step (1310), the voltage necessary for executing the program verifying is set, and the program verifying (1314) is executed after confirming that the signal SET indicating completion of voltage setting is set to "H". Until the verifying passes an acceptance criteria in Step (1318) which confirms a program verifying result, Steps (1310) to (1330) are repeated.

It is known from the contents of the information register illustrated in FIG. 30, (1320-1) to (1330-26) that the program operation and the program verifying were repeated 26 times. Thus, the generation of high voltages can be controlled outside of the flash memory depending on the voltages used in the operation sequence of the flash memory, and power consumption of the storage system can be further reduced.

When the verifying passes the acceptance criteria with the verified error bit being zero in Step (1318) where the program verifying result is confirmed, in Step (1332), a value indicating the next operation is on standby is set in the information register 1132 and the information register change notifying signal CHI is set to "H" to indicate that the contents of the information register 1132 were changed as illustrated in FIG. 29 (1332). Then, the contents of the information register 1122 are set to a value indicating that the operation is completed and a command is acceptable (1334), and the ready/busy RY/BY signal indicating that the flash memory is ready to accept a command is set to "H" (1336).

In Step (1338), the information register change notifying signal CHI is set to "L", and the auto program operation is completed (1340). The contents of the information register 1132 include the verified error bit so that the flash memory controller can terminate the auto program operation when the verified error bit number is equal to or smaller than a predefined bit number although the program verifying failed.

Thus, the generation of high voltages can be controlled outside of the flash memory depending on the voltages used in the operation sequence of the flash memory, and power consumption of the storage system can be further reduced.

Figure 31:
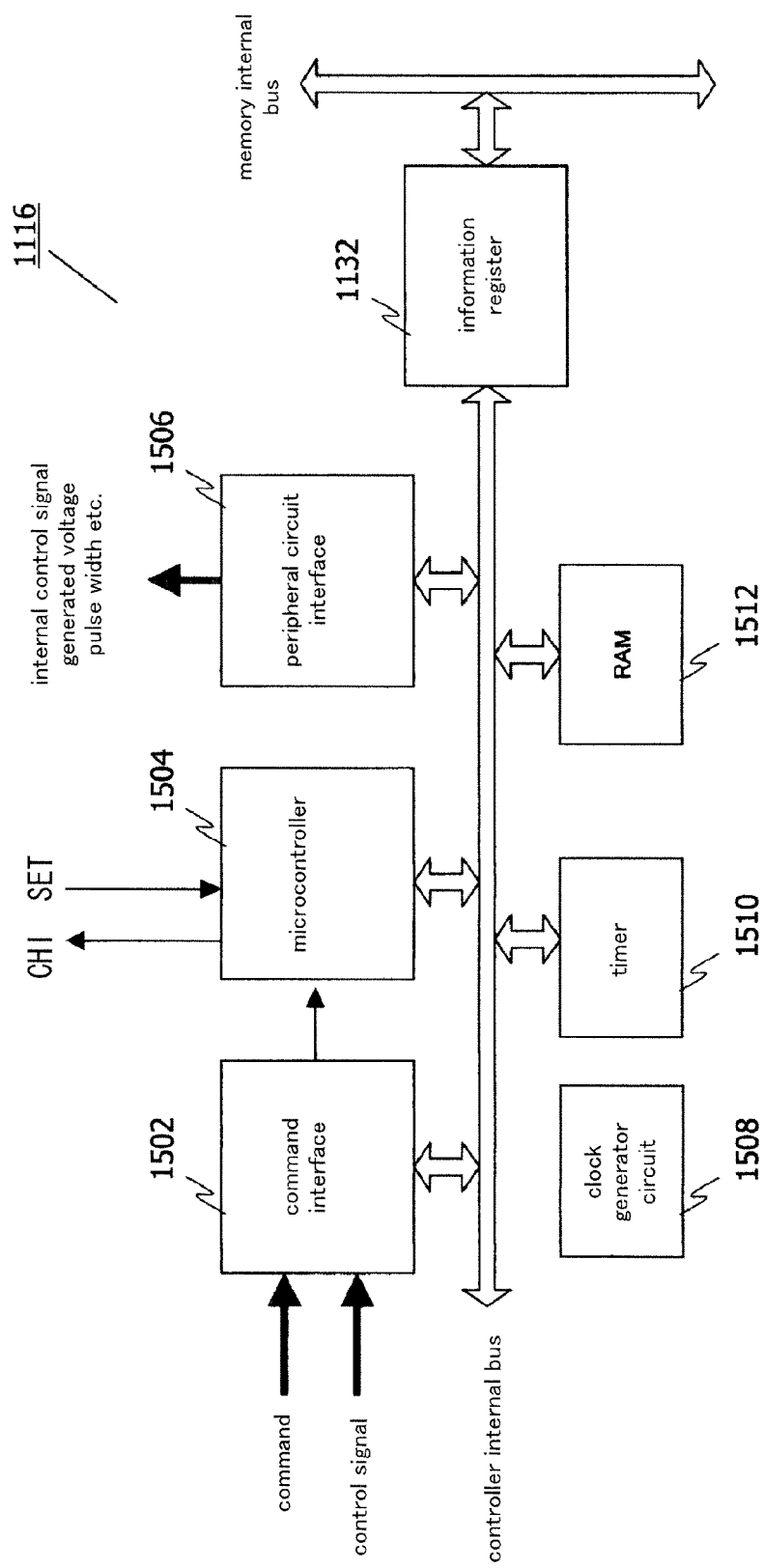
FIG. 31 is a specific circuit configuration of a controller.

FIG. 31 illustrates a specific example of the controller 1116 to execute the sequence illustrated in FIG. 29. A command interface 1502 receives a command signal from a command register 1118 and a control signal from a control logic 1114 to control operation modes of the respective blocks. A microcontroller 1504 receives a signal from the command interface 1502 to execute operation commands written in a RAM 1512 depending on the operation modes and outputs an internal control signal and a voltage application control signal for controlling the respective blocks in the memory through a peripheral circuit interface 1506.

All of the commands for executing the operation sequence illustrated in FIG. 29 are stored in the RAM 1512. The microcontroller 1504 outputs control signals of the respective internal blocks depending on the operation modes. Further, the microcontroller 1504 sets such information that is illustrated in FIG. 30 and outputs the signal CHI to externally notify that the contents set in the information register 1132 were changed in an information register setting step of the operation sequence. The SET signal transmitted from the flash memory controller externally provided is inputted as the control signal of the microcontroller 1504 and used to control the step executions in the operation sequence illustrated in FIG. 29.

A reference numeral 1508 in the illustration of FIG. 31 is a clock generator circuit which generates a clock signal for operating the microcontroller 1504. A timer 1510 generates a timing signal necessary for the operation of the controller 1116 using the clock signal.

In the system provided with the high voltage generator circuit outside of the memory and the flash memory in which the operation sequence is executed by the internal controller, the terminals for outputting the internal operating state (information register value) generated by the controller are provided to output the internal operating state outside. Accordingly, the flash memory controller activates the voltage generator circuit needed for the internal operation alone to supply the voltage to the flash memory to enable any necessary operation. Therefore, the power supply circuits unused for the internal operation are left inactive to avoid unnecessary current consumption. This is very advantageous for reduction of power consumption in the system.

According to the working example, the high voltage power supply terminals are three terminals, VPP1, VPP2, and VPP3 for receiving the voltage for program/erasing, voltage for verifying, and voltage for reading. The voltage for program/erasing and the voltage for verifying may be supplied by one power supply terminal so that two high voltage power supply terminals in total are provided, which, however, complicates the control of the outside power supply and undermines the effect of reduction of power consumption. The high voltages necessary for the operation of the flash memory can be generated outside of the flash memory, and reduction of power consumption can be easily accomplished in any storage systems where a large number of flash memories are used.

Any other voltages necessary in the internal circuit during the program and erasing operations in the flash memory may also be generated outside with more high voltage power supply terminals. This further reduces power consumption, however, increases the terminals of the flash memory. The high voltages can be supplied from a plurality of types of high voltage generator circuits outside of the flash memory, and operations of the plurality of types of high voltage generator circuits are finely controlled depending on the operating state of the flash memory. As a result, power consumption can be further reduced.

In the flash memory block according to the working example illustrated in FIG. 27, the contents of the information register are read through the IO terminal for command/address input and data input/output, so that the internal operating state (information register value) can be outputted outside without any increase of the terminals. As a result, reduction of power consumption can be accomplished without increasing wirings between the flash memory controller and the flash memories in any systems provided with a large number of flash memories. To read the contents of the information register, an information register reading command is prepared as illustrated in FIG. 32.

Working Example 16

A working example 16 of the invention describes a flash memory block illustrating a second example of the nonvolatile semiconductor storage device according to the invention which is illustrated in FIG. 33. With reference to FIG. 33, a dedicated reading terminal Info is provided so that the contents of the information register 1132 are readable without any restrictions irrespective of a status of use of the terminal. Accordingly, the contents of the information register 1132 can be read from outside irrespective of the memory internal operation, which loosens timing restrictions for reading the internal operating state (information register value) from outside of the flash memory. Therefore, the flash memory controller outside of the flash memory can read the contents of the information register 1312 not only when the information register change notifying signal CHI indicating the change of contents changed but also whenever the flash memory controller is required to do so. Thus, it is controllable whether the power supply circuit should be on standby. As a result, power consumption during the operation can be further reduced.

As a result, there are no timing restrictions for the flash memory controller to read the internal operating state of the flash memory (information register value), thereby increasing a degree of freedom in controlling the high voltage generator circuit.

With reference to the illustrations of FIGS. 27 and 33, the internal operating state (information register value) generated by the controller of the flash memory is outputted. Accordingly, the flash memory controller controls the voltage generator circuit depending on the internal operation of the flash memory, thereby enabling to reduce power consumption in any storage systems provided with flash memories.

It further reduces power consumption to control the external voltage generator circuit depending on power consumption characteristics of flash memories in any storage systems where the flash memories are provided.

It accomplishes a better program performance to control the number of flash memories simultaneously executing the program depending on power consumption characteristics of the flash memories, Working Example 17

Figure 34:
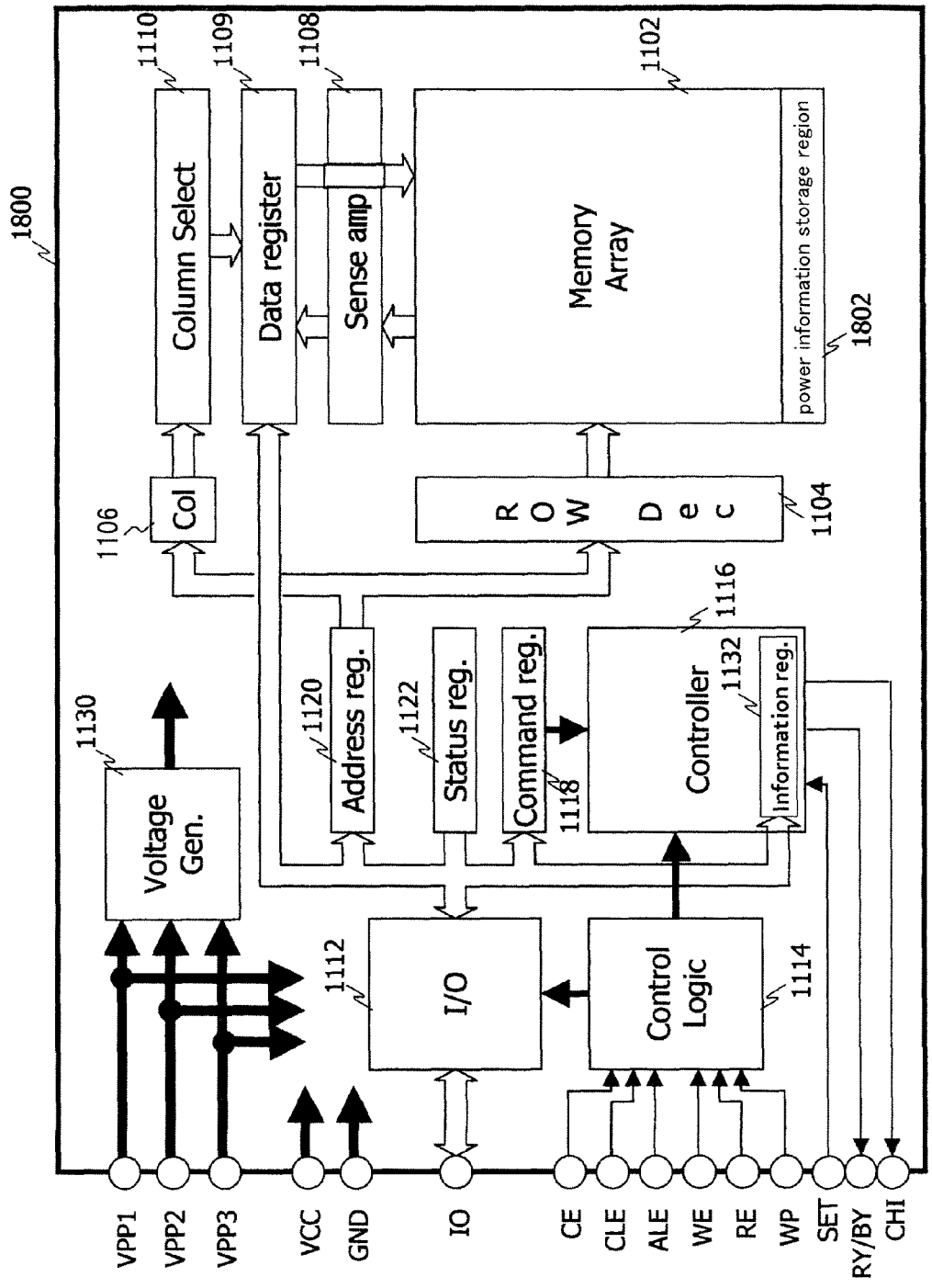
FIG. 34 is a configuration of a flash memory block according to a working example 17 of the invention.

A working example 17 of the invention describes a flash memory illustrating a third example of the nonvolatile semiconductor storage device according to the invention wherein power consumption characteristics of the flash memory can be outputted outside, which is illustrated in FIG. 34.

With reference to FIG. 34, a flash memory 1800 includes a memory cell array 102 serving as a nonvolatile storage region, and a power information storage region 1802 which is chip-specific information storage. As illustrated in FIG. 35, current consumptions in different operation modes of the flash memory 1800 are stored in the power information storage region 1802. The current consumption values may be current values per se or values representing ranks of the current values. The current consumption values are measured and written in an inspection step of a production process of the flash memory. In a storage system where flash memories are used, when the system is turned on, power consumption characteristics of the respective flash memories to be used can be read from the power information storage region 1802 of each of the flash memories and retained in the flash memory controller. Because the chip-specific current consumption characteristics of the flash memories can be thus outputted outside, the storage system provided with the flash memory controller and the high voltage generator circuit can be optimally controlled depending on the current consumption characteristics of the flash memories using the high voltage generator circuit. As a result, power consumption is more effectively reduced.

The current consumption characteristics may be read from the power information storage region 1802 through an IO terminal similarly to the memory cell array 1102, or stored contents of the power information storage region 1802 may be transferred to the information register 1132 when the flash memories are turned on and then read from the information register 1132. This loosens timing restrictions for reading the information stored in the nonvolatile storage region, thereby increasing a degree of freedom for the flash memory controller to read information stored in the nonvolatile storage region.

The flash memory controller can control the voltage generator circuit in the respective operation modes depending on the flash memories to be used, thereby achieving less power consumption in the system. Further, by controlling the number of flash memories concurrently executing the program depending on the current consumption characteristics of the flash memories, program characteristics are improved.

According to the illustration of FIG. 34, the IO terminal is used to read the information from the power information storage region 1802. The storage contents of the power information storage region 1802 may be transferred to the information register 1132 and read irrespective of the memory internal operations through a dedicated reading terminal (Info terminal in the example illustrated in FIG. 33) provided similarly to the working example 16 illustrated in FIG. 33.

Accordingly, the internal operating state of the flash memory (information register value) can be outputted outside without any increase of the terminals. As a result, reduction of power consumption can be accomplished without increasing wirings between the flash memory controller and the flash memories in any systems provided with a large number of flash memories.

This eliminates timing restrictions for the flash memory controller to read the internal operating state of the flash memory, thereby increasing a degree of freedom in controlling the high voltage generator circuit depending on the current consumption characteristics of the flash memories.

The high voltage power supply terminals are three terminals, VPP1, VPP2, and VPP3 for receiving the voltage for program/erasing, voltage for verifying, and voltage for reading. The voltage for program/erasing and the voltage for verifying may be supplied by one power supply terminal so that two high voltage power supply terminals in total are provided. The high voltages necessary for the operation of the flash memory can be generated outside of the flash memory, and reduction of power consumption can be easily accomplished in any storage systems where a large number of flash memories are used.

Any other voltages necessary in the internal circuit during the program and erasing operations in the flash memory may also be generated outside with more high voltage power supply terminals, in which case the operations of the power supply circuits are finely controlled, and power consumption can be further reduced.

The high voltages can be supplied from a plurality of types of high voltage generator circuits outside of the flash memory, and operations of the plurality of types of high voltage generator circuits are finely controlled depending on the operating state of the flash memory. As a result, power consumption can be further reduced depending on the current consumption characteristics of the flash memories.

<50> [Power Supply State Information]

A nonvolatile storage system hereinafter described controls whether a process of an accessed flash memory should start based on a power supply state information received from a power supply circuit for memory system. This is an advantageous technical feature in working examples described below.

Working Example 18

Figure 36:
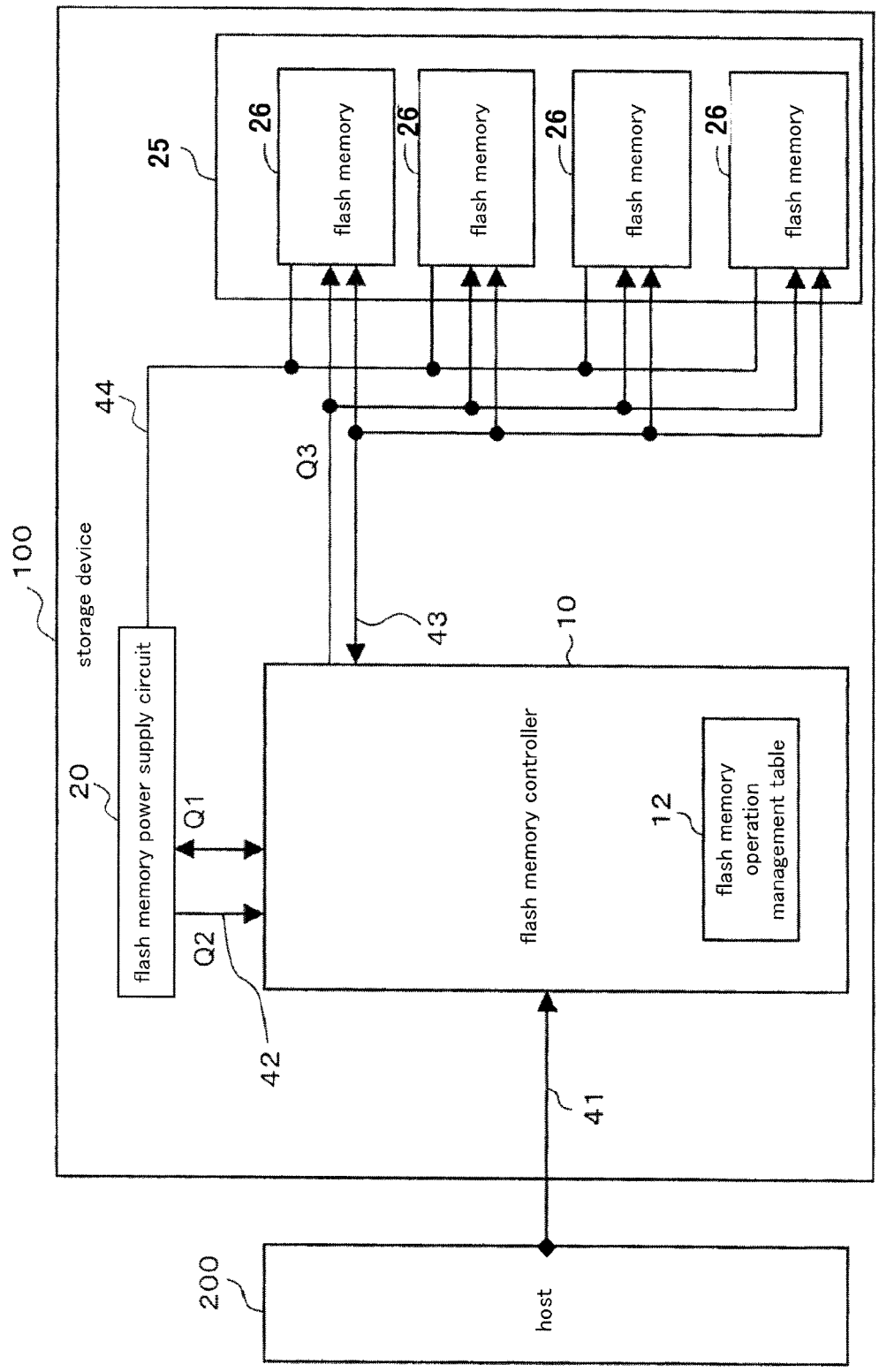
FIG. 36 is a block diagram illustrating structural characteristics of a nonvolatile storage system according to a working example 18 of the invention.

FIG. 36 is a block diagram illustrating structural characteristics of a nonvolatile storage system according to a working example 18 of the invention. A nonvolatile storage system (storage device) 100 has the following structural elements; a flash memory controller (corresponding to the external controller) 10, a power supply circuit (corresponding to the power supply circuit for memory system) 20, and a memory block 25 including plural flash memories 26. A reference numeral 200 is a host. Examples of the host 200 are; personal computer, PDA (Personal Digital Assistant), mobile telephone, digital camera, audio player, automotive navigation device. The host 200 and the flash memory controller 10 are connected to each other through a device control bus 41. The flash memory controller 10 is connected to the power supply circuit 20 by a control bus 42 on which a power supply control signal Q1 and a power supply state notifying signal Q2 are transmitted. The flash memory controller 10 is connected to the plural flash memories 26 by a data bus/control bus 43. Q3 is a flash memory control signal transmitted on the control bus. The power supply circuit 20 is connected to the flash memories 26 by a power supply line 44.

The memory block 25 includes the plural flash memories 26. The flash memory controller 10 has a function to control the power supply circuit 20 and a function to separately control operations of the flash memories 26. The power supply circuit 20 supplies an operating power to each of the flash memories 26 separately. The flash memories 26 may be conventional flash memories each having a predefined operating current value or flash memories each containing information indicating an operating current value thereof.

The power supply circuit 20 has a function to notify the flash memory controller 10 of information of its own power supply state (power supply state information). The power supply state information is superimposed on the power supply state information notifying signal Q2. An example of the power supply state information is driving rate.

The flash memory controller 10 controls the power supply circuit 20 based on the power supply control signal Q1. The control by the flash memory controller 10 includes adjustment of a generated voltage (power supply capacity) of the power supply circuit 20, and output of the power supply state notifying signal Q2 by polling to the power supply circuit 20.

The flash memory controller 10 receives an operation command from the host 200 and accesses one of or a plurality of ones of the flash memories 26 based on the received operation command. When the access is made, the flash memory control signal Q3 is outputted from the flash memory controller to the flash memory 26. When the received operation command is a reading command, data is read from the flash memory 26 and transferred to the host 200. When the received operation command is a writing command, data to be written is transferred from the host 200 and written in the flash memory 26. The data writing is conventionally followed by a data-write verifying process. When the received operation command is an erasing command, data is erased per block in the flash memory 26. The data erasing is conventionally followed by a data-erase verifying process. For example, a required power supply voltage for reading is 5V at a maximum, a required power supply voltage for writing/erasing is 20V at a maximum, and a required power supply voltage for verifying is 10V at a maximum.

While any one of the flash memories 26 is currently executing a process or on standby, the flash memory controller 10 receives the power supply state notifying signal Q2 from the power supply circuit 20 and checks a state of power supply (driving rate) of the power supply circuit 20 based on the received power supply state information. Further, the flash memory controller 10 determines whether any ones of the accessed flash memories 26 fail to execute processes to be executed within the range of a rated power supply capacity of the power supply circuit 10. When determined that the processes are not executable, the flash memory controller 10 controls a part of the accessed flash memories 26 so that the processes are executable within the range of the rated power supply capacity of the power supply circuit 10. A means for controlling the flash memories 26 is pausing or a low power mode setting.

The nonvolatile storage system 100 illustrated in FIG. 36 has a configuration of SSD (Solid State Drive). A flash memory operation management table illustrated with a reference numeral 12 will be described in working examples 19 and thereafter.

Figure 37:
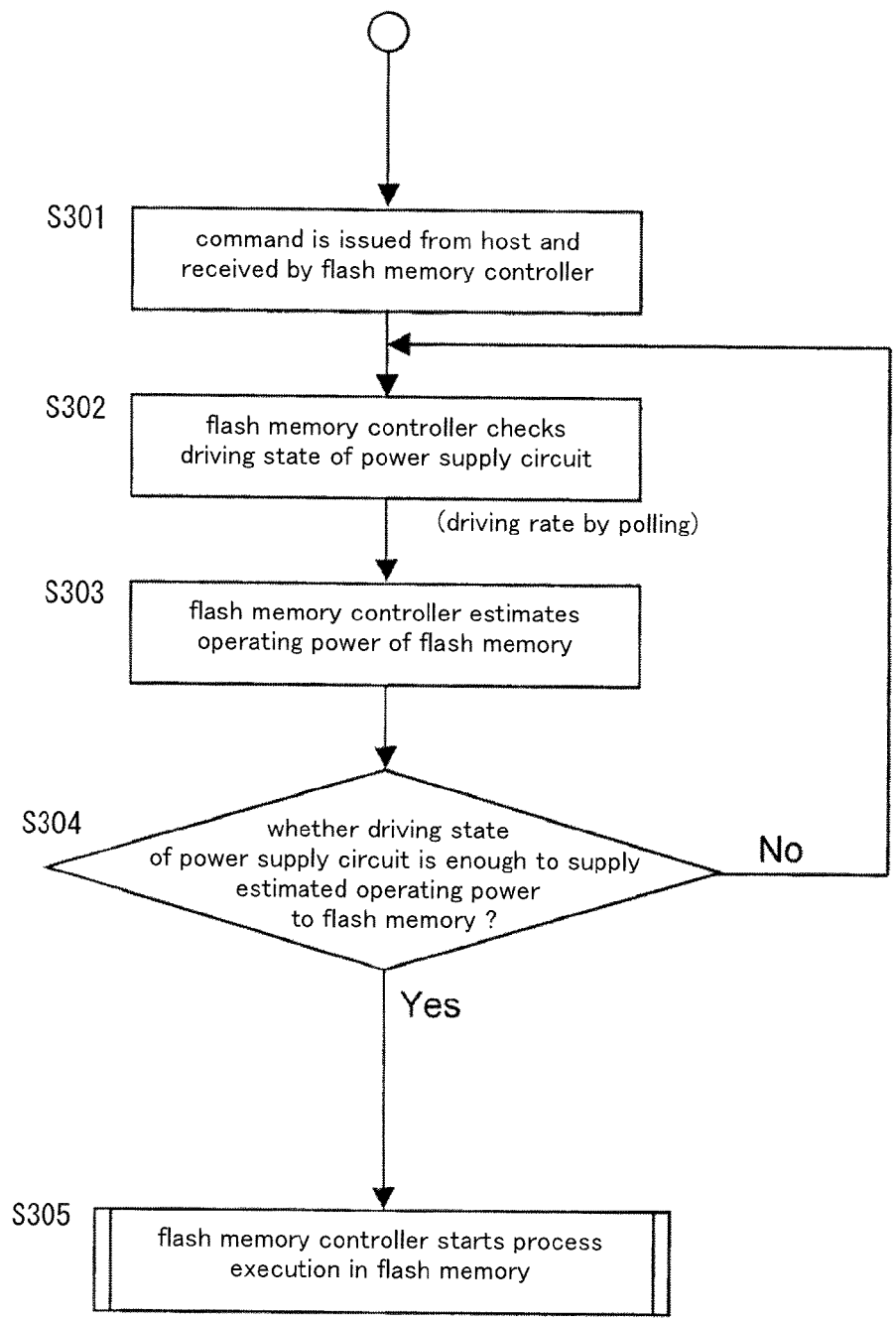
FIG. 37 is a flow chart illustrating an operation of the nonvolatile storage system according to the working example 18.

An operation of the nonvolatile storage system 100 thus configured is described with reference to a flow chart illustrated in FIG. 37. In response to a command outputted from the host 200 externally provided, the flash memory controller 10 starts to control the flash memories 26.

In Step S301, the flash memory controller 10 receives a command from the host 200. The command may be an arbitrary one of a reading command, a writing command, an erasing command, a data-write verifying command, and a data-erase verifying command.

In Step S302, the flash memory controller 10 checks the state of power supply. To check the state of power supply, the flash memory controller receives the power supply state notifying signal Q2 from the power supply circuit 20 and knows the state of power supply of the power supply circuit 20 (present driving rate) based on the power supply state information obtained from the received signal.

In Step S303, the flash memory controller 10 estimates an operating power needed by a type of process such as reading or writing to be executed by the accessed flash memory 26. The processing steps are specifically as follows.

When a data writing command indicating a process to be executed next is outputted from the host 200 and received by the flash memory 26, the flash memory controller 10 decides that data is written in the memory array of the flash memory 26. Depending on which one of the flash memories 26 is selected for data writing, the flash memory controller 10 determines an operating current generated in the flash memory 26 based on information of a predefined operating current value or an operating current value read from the flash memory 26. When the operating current of the flash memory 26 is 50 mA, for example, a current in total for writing data in two flash memories 26 is estimated at 100 mA.

In Step S304 that follows Step S303, the flash memory controller 10 compares the estimated operating current to the present driving rate obtained from the power supply state information to determine whether the present driving rate of the power supply circuit 20 can afford the estimated operating power. The operating power and the driving rate thus compared and determined are respectively converted to adjust their physical dimensions and scales so that the converted values are properly comparable.

When determined that the present driving rate fails to afford the estimated operating power if a process is immediately executed in another flash memory 26 newly accessed, the flash memory controller 10 does not proceed to Step S305 but returns to Step S302 to repeat Steps S303 and S304. As far as Steps S302 to jS304 are repeated, the process of the flash memory 26 newly accessed does not start in Step S305. In the operation example described here, data writing does not start before the power supply reaches a sufficient level. In the background, the processes of the other flash memories 26 are advancing, and a part of the processes will be completed over time. Therefore, the present driving rate will be able to afford the estimated operating power as these steps are repeatedly carried out. Then, the flash memory controller 10 proceeds to Step S305. In Step S305, the flash memory controller 10 shifts to a process execution routine to start to execute the process in the flash memory 26, which is data writing in the operation example. According to the operation example, the overload control is waiting of the flash memory 26 newly accessed (pausing).

According to the working example, the power supply capacity of the power supply circuit 20 is checked, and the process of the flash memory 26 is left on standby when determined as not possible to operate the flash memory 26 within the defined range of the power supply capacity and starts to be executed as soon as the process is executable within the defined range of the power supply capacity along with decrease of power usage while the operation of the flash memory 26 is postponed. This avoids abnormal states such as data loss or data garbling caused by an operational instability or system crash due to, for example, overload of the power supply circuit 20 while the process is being executed in the flash memory 26, thereby ensuring a high data reliability of the system as a storage device.

According to the working example, the power supply circuit 20 has a dedicated terminal for the signal line of the power supply state notifying signal Q2 to confirm the state of power supply of the power supply circuit 20. As an alternative means, a register provided in the power supply circuit 20 (power supply state information) may be monitored through the bus of the power supply control signal Q1 to confirm the state of power supply of the power supply circuit 20.

Hereinafter are described working examples premised on <50>. The respective working examples use the "power supply state information of <50>, which, however, is not recited in titles of the working examples.

<51> [Process in Execution]*[Polling]*[Pausing]

In the nonvolatile storage system recited in <50>, the flash memory controller is preferably configured as described below in the case where the power usage of the memory block causes overload relative to the power supply capacity of the power supply circuit for memory system while the process is being executed in the accessed flash memory. The flash memory controller is preferably configured to actively inquire the state of power supply of the power supply circuit by polling to receive the power supply state information from the power supply circuit.

The flash memory controller determines whether the state of power supply of the power supply circuit (driving rate) is above a specific level based on the power supply state information received from the power supply circuit. When determined that the state of power supply is above the specific level, the flash memory controller pauses a process executed in response to a command in a particular flash memory of the memory block. The flash memory controller continues to monitor the power supply state information to determine whether the power supply circuit can afford to supply enough power. Because the process executed in the flash memory is paused beforehand, the processes in the other flash memories are advancing, and there will be an enough power supply when a part of the ongoing processes executed in the other flash memories are completed over time. When the flash memory controller determines that an enough power supply is secured, the flash memory controller restarts the operation of the paused flash memory.

Summarizing the description given so far, the nonvolatile storage system is characterized in that the flash memory controller of the nonvolatile storage system recited in <50> pauses a process executed in a particular flash memory of the memory block when determined based on the power supply state information received from the power supply circuit by polling that the state of power supply is equal to or larger than a specific level, and the flash memory controller restarts the paused process of the flash memory when determined based on the power supply state information that the power supply circuit can afford to supply enough power.

While the processes are being executed in the flash memories, the state of power supply of the power supply circuit is detected beforehand by polling, and the process of a particular flash memory is dynamically paused. This avoids an operational instability or system crash due to such a problem as overload, thereby providing a better data reliability in the accessed memories.

A specific example of <51> is hereinafter described as a working example 19 of the invention.

Working Example 19

Figure 38:
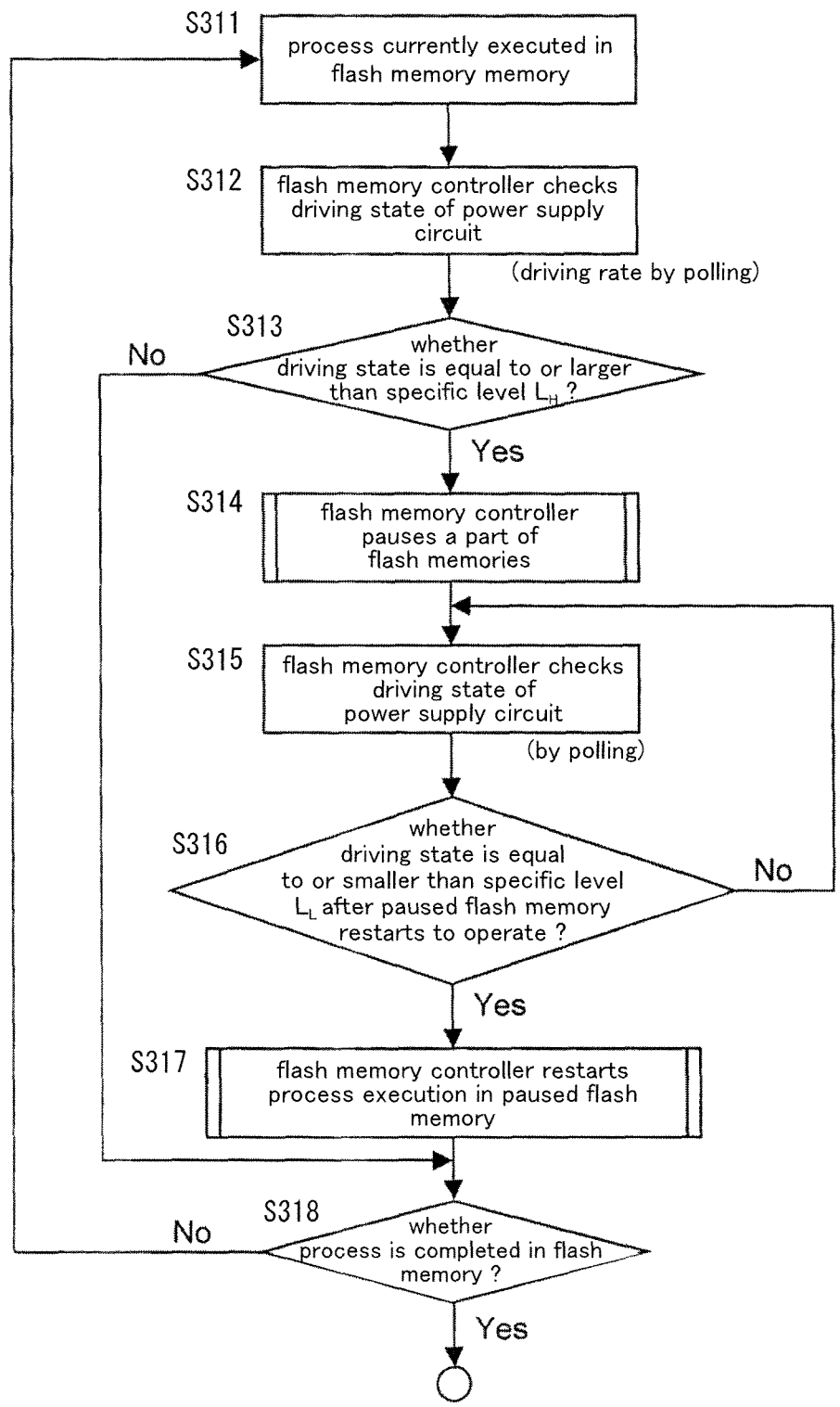
FIG. 38 is a flow chart illustrating an operation of a nonvolatile storage system according to a working example 19 of the invention.

A nonvolatile storage system according to a working example 19 of the invention is configured similarly to the illustration of FIG. 36. FIG. 38 is a flow chart illustrating an operation of the nonvolatile storage system according to the working example 19. According to the working example, the flash memories are configured to pause their operations while the processes are being executed therein when requested from outside.

The flash memory controller 10 has a flash memory operation management table 12. FIG. 39 illustrates an example of the flash memory operation management table 12. The flash memory operation management table 12 contains information of operation priority order ranking, state of flash memory, current consumption, process starting order of each of the flash memories 26. The states of the flash memories are writing, erasing, reading, verifying, and pausing. The data transmitted from the host 200 and data received from the flash memories 26 are stored in the flash memory operation management table 12.

The priority order ranking of the operations is decided based on the process starting order. The priority order of a process is lower as the process starts earlier. The priority order ranking and the process starting order are thus in a reverse relationship. As the current consumption are used a predefined current value or current values individually set.

The data managed by the flash memory operation management table 12 is updated as the processes executed in the accessed flash memories 26 are advancing. Whatever the process, writing or erasing, currently executed is over, the state is updated to "pausing".

The flash memory controller 10 controls the plural flash memories 26 so that the processes are executed at the same time. The flash memory controller 10 has the flash memory operation management table 12 for management of the operating states of the plural flash memories 26. Any other structural and technical characteristics are similar to those of the working example 18.

An operation of the nonvolatile storage system according to the working example thus characterized is hereinafter described. Assuming that the processes are being executed in some flash memories 26, in Step S311, the flash memory controller 10 are controlling the flash memories 26 for the processes executed therein.

In Step S312, the flash memory controller 10 checks the state of power supply of the power supply circuit 20. More specifically, the flash memory controller 10 makes an inquiry to the power supply circuit 20 by polling to receive the driving rate from the power supply circuit 20 as the power supply state information, thereby knowing the driving rate. The polling is performed by using the power supply control signal Q1, and the power supply state information is notified by using the power supply state notifying signal Q2.

In Step S313, the flash memory controller 10 determines whether a present driving rate is equal to or larger than a specific upper-limit level $L_H$. The flash memory controller 10 proceeds to Step S314 when determined that the driving rate is equal to or larger than the specific upper-limit level $L_H$, while jumping to Step S318 when determined otherwise. By determining whether the present driving rate is equal to or larger than the specific upper-limit level $L_H$, the flash memory controller 10 is actually checking whether the power supply circuit 20 is reaching the limit of its power supply capacity, possibly causing overload. If peak currents in the accessed flash memories are overly high, causing overload for a certain period of time, system crash, data loss, and/or data garbling possibly occur. The occurrence of any of these unfavorable events is predicted beforehand and prevented from happening.

When determined that the present driving rate is equal to or larger than the specific upper-limit level $L_H$ and the flash memory controller 10 proceeds to Step S314, the flash memory controller 10 refers to the flash memory operation management table 12 to pause the process executed in a particular flash memory 26 currently accessed. The pausing avoids the overload from continuing any further.

In Step S315, the flash memory controller 10 checks the state of power supply of the power supply circuit 20 again. More specifically, the flash memory controller 10 makes an inquiry to the power supply circuit 20 by polling to receive the power supply state information from the power supply circuit 20 and knows the present driving rate from the received power supply state information.

In Step S316, the flash memory controller 10 determines whether a driving rate higher than the present driving rate when the flash memory controller 10 decides to restart the operation of the flash memory 26 paused in Step S314 is equal to or smaller than a specific lower-limit level $L_L$. The specific lower-limit level $L_L$ is lower than the specific upper-limit level $L_H$ in Step S313. The specific lower-limit level $L_L$ is used as a decision criterion on whether there is an enough power supply. The flash memory controller 10 returns to Step S315 when determined that the driving rate is not equal to or smaller than the specific lower-limit level $L_L$, while proceeding to Step S317 otherwise.

Because the process in the flash memory 26 is paused in Step S314, the driving rate of the power supply circuit 20 is on the decrease over time. When determined in Step S316 that the driving rate on the decrease is finally equal to or smaller than the specific lower-limit level $L_L$, the flash memory controller 10 proceeds to Step S317 to restart to execute the process in the flash memory 26 paused in Step S314. In Step S318, the flash memory controller 10 determines whether the process in the flash memory 26 is completed. The flash memory controller 10 returns to Step S311 to continue to execute the processes if uncompleted, while departing from the routine of FIG. 38 when determined that the process is completed.

Giving a specific example of the operation, the specific upper-limit level $L_H$ and the specific lower-limit level $L_L$ are tentatively set to 90% and 80%, respectively. These numeral values are arbitrarily changeable.

The driving rate of 90% or more suggests the possibility of an operational instability due to overload. In the event of the driving rate equal to or larger than 90%, the flash memory controller 10 pauses the operation of the flash memory 26 where the process is currently in execution (Steps S313-S314).

For example, the power supply circuit 20 has the driving capacity of 500 mA and the driving rate is estimated at 90% thereof, 450 mA, or more, the operation of one of the flash memories 26 is paused, in which case the operation of the last flash memory 26 in the priority order ranking which started the process earlier than any other flash memories is paused. In the illustration of FIG. 39, the operation of a flash memory A with "8" in the priority order ranking is paused.

After that, the power supply state is checked. When determined that the driving capacity is equal to or lower than a specific level (for example, 80%), creating an enough power supply even after the paused process of the flash memory 26 is restarted, the flash memory controller 10 restarts the paused process of the flash memory 26.

80% of the driving capacity 500 mA of the power supply circuit 20 is 400 mA. Supposing that the state of power supply of the power supply circuit 20 falls to 349 mA, the current consumption of the flash memory A is 50 mA, and the state of power supply of the power supply circuit 20 when the operation of the flash memory A is restarted is 349+50=399 mA. This is the driving state blow 400 mA which is 80% of the driving capacity. After confirming that the state of power supply of the power supply circuit 20 is below 350 mA, the operation of the flash memory A paused so far can be restarted.

According to the working example, the likelihood of overload of the power supply circuit 20 is detected before the overload occurs by polling while the processes are being executed. Whenever detected, the operation of the flash memory 26 is paused. This effectively reduces the operating power consumed by the flash memories 26 and accordingly avoids any instability or abnormal states of the operations of the flash memories 26 due to an operational instability or system crash, thereby ensuring a better data reliability. When the operation of the flash memory 26 is thus paused, it takes a less waiting time for the process to be restarted in the normal mode than continuously running the flash memories 26 in the low power mode.

<52> [Process in Execution]*[Interrupt]*[Pausing]

In the nonvolatile storage system recited in <50>, it is preferable to configure the flash memory controller and the power supply circuit as described below by employing interrupt in place of polling described in <51> in the case where the power usage of the memory block is excessively large for the power supply capacity of the power supply circuit, and. The flash memory controller is notified of the power supply state information of the power supply circuit by interrupt initiated by the power supply circuit in place of polling by the flash memory controller described in <51>, wherein an interrupt signal is used as the power supply state information. A description hereinafter given describes the interrupt-based control while the processes are being executed in the accessed flash memories.

The power supply circuit is constantly monitoring its own internal state. When the power usage of the accessed flash memories is too large for the present driving rate, the power supply circuit generates the interrupt signal as the power supply state notifying signal and outputs the generated interrupt signal to the flash memory controller. The interrupt signal is generated immediately after the state of power supply of the power supply circuit changed.

When the flash memory controller receives the interrupt signal from the power supply circuit, the flash memory controller pauses a process currently executed in a particular flash memory of the memory block. The operation of the flash memory controller after the flash memory is paused is similarly to <51>.

The flash memory controller continues to monitor the power supply state information (driving rate) to determine whether the power supply circuit can afford supply enough power. Because the process executed in the flash memory is paused beforehand, the processes in the other flash memories are advancing, and there will be an enough power supply when a part of the ongoing processes executed in the other flash memories are completed over time. When determined that an enough power supply is secured, the flash memory controller restarts the operation of the flash memory previously paused.

Summarizing the description given so far, the nonvolatile storage system is characterized in that the power supply circuit of the nonvolatile storage system recited in <50> generates the interrupt signal when the power supply state being monitored is equal to or larger than a specific level and outputs the generated interrupt signal to the flash memory controller. The flash memory controller that received the interrupt signal from the power supply circuit pauses a process of a particular flash memory of the memory block, and the flash memory controller that received the power supply state information by polling restarts to execute the process of the flash memory previously paused when determined that the power supply circuit can afford to supply enough power based on the received power supply state information.

The flash memory controller uses the interrupt signal associated with the changing state of power supply of the power supply circuit to detect the likelihood of overload of the power supply circuit. This makes it unnecessary for the flash memory controller to monitor the power supply circuit by polling, thereby alleviating a processing load. Further, the receipt of the interrupt signal immediately leads to the detection of overload with no time lag, enabling a fast response.

A specific example of <52> is hereinafter described as a working example 20 of the invention.

Working Example 20

Figure 40:
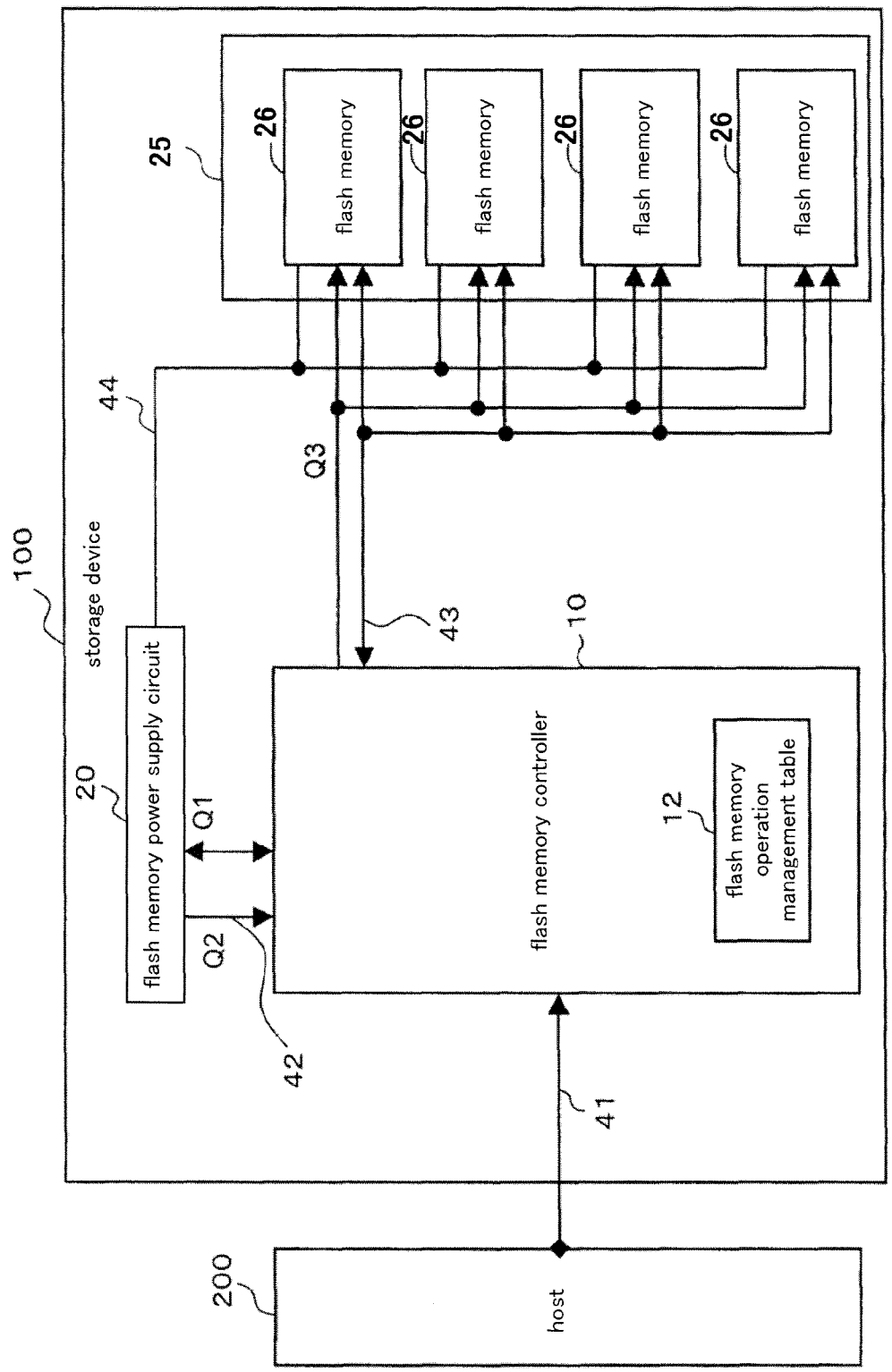
FIG. 40 is a block diagram illustrating structural characteristics of a nonvolatile storage system according to a working example 20 of the invention.

FIG. 40 is a block diagram illustrating structural characteristics of a nonvolatile storage system according to a working example 20 of the invention. This illustration is different to FIG. 36 in that the power supply state notifying signal Q2 of FIG. 36 is replaced with an interrupt signal Q2. The power supply circuit 20 is constantly monitoring its own internal state while the processes are being executed in the flash memories 26. Then, when the power usage of the accessed flash memories 26 is excessively large for the present state of power supply (driving rate) and the driving rate finally exceeds a predefined value, the power supply circuit 20 generates the interrupt signal Q2 indicating that the state of power supply changed and outputs the generated interrupt signal Q2 to the flash memory controller 10. The flash memory controller 10 that received the interrupt signal Q2 pauses the operation of a particular flash memory 26 currently executing a process. Any other structural and technical characteristics are similar to those of FIGS. 36 and 39.

Next, an operation of the nonvolatile storage system according to the working example thus characterized is described below. The flash memory controller 10 sets a power supply condition for pausing the process of the accessed flash memory 26 (for example, driving rate 90%) in the power supply circuit 20 as an interrupt condition before the process of the accessed flash memory 26 starts. The interrupt condition may be fixedly set. When the state of power supply reaches the interrupt condition, (driving rate 90%), the power supply circuit 20 outputs the interrupt signal Q2 indicating that the state of the power supply circuit 20 changed to the flash memory controller 10.

Figure 41:
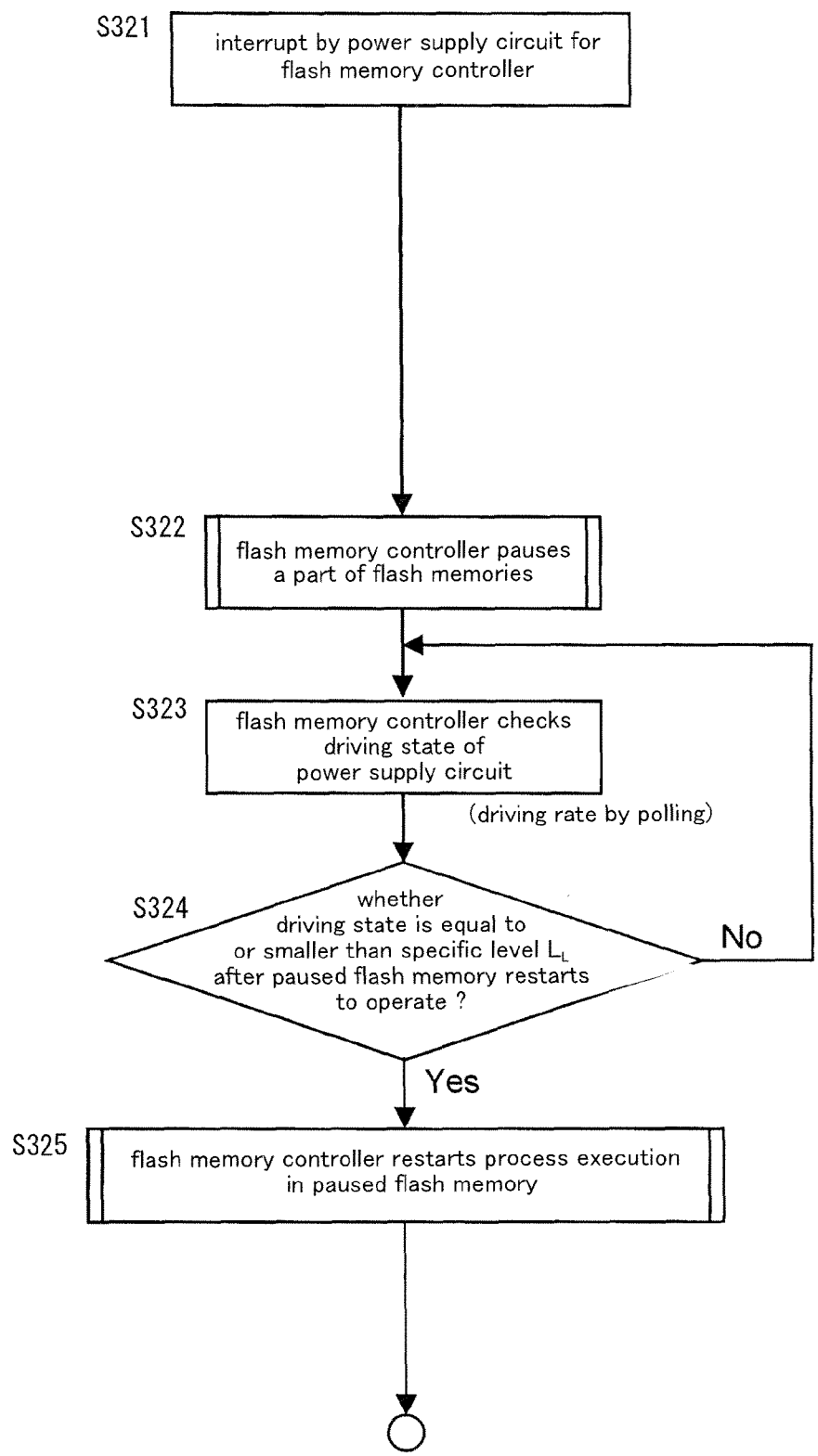
FIG. 41 is a flow chart illustrating an operation of the nonvolatile storage system according to the working example 20.

Hereinafter, the operation of the nonvolatile storage system according to the working example 20 is described with reference to a flow chart illustrated in FIG. 41. Supposing that processes are currently executed in some flash memories 26, the flash memory controller 10, in Step S321, confirms that the interrupt signal Q2 indicating that the state of the power supply circuit 20 changed was outputted from the power supply circuit 20 to the flash memory controller 10.

In Step S322, the flash memory controller 10 refers to the flash memory operation management table 12 to pause the operation of the flash memory 26 currently executing the process. More specifically, the operation of the flash memory 26 ranked lowest in the priority order is paused. Steps S323, S324, and S325 are similar to Steps S315, S316, and S317 illustrated in FIG. 38. In Step S323, the flash memory controller 10 checks the state of power supply of the power supply circuit 20 again. More specifically, the flash memory controller 10 makes an inquiry to the power supply circuit 20 by polling to receive the power supply state information from the power supply circuit 20 in the form of the power supply state notifying signal Q2. Then, the flash memory controller 10 knows the present driving rate of the power supply circuit 20 from the received power supply state information.

In Step S324, the flash memory controller 10 determines whether a driving rate higher than the present driving rate when the flash memory controller 10 decides to restart the operation of the flash memory 26 paused in Step S322 is equal to or smaller than a specific lower-limit level $L_L$. The flash memory controller 10 returns to Step S323 when determined that the driving rate is not equal to or smaller than the specific lower-limit level $L_L$, while proceeding to Step S325 otherwise. Because the process of a flash memory 26 is already paused in Step S322, the driving rate of the power supply circuit 20 is on the decrease over time.

When determined in Step S324 that the driving rate on the decrease is finally equal to or smaller than the specific lower-limit level $L_L$, the flash memory controller 10 proceeds to Step S325 to restart to execute the process in the flash memory 26 paused in Step S322. According to the working example characterized by the interrupt-based control, the flash memory controller 10 departs from the routine after S325.

According to the working example, Steps S312 and S313 illustrated in FIG. 38 according to the working example 1, which are the processes for checking whether the driving rate of the power supply circuit 20 is equal to or larger than 90% by polling by the flash memory controller 10, are unnecessary. The working example makes it unnecessary for the flash memory controller 10 to check the voltage level as described in the working example, thereby alleviating a processing load. Further, a there is little time lag between the receipt of the interrupt signal Q2 and pausing, enabling a fast response.

<53> [Process in Execution]: [Data Controller and Power Supply Controller]

In the nonvolatile storage system recited in <50>, the flash memory controller may be divided in two structural elements, a data controller and a power supply controller. The data controller is in charge of controlling data processes in the flash memories, wherein the processes executed in the flash memories are separately controlled. The power supply controller is in charge of controlling power supply by the power supply circuit. When determined based on the power supply state information received from the power supply circuit that processes are not properly executable in the accessed flash memories within the range of a rated power supply capacity of the power supply circuit, the power supply controller controls a part of the accessed flash memories to reduce power usage so that the processes are properly executable within the range of the rated power supply capacity. The power supply circuit notifies the power supply controller of its own state of power supply. The power supply state information may be notified by polling by the power supply controller or interrupt initiated by the power supply circuit.

Summarizing the description given so far, the nonvolatile storage system is characterized in that the flash memory controller of the nonvolatile storage system recited in <50> includes a data controller in charge of separately controlling processes executed in the flash memories and a power supply controller in charge of controlling power supply by the power supply circuit, wherein the power supply controller, the power supply controller controls a part of the accessed flash memories to reduce power usage so that the processes are properly executable within the range of a rated power supply capacity of the power supply circuit when determined based on the power supply state information received from the power supply circuit that processes are not properly executable in the accessed flash memories within the range of the rated power supply capacity.

According to the nonvolatile storage system thus characterized, in contrast to any conventional systems wherein the flash memory controller is irrelevant to the power supply control but is solely responsible for data control in the flash memories, the flash memory controller including the power supply controller is able to control the power supply. By thus using the existing structural element for another purpose (structurally unchanged), the power supply can be easily and effectively controlled without structurally complicating the whole storage system. The nonvolatile storage system, which utilizes the existing processing function for data control, is further provided with a function for power supply alone. Therefore, conventional systems are usable to accomplish such a nonvolatile storage system.

A specific example of <53> is hereinafter described as a working example 21 of the invention.

Working Example 21

Figure 42:
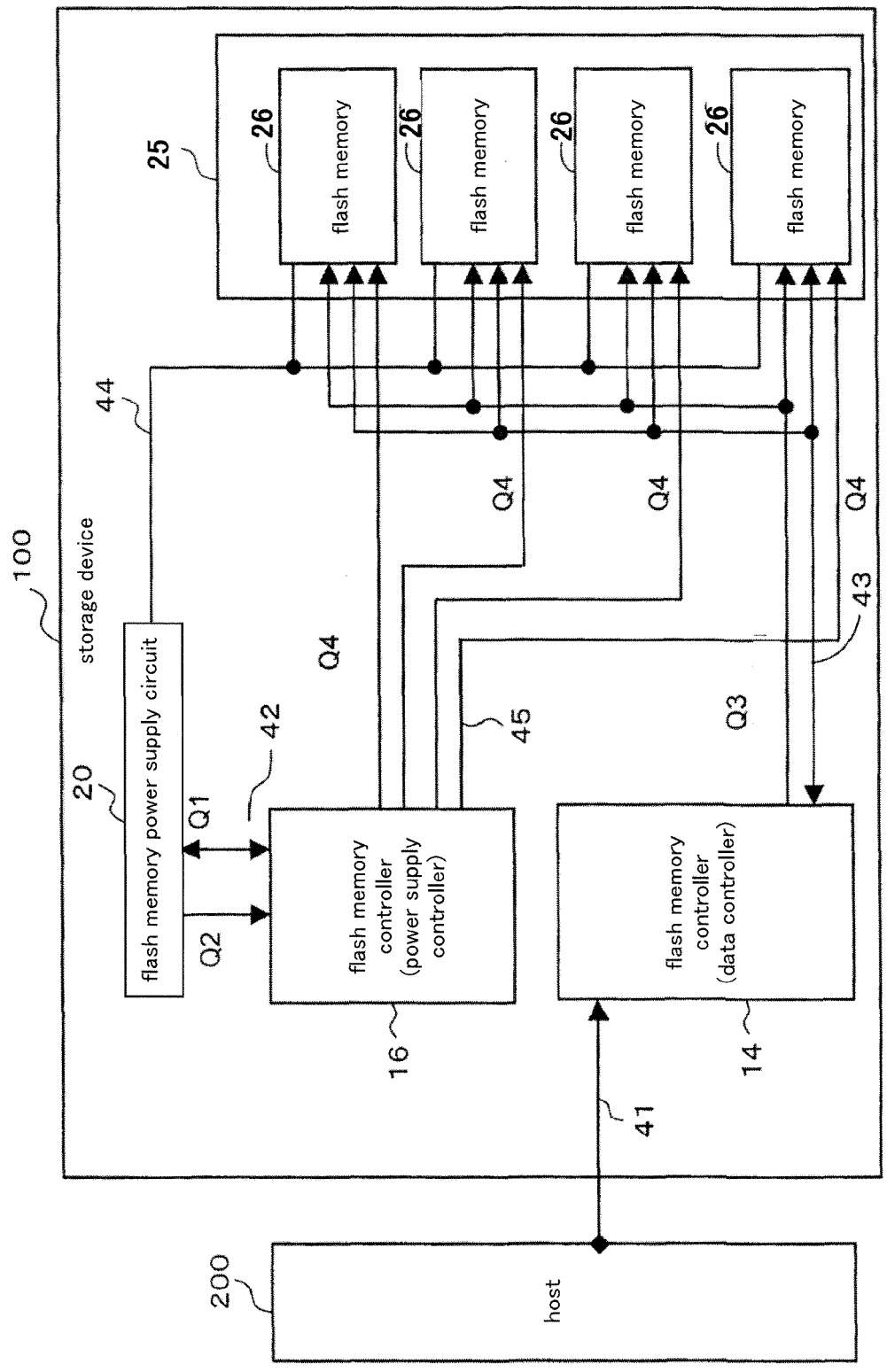
FIG. 42 is a block diagram illustrating structural characteristics of a nonvolatile storage system according to a working example 21 of the invention.

FIG. 42 is a block diagram illustrating structural characteristics of a nonvolatile storage system according to a working example 21 of the invention. The working example divides the flash memory controller into a data controller 14 and a power supply controller 16. The data controller 14 of the flash memory controller is similar to the flash memory controller of conventional systems which is only responsible for data control in flash memories but is irrelevant to the power supply control.

The data controller 14 of the flash memory controller is connected to the host 200 by a device control bus 41. The data controller 14 is connected to a plurality of flash memories 26 by a data bus/control bus 43. A reference symbol Q3 is a flash memory control signal transmitted on the control bus.

The power supply controller 16 of the flash memory controller is connected to the power supply circuit 20 by a control bus 42 on which the power supply control signal Q1 and the power supply state notifying signal Q2 are transmitted. The power supply controller 16 is connected to the respective flash memories 26 by signal lines 45 for a flash memory pause signal Q4. The flash memories 26 each has an input terminal for the flash memory pause signal Q4. The data controller 14 and the power supply controller 16 constitute the flash memory controller 36 illustrated in FIG. 36. Any other structural characteristics, which are similar to those of the illustration of FIG. 36, will not be described again.

Figure 43:
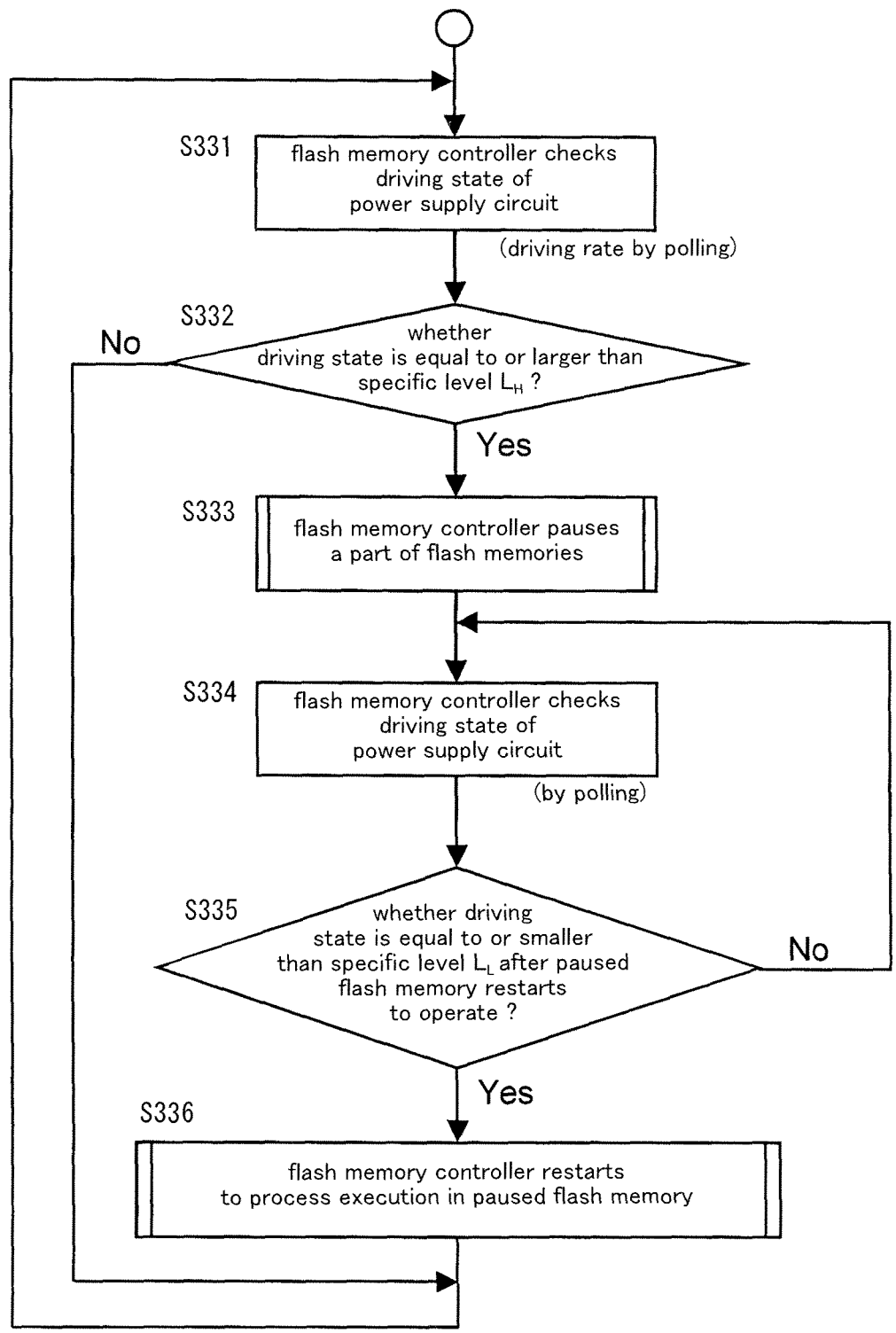
FIG. 43 is a flow chart illustrating an operation of the nonvolatile storage system according to the working example 21.

Next, an operation of the nonvolatile storage system according to the working example thus characterized is described below. FIG. 43 is a flow chart illustrating processing steps of the power supply controller 16 of the flash memory controller. Some of the flash memories 26 are currently executing processes, which is not illustrated in FIG. 43 because the data process control is carried out between the data controller 14 and the flash memories 26.

In Step S331, the power supply controller 16 checks the state of power supply of the power supply circuit 20. More specifically, the power supply controller 16 makes an inquiry to the power supply circuit 20 by polling to receive the power supply state information (driving rate) from the power supply circuit 20 and knows the present driving rate of the power supply circuit 20 from the received information.

In Step S332, the power supply controller 16 determines whether the present driving rate is equal to or larger than the specific upper-limit level $L_H$. The power supply controller 16 proceeds to Step S333 when determined that the present driving rate is equal to or larger than the specific upper-limit level $L_H$, while jumping to Step S336 otherwise. By determining whether the present driving rate is equal to or larger than the specific upper-limit level $L_H$, whether the power supply circuit 20 is reaching the limit of its power supply capacity, inviting the likelihood of overload.

When determined that the present driving rate is equal to or larger than the specific upper-limit level $L_H$ and the power supply controller 16 proceeds to Step S333, the power supply controller 16 pauses the process currently executed in a flash memory 26 currently accessed. This pausing avoids the likelihood of overload.

In Step S334, the power supply controller 16 checks again the state of power supply of the power supply circuit 20. The power supply controller 16 makes an inquiry to the power supply circuit 20 by polling to receive the power supply state information from the power supply circuit 20 and knows the present driving rate of the power supply circuit 20 from the received power supply state information.

In Step S335, the power supply controller 16 determines whether a driving rate higher than the present driving rate when the power supply controller 16 decides to restart the operation of the flash memory 26 paused in Step S333 is equal to or smaller than the specific lower-limit level $L_L$. The power supply controller 16 returns to Step S334 when determined that the driving rate is not equal to or smaller than the specific lower-limit level $L_L$, while proceeding to Step S336 otherwise. Because the process in the flash memory 26 is paused in Step S333, the driving rate of the power supply circuit 20 is on the decrease over time.

When determined in Step S335 that the driving rate on the decrease is finally equal to or smaller than the specific lower-limit level $L_L$, the power supply controller 16 proceeds to Step S336 to restart to execute the process in the flash memory 26 paused in Step S333. Then, the power supply controller 16 returns to Step S331. The power supply controller 16 operating independently from the data controller 14 cyclically performs loop processes from Steps S331 to Steps S336.

The processing steps are more specifically described. Supposing that the driving rate of 90% or more involves the possibility of an operational instability, the power supply controller 16 asserts the flash memory pause signal Q4 (becomes effective) when the driving rate is equal to or higher than 90% and pauses the flash memory 26 currently executing the process (Steps S332-S333).

After that, the power supply controller 16 checks the state of power supply. When determined that the driving capacity is equal to or smaller than a specific level (for example, 80%) after the process of the flash memory 26 currently paused is restarted, the power supply controller 16 clears the flash memory pause signal Q4 to restart the operation of the flash memory 26 currently paused.

These control steps are carried out by the power supply controller 16 of the flash memory controller alone, and the data controller 14 is irrelevant to the processing steps according to the working example. As compared to the conventional nonvolatile storage systems, the power supply controller 16 is additionally provided and connected to the power supply circuit 20 and the flash memories 26. Therefore, any other structural elements of the conventional systems are usable to accomplish such a nonvolatile storage system.

The working example can control the power supply without affecting the data controller 14 of the flash memory controller. The working example thus advantageous can easily control the power supply as compared to the conventional systems focusing on the data control alone without controlling the power supply. As a result, introductory costs can be reduced. The working example is applicable to a system wherein the interrupt signal is used in place of the power supply state notifying signal.

<54> [Prior to Process Start]*[Low Power Shift]

It was so far was described to control the power supply while the processes are being executed in the accessed flash memories. Whenever the likelihood of overload is increasing, probably causing system crash due to imbalance between the power usage of the accessed flash memories and the power supply capacity of the power supply circuit for memory system, the process to be executed in a flash memory is paused.

In a description hereinafter given, the power supply is controlled before a process starts in a newly accessed flash memory to continue the process of the flash memory with reduced power usage (operating current) of a particular flash memory whenever the likelihood of system crash increases. This is a low power shift.

In the nonvolatile storage system recited in <50>, the flash memories have a low power mode, meaning that the flash memories are configured to dynamically change their operating currents. The operations of the flash memories slow down in the low power mode as compared to the normal mode.

When the power supply circuit for memory system cannot afford to supply enough power, the flash memory controller makes a particular one of the process-executing flash memories operate in the low power mode. Failing to secure an enough power supply after one flash memory is shifted to the low power mode, the operation of another flash memory is shifted to the low power mode. Until an enough power supply is secured, the operations of the flash memories are shifted to the low power mode. Based on this technical concept, the process executed in a particular one of the process-executing flash memories may be paused in an early stage when the power supply shortage is predicted.

Summarizing the description given so far, the nonvolatile storage system is characterized in that the flash memories of the nonvolatile storage system recited in <50> are configured to dynamically change operating currents thereof, and when determined that a process is not executable in a newly accessed flash memory within the range of a rated power supply capacity of the power supply circuit, the flash memory controller continues to execute a process in a particular one of the process-executing flash memories with reduced power usage or pauses the process, and restarts to execute the process in the newly accessed flash memory when the reduction of power usage enables to execute the process within the range of the rated power supply capacity.

By thus controlling the power usage of the flash memory in response to the power supply capacity of the power supply circuit in the system, an operational instability or system crash due to such problems as overload of the power supply circuit is prevented from happening, which ensures an improved data reliability. Because the process currently executed in the flash memory is continued on principle at a lower processing speed, a processing capacity of the system is not overly degraded. In other words, the operation of the system can be more finely controlled.

A specific example of <54> is hereinafter described as a working example 22 of the invention.

Working Example 22

Any of the block diagrams of FIGS. 36, 40, and 42 may be quoted as an illustration of structural characteristics of a nonvolatile storage system according to a working example 20 of the invention. According to the working example, the flash memories 26 can change power levels by dynamically changing operating currents thereof. The flash memory controller 10 has a flash memory operation management table 12 for managing operating states of the flash memories 26.

FIG. 44 illustrates an example of the flash memory operation management table 12. The flash memory operation management table 12 contains information of process priority order, state of flash memory, current consumption, process starting order of each of the flash memories 26. The current consumption illustrated in FIG. 39 is replaced with the power level. Though the current consumptions of the flash memories 26 are all equal in the illustration of FIG. 39, there are different current consumptions in the illustration of FIG. 44 for different processes and flash memories, resulting in different power levels. The power levels do not have binary values of "0" and "1" but have at least ternary values. Therefore, the flash memories 26 can change their driving levels to operate at optimum driving levels depending on different situations.

The states of the flash memories are writing process in execution, erasing process in execution, pausing, reading process in execution, and verifying process in execution. The operating currents of the flash memories can be calculated based on the states and the power levels of the flash memories.

In each of writing or erasing process, the power level is changeable depending on contents of the processes (by each flash memory executing the process). The operating current values of the flash memories change at all times. The process starting order starts with the flash memory 26 which executed the process first, followed by the other flash memories 26 in the descending order. "0" is pausing.

The flash memory operation management table 12 is updated when the operation of the flash memory 26 starts and pauses and the operation mode such as power level change is carried out.

The flash memory 26 has a function to convert the power supply state notifying signal Q2 from the power supply circuit 20 into the power level. In the case of the operating power of 20 mA for the power level of "1", a conversion value of the power level is "30" at a maximum in the power supply circuit 20 having the current capacity of 600 mA (60 divided by 20 equals 30). Therefore, the power levels are very finely set from "0" to "30". Any other structural and technical characteristics are similar to those of nonvolatile storage system according to the working example 1.

According to the working example 19 described with reference to FIGS. 38 and 39, wherein all of the flash memories 26 have an equal current consumption, 50 mA, it is not possible to finely adjust the power usage. The only option at the time of overload is to pause the operation of any accessed flash memory. According to the working example wherein four power levels, "0", "1", "2", and "3", are set as illustrated in FIG. 44, the likelihood of overload is not necessarily dealt with by pausing the operation of the accessed flash memory but by adjusting the power level in a phased manner. The power level reduction is an effective means for avoiding the likelihood of overload.

Figure 45:
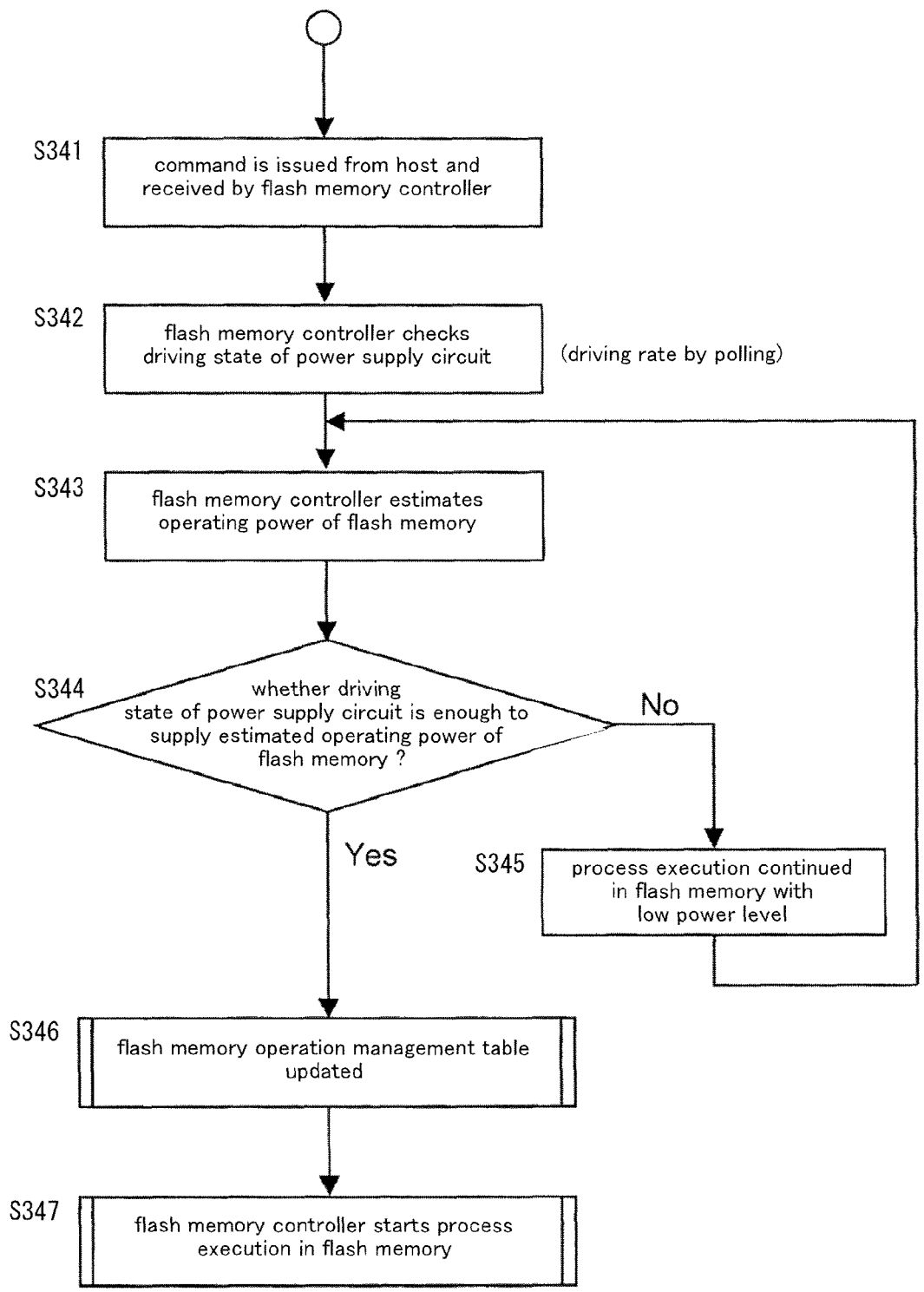
FIG. 45 is a flow chart illustrating an operation of the nonvolatile storage system according to the working example 22.

Next, an operation of the nonvolatile storage system according to the working example is hereinafter described. FIG. 45 is a flow chart illustrating an operation of the flash memory controller 10. The processing details illustrated in the flow chart are applicable to all of the flash memories 26 but are separately applied to each of the flash memories 26. In Step S347 subsequent to Steps S341 to S346, an intended one of the flash memories 26 starts to execute a process, however, a different flash memory 26 already started to execute a process before that.

In response to a command from the host 200 outside, the flash memory controller 10 starts to control the flash memory 26 to be accessed. To start with, the flash memory controller 10 receives in Step S341 a command from the host 200. The command in this description is not necessarily limited.

In Step S342, the flash memory controller 10 receives the power supply state notifying signal Q2 from the power supply circuit 20 to check the state of power supply of the power supply circuit 20. The state of power supply, when converted to the power level, is capable of, for example, "25", and the processes at the power level of "19" in total are currently handled.

In Step S343, the flash memory controller 10 estimates an operating power used in a process requested by the command and executed in the accessed flash memory 26 based on the type of the process. FIG. 44 illustrates an example of the flash memory operation management table 12 in the flash memory controller 10 when the command is received from the host. According to the table, a flash memory A has the power level of "1", flash memories B, C, D have the power level of "2", flash memories E, F, G, and H have the power level of "3", and flash memories I and J are currently paused. A total value of the power levels of the process-executing flash memories 26 is "19". When the processing power is estimated based on the operating states and independent characteristics of the flash memories 26 instead of simply summing the power levels, the estimated power level can be more accurate. The processes with younger numbers in the process starting order are more recently executed. According to the working example, younger numbers in the process starting order have lower priority.

In Step S344 that follows Step S343, the flash memory controller 10 compares the estimated operating power to the present driving rate obtained from the power supply state information to determine whether the present driving rate of the power supply circuit 20 can afford to supply the estimated operating power. When determined that the present driving rate is inadequate for the estimated operating power, the flash memory controller 10 proceeds to Step S345, while proceeding to Step S346 otherwise.

Below is described an example when a writing command outputted from the host 200 is received for a flash memory I. To execute a process in the flash memory I using the power level "3", the power level in total is "22" (=19+3), exceeding the level "20" which is a level that ensures a stable operation of the power supply circuit 20 (80% of level "25"). It possibly leads to a poor data reliability to start the operation of the flash memory 26 under the circumstances illustrated in FIG. 44. Therefore, the power level of the flash memory 26 needs to be changed.

In Step S345, the power level of the flash memory 26 is lowered. In the operation example, the power level of the flash memory I ranked lowest in the priority order (set to "9" in the priority order ranking because the operation starts first) is changed to from "3" to "1". As a result, the power level in total is "20" (=19+1), allowing the processes to be executed within an operational stability level of the power supply circuit 20. This means that Step S344 determines that the present driving rate can afford to supply the estimated operating power. Then, the flash memory controller 10 proceeds to Step S346.

In Step S346, the flash memory controller 10 updates the flash memory operation management table 12. In Step S347, the flash memory controller 10 starts to execute the processes in the flash memories 26.

According to the working example the processes continue to be executed in the flash memories on principle at a lower processing speed whenever the power supply circuit 20 is possibly undergoing overload. As a result, a processing capacity of the system is not overly degraded.

<55> [Prior to Process Start]*[Low Power Shift]*[Priority Order]

In a description hereinafter given are discussed improvements in shifting the flash memory to the low power mode in the nonvolatile storage system recited in <54> characterized by the low power shift. The flash memories in the description given below are capable of dynamically changing their operating currents.

When the flash memory controller monitors the operating states of the plural flash memories in the flash memory operation management table, the flash memory controller predefines the priority order ranking among the flash memories and manages the flash memories using the predefined priority order ranking as a monitoring item. The priority order ranking changes as the processes executed in the flash memories are advancing. The flash memory controller updates the priority order, every time when it changes, in the flash memory operation management table.

In the event of possible system crash because of failure to solve the problem of overload due to imbalance between the power usage of the process-executing flash memories and the power supply capacity of the power supply circuit for memory system, in other words, when the flash memory controller determines that the processes are not properly executable in the accessed flash memories within the range of the rated power supply capacity of the power supply circuit for memory system, the flash memory controller refers to the flash memory operation management table to reduce the power usage of the flash memory ranked lowest in the priority order. According to the low power shift, the processes currently executed may continue with less power or paused.

Summarizing the description given so far, the nonvolatile storage system is characterized in that the plural flash memories of the nonvolatile storage system recited in <54> that described the low power shift are managed based on the predefined priority order ranking, wherein continuation or pausing of the processes to be executed with reduced power usage starts with the flash memory ranked lowest in the priority order among the process-executing flash memories.

This working example exerts operational advantages similar to those recited in <54>. Further, this working example, wherein the flash memory ranked lowest in the priority order is selected over the other flash memories as the flash memory in which the process to be executed continues with reduced power usage when such problems as overload occurs due to an insufficient power supply from the power supply circuit for memory system, can minimize adverse influences resulting from reduction of the processing speed.

A specific example of <55> is hereinafter described as a working example 23 of the invention.

Working Example 23

Any of the block diagrams of FIGS. 36, 40, and 42 may be quoted as an illustration of structural characteristics of a nonvolatile storage system according to a working example 20 of the invention. According to this working example, the flash memories 26 can change power levels by dynamically changing operating currents thereof. The flash memory controller 10 has a flash memory operation management table 12 for managing operating states of the flash memories 26. FIG. 46 illustrates an example of the flash memory operation management table 12.

FIG. 46 illustrates a flash memory operation management table 12 of the flash memory controller 10 according to the working example 23. The flash memory operation management table 12 contains information of operation priority order ranking, operation priority level, state of flash memory, power level, and process starting order of each of the flash memories 26.

The operation priority level is expressed in four stages from, for example, "0" to "3". "0" represents inactive, and "3" represents a process of the highest priority. The flash memory controller 10 puts larger priority levels to the flash memories more affected by reduction of the processing speed. In other words, the flash memories less affected by reduction of the processing speed are selectively shifted to the low power mode, while all of the flash memories largely affected are desirably operated in the normal mode. The flash memories to be switched to the low power mode are arranged reverse to the priority levels recited in the flash memory operation management table 12. The priority order ranking represents a degree of priority in selecting the flash memories to be shifted to the low power mode. In the illustration of FIG. 46, the flash memories positionally higher than the others are selectively shifted to the low power mode. As a result, the ranking of the process starting order is randomly arranged.

The processes with the priority level of "3" are processes relating to data reading/writing directly requested by the host 200, which are regarded by the host 200 as processes directly affecting the processing speed.

The processes with the priority level of "2" are post processes of the processes requested by the host 200, which are regarded by the host 200 as processes desirably executed faster though not directly affecting the processing speed.

The processes with the priority level of "1" are processes regarded by the host 200 as processes not affecting the processing speed such as transferring any failed sector to a different sector.

The state of the flash memory state indicates writing process in execution or erasing process in execution. The operating current value of the flash memory 26 can be calculated based on the state and the power level of the flash memory.

The process starting order starts with the flash memory 26 which executed the process first, followed by the other flash memories 26 in the descending order. "0" is pausing. The illustration of FIG. 46 does not follow the process starting order but follows the priority order ranking. Though the same priority levels are redundantly recited, the priority order numbers are serial numbers with no overlap.

The flash memory operation management table 12 is updated when the operation of the flash memory 26 starts and pauses and the operation mode such as power level change is carried out. Any other structural and technical characteristics are similar to those of nonvolatile storage system according to the working example 5.

An operation of the nonvolatile storage system thus configured is hereinafter described. FIG. 47 is a flow chart illustrating processing steps of the flash memory controller 10.

Of Steps S351 to S357, Step S355 is different to Step S345 of FIG. 45, and the rest of the processing steps are similar to those illustrated in FIG. 45. In Step S357 subsequent to Steps S351 to S356, the flash memory 26 starts to execute a process, however, a different flash memory 26 already started to execute a process before that.

In response to a command transmitted from the host 200 externally provided, the flash memory controller 10 starts to control the flash memories 26 to be accessed. In Step S351, the flash memory controller 10 controls the flash memories 26 to be accessed in response to a command transmitted from the host 200. In Step S352, the flash memory controller 10 checks the state of power supply of the power supply circuit 20 based on the power supply state notifying signal Q2 received from the power supply circuit 20.

The state of power supply described here has the capacity of "30" when converted to the power level, the processes are currently executed at the power level of "22". The power level equivalent to the operational stability level of the power supply circuit 20 is "24" which is 80% of the level "30".

In Step S353, the flash memory controller 10 estimates processes to be executed in the flash memories 26 and operating powers needed for the processes. For example, FIG. 46 illustrates the flash memory operation management table 12 of the flash memory controller 10 when the command is received from the host. According to the table, flash memories A to J are currently executing processes, while a flash memory I is currently paused.

The flash memories D, H, and J are at the highest priority level "3", the flash memories C and G are at the intermediate priority level "2", and the flash memories A, B, E, and F are at the lowest priority level "1". The flash memory A is operated at the power level of "1", the flash memories B, E, and F are operated at the power level of "2", and the flash memories C, G, D, H, and J are operated at the power level of "3".

Therefore, the power level in total of the process-executing flash memories 26 is "22". When the processing power is estimated based on the operating states and independent characteristics of the flash memories 26 instead of simply summing the power levels, the estimated power level can be more accurate.

By not setting the power level of the flash memory 26 to any power levels below the priority level, reduction of a processing performance of the system can be controlled. In a process with the priority level of "1", any of the power levels "1", "2", and "3" can be selected. In a process at the priority level of "3", the power levels "1" and "2" are not selectable but the power level "3" is the only option.

As the numbers in the process starting order are younger, the processes are more recently executed. According to this working example, the processes with younger numbers in the process starting order have lower priority among the same priority levels. Though the same priority levels are redundantly recited, the priority order numbers are serial numbers with no overlap based on the process starting order.

As to Steps S355 and S356, a description is given to a method of updating the flash memory operation management table 12 when data writing with the priority level of "3" is requested in the flash memory I in response to a command from the host 200.

FIG. 48 is a table further reciting an operation of the flash memory I. Because the flash memory I has the priority level of "3", the priority order number 4, which is the lowest rank in the priority order among the processes having the priority level of "3", is given to the flash memory I. The flash memory I at the bottom of FIG. 46 is recited in FIG. 48 in the fourth column from the bottom. The process starting order then is "0", meaning interim registration in the flash memory operation management table 12. The power level of the flash memory I is "3".

Then, the power level in total is "25" (22+3), exceeding the operational stability level of the power supply circuit 20, "24" (80% of level "30"). It possibly undermines the data reliability to start the operation of the flash memory 26 at the power level. To avoid the risk, the power level of the flash memory 26 needs to be changed. More specifically describing the power level change, Step S354 is negative, and the flash memory controller 10 proceeds to Step S355.

The flash memory A ranked lowest with the priority order "10" is unable to lower the power level which is currently "1" because the lowered power level would be "0", stopping the process to be executed in the flash memory. This is contradictory to the purpose to be desirably achieved by this working example. Then, focusing on the flash memory B ranked lowest next to the flash memory A with "9" in the priority order ranking, the power level of "2" of the flash memory B with the priority level of "1" can be reduced.

When the power level of the flash memory B currently "2" is reduced to "1", the power level in total is "24" (=25−1), allowing the processes to be executed within the operational stability level of the power supply circuit 20 ("24" which is 80% of level "30"). FIG. 49 illustrates a result after the power level is changed. Referring to FIG. 48, the power level of the flash memory B, which is "2" in FIG. 48, is changed to the lower power level "1". Thus, the power levels were checked and corrected to decide the final power level. Then, the flash memory controller 26 updates the flash memory operation management table 12 and starts to execute the processes in the flash memories 26.

In the operation according to the working example 5 described referring to FIGS. 44 and 45, the power level of the flash memory I newly introduced currently "3" is lowered to "1". According to this working example, the power level of the flash memory I newly introduced stays at "3", and the power level of the flash memory B where the process is already advancing is lowered.

This working example arranges the flash memories 26 according to the priority order ranking for low power shift to execute the processes, thereby minimizing adverse influences on the processes executed in the system.

<56> [Process in Execution]*[Poling]*[Low Power Shift]

A nonvolatile storage system hereinafter described and the nonvolatile storage system recited in <54> are different in that the processing timing is [Prior to Process Start] in the latter bus during [Process in Execution] in the former. Further, the nonvolatile storage system hereinafter described and the nonvolatile storage system recited in <51> are different in that the processing method is [Pausing] in the latter but [Low Power Shift] in the former. <54> described the control when and after a command transmitted from the host is received by the flash memory controller, more specifically the control before a process starts to be executed in a new accessed flash memory. Hereinafter is described a control in the case where the operating currents of the flash memories exceed a predefined reference level while the processes are being executed in the plural flash memories and the power supply circuit for memory system accordingly can no longer to afford to supply enough power, inviting such problems as overload.

According to the nonvolatile storage system, the flash memories of the nonvolatile storage system recited in <50> have a low power mode as a power consumption mode to dynamically change the operating currents, and the flash memory controller has the flash memory operation management table for management of different operating states of the flash memories.

The flash memory controller receives by polling the power supply state information from the power supply circuit for memory system and refers to the flash memory operation management table to compare the received power supply state information to a specific level. When determined that the received power supply state information is equal to or above the specific level, indicating the power supply circuit for memory system is becoming short of an enough power, the flash memory controller lowers the power level of a particular flash memory. When determined that the power supply circuit for memory system can afford to supply an enough power, the flash memory controller updates the flash memory operation management table.

Summarizing the description given so far, the nonvolatile storage system is characterized in that the flash memories of the nonvolatile storage system recited in <50> is configured to dynamically change the operating currents, and the flash memory controller receives by polling the power supply state information from the power supply circuit for memory system and lowers the power level of a particular flash memory when determined that the received power supply state information is equal to or above the specific level, so that the power supply circuit for memory system can afford to supply an enough power for the processes to be continuously executed.

Whenever the power supply circuit for memory system can no longer afford to supply an enough power for the processes to be executed in the flash memories, involving the risk of such an unfavorable event as overload, such an unfavorable event is detected beforehand by polling to lower the power level of a particular process-executing flash memory. Accordingly, an operational instability and system crash resulting from overload of the power supply circuit for memory system are prevented from happening, and reduction of an overall processing performance of the system can be minimized. Further, it becomes unnecessary to equip the power supply circuit with an overly high power supply capacity to ensure an operational stability.

A specific example of <56> is hereinafter described as a working example 24 of the invention.

Working Example 24

Figure 50:
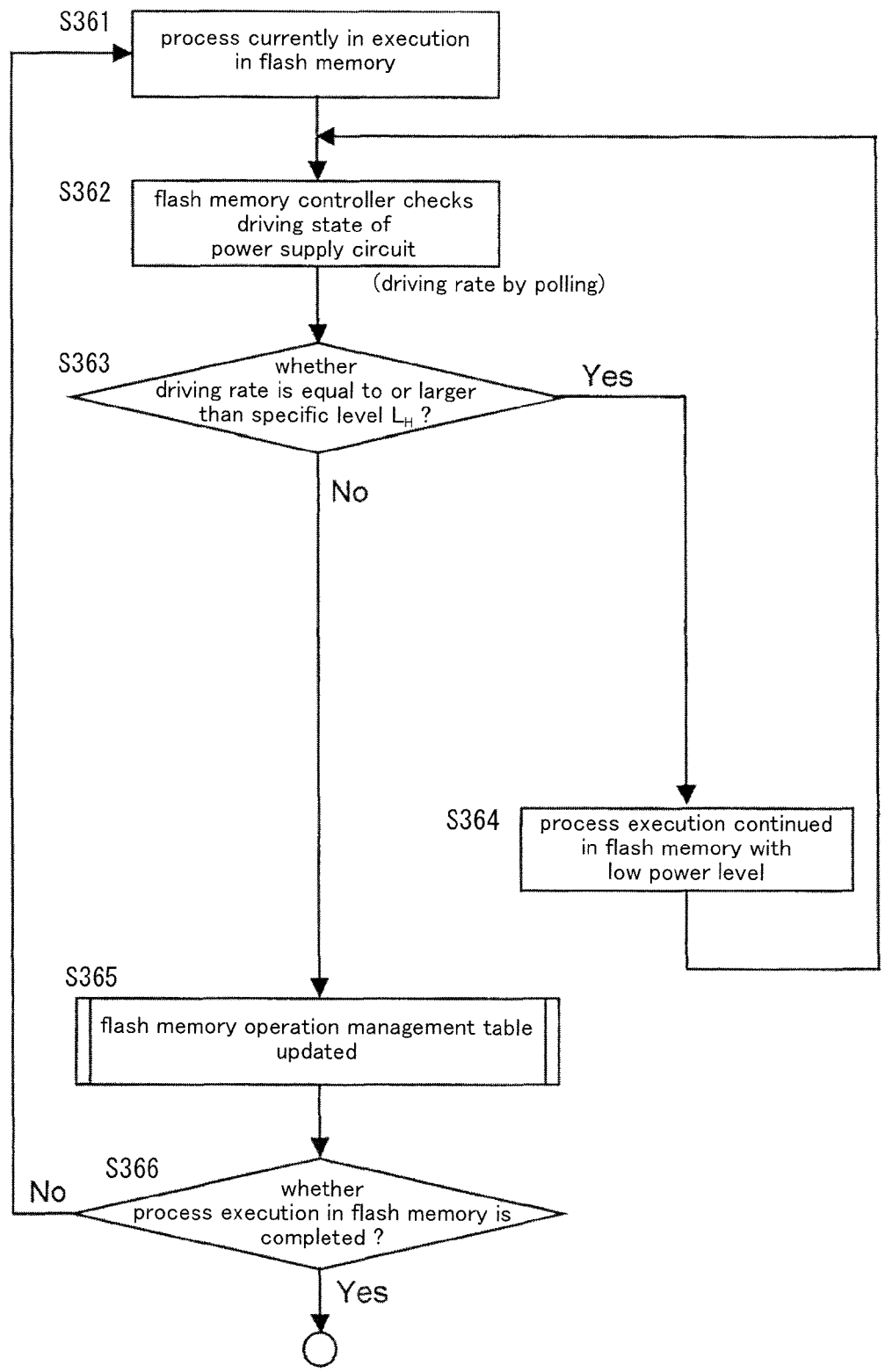
FIG. 50 is a flow chart illustrating an operation of a flash memory controller provided in a nonvolatile storage system according to a working example 24 of the invention.

Either of the block diagrams of FIGS. 36 and 42 may be quoted as an illustration of structural characteristics of a nonvolatile storage system according to a working example 24 of the invention. Hereinafter, an operation of the nonvolatile storage system according to this working example is hereinafter described. FIG. 50 is a flow chart illustrating processing steps of the flash memory controller 10.

Supposing that some of the flash memories 26 are currently executing the processes, in Step S361, the flash memory controller 10 is controlling the processes currently executed in the flash memories 26. In Step S362, the flash memory controller 10 checks the state of power supply of the power supply circuit 20. More specifically, the flash memory controller 10 makes an inquiry by polling to the power supply circuit 20 and accordingly receives and checks the driving rate as the power supply state information from the power supply circuit 20.

In Step S363, the flash memory controller 10 determines whether the present driving rate is equal to or larger than a specific upper-limit level $L_H$. The flash memory controller 10 proceeds to Step S364 when determined that the driving rate is equal to or larger than the specific upper-limit level $L_H$, while proceeding to Step S365 when determined otherwise. By determining whether the present driving rate is equal to or larger than the specific upper-limit level $L_H$, the flash memory controller 10 is actually checking whether the power supply circuit 20 is reaching the limit of its power supply capacity, possibly causing overload.

When determined in S363 that the present driving rate is equal to or larger than the specific upper-limit level $L_H$, involving the risk of overload, the flash memory controller 10 proceeds to Step S364 to lower the power level of a process-executing flash memory 26 (low power shift) by changing the power mode of the flash memory 26 to the low power mode. The flash memories whose power levels are to be lowered are set in accordance with the process starting order. Of the access-target flash memories 26, the flash memories which started processes relatively early in response to the command from the host 200 are subjected to the low power shift.

After Step S364, the flash memory controller 10 returns to Step S362. While Steps S362→S363→S364→S362 are cyclically carried out, the power levels of the flash memories are gradually lower, leading the present driving rate used to determine the risk of overload to fall under the specific upper-limit level $L_H$. Then, the power supply circuit 20 can afford to supply power necessary for the processes to be executed in all of the flash memories 26 to be accessed at the present driving rate. When the power supply circuit 20 is capable of an enough power supply, the flash memory controller 10 proceeds to Step S365.

In Step S365, the flash memory controller 10 updates the flash memory operation management table 12. When the flash memory controller 10 proceeds from Step S364 to S365, the flash memory controller 10 sets the lowered power levels. The reduction of power levels avoids the occurrence of overload. In Step S304, the flash memory operation management table 12 contains therein data tentatively registered. In Step S365, the data is really registered in the table.

In Step S366, the flash memory controller 10 determines whether the processes executed in the flash memories 26 are completed. When determined that the processes are still uncompleted, the flash memory controller 10 returns to Step S361 to continue to execute the processes. Steps S362, S363, S364, and S365 are repeatedly carried out to continue the uncompleted processes. When the processes are completed, the flash memory controller 10 departs from the routine of FIG. 50. The pausing of a part of the flash memories 26 is a part of the low power shift.

According to this working example, the power usage of the flash memories 26 is realistically and dynamically controlled with the state of power supply of the power supply circuit 20 (driving rate) being constantly monitored. Therefore, an operational instability and system crash resulting from overload of the power supply circuit 20 are prevented from happening, and reduction of an overall processing performance of the system can be minimized. Further, it becomes unnecessary to equip the power supply circuit with an overly high power supply capacity to ensure an operational stability.

<57> [Process in Execution]*[Interrupt]*[Low Power Shift]

In a description hereinafter given, the function exerted by <54> is accomplished by interrupt initiated by the power supply circuit for memory system in place of polling. According to a nonvolatile storage system hereinafter described, the nonvolatile storage system recited in <50> is configured to constantly monitor the state of power supply of the power supply circuit and generates an interrupt signal whenever the state of power supply is equal to or larger than a specific level and outputs the generated interrupt signal to notify the flash memory controller. When the flash memory controller receives the interrupt signal from the power supply circuit for memory system, the flash memory controller lowers the power level of a particular flash memory in which a process is currently executed to create an enough power supply in the power supply circuit for memory system, thereby continuing to execute the processes.

The flash memory controller uses the interrupt signal generated in response to changes of the state of power supply of the power supply circuit for memory system to know such problems as overload of the power supply circuit for memory system. This makes it unnecessary for the flash memory controller to monitor the power supply circuit for memory system by polling, thereby alleviating a processing load. Further, the receipt of the interrupt signal immediately leads to the detection of overload with no time lag, enabling a fast response.

A specific example of <57> is hereinafter described as a working example 25 of the invention.

Working Example 25

Either one of the block diagrams of FIGS. 40 and 42 may be quoted as an illustration of structural characteristics of a nonvolatile storage system according to a working example 25 of the invention. The power supply circuit 20 constantly monitors its own internal state while the processes are being executed in the flash memories 26. The power supply circuit 20 generates an interrupt signal Q2 indicating that the state of power supply changed when the power usage of the accessed flash memories 26 is overly high relative to the present driving rate of the power supply circuit 20 and the driving rate finally exceeds a predefined value, and then outputs the generated interrupt signal Q2 to the flash memory controller 10. The flash memory controller 10 that received the interrupt signal Q2 lowers the power level of a particular process-executing flash memory 26. Any other structural and technical characteristics are similar to those of the nonvolatile storage system according to the working example 22.

Figure 51:
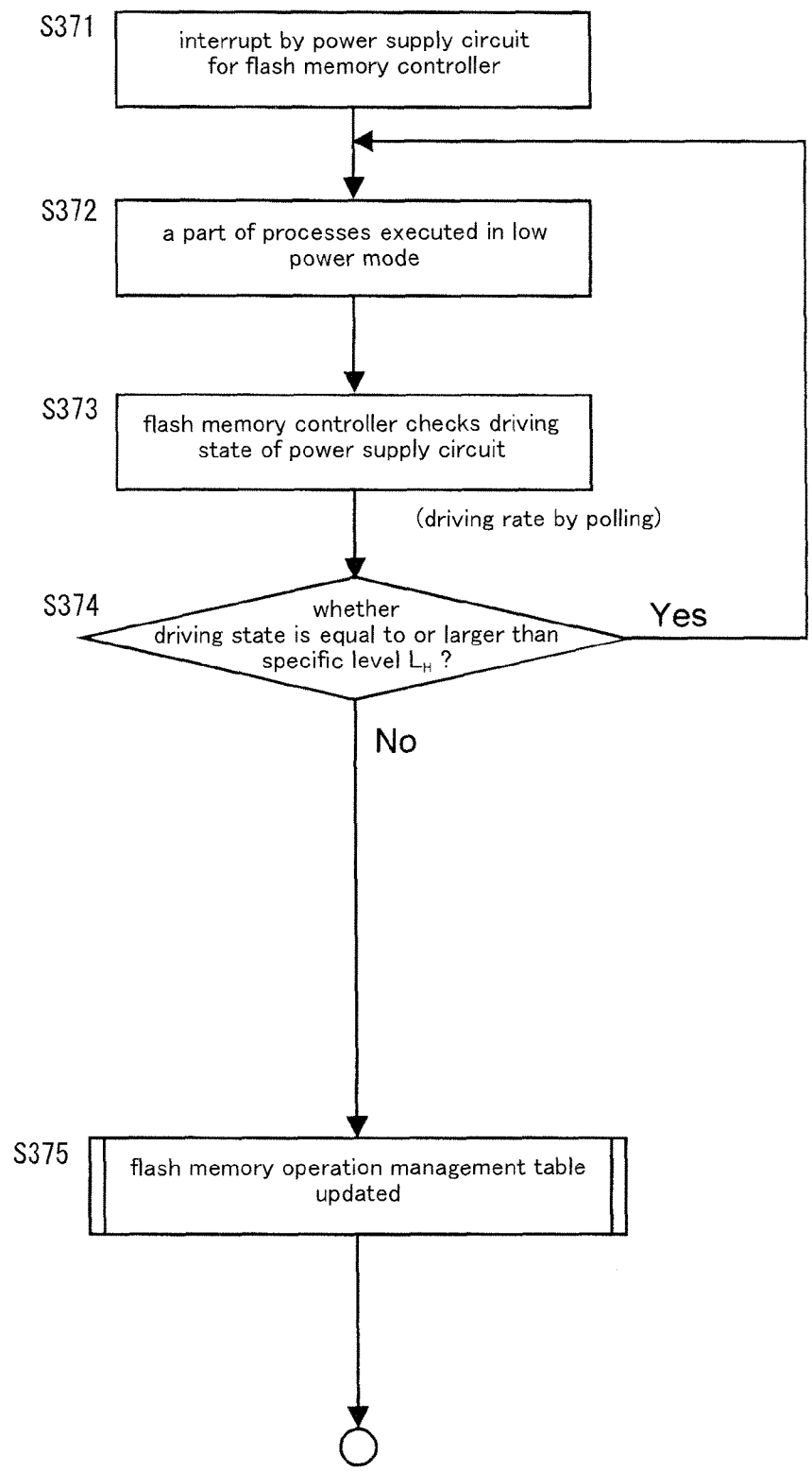
FIG. 51 is a flow chart illustrating an operation of a flash memory controller provided in a nonvolatile storage system according to a working example 25 of the invention.

Next, an operation of the nonvolatile storage system according to this working example thus characterized is described. FIG. 51 is a flow chart illustrating processing steps of the flash memory controller 10. In Step S371, the flash memory controller 10 recognizes the receipt of the interrupt signal Q2 indicating that the state of power supply of the power supply circuit 20 changed from the power supply circuit 20. In Step S372, the flash memory controller 10 lowers the power level of the process-executing flash memory 26, meaning that the flash memory 26 is shifted to the low power mode. According to this example, the flash memory subjected to the lower power shift is set based on the process starting order. More specifically, the flash memory 26 selected by the flash memory controller 10 to lower the power level is one of the flash memories 26 currently accessed which started to execute the process earlier than the others in response to the command from the host 200.

In Step S373, the flash memory controller 10 checks the state of power supply of the power supply circuit 20. More specifically, the flash memory controller 10 makes an inquiry by polling to the power supply circuit 20 to receive the power supply state notifying signal Q2 from the power supply circuit 20, and then fetches the power supply state information from the received power supply state notifying signal Q2 to know the present driving rate of the power supply circuit 20 from the fetched power supply state information.

In Step S374, the flash memory controller 10 determines whether the present driving rate is equal to or larger than a specific upper-limit level $L_H$. The flash memory controller 10 returns to Step S372 when determined that the driving rate is equal to or larger than the specific upper-limit level $L_H$, while proceeding to Step S375 when determined otherwise. By determining whether the present driving rate is equal to or larger than the specific upper-limit level $L_H$, the flash memory controller 10 is actually checking whether the power supply circuit 20 is reaching the limit of its power supply capacity, possibly causing overload.

When the present driving rate is equal to or larger than the specific upper-limit level $L_H$, involving the risk of overload, and the flash memory controller 10 accordingly returns to Step S372, the flash memory controller 10 further lowers the power level of the flash memory 26 or shifts another flash memory 26 to the low power mode.

As Steps S372→S373→S374→S372 are cyclically repeated, the present driving rate used as an indicator for determining the risk of overload start to fall below the specific upper-limit level $L_H$ because the power level of the flash memory is lowered in a phased manner. When the present driving rate falls below the specific upper-limit level $L_H$, power in total needed to execute the processes in all of the accessed flash memories 26 can be safely covered by the present driving rate of the power supply circuit 20. Then, the flash memory controller 10 proceeds to Step S375.

In Step S375, the flash memory controller 10 updates the flash memory operation management table 12. After the foregoing steps are cyclically repeated, the lowered power level is set in the table. The reduction of the power level avoids the occurrence of overload. According to this working example wherein the interrupt is employed, the flash memory controller 10 departs from the routine of FIG. 151 when Step S375 is over.

This working example can dispense with the processes of Steps S362 and S363 according to the working example 7 illustrated in FIG. 50, more specifically, it is unnecessary for the flash memory controller 10 to check by polling whether the driving rate of the power supply circuit 20 exceeds 90%. Thus, the flash memory controller 10 can alleviate its own processing load by omitting the voltage level check described in the working example 7.

<58> [Process in Execution]*[Polling]*[Low Power Shift]*[Priority Order]

A description hereinafter given discusses improvements in shifting the flash memory to the low power mode in <56> that described the low power shift. The flash memories are capable of dynamically changing their operating currents. The state of power supply of the power supply circuit 20 is checked by polling by the flash memory controller 10. A difference between <55> and <58> is that the processing timing is [Prior to Process Start] in the former but during [Process in Execution] in the latter.

The flash memory controller monitors the operating states of the plural flash memories in the flash memory operation management table. To monitor the operating states, the flash memory controller defines a priority order ranking of the plural flash memories and accordingly manages the flash memories. The priority order ranking changes as the processes of the flash memories are advancing, and the flash memory controller updates the priority order ranking in the flash memory operation management table whenever it changed.

When the flash memory controller determines that the likelihood of overload increases due to imbalance between the power usage of the process-executing flash memories and the power supply capacity of the power supply circuit for memory system. In other words, the flash memory controller refers to the flash memory operation management table whenever the accessed flash memories are unable to execute the processes within the range of the rated power supply capacity of the power supply circuit for memory system to selectively lower the power usage of the flash memory ranked lowest in the priority order. This low power shift allows the processes to be executed with less power.

Summarizing the description given so far, the nonvolatile storage system is characterized in that the flash memory controller of the nonvolatile storage system in <56> that described the low power shift predefines the priority order ranking of the plural flash memories and accordingly manage the flash memories, wherein the process continuation with reduced power starts with one of the flash memories ranked lowest in the priority order.

In addition to the operational advantages exerted by <56>, the flash memory ranked lowest in the priority order is selected over the other flash memories for the process continuation with reduced power in the case where the power supply circuit for memory system can no longer afford to supply an enough power, involving the risk of overload. This minimizes reduction of the processing speed.

A specific example of <58> is hereinafter described as a working example 26 of the invention.

Working Example 26

Figure 52:
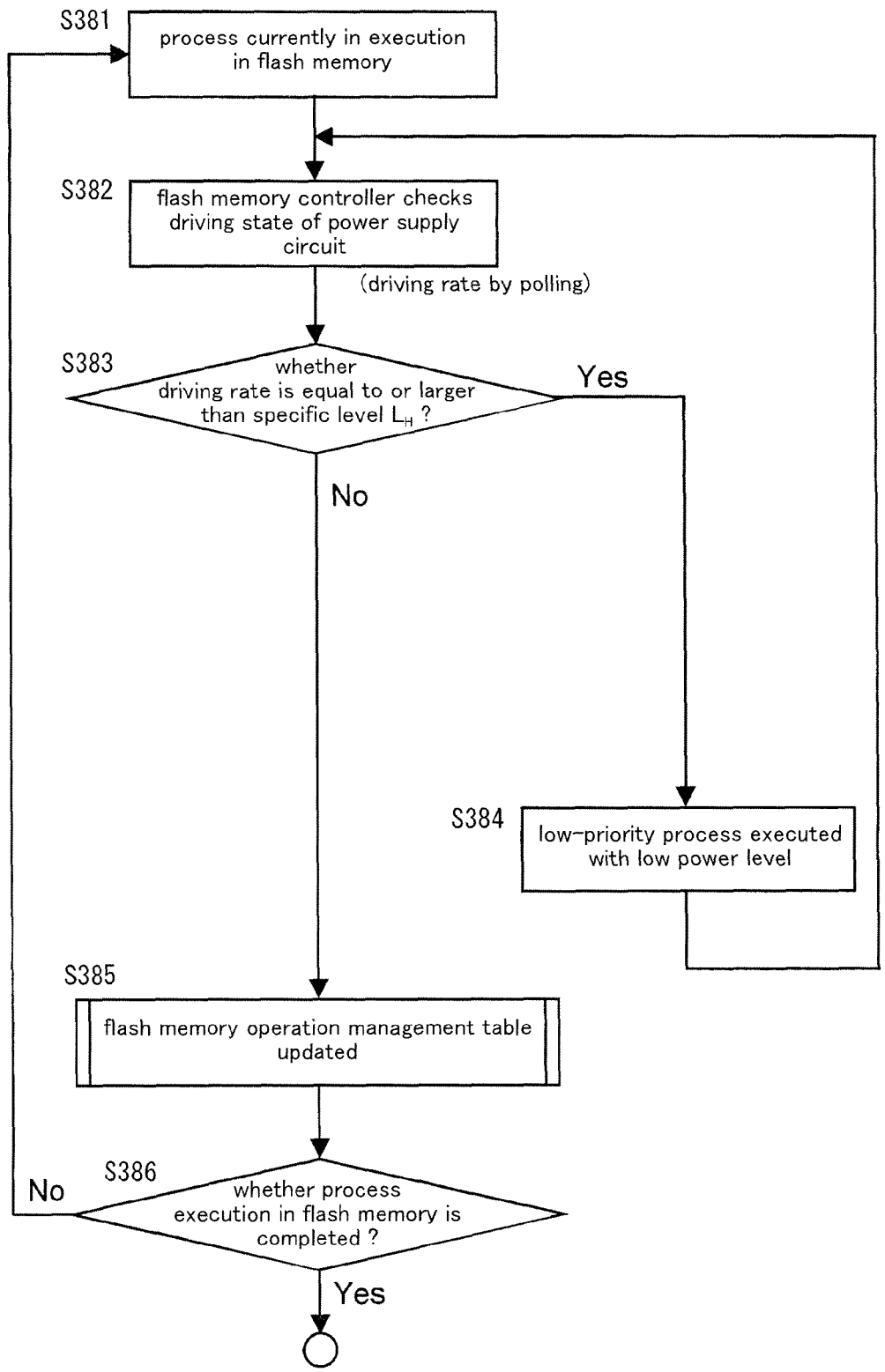
FIG. 52 is a flow chart illustrating an operation of a flash memory controller provided in a nonvolatile storage system according to a working example 26 of the invention.

Either one of the block diagrams of FIGS. 36 and 42 may be quoted as an illustration of structural characteristics of a nonvolatile storage system according to a working example 26 of the invention. An operation of the nonvolatile storage system according to this working example thus characterized is described. FIG. 52 is a flow chart illustrating processing steps of the flash memory controller 10. Of Steps S381 to S386, Step S384 is different to Step S364 of FIG. 50 with any other steps exactly the same as FIG. 50.

Supposing that some of the flash memories 26 are currently executing the processes, in Step S381, the flash memory controller 10 is controlling the processes currently executed in the flash memories 26. In Step S382, the flash memory controller 10 makes an inquiry by polling to the power supply circuit 20 and accordingly receives the power supply state information from the power supply circuit 20 to know the driving rate of the power supply circuit 20 based on the received power supply state information.

In Step S383, the flash memory controller 10 determines whether the present driving rate is equal to or larger than a specific upper-limit level $L_H$. The flash memory controller 10 proceeds to Step S384 when determined that the driving rate is equal to or larger than the specific upper-limit level $L_H$, while proceeding to Step S385 when determined otherwise. By determining whether the present driving rate is equal to or larger than the specific upper-limit level $L_H$, the flash memory controller 10 is actually checking whether the power supply circuit 20 is reaching the limit of its power supply capacity, possibly causing overload.

When determined in S383 that the present driving rate is equal to or larger than the specific upper-limit level $L_H$, involving the risk of overload, the flash memory controller 10 proceeds to Step S384, in which the flash memory controller 10 refers to the flash memory operation management table 12 to select the flash memory ranked low in the priority order and lowers the power level of the selected process-executing flash memory 26 by shifting the power consumption mode of the selected flash memory to the low power mode.

After Step S384 is over, the flash memory controller 10 returns to Step S382. As Steps S382→S383→S384→S382 are cyclically repeated, the power level of the flash memory is lowered in a phased manner, and the present driving rate used as an indicator for determining the risk of overload falls below the specific upper-limit level $L_H$. When the present driving rate falls below the specific upper-limit level $L_H$, power in total needed to execute the processes in all of the accessed memories 26 can be safely covered by the present driving rate of the power supply circuit 20. Then, the flash memory controller 10 proceeds to Step S385.

In Step S385, the flash memory controller 10 updates the flash memory operation management table 12. The flash memory controller 10 proceeds from Step S384 to Step S385 to set the lowered power level in the table. The reduction of the power level avoids the occurrence of overload.

In Step S386, the flash memory controller 10 determines whether the processes of the flash memories 26 are completed, and returns to Step S381 to continue to execute the processes when determined that the processes are still uncompleted. To continue to execute the processes, Steps S382, S383, S384, and S385 are repeatedly carried out. When the processes are completed, the flash memory controller 10 departs from the routine of FIG. 52. The pausing of the flash memory 26 is a part of the low power shift.

This working example, in addition to the operational advantages exerted by the working example 24, can minimize adverse influences on the processes executed in the system by prioritizing the flash memories 26.

<59> [Process in Execution]*[Interrupt]*[Low Power Shift]*[Priority Order]

A description hereinafter given discusses accomplishing the function of <58> not by polling but by interrupt initiated by the power supply circuit for memory system.

In a nonvolatile storage system hereinafter described, the power supply circuit recited in <56> that described the low power shift constantly monitors the state of power supply and generates an interrupt signal when the state of power supply is equal to or larger than a specific level and then outputs the generated interrupt signal to the flash memory controller. The flash memory that received the interrupt signal lowers the power level of a particular process-executing flash memory to create an enough power supply in the power supply circuit for memory system, thereby continuing to execute the processes.

The flash memory controller uses the interrupt signal generated when the state of power supply of the power supply circuit for memory system changed to know such problems as overload of the power supply circuit for memory system. This makes it unnecessary for the flash memory controller to monitor the power supply circuit for memory system by polling, alleviating the processing load. Further, the receipt of the interrupt signal immediately leads to the detection of overload with no time lag, enabling a fast response.

A specific example of <59> is hereinafter described as a working example 27 of the invention.

Working Example 27

Either one of the block diagrams of FIGS. 40 and 42 may be quoted as an illustration of structural characteristics of a nonvolatile storage system according to a working example 27 of the invention. In the nonvolatile storage system according to this working example, the flash memory controller 10 has a flash memory operation management table 12 for priority level management similar to that of FIG. 46.

The power supply circuit 20 constantly monitors its own internal state while the processes are being executed in the flash memories 26. The power supply circuit 20 generates an interrupt signal Q2 indicating that the state of power supply changed when the power usage of the accessed flash memories 26 is overly high relative to the present driving rate of the power supply circuit 20 and the driving rate finally exceeds a predefined value. The power supply circuit 20 then outputs the generated interrupt signal Q2 to the flash memory controller 10. The flash memory controller 10 that received the interrupt signal Q2 lowers the power level of a particular process-executing flash memory 26. Any other structural and technical characteristics are similar to those of the nonvolatile storage system according to the working example 22.

Figure 53:
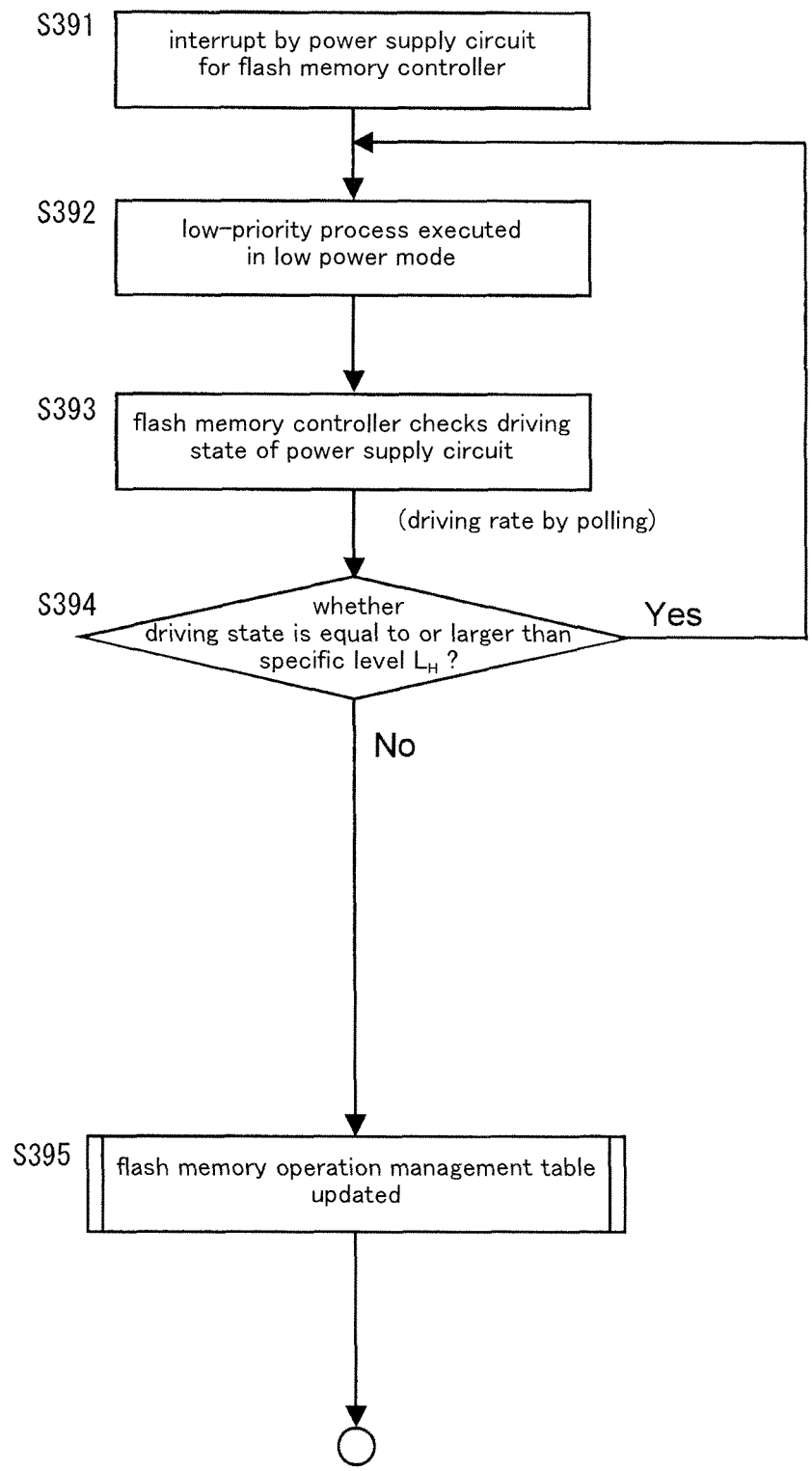
FIG. 53 is a flow chart illustrating an operation of a flash memory controller provided in a nonvolatile storage system according to a working example 27 of the invention.

Next, an operation of the nonvolatile storage system according to this working example thus characterized is described. FIG. 53 is a flow chart illustrating processing steps of the flash memory controller 10. In Step S391, the flash memory controller 10 recognizes the receipt of the interrupt signal Q2 indicating that the state of power supply of the power supply circuit 20 changed from the power supply circuit 20.

In Step S392, the flash memory controller 10 refers to the flash memory operation management table 12 to select the flash memory ranked low in the priority order and lowers the power level of the selected process-executing flash memory 26, meaning that the flash memory 26 is shifted to the low power mode.

In Step S393, the flash memory controller 10 makes an inquiry by polling again to the power supply circuit 20 and accordingly receives the power supply state information (power supply state notifying signal Q2) from the power supply circuit 20 to know the driving rate of the power supply circuit based on the received power supply state information.

In Step S394, the flash memory controller 10 determines whether the present driving rate is equal to or larger than a specific upper-limit level $L_H$. The flash memory controller 10 returns to Step S392 when determined that the driving rate is equal to or larger than the specific upper-limit level $L_H$, while proceeding to Step S395 when determined otherwise. By determining whether the present driving rate is equal to or larger than the specific upper-limit level $L_H$, the flash memory controller 10 is actually checking whether the power supply circuit 20 is reaching the limit of its power supply capacity, possibly causing overload.

When determined that the present driving rate is equal to or larger than the specific upper-limit level $L_H$, involving the risk of overload, and the flash memory controller 10 returns to Step S392, the flash memory controller 10 further lowers the power level of the selected flash memory 26 or shifts another flash memory 26 to the low power mode.

As Steps S392→S393→S394→S392 are cyclically repeated, the power level of the flash memory is lowered in a phased manner, and the present driving rate used as an indicator for determining the risk of overload falls below the specific upper-limit level $L_H$. When the present driving rate falls below the specific upper-limit level $L_H$, power in total needed to execute the processes in all of the accessed memories 26 can be safely covered by the present driving rate of the power supply circuit 20. Then, the flash memory controller 10 proceeds to Step S395.

In Step S395, the flash memory controller 10 updates the flash memory operation management table 12. After the cyclically repeated steps, the flash memory controller 10 sets the lowered power level in the table. The reduction of the power level avoids the occurrence of overload. In this working example in which the interrupt is employed, the flash memory controller 10 departs from the routine of FIG. 53 after Step S395 is over.

This working example can dispense with the processes of Steps S382 and S383 according to the working example 26 illustrated in FIG. 52, more specifically, it is unnecessary for the flash memory controller 10 to check by polling whether the driving rate of the power supply circuit 20 exceeds 90%. Thus, the flash memory controller 10 can alleviate its own processing load by omitting the voltage level check described in the working example 26.

<60> [Checking Occurrence of Overload or Other Problem]

In a description hereinafter given, it is checked whether there is any data abnormality when the process executed in the flash memory is completed, and a checking result thereby obtained is transmitted to the host.

A nonvolatile storage system hereinafter described is characterized in that the flash memory controller in the nonvolatile storage systems recited in <50> to <59> checks whether overload occurred in the power supply circuit for memory system when the process executed in the flash memory is completed and performs a verifying process of the flash memory when the occurrence of overload was confirmed. When the flash memory controller determines during the verifying process any data abnormality of the flash memory, the flash memory controller notifies the host of a checking result thereby obtained.

The system confirms the occurrence of overload to determine whether the process executed at the time of the occurrence of overload succeeded or failed and notifies the host of a result thereby obtained, thereby improving the data reliability.

A specific example of <60> is hereinafter described as a working example 28 of the invention.

Working Example 28

Figure 54:
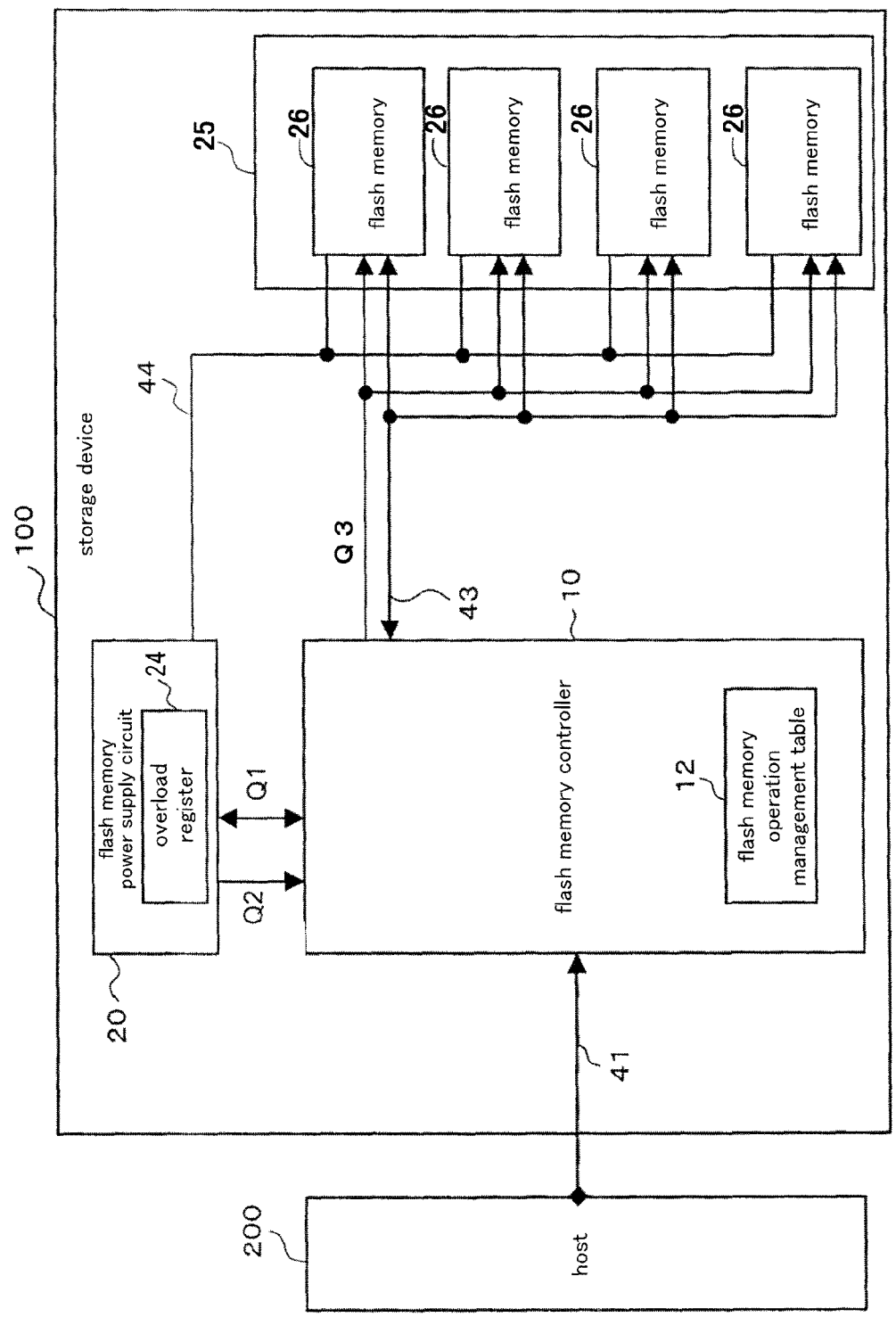
FIG. 54 is a block diagram illustrating structural characteristics of a nonvolatile storage system according to a working example 28 of the invention.

FIG. 54 is a block diagram illustrating structural characteristics of a nonvolatile storage system according to a working example 28 of the invention. The power supply circuit 20 is provided with an overload register 24 to set an overload flag indicating whether the power supply circuit 20 is undergoing overload. When the flash memory controller 10 learns by polling to the overload register 24 that the power supply circuit 20 is undergoing overload, the flash memory controller 10 continues to operate the flash memory 26 for a verifying process. Any other structural and technical characteristics are similar to those of the working example 20 (nonvolatile storage system illustrated in FIG. 40).

Figure 55:
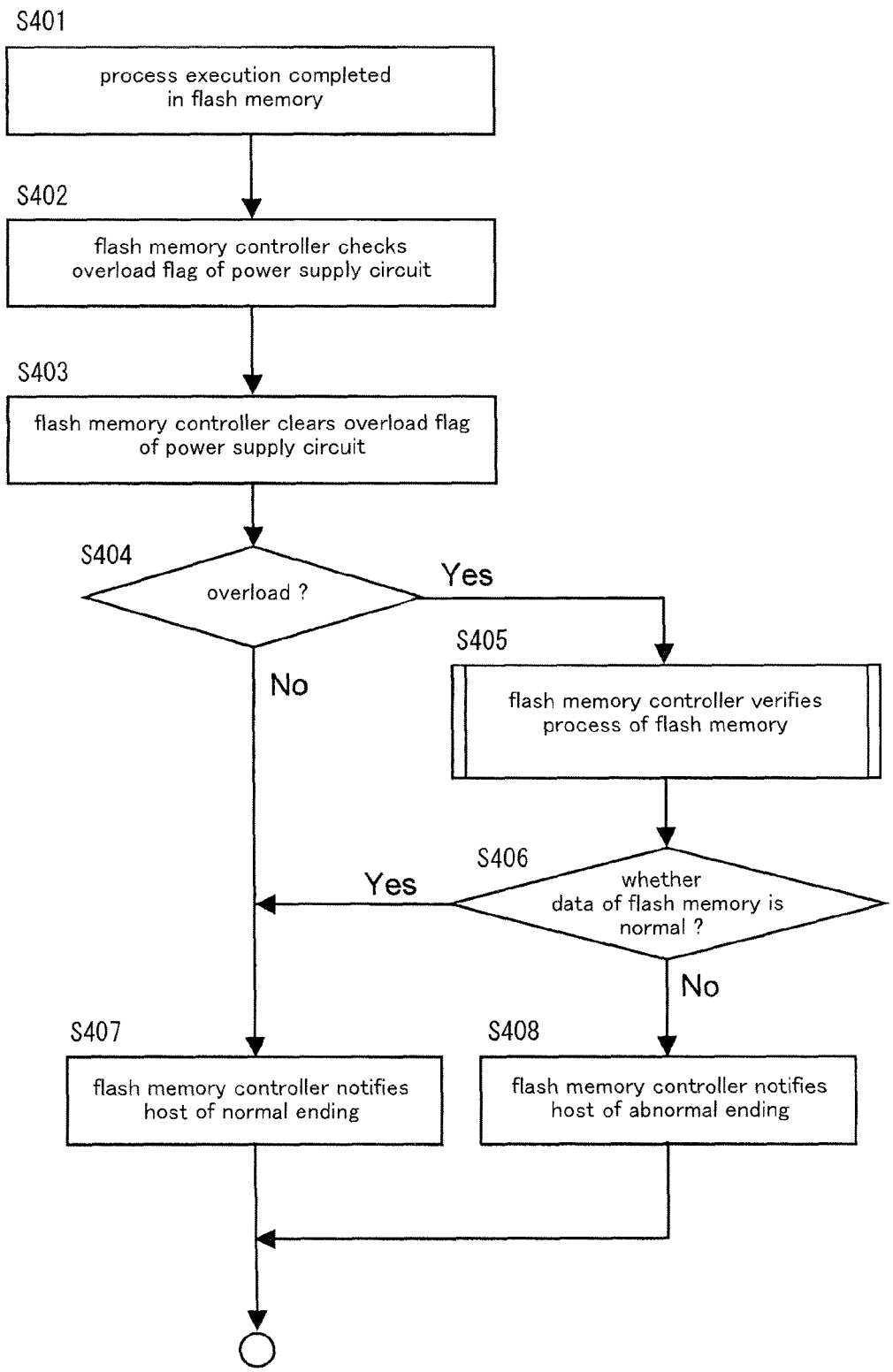
FIG. 55 is a flow chart illustrating an operation of a flash memory controller provided in the nonvolatile storage system according to the working example 28.

An operation of the nonvolatile storage system according to this working example thus characterized is described. FIG. 55 is a flow chart illustrating processing steps of the flash memory controller 10. In Step S401, the flash memory controller 10 recognizes completion of a process executed in the flash memory 26. In Step S402, the flash memory controller 10 checks an overload flag of the power supply circuit 20. The flash memory controller 10 checks the overload flag by polling to the overload resister 24 provided in the power supply circuit 20. In Step S403, the flash memory controller 10 clears the overload register 24 of the power supply circuit 20.

In Step S404, the flash memory controller 10 determines whether overload is occurring based on a result of Step S402. The flash memory controller 10 proceeds to Step S405 when the occurrence of overload is confirmed, while processing to Step S407 otherwise.

In Step S405, the flash memory controller 10 verifies the process executed in the flash memory 26. More specifically, the flash memory controller 10 reads data from a region of the flash memory 26 where data was written or erased (processed data) to check whether the data is normal. In Step S406, the flash memory controller 10 determines whether the data of the flash memories 26 is normal (whether all of data in the flash memory is normal). The flash memory controller 10 proceeds to Step S407 when determined that the data is normal, while proceeding to Step S408 otherwise.

When the occurrence of overload in the power supply circuit 20 is denied or the processing result of the flash memory 26 is normal, the flash memory controller 10 proceeds to Step S407 to notify the host 200 of "normal ending". When the processing result of the flash memory 26 is abnormal, the flash memory controller 10 proceeds to Step S408 to notify the host 200 of "abnormal ending".

According to the working example, the system confirms the occurrence of overload and determines whether the processing result at the time of the occurrence of overload was successful or failed to notify the host 200 of the result, thereby improving the data reliability.

<61> In the nonvolatile storage system recited in <50>, the flash memory controller preferably includes a first power supply terminal to which a first power supply voltage applied to an input/output circuit etc is applied and a second power supply terminal to which a second power supply voltage lower than the first power supply voltage, which is applied to a signal processing circuit etc is applied, wherein the power supply circuit includes a circuit for generating the second power supply voltage to be applied to the second power supply terminal of the flash memory controller.

<62> [Basic Structure: Voltage Generating Unit and Voltage State Monitoring Unit]

A power supply circuit for memory system hereinafter described is controlled by the flash memory controller in relation to a power supply voltage to be generated, monitors its own internal state as controlled by the flash memory controller, and transmits a monitoring result (state of power supply (driving rate)) to the flash memory controller. The flash memory controller uses the received monitoring result (state of power supply (driving rate)) to control the power supply voltage. Such a constantly performed feedback and feedforward enable to control the power supply voltage in a realistic, dynamic, and a fine-tuned manner. This technical feature is advantageously used in working examples hereinafter described.

Working Example 29

Figure 56:
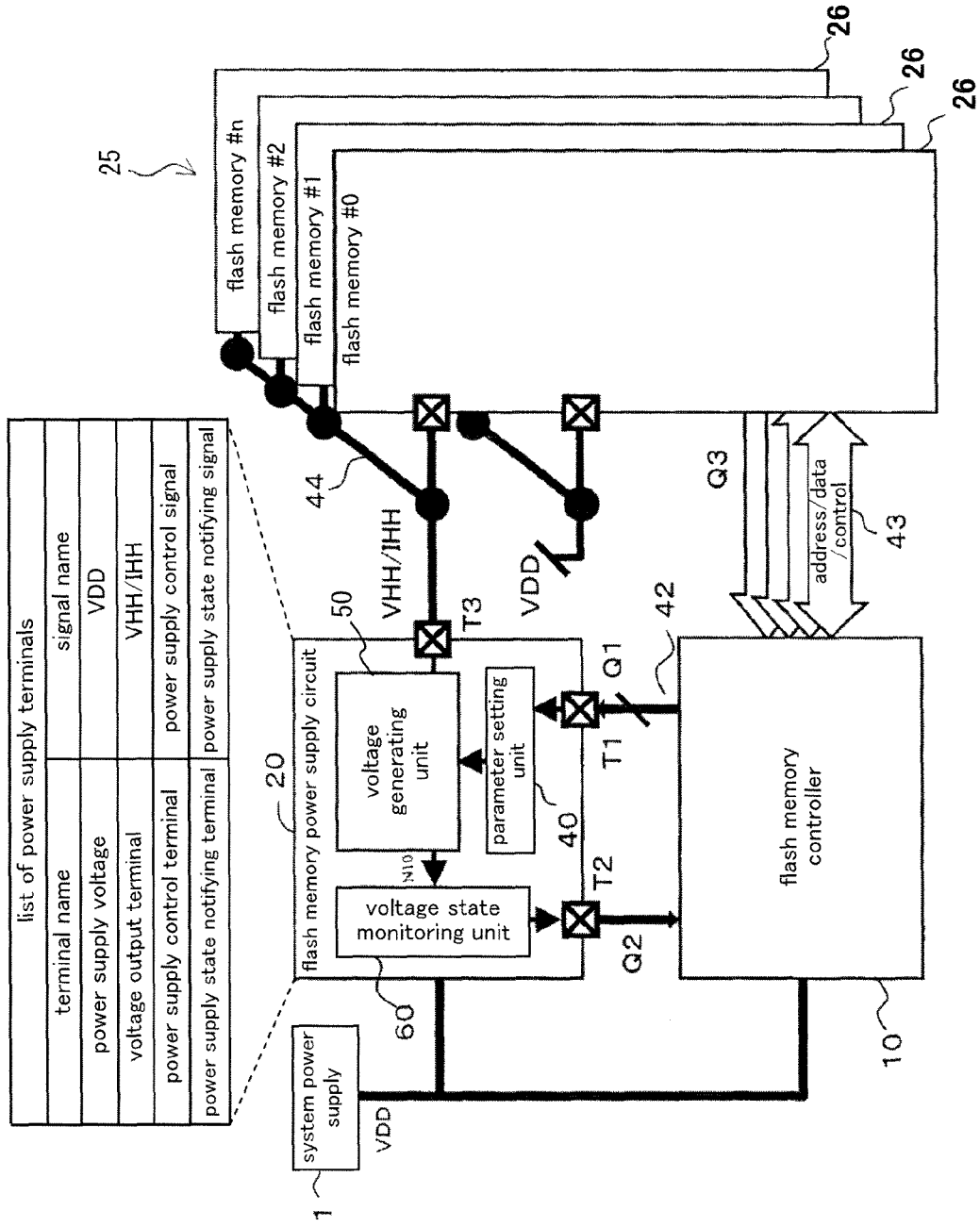
FIG. 56 is a block diagram illustrating structural characteristics of a nonvolatile storage system (power supply circuit for memory system) according to a working example 29 of the invention.

FIG. 56 is a block diagram illustrating structural characteristics of a nonvolatile storage system (power supply circuit for memory system) according to a working example 29 of the invention. Referring to reference numerals illustrated in FIG. 56, 10 is a flash memory controller, 20 is a power supply circuit for memory system, and 25 is a memory block including a plurality of flash memories 26. The flash memory controller 10 controls a data reading process and a data writing/erasing process to be executed in one or more flash memories 26. Further, flash memory controller 10 generates a power supply control signal Q1 depending on a voltage/current capacity required for each process to be executed in the flash memories 26 and supplies the generated signal to the power supply circuit 20.

The structural elements of the power supply circuit 20 are a parameter setting unit 40, a voltage generating unit 50, and a voltage state monitoring unit 60. A reference numeral 1 is a power supply. The system power supply 1 supplies the flash memory controller 10 and the power supply circuit 20 with a power supply voltage VDD which is a primary power supply. The flash memory controller 10 is connected to the power supply circuit 20 by a control bus 42. A power supply control signal Q1 and a power supply state notifying signal Q2 are transmitted on the control bus 42. The flash memory controller 10 is connected to the plural flash memories 26 by a bus 43. Q3 is a flash memory control signal transmitted on the control bus 42. The power supply circuit 20 is connected to the respective flash memories 26 by a power supply line 44.

The power supply circuit 20 has a power supply control terminal T1 for inputting the power supply control signal Q1 transmitted from the flash memory controller 10, a power supply state notifying terminal T2 for outputting the power supply state notifying signal Q2 from the power supply state monitoring unit 60 to the flash memory controller 10, and a power supply output terminal T3 for outputting the power supply voltage from the voltage generating unit 50 to the flash memories 26.

The parameter setting unit 40 has a function to set variously different control parameters such as current capacity, number of rows of boosters, number of boosters per row, and oscillation frequency based on the power supply control signal Q1. The power supply control signal Q1 is inputted from the flash memory controller 10 to the parameter setting unit 40 through the power supply control terminal T1. An output side of the parameter setting unit 40 is connected to the voltage generating unit 50.

The parameters are set in the voltage generating unit 50 by the parameter setting unit 40. The voltage generating unit 50 has a function to generate and output a power supply voltage for the flash memories to operate depending on the parameters set therein. The power supply voltage generated by the voltage generating unit 50 is supplied to the flash memories 26 through the power supply output terminal T3. The voltage generating unit 50 generates a power supply voltage variation signal N10 indicating a variation of the generated power supply voltage and outputs the generated power supply voltage variation signal N10 to the voltage state monitoring unit 60.

Figure 57:
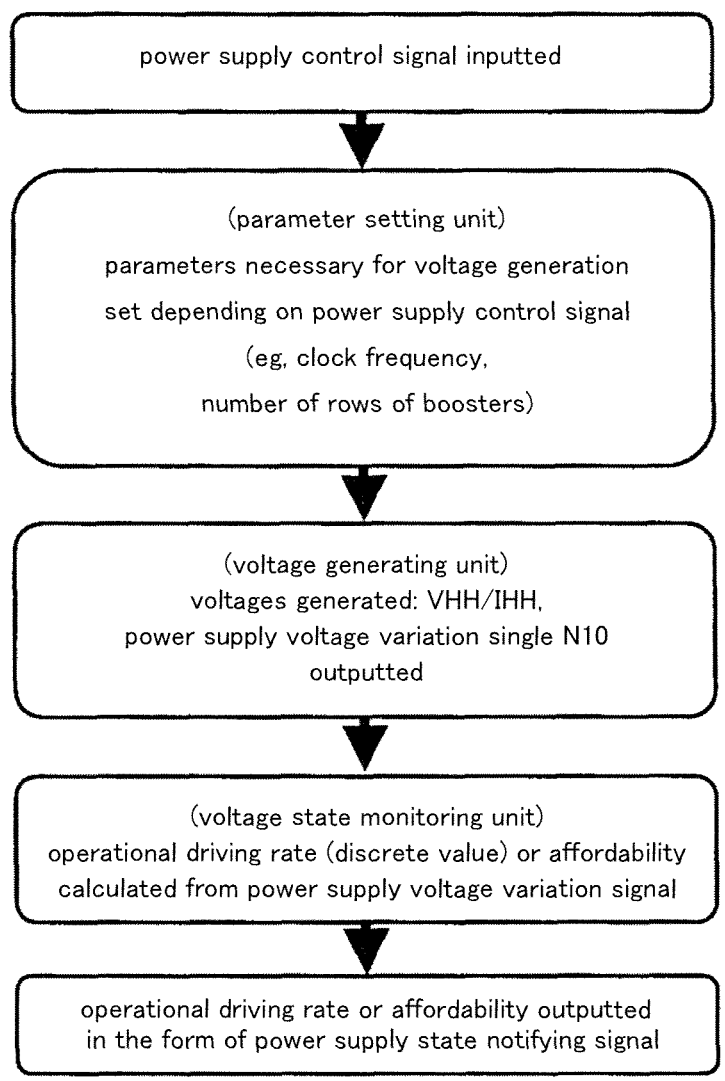
FIG. 57 is a flow chart illustrating an operation of the power supply circuit according to the working example 29.

The voltage state monitoring unit 60 receives the power supply voltage variation signal N10 outputted from the voltage generating unit 50. Then, the voltage state monitoring unit 60 generates the power supply state notifying signal Q2 indicating a driving rate of the voltage generating unit 50 based on the received power supply voltage variation signal N10 and outputs the generated power supply state notifying signal Q2 to the flash memory controller 10 through the power supply state notifying terminal T2. FIG. 57 is a flow chart illustrating an operation of the power supply circuit 20.

The working example exerts the following operational advantages. The power supply voltage to be generated by the power supply circuit 20 is controlled by the flash memory controller 10 externally provided, and the power supply circuit 20 constantly monitors its own internal state and outputs the power supply state notifying signal Q2 indicating a monitoring result (driving rate) to the flash memory controller 10. The flash memory controller 10 controls the power supply circuit 20 based on the received power supply state notifying signal Q2 (driving rate). Such a constantly performed feedback and feedforward enables to control the power supply voltage in a realistic, dynamic, and a fine-tuned manner. This makes it unnecessary to arrange an overly high power supply capacity. As a result, any useless power consumption is effectively controlled.

<63> [A Plurality of Types of Power Supply Circuits for Process Execution]

Conventionally, a plurality of combinations (pairs) of voltage generating units and voltage state monitoring units are provided in the power supply circuit for memory system recited in <62>. A conventional power supply circuit for memory system has a power supply circuit for reading and a power supply circuit for writing/erasing. Most typically, the power supply circuit for memory system has a power supply circuit for reading, a power supply circuit for writing/erasing, and a power supply circuit for verifying. These power supply circuits are called a plurality of types of power supply circuits for process execution.

The voltage generating unit for reading and the voltage state monitoring unit for reading are associated with each other, the voltage generating unit for writing/erasing and the voltage state monitoring unit for writing/erasing are associated with each other, and the voltage generating unit for verifying and the voltage state monitoring unit for verifying are associated with each other. These voltage generating units respectively have different reference voltages. The plurality of types of power supply circuits for process execution are independently controlled and operated by the flash memory controller.

The flash memory controller controls a power supply of the voltage generating unit for reading of the power supply circuit for reading, and the voltage state monitoring unit for reading monitors a state of power supply of the voltage generating unit for reading. The voltage state monitoring unit for reading outputs a power supply state notifying signal for reading to the flash memory controller as a monitoring result. The flash memory controller resets the voltage generating unit for reading based on the received power supply state notifying signal.

The flash memory controller controls a power supply of the voltage generating unit for writing/erasing of the power supply circuit for writing/erasing, and the voltage state monitoring unit for writing/erasing monitors a state of power supply of the voltage generating unit for writing/erasing. The voltage state monitoring unit for writing/erasing outputs a power supply state notifying signal for writing/erasing to the flash memory controller as a monitoring result. The flash memory controller resets the voltage generating unit for writing/erasing based on the received power supply state notifying signal.

The flash memory controller controls a power supply of the voltage generating unit for verifying of the power supply circuit for verifying, and the voltage state monitoring unit for verifying monitors a state of power supply of the voltage generating unit for verifying. The voltage state monitoring unit for verifying outputs a power supply state notifying signal for verifying to the flash memory controller as a monitoring result. The flash memory controller resets the voltage generating unit for verifying based on the received power supply state notifying signal.

Summarizing the description given so far, the power supply circuit for memory system is characterized in that a plurality of voltage generating units and a plurality of voltage state monitoring are provided as a plurality of types of power supply circuits for process execution in the power supply circuit for memory system recited in <61>, wherein the plurality of types of power supply circuits for process execution are independently controlled and operated.

When the plural flash memories respectively need different voltages to execute different processes (writing, reading), the power supply circuit for memory system can generate and supply any power supply voltages respectively suitable for the different processes. Further, the voltage generating units can be optimally driven in the system because the state of power supply (driving rate or affordability) monitoring result of each power supply circuit is outputted. As a result, any useless power consumption is effectively controlled.

A specific example of <63> is hereinafter described as a working example 30 of the invention.

Working Example 30

FIG. 58 is a block diagram illustrating structural characteristics of a power supply circuit for memory system used in a nonvolatile storage system according to a working example 30 of the invention. The power supply circuit 20 is provided with three different power supply circuits for process execution. One of them is a power supply circuit for logic, which is a combination of a voltage generating unit 51 for logic and a voltage state monitoring unit 61 for logic. The others are a combination of a voltage generating unit 52 for reading and a voltage state monitoring unit 62 for reading, and a combination of a voltage generating unit 53 for writing/erasing and a voltage state monitoring unit for writing/erasing 63. A power supply voltage necessary for a logic operation is, for example, 1.8V at a maximum, a power supply voltage necessary for a reading operation is, for example, 5V at a maximum, and a power supply voltage necessary for a writing/erasing operation is, for example, 20V at a maximum.

A parameter setting unit 40 is shared by three voltage generating units 51 to 53. T21, T22, and T23 are power supply state notifying terminals, which are provided respectively for three voltage state monitoring units 61, 62, and 63. T31, T32, and T33 are power supply output terminals leading to the flash memories 26, which are respectively for three voltage state monitoring units 61, 62, and 63. Any other structural elements are similar to those illustrated in FIG. 56 according to the working example 12. The similar structural elements are simply illustrated with the same reference symbols to omit redundant description.

An operation of the power supply circuit for memory system according to the working example thus characterized is hereinafter described. In the power supply circuit for reading, the flash memory controller 10 controls a power supply of the voltage generating unit 52 for reading. A driving state of the voltage generating unit 52 for reading is monitored by the voltage state monitoring unit 62 for reading, and a power supply state notifying signal Q2 for reading is outputted to the flash memory controller 10. The flash memory controller 10 resets the voltage generating unit 52 for reading based on the received power supply state notifying signal Q2.

In the power supply circuit for writing/verifying, the flash memory controller 10 controls a power supply of the voltage generating unit for writing/verifying 53. A driving state of the voltage generating unit for writing/verifying 53 is monitored by the voltage state monitoring unit 63 for writing/verifying, and a power supply state notifying signal Q2 for writing/verifying is outputted to the flash memory controller 10. The flash memory controller 10 resets the voltage generating unit for writing/verifying 53 based on the received power supply state notifying signal Q2.

In the power supply circuit for logic, the flash memory controller 10 controls a power supply of the voltage generating unit 51 for logic. A driving state of the voltage generating unit 51 for logic is monitored by the voltage state monitoring unit 61 for logic, and a power supply state notifying signal Q2 for logic is outputted to the flash memory controller 10. The flash memory controller 10 resets the voltage generating unit 51 for logic based on the received power supply state notifying signal Q2.

According to this working example, operational effects similar to those of the working example 12 (FIG. 56) are obtained from the power supply circuits for process execution including the voltage generating units 51 to 53 and the voltage state monitoring units 61 to 63.

In order to reduce the power supply state notifying terminals T21, T22, and T23, the power supply state notifying signal Q2 may be outputted as a bus. For example, the power supply state notifying signal of [1:0] can reduce the number of terminals by one.

<64> In the power supply circuit for memory system recited in <62>, the voltage generating unit preferably includes an increased voltage generator for generating a voltage higher than the inputted power supply voltage, and a decreased voltage generator for generating a voltage lower than the inputted power supply voltage.

<65> [Integrator Circuit, Comparator Circuit, Status Register]

In the power supply circuits for memory system recited in <62> and <63>, the voltage state monitoring unit may be configured as described below.

The voltage generating unit generates a power supply voltage variation signal of a pulse signal indicating the state of power supply with an on-duty ratio and outputs the generated power supply voltage variation signal to the voltage state monitoring unit.

The voltage state monitoring unit includes an integrator circuit, a comparator circuit, and a status register. The integrator circuit integrates the power supply voltage variation signals outputted from the voltage generating unit during an inactive period. The comparator circuit compares an integration signal generated by the integrator circuit to a reference voltage and outputs a comparison result thereby obtained in the form of a power supply state information signal. The status register latches the power supply state information signal outputted from the comparator circuit. A timing of latching the power supply state information signal is coincident with a timing of the power supply voltage variation signal to become active.

The state of power supply of the voltage generating unit is inputted to the integrator circuit in the form of a pulse signal indicating an on-duty driving rate. The integrator circuit integrates the power supply voltage variation signals during the inactive period. An integration value is larger as the inactive period of the power supply voltage variation signal is longer. The comparator circuit compares the integration signal to the reference voltage. When the compared integration signal is larger than the reference voltage, the output of the comparator circuit is logically inverted. The output of the comparator circuit is latched by the status register when an access period ends.

When the state of power supply (driving rate or affordability) of the voltage generating unit is larger than a predefined value, increasing the likelihood of overload, the status register is set to an asserted state. When the state of power supply is lower than the predefined value, the status register is set to a negated state.

When the information of the power supply state notifying signal (driving rate) is thus set in the status register, the flash memory controller can suitably obtain by polling (inquiry at regular or irregular intervals) the power supply state information of the power supply circuit for memory system.

Though not illustrated in the drawings because examples of the state of power supply are be easily anticipated by the ordinarily skilled in the art, a pulse signal indicating not the drivability but the affordability of the voltage generating unit with an on-duty ratio can be outputted by additionally providing a node N10 with an inverter circuit. The integration of the pulse signal indicating the affordability enables to monitor the operational affordability of the voltage generating unit. The affordability is higher as a signal integration value of the node N10 has a larger value. On the other hand, the voltage generating unit is more actively operating as the integration value is lower, suggesting that the affordability is lower. This means that overload is more likely to occur as the affordability is lower. The drivability is mostly used in the description of the power supply circuit, however, the affordability may also be used as an indicator.

A specific example of <65> is hereinafter described as a working example 31 of the invention.

Working Example 31

Figure 59:
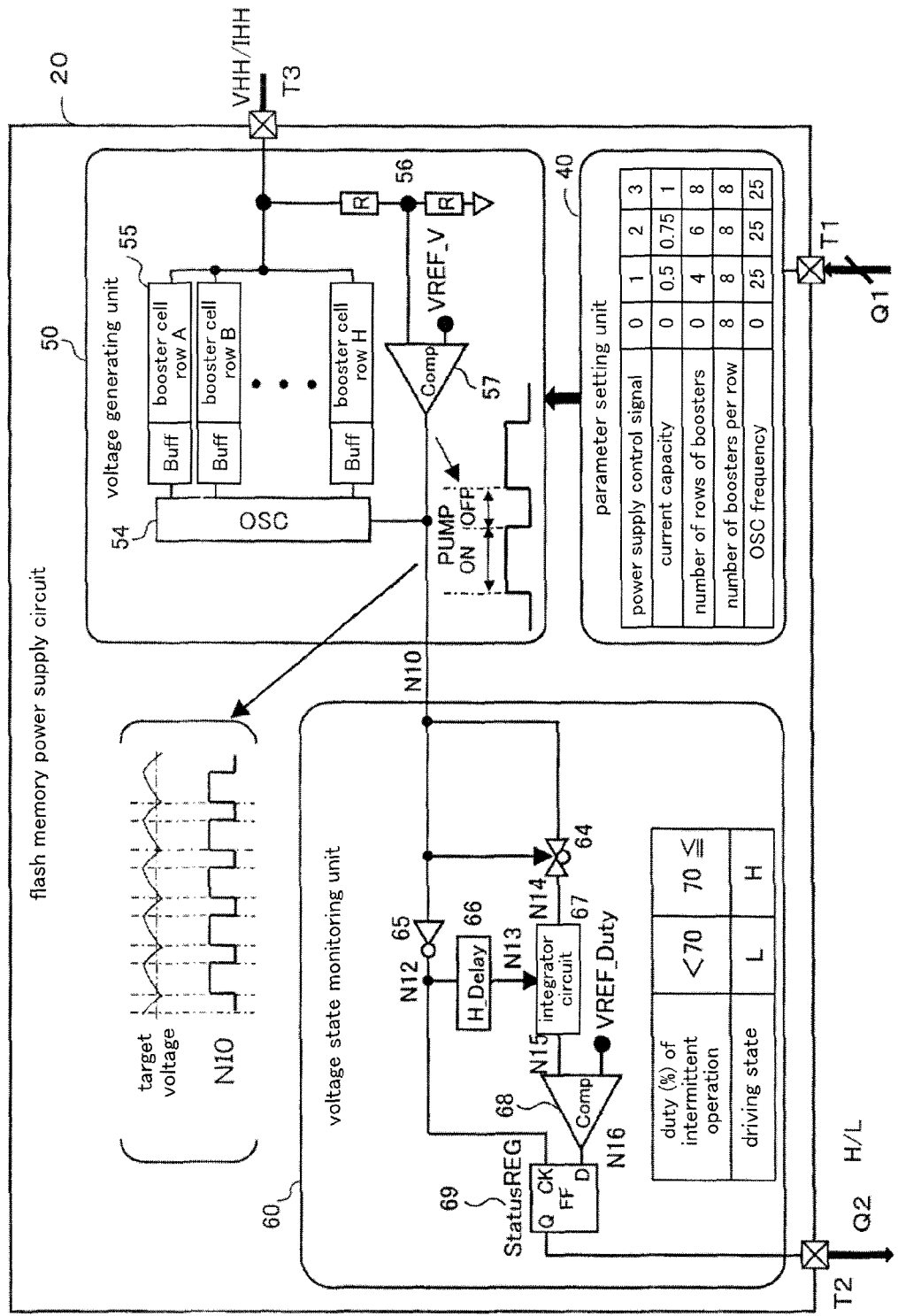
FIG. 59 is a block diagram illustrating structural characteristics of a power supply circuit for nonvolatile storage system according to a working example 31 of the invention.

FIG. 59 is a block diagram illustrating detailed structural characteristics of the power supply circuit 20. The parameter setting unit 40 is configured to set in the voltage generating unit 50 the various parameters necessary for the voltage generating unit 50. The parameter setting unit 40 has four setting items. When the power supply control signal Q is "1", for example, the current capacity is set to "0.5", the number of rows of boosters is set to "4", the number of boosters per row is set to "8", and the oscillation frequency is set to "25". When the power supply control signal Q is "3", for example, the current capacity is set to "1", the number of rows of boosters is set to "8", the number of boosters per row is set to "8", and the oscillation frequency is set to "25".

The voltage generating unit 50 includes an oscillator circuit 54, a plurality of booster circuits 55, a voltage detector 56, and a comparator circuit 57 having a differential amplifier. An output terminal of the oscillator circuit 54 is connected to input terminals of the booster circuits 55, and output terminals of the booster circuits 55 are connected to a power supply output terminal T3 and an input terminal of the voltage detector 56. An output terminal of the voltage detector 56 is connected to a non-inversion input terminal (−) of the comparator circuit 57. An output terminal of the comparator circuit 57 is connected to a frequency control terminal of the oscillator circuit 54 and an input terminal of the voltage state monitoring unit 60.

The parameters set by the parameter setting unit 40 are used to decide the frequency of the oscillator circuit 54, the number of rows of booster circuits 55, and the number of booster circuits 55 per row. The booster circuits 55 are driven by the output of the oscillator circuit 54, and the reference power supply voltage VDD is boosted to a higher voltage level to generate an increased voltage VHH. The increased voltage VHH is supplied to the flash memories 26 through the power supply output terminal T3. The increased voltage VHH changes depending on loads connected to the output terminals of the booster circuits 55.

The generated power supply voltage is detected by the voltage detector 56 having a voltage dividing function. The voltage detector 56 outputs a detection result thereby obtained to the comparator circuit 57. The detection result is inputted to the comparator circuit 57 in the form of a voltage signal, which is a pulsating current. The comparator circuit 57 compares the detection result (voltage signal) to a voltage to be referenced VREEF_V and outputs a comparison result thereby obtained as a power supply voltage variation signal N10. The power supply voltage variation signal N10 is a pulse signal having an on/off duty ratio.

A further detailed description is given below. When the increased voltage VHH falls below a target voltage level, a voltage divided by a resistor R falls below the voltage to be referenced VREEF_V, and the comparator 57 outputs "H" level as the power supply voltage variation signal N10. The comparator circuit 57 outputs the generated power supply voltage variation signal N10 to the voltage state monitoring unit 60 in a subsequent stage. The comparator circuit 57 transmits a feedback of the power supply voltage variation signal N10 to the oscillator circuit 54 to convert an oscillation output into a pulsating current based on the on/off control of the power supply voltage variation signal N10. The voltages generated and outputted by the booster circuits 55 in the voltage generating unit 50 are controlled by the parameters 40 set based on the parameter setting unit 40.

When the comparator circuit 57 is outputting "H" level, the oscillator circuit 54 is active, and the voltage increase continues. When the increased voltage VHH exceeds the target voltage level, the voltage divided by the resistor R of the voltage detecting unit 56 exceeds the voltage to be referenced VREEF_V, and the comparator circuit 57 outputs "L" level. When the comparator circuit 57 is outputting "L" level, the oscillator circuit 54 is inactive, and the voltage increase is suspended. This means that the interval of "H" level of the power supply voltage variation signal N10 outputted from the comparator circuit 57 can be converted to the driving rate of the booster circuit 55, and the interval of "L" level of the power supply voltage variation signal N10 can defined as an operating surplus ratio.

The voltage state monitoring unit 60 includes a transfer gate 64, an inverter 65, a delay circuit 66, an integrator circuit 67, a comparator circuit 68, and a status register 69 (including flip-flops). In the voltage generating unit 50, the output terminal of the comparator circuit 57 from which the power supply voltage variation signal N10 is outputted is connected to an input terminal of the integrator circuit 67 through the transfer gate 64. The output terminal of the comparator circuit 57 is connected to a control terminal of the transfer gate 64 and an input terminal of the inverter 65. An output terminal of the inverter 65 is connected to an input terminal of the delay circuit 66. An output terminal of the delay circuit 65 is connected to a control terminal of the integrator circuit 67. An output terminal of the integrator circuit 67 is connected to a non-inversion input terminal (+) of the comparator circuit 68. An output terminal of the comparator circuit 68 is connected to a data input terminal of the status register 69. The output terminal of the inverter 65 is connected to a clock input terminal of the status register 69. A data output terminal of the status register 69 is connected to the power supply state notifying terminal T2.

Figure 60:
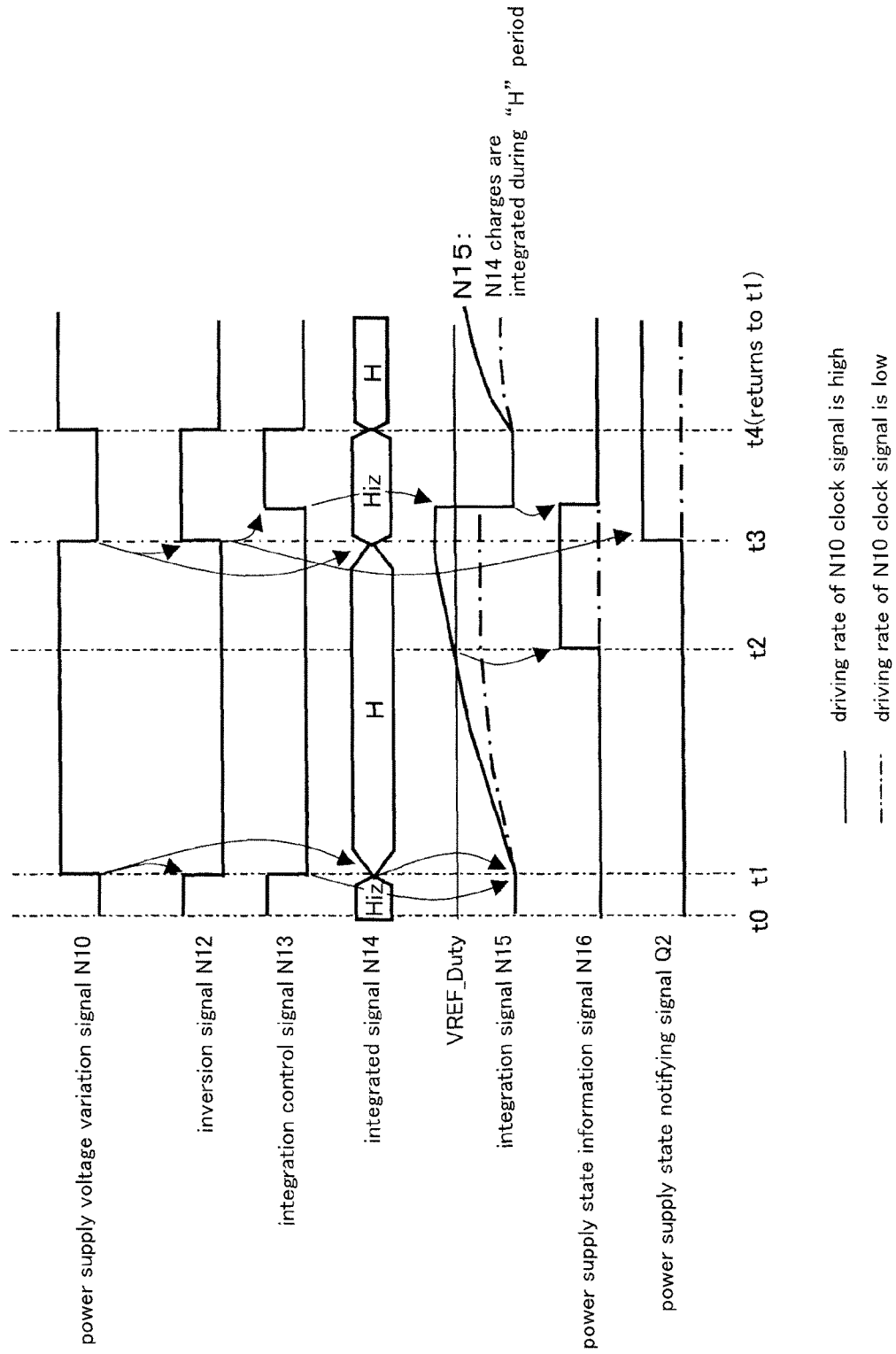
FIG. 60 is a timing chart illustrating an operation of the power supply circuit for nonvolatile storage system according to the working example 31.

An operation of the voltage state monitoring unit 60 is described referring to a timing chart illustrated in FIG. 60. The power supply voltage variation signal N10 indicating the driving rate of the voltage generating unit 50 is inputted to the input terminal and the control terminal of the transfer gate 64. The transfer gate 64 is opened when the control input is at "H" level but is closed when the control input is at "L" level. An integrated signal N14 that passed through the transfer gate 64 is at "H" level when the gate is opened and has high impedance (Hiz) when the gate is closed.

The inverter 65 logically inverts the power supply voltage variation signal N10 and outputs an inversion signal N12 thereby obtained to the delay circuit 66 and the clock input terminal of the status register 66. An integration control signal N13 outputted from the delay circuit 66 rises by a delayed timing. The integration control signal N13 is used to operate the integrator circuit 67. During a period when the integration control signal N13 is at "L" level, the integrator circuit 67 performs an integrating operation during the "H" level period of the integration target signal N14 that passed through the transfer gate 64 over time to generate an integration signal N15. The integration result signal N15 is inputted to the analog comparator circuit 68 to be compared to a period-defining voltage to be referenced VREF_Duty and outputted as a power supply state information signal N16.

When the integration result signal N15 has a higher level over time and finally reaches the voltage to be referenced VREF_Duty, the power supply stat information signal N16 outputted from the comparator circuit 68 currently at "L" level is inverted to "H" level. In the case where the integration control signal N13 fails to reach the voltage to be referenced VREF_Duty during the period of "L" level regardless of the higher level of the integration result signal N15, the voltage level of the power supply state information signal N16 outputted from the comparator circuit 68 stays at "L" level. At the time, the driving rate of the voltage generating unit 50 still fails to meet a desirably expected level. The voltage generating unit 50 has a desirably expected driving rate as far as the voltage level of the power supply state information signal N16 is at "H" level. The desirably expected driving rate is obtainable through adjustment of the voltage to be referenced VREF_Duty of the comparator circuit 68.

The power supply state information signal N16 is thus outputted from the comparator circuit 68, and then applied to the data input terminal of the status register 69. The logical state of the power supply state information signal N16 is fetched by the status register 69 including flip-flops by a clock rising timing of the inversion result signal N12 from the inverter 65 and outputted as the power supply state notifying signal Q2 to the flash memory controller 10 through the power supply state notifying terminal T2.

The operation of the voltage state monitoring unit 60 is characterized by integration and comparison. As the driving rate of the voltage generating unit 50 is higher, the period of "H" level of the power supply voltage variation signal N10 is longer, and the period of integration is also longer. As a result, it is more likely that the power supply state information signal N16 outputted from the comparator circuit 68 is logically inverted to become active. As the driving rate of the voltage generating unit 50 is lower, the period of "H" level of the power supply voltage variation signal N10 is shorter, and the period of integration is also shorter. As a result, it is more likely that the power supply state information signal N16 outputted from the comparator circuit 68 is not logically inverted and remains inactive. Thus, the voltage state monitoring unit 60 is monitoring whether the driving rate of the voltage generating unit 50 exceeds a certain threshold. Whenever the driving rate exceeds the threshold, the voltage generating unit 50 of the power supply circuit 20 is beyond the boundary defining the occurrence of overload. The driving rate of the voltage generating unit 50 induced by the voltage state monitoring unit 60 is outputted as the power supply state notifying signal Q2 through the power supply state notifying terminal T2. Thus, "beyond the boundary defining the occurrence of overload" is defined because the status register 69 is a 1-bit register. If the status register 69 is a multi-bit register, the driving rate is compared to an arbitrary threshold level.

The power supply state notifying signal Q2 shifts to "H" level when a ratio of the period of "H" level of the power supply voltage variation signal N10 to a cycle of the oscillator circuit 54 exceeds a predefined value. Otherwise, the power supply state notifying signal Q2 stays at "L" level. This is useful for determining whether the driving rate of the voltage generating unit is over or below the threshold because the on/off duty ratio of the power supply voltage variation signal N10 is substantially equivalent to the driving rate of the voltage generating unit 50.

The flash memory controller 10 that received the power supply state notifying signal Q2 updates the power supply control signal Q1 and supplies the updated power supply control signal Q1 to the parameter setting unit 40. Then, the current capacity of the power supply circuit 20 is reset to a lower current value. Accordingly, the on/duty ratio of the power supply voltage variation signal N10 is reduced, the period of "H" level of the integration target signal N14 is shorter, and the integration result signal N15 is not logically inverted and stays at "L" level. As a result, the power supply state information signal N16 stays at "L" level, and the power supply state notifying signal Q2 is inverted to "L" level by a rising timing of the inversion result signal N12.

According to the working example wherein the information of the power supply state notifying signal N16 (driving rate) is previously set in the status register 69, the flash memory controller 10 can suitably obtain by polling the power supply state information of the power supply circuit 20.

<66> [Counter Circuit]

The power supply circuit for memory system recited in <65> characterized by the integrator circuit, comparator circuit, and status register can employ the following technology for ensuring an operational stability against high frequencies. In the voltage state monitoring unit, a counter circuit is preferably interposed between an input unit of the power supply voltage variation signal and the integrator circuit.

The level of the integration signal is elevated over time. The integrator circuit integrates the power supply voltage variation signals. As an operation clock frequency is higher in the voltage generating unit, the power supply voltage variation signal has a shorter cycle, often lacking in enough time for the integration result signal to reach the voltage to be referenced in the comparator circuit. To avoid the problem, the power supply voltage variation signals of a few cycles are integrated in place of the power supply voltage variation signals of one cycle. Supposing that the number of cycles is m, the counter circuit counts the power supply voltage variation signals of the m number of cycles. When a count value starting at 0 equals to (m−1), the count value is reset at the next count to 0. Because the power supply voltage variation signals are integrated over a period equivalent to the m number of cycles, the integration signal level is accurate enough for comparison to the voltage to be referenced.

Summarizing the description given so far, the power supply circuit for memory system is characterized in that the voltage state monitoring unit of the power supply circuit for memory system recited in <65> including the integrator circuit, comparator circuit, and status register includes a counter circuit for counting cycles of the power supply voltage variation signal provided between the input unit of the power supply voltage variation signal outputted from the voltage generating unit and the integrator circuit, wherein a count value of the counter circuit is reset after the power supply voltage variation signals are counted for a plurality of cycles.

Because the period of integration of the power supply voltage variation signals by the integrator circuit is extended as long as the count-up cycles of the counter circuit, the power supply state information (driving rate) can be very accurately known even when the voltage generating unit is operating at high frequencies. This actually provides the temporally averaged state of power supply of the voltage generating unit. In other words, the state transition is given temporal hysteresis to prevent the system condition being destabilized.

A specific example of <66> is hereinafter described as a working example 32 of the invention.

Working Example 32

Figure 61:
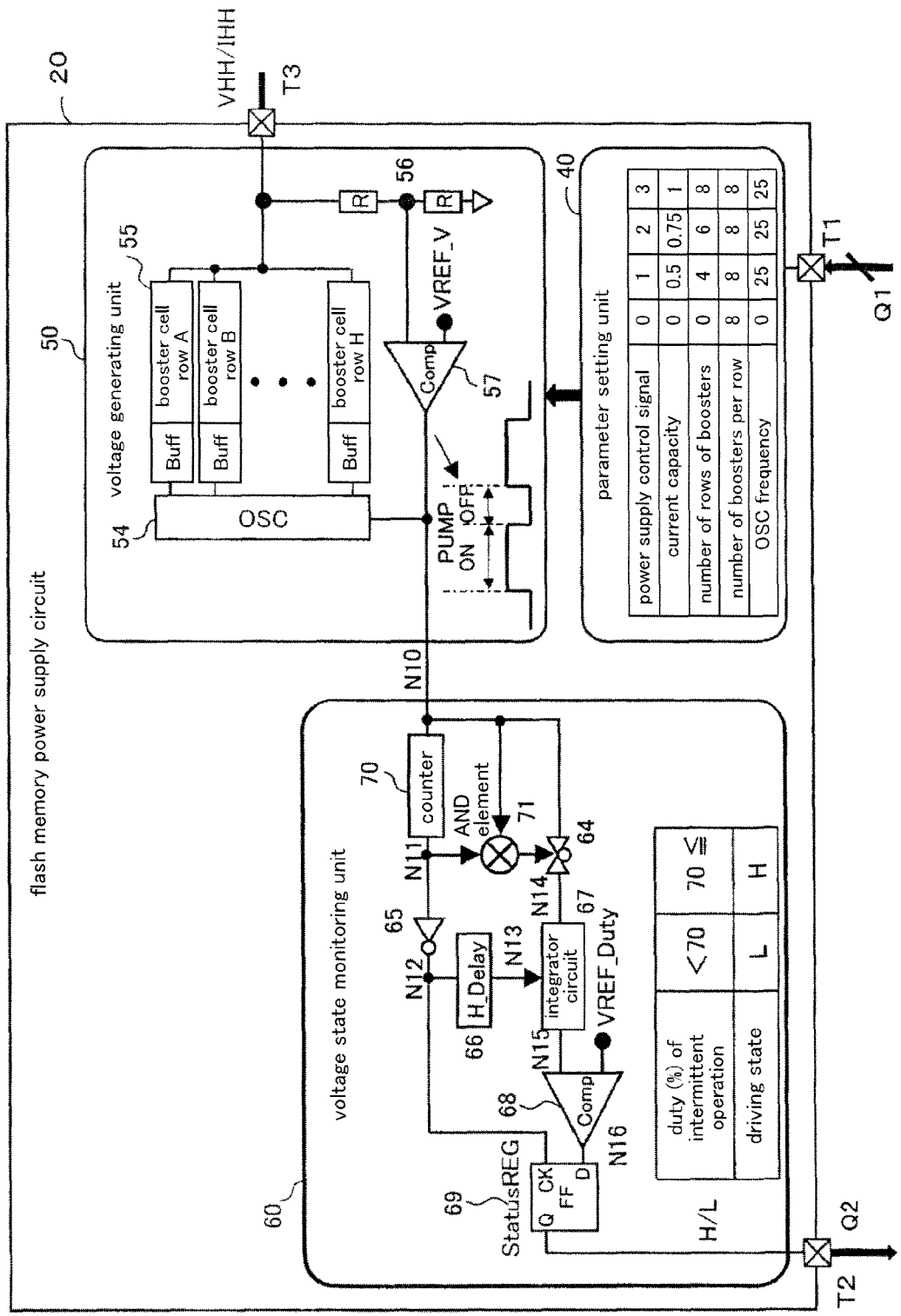
FIG. 61 is a block diagram illustrating structural characteristics of a power supply circuit for nonvolatile storage system according to a working example 32 of the invention.

FIG. 61 is a block diagram illustrating structural characteristics of a power supply circuit for memory system according to a working example 32 of the invention. According to this working example, the voltage state monitoring unit 60 illustrated in FIG. 59 according to the working example 31 is provided with a counter circuit 70 and an AND gate element 71. This technical feature is provided to deal with high oscillation frequencies of the oscillator circuit 54.

An input terminal of the counter circuit 70 is connected to the output terminal of the comparator circuit 57 of the voltage generating unit 50, and an output terminal of the counter circuit 70 is connected to the inverter 65. The input and output terminals of the counter circuit 70 are connected to an input terminal of the AND gate element 71, and an output terminal of the AND gate element 71 is connected to the control terminal of the transfer gate 64. When a count value of the counter circuit 70 starting at 0 equals to a predefined count value, the count value of the counter circuit 70 is reset at the next count to 0. The predefined count value is changeable by trimming Any other structural elements, which are similar to those illustrated in FIG. 59 according to the working example 14, are not described again.

This working example, wherein the counter circuit 70 is provided, is suitable for high frequencies of the oscillator circuit described later (see FIGS. 75 and 76). The working example described later uses an embedded capacitance element wherein boosting capacities of the booster circuits 55 are provided in the power supply circuit 20 (power supply chip).

Figure 62:
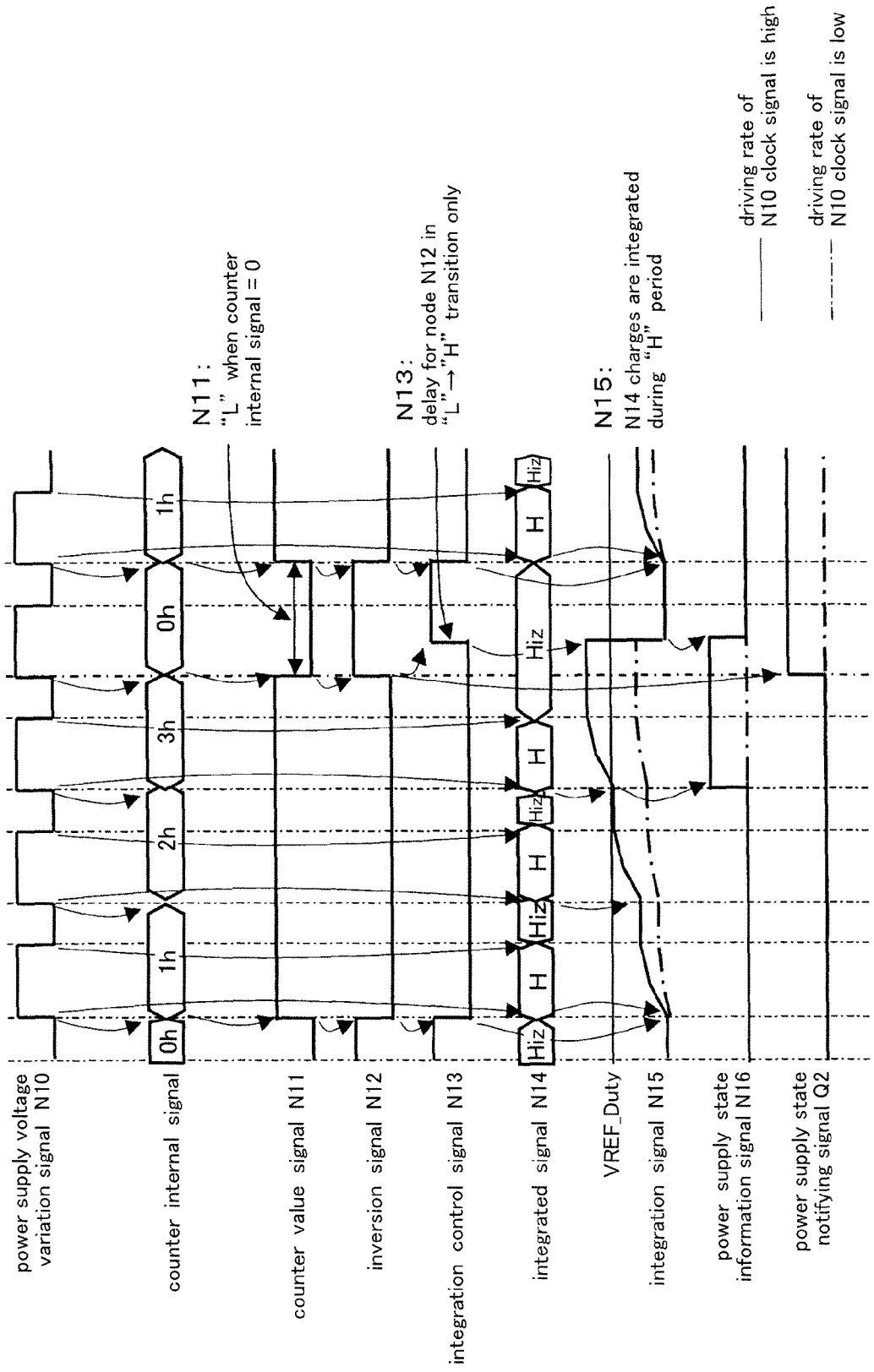
FIG. 62 is a timing chart illustrating an operation of the power supply circuit for nonvolatile storage system according to the working example 32.

FIG. 62 is a timing chart illustrating an operation of the power supply circuit 20 according to the working example 32 thus characterized. The operation is described referring to the timing chart. The counter circuit 70 of the voltage state monitoring unit 60 counts number of transitions of the power supply voltage variation signal N10 from "L" level to "H" level. A count value signal N11 outputted from the counter circuit 70 stays at "H" level until the count value reaches a count-up number. When the count value equal to the count-up number, the count value signal N11 is logically inverted and reset to "L" level. The count-up number is set to "4". When the count value starting at 0 equals to (m−1)=3, the count value is reset at the next count to 0. The count value signal N11 stays at "H" level for a period of time equivalent to three cycles. A reset timing of the count value signal N11 is coincident with a fetch timing of the logical state of the power supply state information signal N16 from the comparator circuit 68 into the status register 69.

The AND gate element 71 takes a logic product of the power supply voltage variation signal N10 and the count value signal N11 and opens the transfer fate 64 based on a result thereby obtained. Further, the AND gate element 71 inputs the power supply voltage variation signal N10 to the integrator circuit 67 as the integration target signal N14. The integrator circuit 67 performs an integrating operation during the period of "H" level of the integration target signal N14 and accumulates the obtained results for three cycles in total.

This actually provides the time of integration extended to three cycles, or an average result for three cycles when viewed from another perspective. Putting averaging differently, it is leveling off. When the oscillation frequency of the oscillator circuit 54 is high, the power supply voltage variation signal N10 often logically shifts, likely to disturbing the integrating operation. Any adverse influences from this disadvantage are averaged to be lessened. In other words, the state transition is given temporal hysteresis to prevent the system condition from being destabilized. How far the time of integration should be extended is adjustable by differently setting the count-up value of the counter circuit 70.

The status register 69 updates the logical state of the power supply state information signal N16 outputted from the comparator circuit 68 by a rising timing of the inversion result signal N12 from the inverter 65. The rising timing is equal to a timing by which the count value of the counter circuit 70 shifts to "0h". Every time when the count value is "0h", the state of power supply of the voltage generating unit 50 (driving rate or affordability) is updated in the status register 69. A cycle of the count value shifting to "0h" is adjustable as described earlier.

According to the working example wherein the counter circuit 70 is further provided, the period of integrating the power supply voltage variation signal N10 (integration target signal N14) is extended to the count-up cycles of the counter circuit 70. This consequently enables to accurately know the driving rate of the voltage generating unit 50 even when the voltage generating unit 50 is operating at high frequencies. Further, such a feedback control based on the driving rate makes it easy to optimize power consumption of the system.

<67> [Multi-Bit Outputs]

In the power supply circuits for memory system recited in <65> and <66> characterized by the integrator circuit, comparator circuit, and status register, the voltage state monitoring unit may be configured as described below. The comparator circuits and the status registers are provided in a plurality of stages for multi-bit outputs of the power supply state notifying signal. More specifically, the comparator circuits respectively having different voltages to be referenced are provided in a plurality of stages, and the status registers are provided in a plurality of stages respectively corresponding to the comparator circuits in the plurality of stages.

The power supply state notifying signal indicating the state of power supply of the voltage generating unit (driving rate or affordability) are supplied in the form of multi-bit outputs. As a result, the state of power supply of the voltage generating unit is specifically known in different stages, and power optimization of the system is further improved because the power supply state notifying signal has a better resolving power.

<68> [Multi-Bit Outputs]*[Table Conversion]

In the power supply circuit for memory system recited in <67> characterized by the status resisters in plural stages, the voltage state monitoring unit is preferably provided with a table converter circuit for reducing a necessary bit number is provided on an output side of the comparator circuits in plural stages or an output side of the status registers in plural stages.

The integration result simply increases, making it impossible that the bits are inverted to decrease during the operation. Accordingly, a bit number of the power supply state notifying signal can be reduced. This is the purpose of providing the table converter circuit.

The table convertor circuit serves to successfully reduce a necessary bit number. This simplifies the buses and terminals connecting the power supply circuit for memory system to the flash memory controller.

A specific example of <67> and <68> is hereinafter described as a working example 33 of the invention.

Working Example 33

Figure 63:
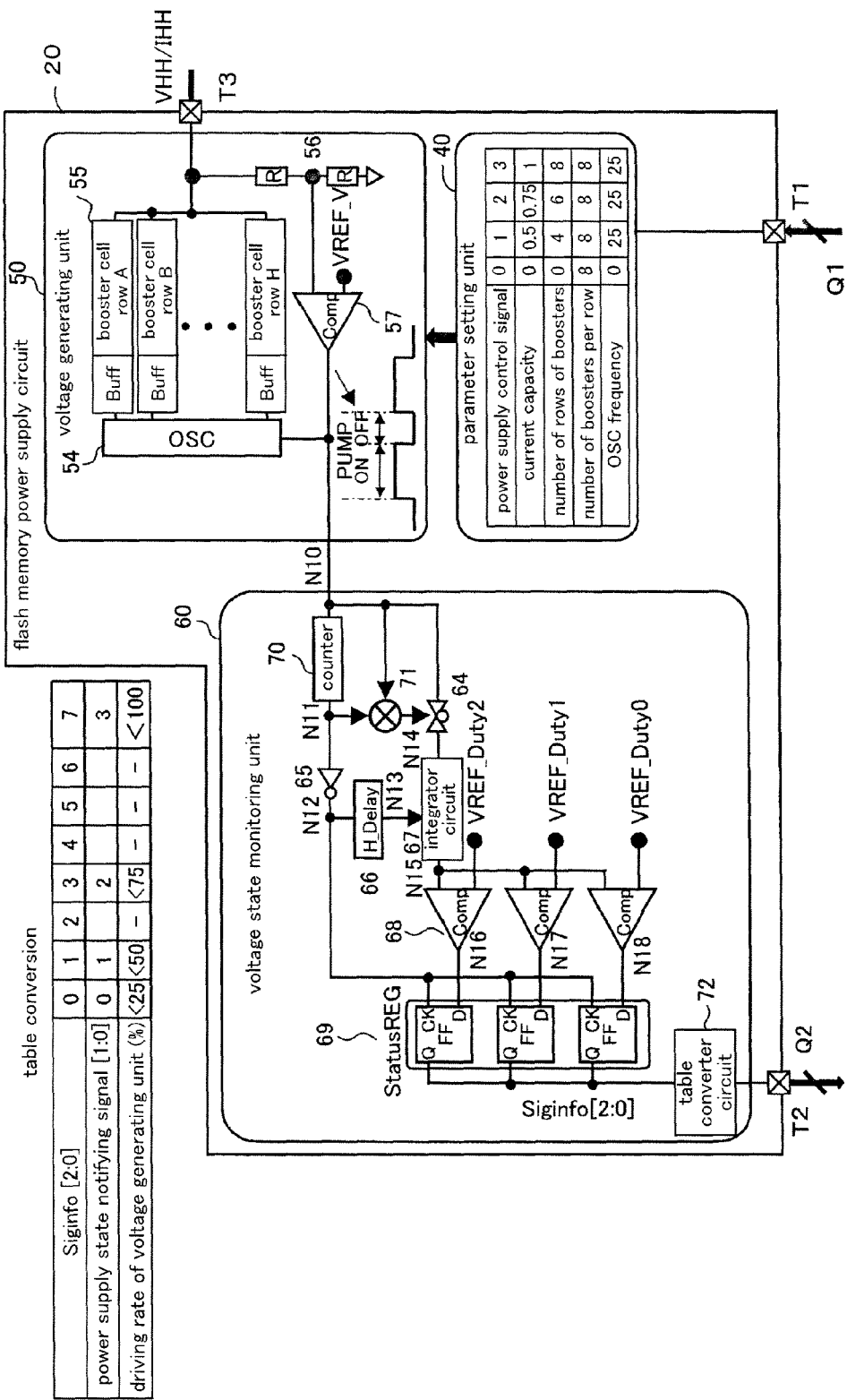
FIG. 63 is a block diagram illustrating structural characteristics of a power supply circuit for nonvolatile storage system according to a working example 33 of the invention.

FIG. 63 a block diagram illustrating structural characteristics of a power supply circuit for memory system according to a working example 33 of the invention. According to this working example, there are comparator circuits 68 in a plurality of stages on an output side of the integrator circuit 67. The comparator circuits 68 in plural stages respectively use different voltages to be referenced, which are VREF_Duty2>VREF_Duty 1>VREF_Duty0. The integration result signal N15 outputted from the integrator circuit 67 is inputted to all of the comparator circuits 68 in plural stages, meaning that the integration result signal N15 is supplied in the form of multi-bit outputs.

Similarly, there are status registers 69 in plural stages on an output side of the comparator circuits 68 in plural stages. To data input terminals of the status registers 69 in plural stages are inputted power supply state information signals N16, N17, and N18 which are outputted from the comparator circuits 68 through a wire connection provided therein. To clock input terminals of the status registers 69 in plural stages is inputted the inversion result signal N12 from the inverter 65 through a wire connection provided therein. Further, data output terminals of the status registers 69 in plural stages are connected to an input terminal of the table converter circuit 72, and an output terminal of the table converter circuit 72 is connected to the power supply state notifying terminal T2. From the table converter circuit 72 are supplied multi-bit outputs of the power supply state notifying signal Q2, which are inputted to the flash memory controller 10.

The integration result signal N15 is divided into the following four different signal levels to more finely detect the driving rate of the voltage generating unit 50 in different stages.

equal to or lower than VREF_Duty0 higher than VREF_Duty0 and equal to or lower than VREF_Duty1 higher than VREF_Duty1 and equal to or lower than VREF_Duty2 higher than VREF_Duty2

The power supply state information signals N16, N17, and N18 outputted from the comparator circuits 68 in plural stages are either "0" or "1", and sequences of these signals are [0,0,0], [0,0,1], [0,1,0], [0,1,1], [1,0,0], [1,0,1], [1,1,0], and [1,1,1]. Any one of these data sequences is set in the status registers 69 in plural stages.

In none of these data sequences, there is no inversion/decrease of the bits from the preceding data sequences. Focusing on [0,1,0], for example, the preceding sequence is [0,0,1]. The least significant bit of [0,1,0] is 0, while the least significant bit of [0,0,1] is 1. Thus, the bit is inverted and decreased. An integration result is supposed to simply increase with no possibility of such a decrease during the operation. Therefore, [0,1,0], [1,0,0], [1,0,1], and [1,1,0] of eight data sequences are impossible. When these data sequences are decimally represented, they are respectively "2", "4", "5", and "6". Deducting the four impossible ones from the eight data sequences leaves the other four data sequences, which are [0,0,0], [0,0,1], [0,1,1], and [1,1,1] ("0", "1", "3", and "7" when decimally represented). These decimal numbers are inconsecutive, which are difficult to use on the system side, and the output bit number can be reduced from 3 bits to 2 bits. The table converter circuit 72 is provided for this purpose.

[0,0,0], [0,0,1], [0,1,1], and [1,1,1] ("0", "1", "3", and "7" when decimally represented) are respectively converted to [0,0], [0, 1], [1, 0], and [1,1] ("0", "1", "2", and "3" when decimally represented). As a result of the table conversion, consecutive bit values can be outputted.

Different numeral values of the driving rate are associated with "0", "1", "2", and "3" of the power supply state notifying signal Q2. This description sets an example; less than 25%, equal to or lager than 25% and less than 50%, equal to or larger than 50% and less than 75%, and equal to or larger than 75% and less than 100%.

Referring to the illustration of FIG. 63, the table converter circuit 72 is provided on the output side of the status registers 69 in plural stages. In consideration of the function thereby exerted, the table converter circuit 72 may be provided on the input side of the status registers 69 in plural stages. The driving rate of the voltage generating unit, given examples of which are at most 25%, at most 50%, at most 75%, and at most 100%, may be arbitrarily decided in accordance with any driving rate necessary in the system when the voltages to be referenced VREF_Duty0-VREF_Duty are set. For example, at most 50%, at most 60%, at most 80%, and at most 90%. Any other structural elements, which are similar to those illustrated in FIG. 61 according to the working example 15, are not described again.

FIG. 64 is a timing chart illustrating an operation of the power supply circuit 20 according to the working example 33 thus characterized. Describing the operation in contrast to the illustration of FIG. 62 according to the working example 32, three voltages to be referenced are set; VREF_Duty2, VREF_Duty1, and VREF_Duty0, and three power supply state information signals N16, N17, and N18 are obtained. The power supply state notifying signal Q2 is binary bit data.

According to the working example wherein multi-bit outputs of the driving rate of the voltage generating unit 50 is supplied, the state of power supply of the voltage generating unit 50 is specifically known in different stages, and power optimization of the system can be further improved.

The necessary bit number is decreased by providing the table converter circuit 72. This simplifies the busses and terminals connecting the power supply circuit 20 to the flash memory controller 10.

<69> [State Transition Detector]

In the power supply circuits for memory system recited in <65> and <66> characterized by the status register, the power supply state notifying signal may be an interrupt signal. To set the power supply state information in the status register, the flash memory controller checks the state of power supply of the power supply circuit for memory system by polling performed at regular or irregular intervals. When the state of power supply is thus checked by polling, there is conventionally generated a delay from the transition timing of the state of power supply. An interrupt technique hereinafter described solves the problem of such a delay.

In <65> and <66>, the voltage state monitoring unit includes a state transition detector on the output side of the status register, wherein the state transition detector generates and outputs an interrupt signal when contents of the status register change.

The technical feature is applicable to the power supply circuit for memory system provided with one status register and also applicable to the power supply circuit for memory system provided with two status registers or more.

For any change of the contents of at least one status register, the state transition detector detects the change and outputs the interrupt signal to the flash memory controller. The flash memory that received the interrupt signal immediately accesses the status register to obtain the power supply state information at the time when the state of power supply changed.

This technical feature avoids any possible delay in obtaining the power supply state information, improving responsiveness when the flash memory controller controls the voltage generating unit to adjust the state of power supply.

By using the interrupt signal as a power supply state transition notifying signal, the system is required to check the power supply state notifying signal only when the power supply state transition notifying signal changed. As a result, the system configuration can be simplified. It is unnecessary for the flash memory controller to repeatedly check the power supply state notifying signal at regular intervals by polling, making the system so simple and easy to use.

A specific example of <69> is hereinafter described as a working example 34 of the invention.

Working Example 34

Figure 65:
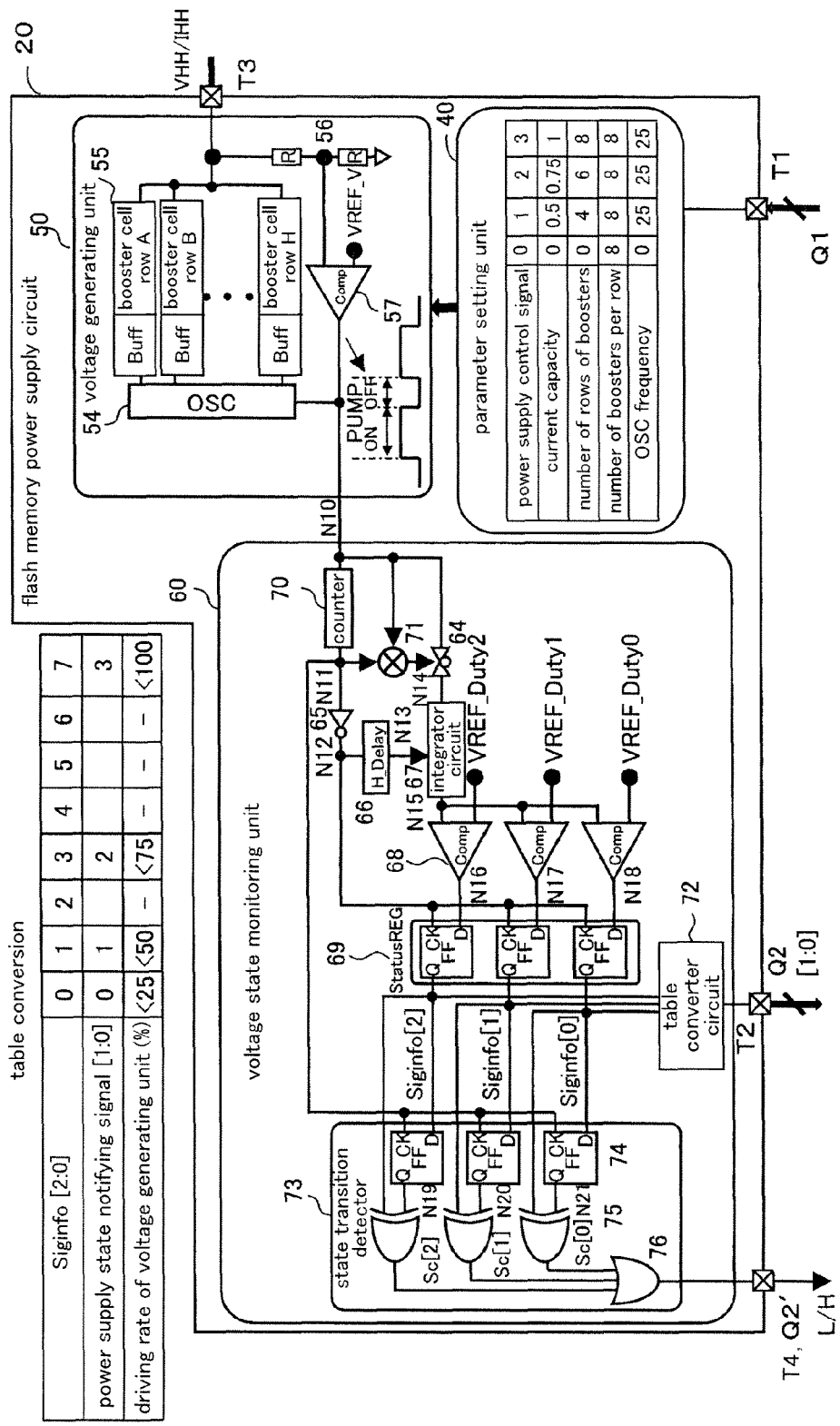
FIG. 65 is a block diagram illustrating structural characteristics of a power supply circuit for nonvolatile storage system according to a working example 34 of the invention.

FIG. 65 a block diagram illustrating structural characteristics of a power supply circuit for memory system according to a working example 34 of the invention. According to this working example, a state transition detector 73 is further provided in the power supply circuit for memory system according to the working example 33 illustrated in FIG. 63 to generate an interrupt signal when contents of the status register 69 change and outputs the generated interrupt signal to the flash memory controller 10. The state transition detector 73 includes registers 74 in plural stages, EXCLUSIVE-OR gates 75 in plural stages, and an OR gate 76. The registers 74 and the EXCLUSIVE-OR gates 75 are provided in the number of stages equal to the stages of the status registers 69. Data input terminals of the registers 74 are connected to data output terminals of the status registers 69, and clock input terminals of the registers 74 are connected to the output terminal of the counter circuit 70. Data output terminals of the registers 74 and the data output terminals of the status registers 69 are connected to input terminals of the EXCLUSIVE-OR gates 75. Output terminals of the EXCLUSIVE-OR gates 75 are connected to an input terminal of the OR gate 76, and an output terminal of the OR gate 76 is connected to a power supply state transition notifying terminal T4. The power supply state transition notifying terminal T4 is connected to the flash memory controller 10.

The state transition detector 73 compares present data to earlier data of the status registers 69 to detect whether there is any transition therebetween and outputs a detected result in the form of a power supply state transition notifying signal Q2'. Any other structural and technical characteristics, which are similar to those of FIG. 63 according to the working example 16, are not described again.

Figure 66:
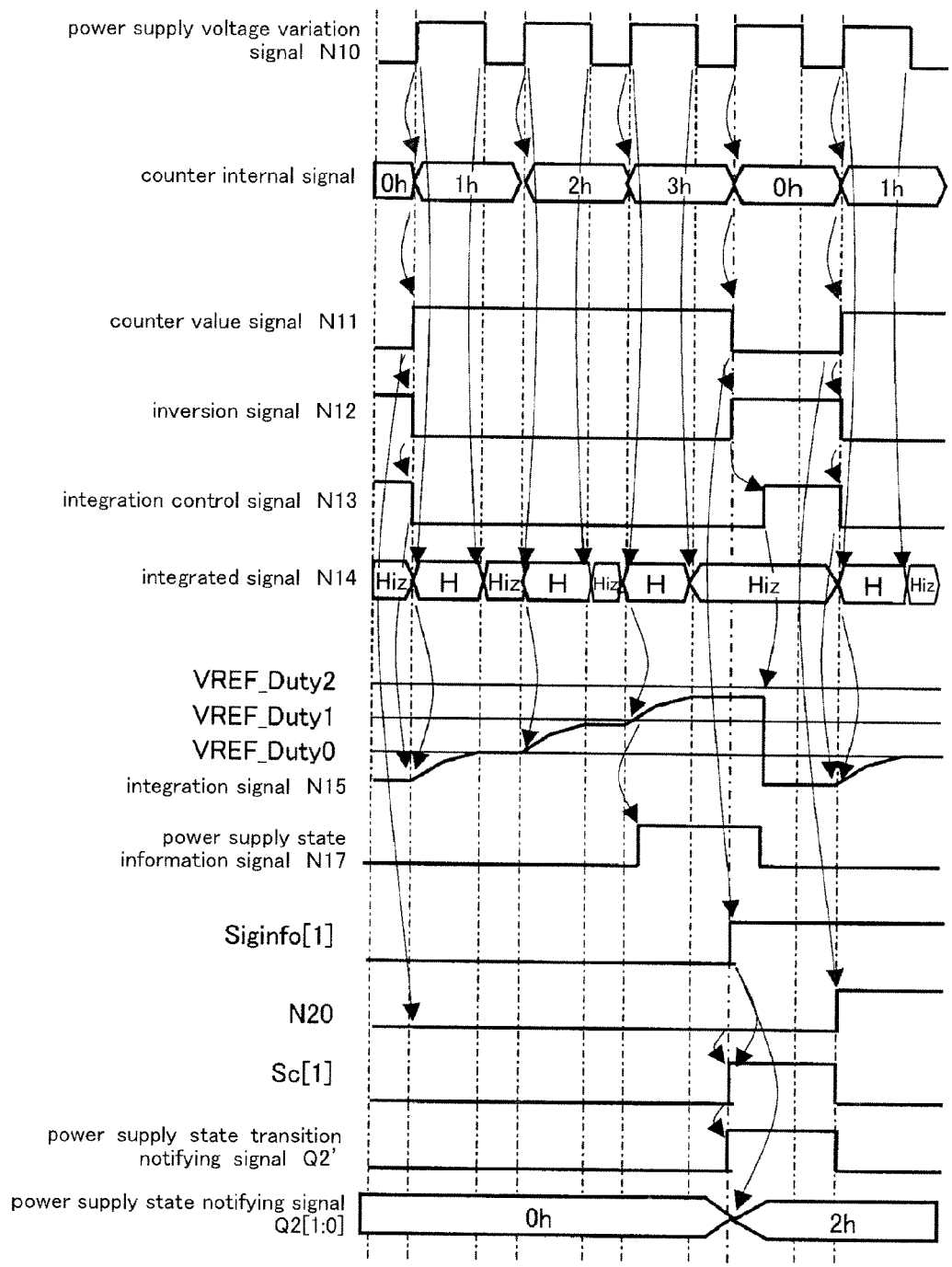
FIG. 66 is a timing chart illustrating an operation of the power supply circuit for nonvolatile storage system according to the working example 34.

FIG. 66 is a timing chart illustrating an operation of the power supply circuit 20 according to the working example 34 thus characterized. A second one of three status registers 69 is used to describe the operation. The voltage to be referenced of the second comparator circuit 68 is VREF_Duty1. When the integration result signal N15 exceeds the level of VREF_Duty1, the power supply state information signal N17 becomes active, and "H" level is set in the second status register 69 by a rising timing of the inversion result signal N12 of the inverter 65. In response to that, Siginfo[1] outputted from the status register 69 shifts from "L" level to "H" level. By a timing by which Siginfo[1] at "H" level is inputted to the EXCLUSIVE OR gate 75, the level of an output signal N20 of the register 74 to be inputted to the EXCLUSIVE OR gate 75 is checked. At the time, the count value signal N11 from the counter circuit 70 is at "L" level, therefore, "H" level of Siginfo[1] is not fetched by the register 74, and the output signal N20 stays at "L" level. One of the inputs to the EXCLUSIVE OR gate 75 is "H" level of Siginfo[1], while the other input to the EXCLUSIVE OR gate 75 is "L" level of the output signal N20. Therefore, an output signal SC[1] of the EXCLUSIVE OR gate 75 shifts from "L" level to "H" level. As a result, the power supply state transition notifying signal (interrupt signal) Q2' outputted from the OR gate 76 shifts from "L" level to "H" level.

Summarizing the description given so far, when the integration result signal N15 exceeds the voltage to be referenced VREF_Duty1, the power supply state transition notifying signal Q2' becomes active as soon as the count value signal N11 rises. The active power supply state transition notifying signal Q2' is reset to "L" level by a timing by which the count value signal N11 rises again.

The description given so far with reference to the second status register 69 is also applicable to the other first and third status registers 69. Similarly, when the integration result signal N15 exceeds the voltage to be referenced VREF_Duty0, the power supply state transition notifying signal Q2' becomes active as soon as the count value signal N11 rises. When the integration result signal N15 exceeds the voltage to be referenced VREF_Duty2, the power supply state transition notifying signal Q2' becomes active as soon as the count value signal N11 rises.

According to the working example, when the logical value of the 1-bit or multi-bit power supply state transition notifying signal Q2' changes, the power supply state transition notifying signal Q2' (interrupt signal) is shifted to "H" level and the system is notified of the changed logical value. It is unnecessary for the system to check the power supply state transition notifying signal Q2' as far as the system is notified of the interrupt signal, thereby simplifying the system configuration.

<70> [Overload Detector]

The power supply circuits for memory system recited in <67> characterized by the plural status registers may be equipped with an overload detecting function. More specifically, an overload detector for detecting the likelihood of overload of the voltage generating unit is provided as an additional structural element of the voltage state monitoring unit. The overload detector receives the power supply voltage variation signal from the voltage generating unit to detect the likelihood of overload of the voltage generating unit based on the received power supply voltage variation signal. Then, the overload detector outputs an overload detection signal to the flash memory controller. This technical feature is aimed at dealing with forthcoming overload in the case where the state of power supply of the voltage generating unit is likely to undergo overload.

When the system is thus notified of the likelihood of overload, the system can know that the applied voltage to the flash memory is not a desirably expected voltage level. This prevents the system from being destabilized by any unwanted voltage, thereby avoiding an operational instability and system crash caused by overload. As a result, the data reliability is improved.

A specific example of <70> is hereinafter described as a working example 35 of the invention.

Working Example 35

Figure 67:
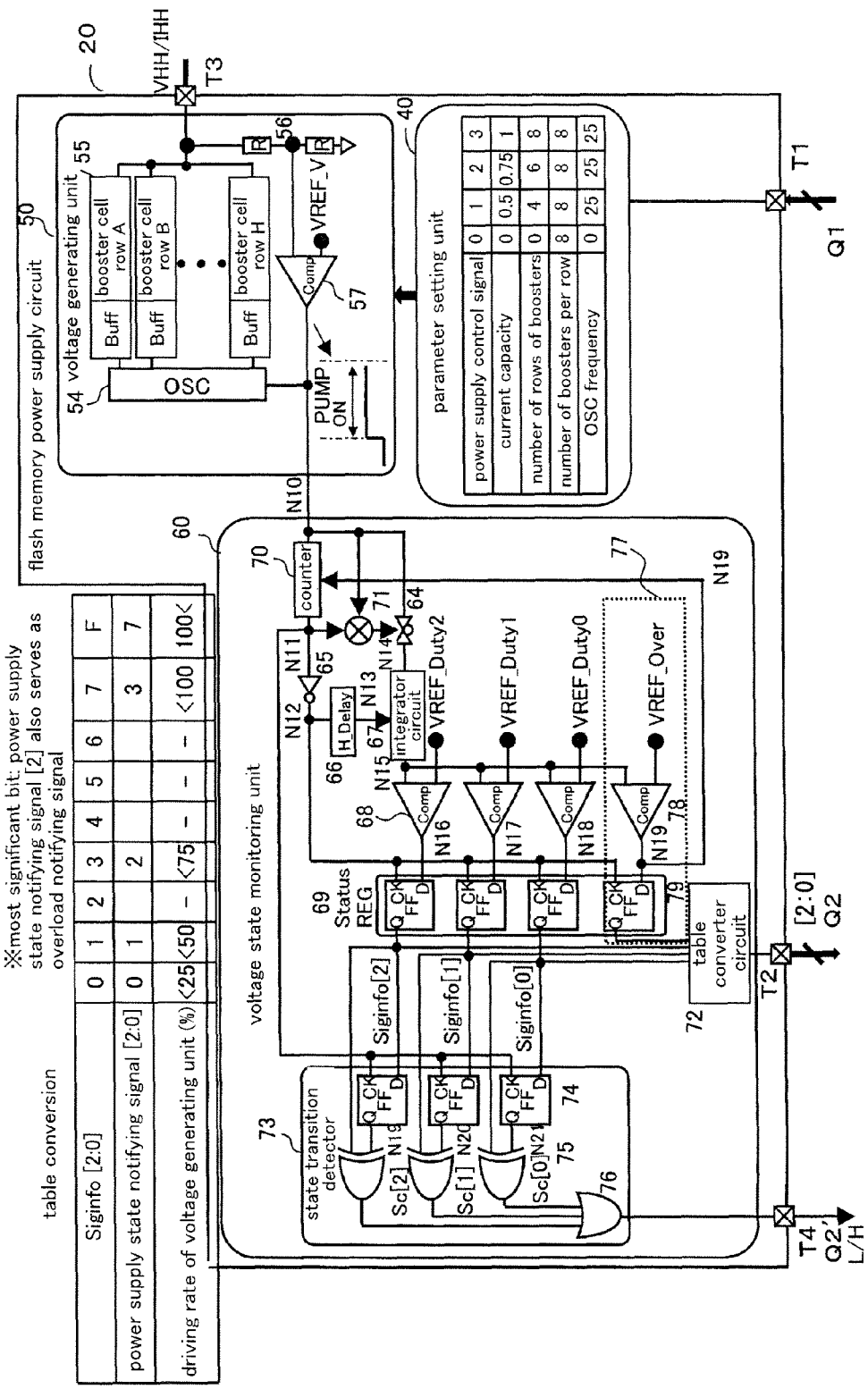
FIG. 67 is a block diagram illustrating structural characteristics of a power supply circuit for nonvolatile storage system according to a working example 35 of the invention.

FIG. 67 a block diagram illustrating structural characteristics of a power supply circuit for memory system according to a working example 35 of the invention. According to this working example, the voltage state monitoring unit 60 is further provided with an overload detector 77 on the output side of the integrator circuit 67 in the illustration of FIG. 65 according to the working example 34. The overload detector 77 includes a comparator circuit 78 for overload detection which compares the integration result signal N15 outputted from the integrator circuit 67 to a voltage to be referenced VREF_Over, and a status register 79 for overload detection. An output terminal of the comparator circuit 78 for overload detection is connected to a data input terminal of the status register 79 for overload detection. The output terminal of the inverter 65 is connected to a clock input terminal of the status register 79 for overload detection. A data output terminal of the status register 79 for overload detection is connected to the input terminal of the table converter circuit 72. The output terminal of the comparator circuit 78 for overload detection is connected to a reset terminal of the counter circuit 70.

Figure 68:
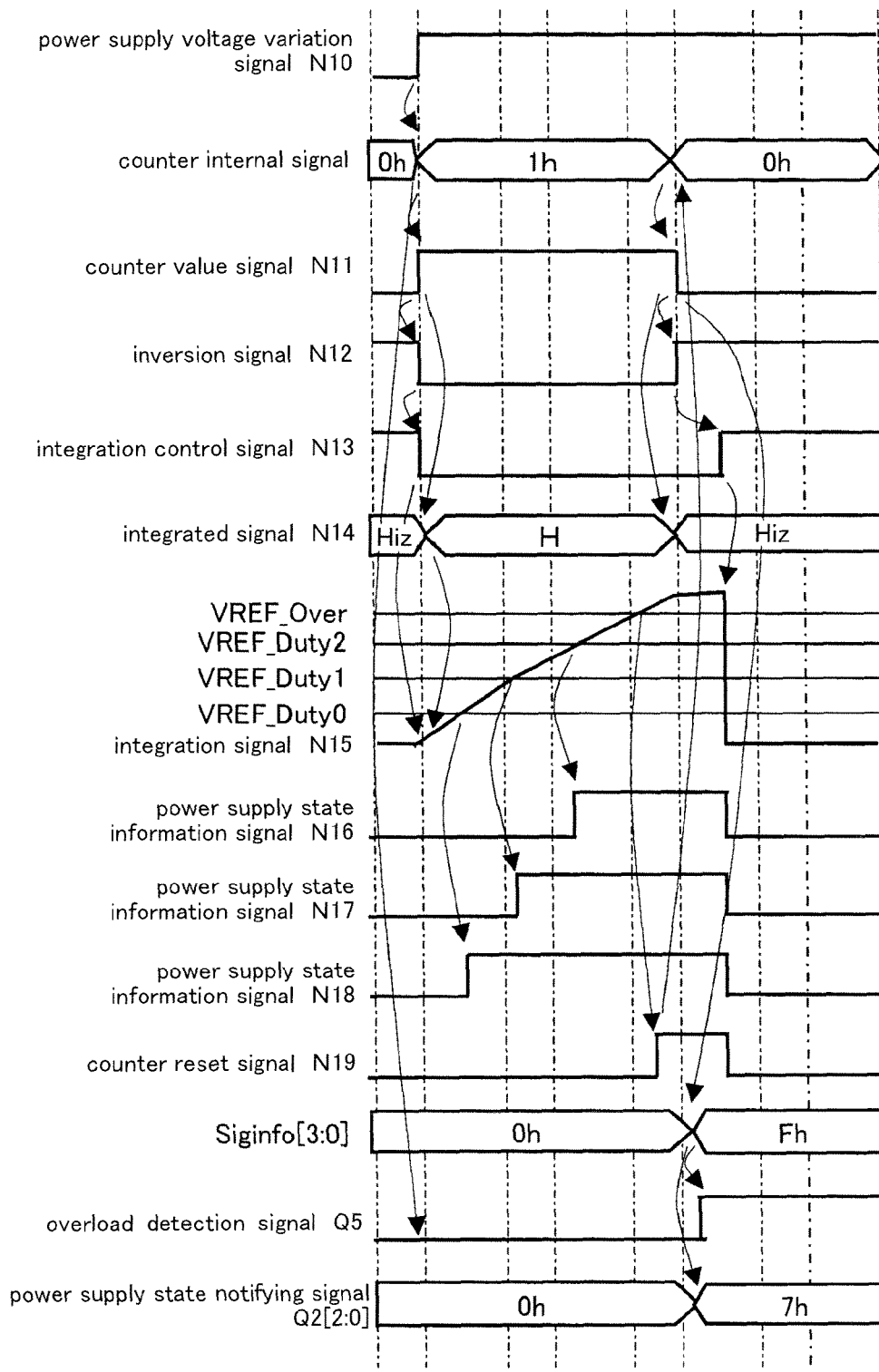
FIG. 68 is a timing chart illustrating an operation of the power supply circuit for nonvolatile storage system according to the working example 35.

The voltage to be referenced VREF_Over of the comparator circuit 78 for overload detection has a voltage level higher than the voltage level of VREF_Duty2 which is the highest level in the illustration of FIG. 65 (see FIG. 68). A counter reset signal N19 outputted from the comparator circuit 78 for overload detection as a result of overload detection is supplied to the counter circuit 70 to reset the counter circuit 70. An output of the status register 79 corresponding to the comparator circuit 78 for overload detection is allocated as the most significant bit "Fh" of Siginfo[3:0].

An operation of the power supply circuit for memory system according to the working example 33 thus characterized is hereinafter described. FIG. 68 is a timing chart illustrating the operation of the power supply circuit 20. When the voltage generating unit 50 is ready to consecutively operate, the power supply voltage variation signal N10 outputted from the comparator circuit 57 of the voltage generating unit 50 is always at "H" level. The counter circuit 70, in which the count-up operation is inactive, retains the same condition. The power supply voltage variation signals N10 is continuously integrated by the integrator circuit 67. Then, the integration result signal N15 obtained by the integrator circuit 67 is compared to the voltage to be referenced VREF_Over in the comparator circuit 78 for overload detection, and the counter reset signal N19 is shifted from "L" level to "H" level. The counter reset signal N19 at "H" level resets the counter circuit 70. By a timing by which the inversion result signal N12 obtained by the inverter 65 in the next stage of the counter circuit 70 shifts from "L" level to "H" level, the output signals of the comparator circuits 68 in plural stages and the comparator circuit 78 for overload detection are stored in the status registers 69 and the status register 79 for overload detection. Concurrently, an overload detection signal Q5 outputted from the status register 79 for overload detection shifts from "L" level to "H" level.

According to the working example wherein the counter reset signal N19 is additionally used, the system is immediately notified that the voltage outputted from the voltage generating unit 50 does not have a desirably expected voltage level. This avoids the system from being destabilized by any unwanted voltage in an early stage.

<71>, <72> [Setting Register, Logic Comparator Circuit]

In the power supply circuit for memory system recited in <67> characterized by the status registers provided in plural stages, the voltage state monitoring unit may be configured as described below. The voltage state monitoring unit is further provided with a setting register for retaining a comparative value of the state of power supply (driving rate) of the voltage generating unit (power supply state comparative value) inputted from outside to be set, and a logic comparator circuit for comparing the contents of the status registers provided in plural stages to contents of the setting register to activate the power supply state notifying signal when the former is equal to or larger than the latter and outputs the activated power supply state notifying signal to the flash memory controller.

In the power supply circuit for memory system recited in <68> characterized by the status registers provided in plural stages and the table converter circuit, the voltage state monitoring unit may be configured as described below. The voltage state monitoring unit is further provided with a setting register for retaining a comparative value of the state of power supply (driving rate) of the voltage generating unit (power supply state comparative value) inputted from outside to be set, and a logic comparator circuit for comparing the contents converted by the table converter circuit to contents of the setting register to activate the power supply state notifying signal when the former is equal to or larger than the latter and outputs the activated power supply state notifying signal to the flash memory controller.

In these power supply circuits, the power supply state comparative value is arbitrarily set in the setting register by a user's manual operation, or an arbitrary one of a plurality of power supply state comparative values is selected and set by the user.

The power supply state comparative value is thus set in the setting register in advance to know from outside of the power supply circuit whether the state of power supply of the voltage generating unit is equal to or larger or smaller than a desirably expected value. This helps to know whether the state of power supply of the voltage generating unit meets a value desirably expected by the system.

A specific example of <71> and <72> is hereinafter described as a working example 36 of the invention.

Working Example 36

Figure 69:
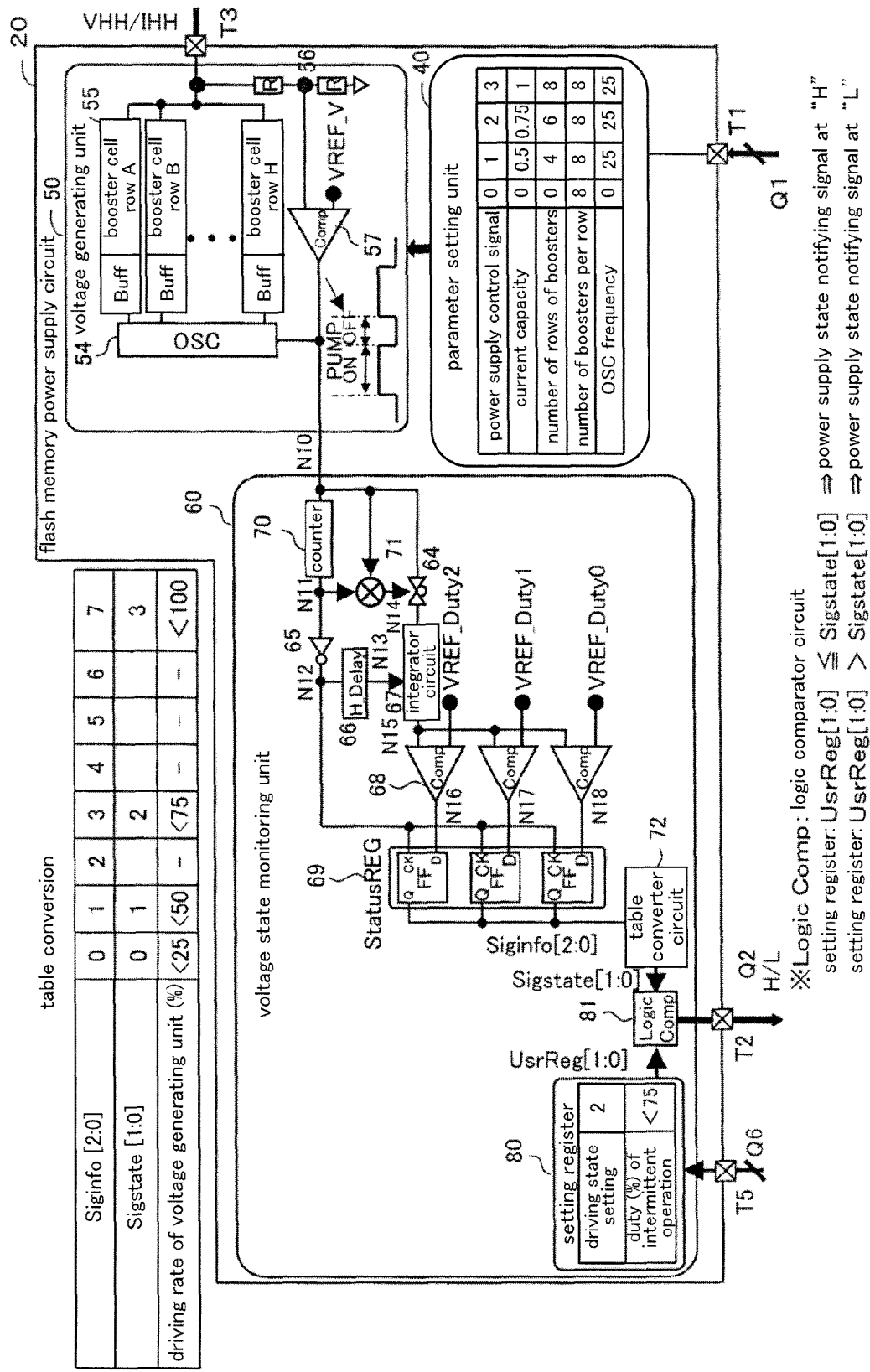
FIG. 69 is a block diagram illustrating structural characteristics of a power supply circuit for nonvolatile storage system according to a working example 36 of the invention.

FIG. 69 a block diagram illustrating structural characteristics of a power supply circuit for memory system according to a working example 36 of the invention. According to this working example, a rewritable setting register 80 and a logic comparator circuit 81 are further provided in the illustration of FIG. 63 according to the working example 33 recited in <68>.

The setting register 80 is provided so that a user sets therein a desirably expected power supply state comparative value (target driving rate) for the state of power supply of the voltage generating unit 50. The contents of the setting register 80 can be arbitrarily changed by the user. A reference symbol T5 is a driving state setting terminal for transmitting the target driving rate from the flash memory controller 10 to the setting register 80 in the form of a driving state setting signal Q6.

The logic comparator circuit 81 compares the contents of the table convertor circuit 72 to contents of the setting register 80 to generate the power supply state notifying signal Q2 when the former is equal to or larger than the latter and outputs the generated power supply state notifying signal Q2 to the flash memory controller 10 through the power supply state notifying terminal T2.

The driving rate of the voltage generating unit 50 set in the status registers 69 in plural stages is converted into a data format with reduced bit number by the table converter circuit 72. In the setting register 80 is set the power supply state comparative value (target driving rate) corresponding to the data format of the table converter circuit 72. Any other structural elements are similar to those illustrated in FIG. 63. The similar structural elements are simply illustrated with the same reference symbols to omit redundant description.

An operation of the power supply circuit for memory system according to the working example thus characterized is hereinafter described. In the logic comparator circuit 81, the logic value set in the status registers 69 in plural stages and bit-converted by the table converter circuit 72 is compared to the power supply state comparative value set in the setting register 80. When the bit-converted logic value is smaller than the power supply state comparative value, the logic comparator circuit 81 outputs the power supply state notifying signal Q2 at "L" level. When the bit-converted logic value is equal to or larger than the power supply state comparative value, the logic comparator circuit 81 outputs the power supply state notifying signal Q2 at "H" level. The power supply state notifying signal Q2 uses binary values (0 or 1) to indicate whether the present driving rate of the voltage generating unit meets a desirable value expected by the system. The logic comparator circuit 81 outputs the power supply state notifying signal Q2 with such information superimposed thereon to the flash memory controller 10. By thus setting the expectation value of the system (power supply state comparative value), the driving rate of the voltage generating unit 50 can be confirmed in details based on the two-bit power supply state notifying signal Q2.

Figure 70:
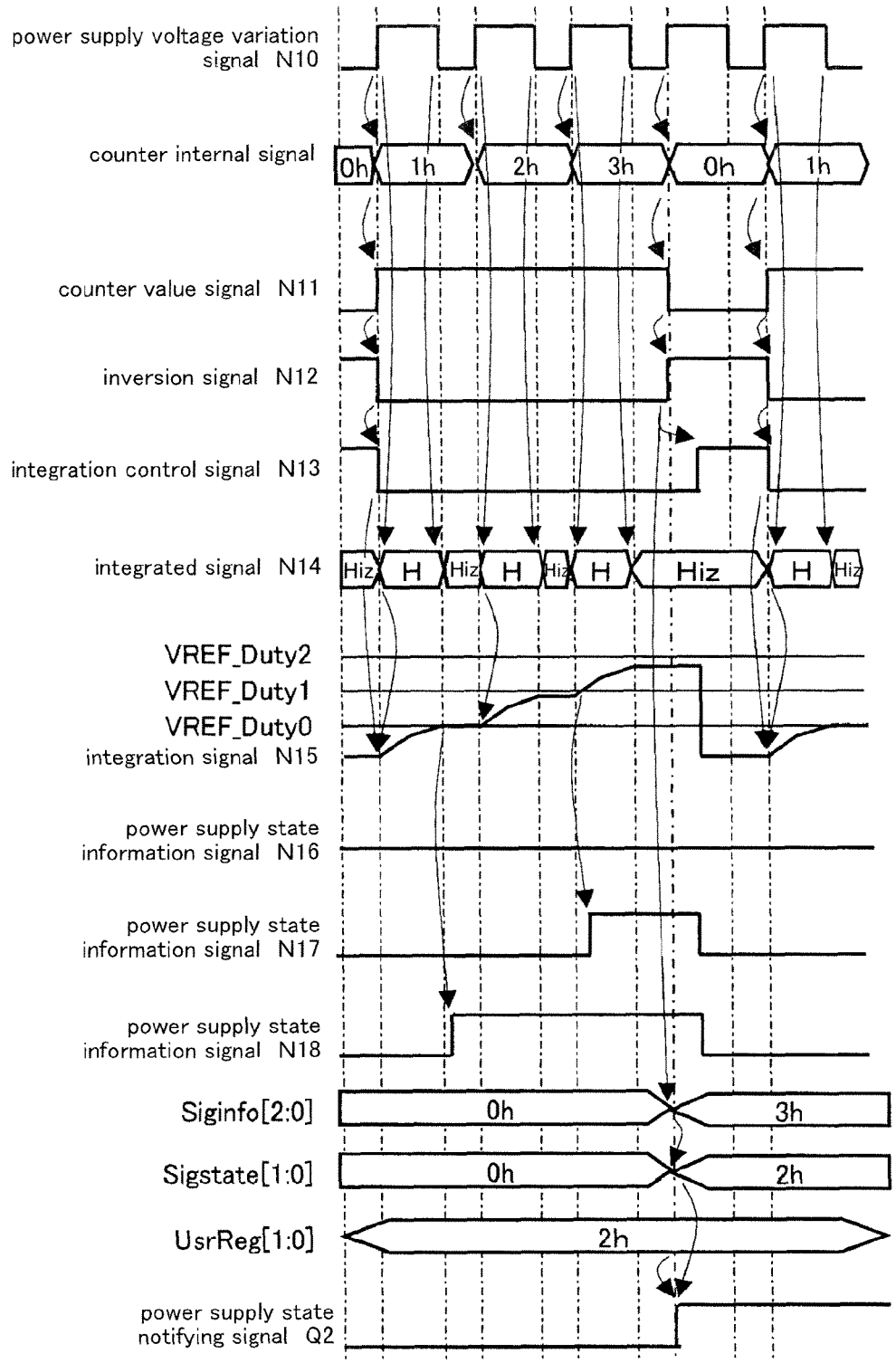
FIG. 70 is a timing chart illustrating an operation of the power supply circuit for nonvolatile storage system according to the working example 36.

FIG. 70 is a timing chart illustrating the operation of the power supply circuit 20. Supposing that "2h" is set beforehand as setting of the state of power supply in the setting register 80, the set value is equivalent to 75% of the driving rate. The integration result signal N15 outputted from the integrator circuit 67 is moderately elevated in a phased manner over time. When the level of the integration result signal N15 is equal to or larger than the voltage to be referenced VREF_Duty0 of the comparator circuits 68, the power supply state information signal N18 is logically inverted to "H" level. At the time, the power supply state information signals N16, N17, and N18 outputted from the comparator circuits 68 in plural stages shift from [0,0,0] to [0,0,1]. However, Siginfo [2:0] outputted from the status registers 69 in plural stages, which is changed by a reset timing from "3h" to "0h" of the count value signal N11, still remains unchanged, and Siginfo [2:0] is still "0h". "0h" remains unchanged in the table converter circuit 72 as well. Because the driving state set in the setting register 80 is "2h", it is determined by the logic comparator circuit 81 that they are inconsistent, and the power supply state notifying signal Q2 stays at "L" level.

When the level of the integration result signal N15 is equal to or larger than the voltage to be referenced VREF_Duty1, the power supply state information signal N17 is logically inverted to "H" level. At the time, the power supply state information signals N16, N17, and N18 shift from [0,0,1] to [0,1,1]. Because the reset timing of the count value signal N11 has not arrived yet, Siginfo[2:0] outputted from the status registers 69 in plural stages remains unchanged When the reset timing arrives, Siginfo[2:0] changes from "0h" to "3h" (∵ [N16, N17, N18]=[0,1,1]). This change leads to the change from "0h" to "2h" in the table converter circuit 72 (see the table conversion chart). The driving state set in the setting register 80 is "2h", therefore, it is determined by the logic comparator circuit 81 that they are consistent, and the power supply state notifying signal Q2 shifts from "L" level to "H" level. Because the power supply state notifying signal Q2 is already received by the flash memory controller 10, the flash memory controller 10 that detected such a change of the power supply state notifying signal Q2 recognizes that the driving rate of the power supply circuit 20 has reached 75% previously set.

According to the working example, the ongoing status of the voltage generating unit 50 relative to the power supply state comparative value (expectation value) of the system can be easily known. The voltage generating unit 50 notifies the system in the form of the binarized value whether the voltage generating unit 50 is operating as desirably expected by the system. The system can easily detect the ongoing status of the voltage generating unit 50 by arbitrarily rewriting the setting register 80 and optimize the power supply control signal Q1 or the load of the voltage generating unit 50 depending on the detection result.

The interrupt signal illustrated in FIG. 65 according to the working example 34 or the overload signal illustrated in FIG. 67 according to the working example 35 may be combined with this working example. If omitting the table converter circuit 72, the data format to be set in the setting register 80 complies with the data format of the status registers 69 in plural stages.

<73> [Overload Detector]

The power supply circuits for memory system recited in <67> and <68> characterized by the status registers provided in plural stages may be equipped with an overload detecting function. More specifically, an overload detector for detecting the likelihood of overload of the voltage generating unit is provided as an additional structural element of the voltage state monitoring unit. The overload detector receives the power supply voltage variation signal from the voltage generating unit to detect the likelihood of overload of the voltage generating unit based on the received power supply voltage variation signal, and then outputs an overload detection signal to the flash memory controller. This technical feature is aimed at dealing with forthcoming overload in the case where the state of power supply (driving rate or affordability) of the voltage generating unit is likely to undergo overload.

When the system is notified of the likelihood of overload, the system can know that the applied voltage to the flash memory is not a desirably expected voltage level. This prevents an operational instability or system crash due to overload from happening. As a result, the data reliability is improved.

A specific example of <73> is hereinafter described as a working example 37 of the invention.

Working Example 37

Figure 71:
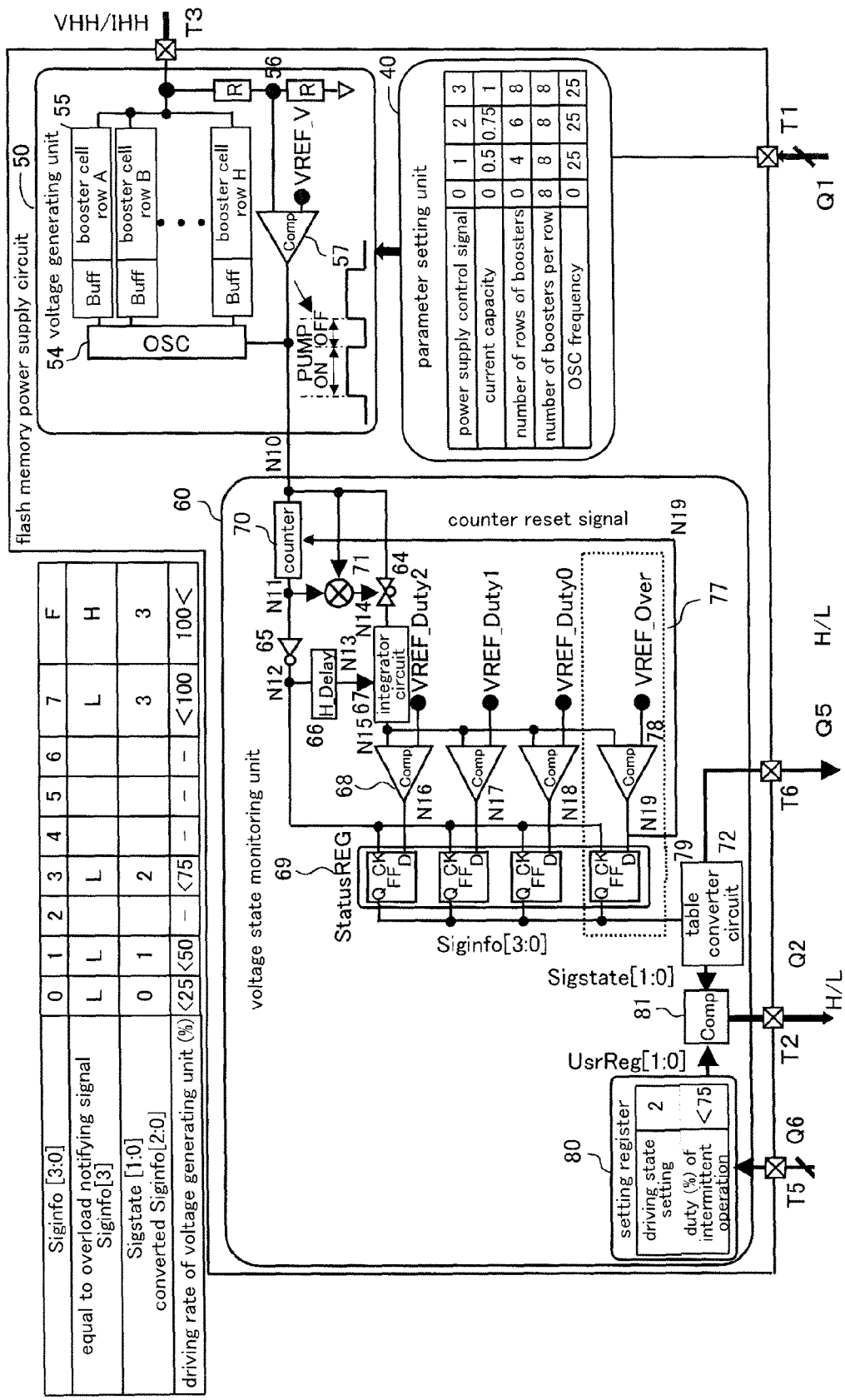
FIG. 71 is a block diagram illustrating structural characteristics of a power supply circuit for nonvolatile storage system according to a working example 37 of the invention.

FIG. 71 a block diagram illustrating structural characteristics of a power supply circuit for memory system according to a working example 37 of the invention. According to this working example, an overload signal is further used in the illustration of FIG. 69 according to the working example 36.

According to this working example, the voltage state monitoring unit 60 is further provided with an overload detector on the output side of the integrator circuit 67. The overload detector 77 includes a comparator circuit 78 for overload detection which compares the integration result signal N15 outputted from the integrator circuit 67 to a voltage to be referenced VREF_Over, and a status register 79. An output terminal of the comparator circuit 78 for overload detection is connected to a data input terminal of the status register 79. The output terminal of the inverter 65 is connected to a clock input terminal of the status register 79. A data output terminal of the status register 79 is connected to the input terminal of the table converter circuit 72. The output terminal of the comparator circuit 78 for overload detection is connected to a reset terminal of the counter circuit 70.

The voltage to be referenced VREF_Over of the comparator circuit 78 for overload detection has a voltage level higher than that of VREF_Duty2 which is the highest level in the illustration of FIG. 65. The counter reset signal N19 outputted from the comparator circuit 78 for overload detection as a result of overload detection is supplied to the counter circuit 70 to reset the counter circuit 70. An output of the status register 79 corresponding to the comparator circuit 78 for overload detection is allocated as the most significant bit of the power supply state notifying signal Q2.

Figure 72:
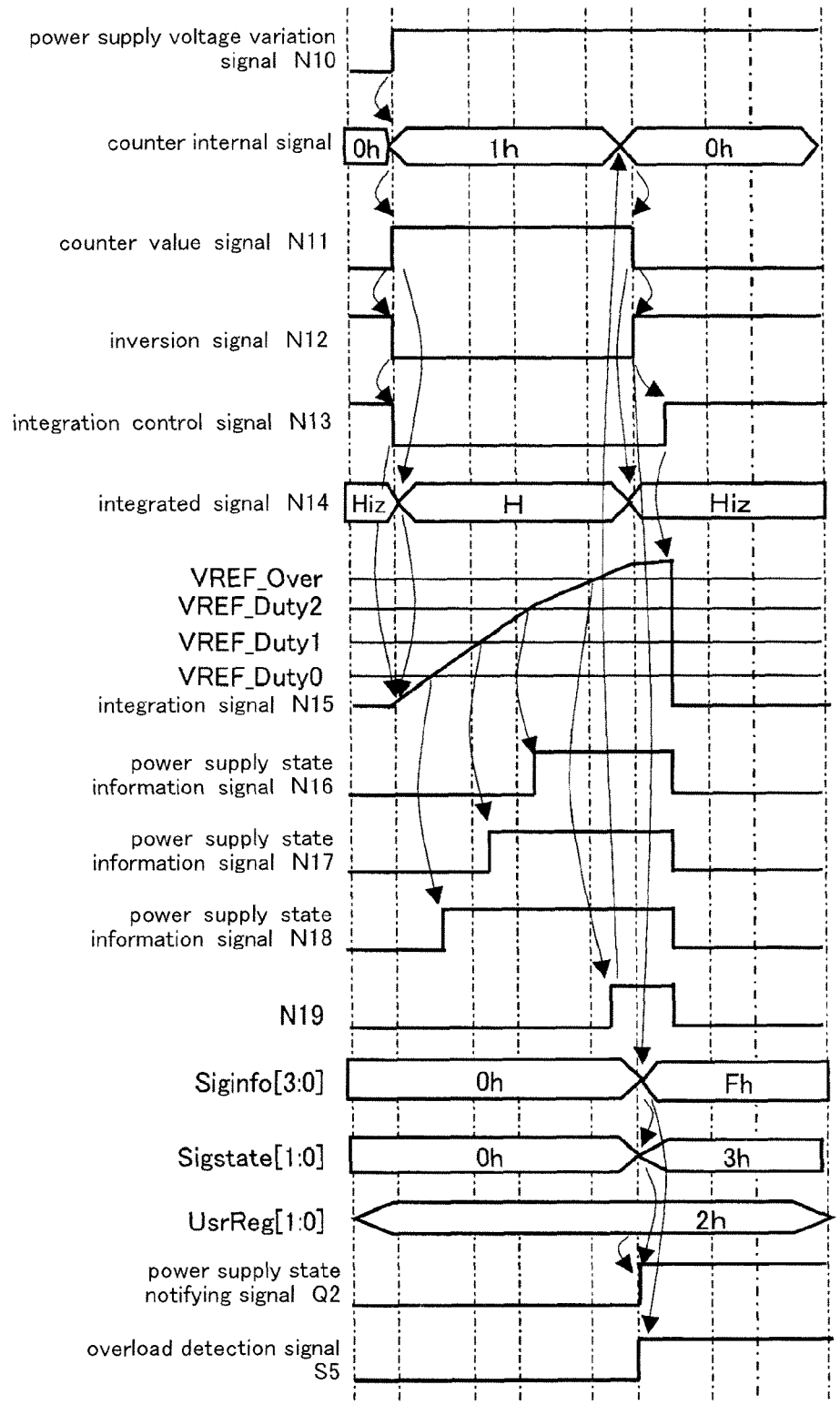
FIG. 72 is a timing chart illustrating an operation of the power supply circuit for nonvolatile storage system according to the working example 37.

An operation of the power supply circuit for memory system according to the working example thus characterized is hereinafter described. FIG. 72 is a timing chart illustrating the operation of the power supply circuit 20. When the voltage generating unit 50 is ready to consecutively operate, the power supply voltage variation signal N10 outputted from the comparator circuit 57 of the voltage generating unit 50 is constantly at "H" level. The counter circuit 70, in which the count-up operation is inactive, retains the same condition. The power supply voltage variation signals N10 is continuously integrated by the integrator circuit 67. Then, the integration result signal N15 obtained by the integrator circuit 67 is compared to the voltage to be referenced VREF_Over in the comparator circuit 78 for overload detection, and the counter reset signal N19 shifts from "L" level to "H" level. The counter reset signal N19 at "H" level resets the counter circuit 70. By a timing by which the inversion result signal N12 obtained by the inverter 65 in the next stage of the counter circuit 70 shifts from "L" level to "H" level, the output signals of the comparator circuits 68 in plural stages and the comparator circuit 78 for overload detection are stored in the status registers 69 and the status register 79 for overload detection. At the time, the ongoing statuses of the four status registers 69 and 79 are [1,1,1,1] and "Fh". The overload detection signal Q5 is outputted from the table converter circuit 72 to the flash memory controller 10 through the terminal T6.

According to the working example, in addition to the operational advantages according to the working example 19, the system is notified whether there is the likelihood of overload so that the system can know whether the voltage generating unit 50 is stably operating.

<74> [Multi-Bit Detection of Power Supply State (Driving Rate or Affordability)]

In a description given below, the power supply circuit for memory system recited in <62> employs a different configuration for storing a multi-bit signal in status registers of the voltage state monitoring unit as the power supply state information signals. In place of providing the integrator circuit, delay circuit, and the plural comparator circuits in the voltage state monitoring unit, a plurality of comparator circuits are provided in the voltage generating unit, wherein the integrator circuit and the delay circuit become necessary.

Further, a power supply voltage variation signal for feedback-controlling the oscillation frequency of an oscillator circuit is used as a signal transmitted from the voltage generating unit to the voltage state monitoring unit to know the state of power supply of the voltage generating unit. The power supply voltage variation signal may be a 1-bit signal or multi-bit signal. Hereinafter is described a technical feature wherein a multi-bit power supply voltage variation signal is generated.

To generate the multi-bit power supply voltage variation signal in the voltage generating unit, a plurality of comparator circuits are provided. An output voltage of the voltage generating unit or a voltage used to detect the output voltage is inputted to all of these comparator circuits, while voltages to be referenced respectively having different voltage levels are applied to these comparator circuits. The outputs of the comparator circuits control the oscillation frequency of the oscillator circuit, and these outputs are transmitted to the voltage state monitoring unit in the next stage as the power supply voltage variation signal. The voltage state monitoring unit has status registers provided in plural stages for retaining any changes of the power supply voltage variation signal. Output terminals of the comparator circuits of the voltage generating unit are connected to input terminals of the status registers in plural stages.

Summarizing the description given so far, the power supply circuit for memory system is characterized in that the voltage generating unit in <62> further includes a plurality of comparator circuits for generating multi-bit signals as the power supply state notifying signal, wherein the voltage generating unit includes status registers provided in plural stages for latching the multi-bit power supply state notifying signals.

A multi-bit signal for setting the frequency of an oscillator circuit, for example, is used as the multi-bit power supply state notifying signal. The multi-bit signal is equivalent to the state of power supply. Therefore, the multi-bit power supply state notifying signal is stored in the status register and read therefrom to be outputted outside of the power supply circuit by way of the voltage state monitoring unit. To use the existing multi-bit signal makes it unnecessary to provide the integrator circuit, leading to a smaller area dimension and less current consumption.

A specific example of <74> is hereinafter described as a working example 38 of the invention.

Working Example 38

Figure 73:
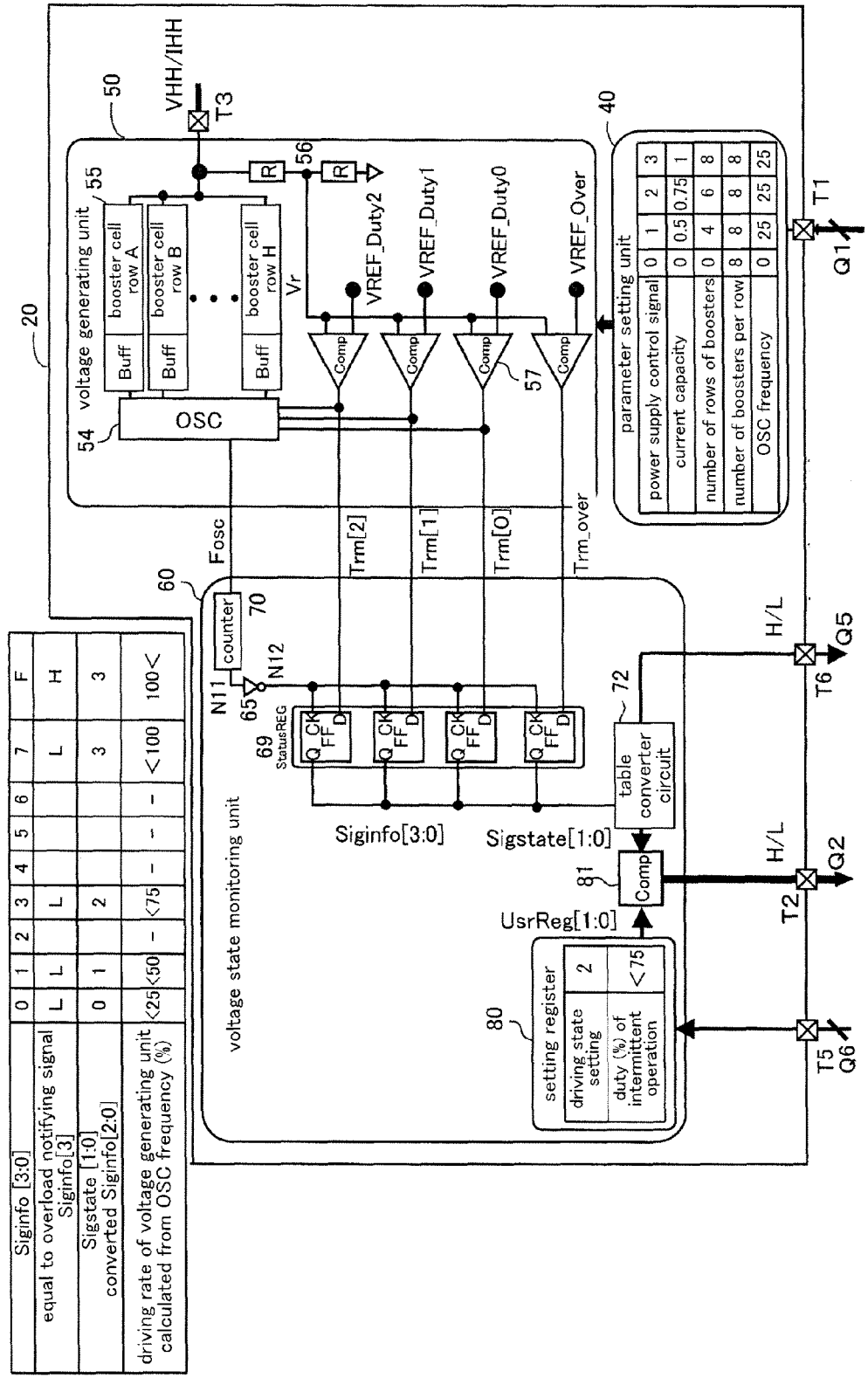
FIG. 73 is a block diagram illustrating structural characteristics of a power supply circuit for nonvolatile storage system according to a working example 38 of the invention.

FIG. 73 a block diagram illustrating structural characteristics of a power supply circuit for memory system according to a working example 38 of the invention. The voltage generating unit 50 includes an oscillator circuit 54, a plurality of booster circuits 55, a voltage detector 56, and a plurality of comparator circuits 57 including differential amplifiers. This working example is different to the other working examples in that the comparator circuits 57 are provided in plural stages. An output terminal of the voltage detector 56 is connected to inversion input terminals (−) of the comparator circuits 57. Voltages to be referenced, VREF_Duty2, VREF_Duty1, VREF_Duty0, and VREF_Over, are applied to non-inversion input terminals (+) of the comparator circuits 57. The voltage levels of these voltages to be referenced are; VREF_Duty2<VREF_Duty1<VREF_Duty0< VREF_Over. As is known from the comparison to the illustration of FIG. 72, this relationship among the voltages is reverse to that of the working example 20 because a negative feedback control is employed to control the oscillator circuit 54. The negative feedback control is to lower the oscillation frequency as the output voltage is elevated. A signal Fosc indicating the oscillation frequency of the oscillator circuit 54 is inputted to the counter circuit 70. Output terminals of the comparator circuits 57 are connected to a frequency control terminal of the oscillator circuit 54 and further connected to an input terminal of the voltage state monitoring unit 60. The output terminals of the comparator circuits 57 provided in the voltage generating unit 50 are connected to data input terminals of the status registers 69 provide in plural stages in the voltage state monitoring unit 60.

This working example does not use the integrator circuit 67, delay circuit 66, transfer gate 64, and AND gate element 71 illustrated in FIG. 71. Any other structural elements are similar to those illustrated in FIG. 71 according to the working example 20. The similar structural elements are simply illustrated with the same reference symbols to omit redundant description.

The working example is different to the illustration of FIG. 71 in that the voltage state monitoring unit 60 fetches a discrete value retained in the voltage generating unit 50 (corresponding to the driving rate of the voltage generating unit 50) and calculates the driving rate of the voltage generating unit 50 based on the fetched discrete value, and then outputs a calculation result in the form of the power supply state notifying signal Q2.

When, for example, the frequency Fosc of the oscillator circuit 54 of the voltage generating unit 50 is changed discretely in a phased manner, a discrete value corresponding to the frequency Fosc is a discrete value corresponding to the driving rate of the voltage generating unit 50. When the frequency of the oscillator circuit 54 is changed from 5 MHz to 20 MHz in the steps of 5 MHz depending on Trm[2:0]=7 to 0h, Trm[2:0] is equivalent to the discrete value. Therefore, the driving rate of the voltage generating unit 50 is known by converting Trm[2:0].

An operation of the power supply circuit 20 according to the working example thus characterized is hereinafter described. FIG. 74 is a flow chart illustrating the operation of the power supply circuit 20. In the description hereinafter given, the output voltage of the voltage generating unit 50 is lowering along a time axis, in which case a resistor-divided voltage Vr is also lowering. As a result of the lowering resistor-divided voltage Vr, (Trm_over+Trm[2:0]) is outputted as comparison results of the comparator circuits 57.

When the count value of the counter circuit 70, to which the frequency signal Fosc of the oscillator circuit 54 is inputted, shows the value of "0", the count value signal N11 and the inversion result signal N12 obtained by the inverter 65 are logically inverted, and (Trm_over+Trm[2:0]) is concurrently stored in the status registers 69 in plural stages. When the divided voltage falls to a certain voltage level or below, the overload notifying signal is outputted. The rest of the operation, which is similar to that of the working example 20, is no described again.

According to the working example wherein the discrete value which enables to simply increase or decrease the output voltage current capacity provided in the voltage generating unit 50 is supplied to the voltage state monitoring unit, the voltage state monitoring unit is reduced in circuit area dimension.

As described in the working examples 31 to 36, the power supply state notifying signal Q2 may be outputted as a 1-bit or a multi-bit signal, or the power supply state transition notifying signal Q2' may be outputted as the interrupt signal. In the case where the oscillation frequency of the oscillator circuit 54 is adequately low, the counter circuit 70 is not a necessary structural element.

A DC-DC converter circuit may constitute the voltage generating unit. Hereinafter is described a working example 39 of the invention wherein a DC-DC converter circuit constitutes the voltage generating unit.

Working Example 39

Figure 75:
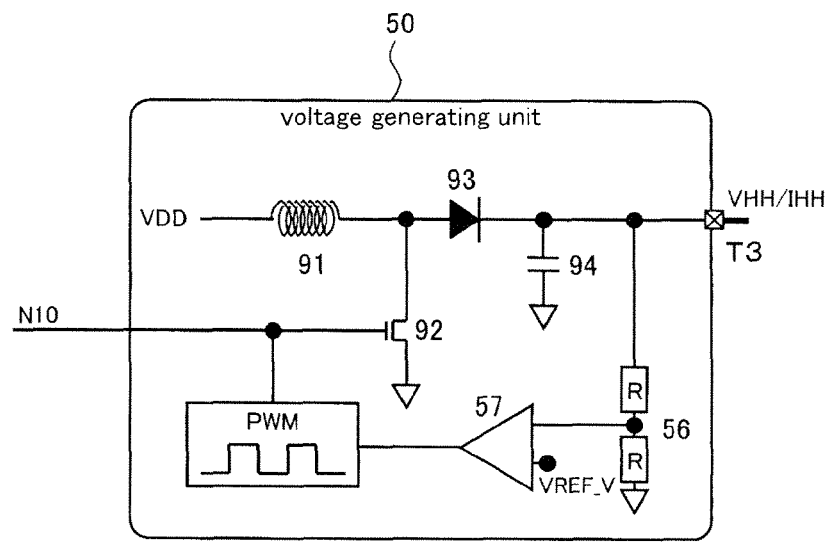
FIG. 75 is a block diagram illustrating structural characteristics of a voltage generating unit provided in a power supply circuit according to a working example 39 of the invention.

FIG. 75 a block diagram illustrating structural characteristics of a power generating unit in a power supply circuit for memory system according to a working example 39 of the invention. A DC-DC converter constitutes a voltage generating unit 50 illustrated in the drawing. A switching element 92 is controlled to be ON and OFF by the power supply voltage variation signal N10 which is a PWM (pulse width modulation) signal from the comparator circuit 57. When the switching element 92 is switched on, a direct current by a direct-current power supply voltage VDD flows through a choke coil 91 and the switching element 92, and an electric energy is stored in the choke coil 91. When the switching element 92 is switched off, the electric energy stored in the choke coil 91 is released at once, and the released electric energy is charged in a smoothening capacitor 94 through a backflow preventing diode 93. The ON/OFF control of the switching element 92 generates an increased power supply voltage at a positive electrode terminal of the smoothening capacitor 94, and the generated power supply voltage is supplied to the flash memories 26 through the terminal T3. The backflow preventing diode 93 prevents backflow of the electric energy from the smoothening capacitor 94 when the switching element 92 is switched on.

The power supply voltage is detected by the voltage detector 56, and the detected power supply voltage is compared to a voltage to be referenced VREF_V in the comparator circuit 57. An output from the comparator circuit 57 having a PWM (pulse width modulation) waveform is used to switch on and off the switching element 92 and also transmitted to the voltage state monitoring unit in the next stage as the power supply state variation signal N10.

Working Example 40

Figure 76:
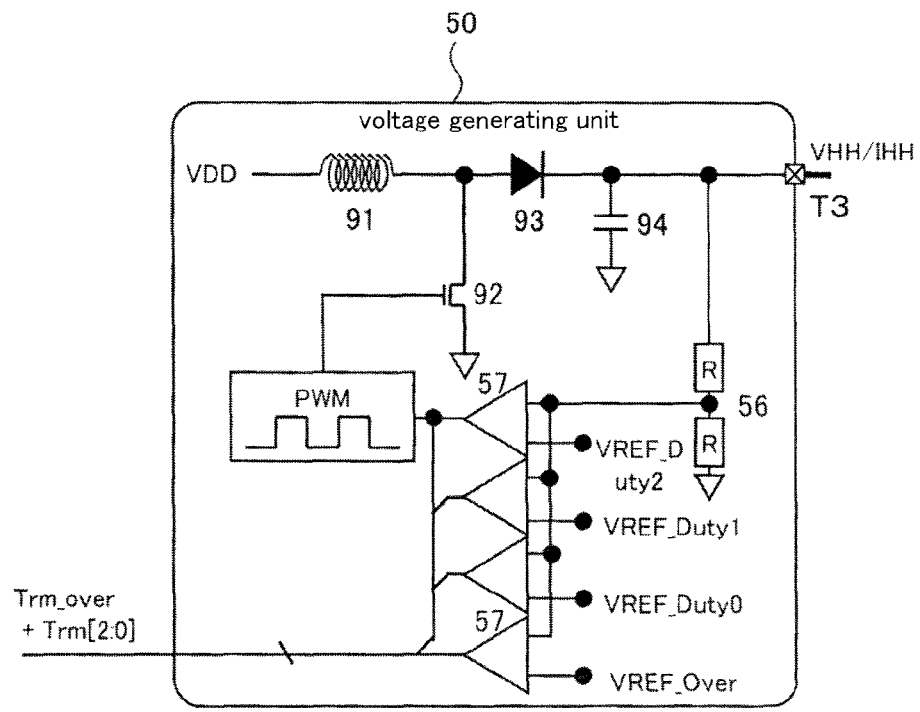
FIG. 76 is a block diagram illustrating structural characteristics of a voltage generating unit provided in a power supply circuit according to a working example 40 of the invention.

A multi-bit DC-DC converter circuit may constitute the voltage generating unit as illustrated in FIG. 76. This working example uses a plurality of comparator circuits 57. This technical feature is applicable to the illustration of FIG. 73 according to the working example 38.

Working Example 41

Figure 77:
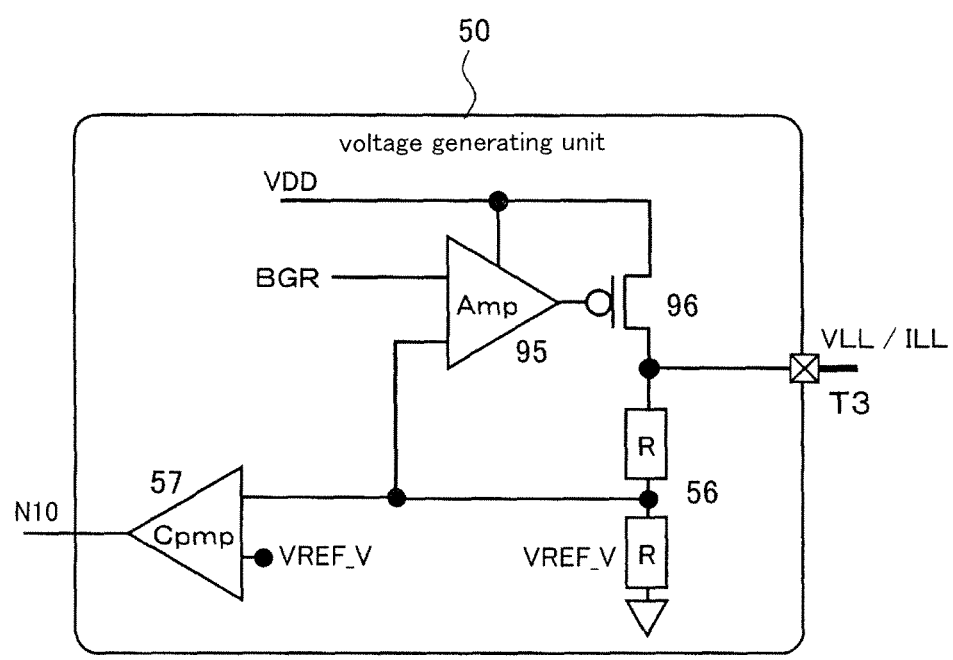
FIG. 77 is an illustration of a voltage generating unit provided in a power supply circuit according to a working example 41 of the invention.

The voltage generating unit may be configured as illustrated in FIG. 77. An output of an operational amplifier 95 is used to switch on and off the switching element 96. A signal outputted from the voltage detector 56 is applied to an input terminal of the operational amplifier 95, and the output of the operational amplifier 95 shifts to and from "H" and "L" for voltage increases.

Hereinafter, flash memories according to a working example of the invention are described. The flash memories 26 according to the working example contain some information to be transmitted to the flash memory controller 10 when an inquiry is received from the flash memory controller 10. The information is, for example, power level, voltage value, pulse width, failed bit number, and processing time, which is, on principle, chip-specific information.

FIG. 78 is an illustration of storage of power parameters in the flash memories 26. Before the storage of power parameters in the flash memories 26 is described, technical disadvantages of conventional flash memories are discussed again. In any storage system wherein a large number of flash memory chips are used, power consumption when the storage system is operating is a huge issue. Particularly when a program operation is executed simultaneously in the plural flash memories for a better program performance, a large amount of current used then results in large cost increase for power supply and heat release in the system. Therefore, it is desirable to reduce current consumption when the flash memories are operating.

A booster circuit which generates high voltages of 20V or more has a poor power efficiency and uses a large amount of power a few times larger than power required to change thresholds of the memory cells in the program and erasing operations. In any systems such as storage systems provided with a large number of flash memories wherein a booster circuit is provided in each of the flash memory chips, it needs an enormous amount of power when the program and erasing operations are running in the plural flash memories, which is a bottleneck in designing power supply of such a system.

In some conventional systems, a power supply circuit which generates high voltages is provided outside of the flash memory chips. However, the program operation and erasing operations are carried out in the flash memories in response to input of commands and these operations can only be notified outside by outputting signals indicating completion of the operations or by a status register. During the program operation and erasing operation, therefore, it is necessary for the power supply circuit to keep generating the maximum voltage 20V or to wait on standby with its full current drive capacity from start to finish of the operations.

The flash memories 26 each includes a register 34 indicating a power level consumed by each of the flash memories in different operation modes (indicating whether the operation is a program executing operation or a data erasing operation in flash memories). Accordingly, a power supply circuit provided outside of the flash memories 26 (power supply circuit 20) is controllable depending on the power level indicated by the register 34. As a result, the flash memories 26 can be operated with less power consumption. When the flash memories 26 thus technically advantageous are applied to any system provided with a large number of flash memories such as storage systems, lower power consumption and a better performance of the system can be effectively achieved. Further, the flash memory controller 10 can adjust an operating power (current) load of the power supply circuit 20 by any suitable timing based on the power levels notified by the flash memories 26. As a result, power transmission of the flash memories 26 can be accurately managed (for example, current to be used is lessened). Further, the power supply circuit 20 does not need an overly high power supply capacity (for example, high peak currents), and power supplied by the power supply circuit 20 necessary for a process requested by a command such as reading or rewriting data in the memory can be reserved in advance when the required power level is set at the time of or before the command is inputted.

As illustrated in FIG. 78, the flash memories 26 each has an internal controller 33, a command register 34, and a nonvolatile memory area 36. In the command register are set commands transmitted and received to and from the flash memory controller 10. The command register 34 has a plurality of fields set therein, the fields including an operation mode setting bit, a power level setting bit, and other bits, and the commands are set in these fields. The commands set in the command register 34 respectively have fields where an operation mode P1 and a power level P2 are set, so that fields relating to the power levels are set in the commands that need to be power-controlled (for example, reading, program and erasing). This enables to set definite power loads when these commands are issued, facilitating management of the power information by the flash memory controller 10. When a command for changing the power level alone, for example, is set, the power level can be defined beforehand by the command to be power-controlled, which makes it unnecessary to directly set the power level. This controls reduction of a data transfer bandwidth for command input (IO terminal and control signal in NAND flash).

The nonvolatile memory area 26 (NV: nonvolatile area) has first and second storages units. In the nonvolatile memory area 26 are stored power information such as current consumptions at the respective power levels (first information) and execution time information (second information, indicating a processing speed of the flash memory 26 at each power level). The first and second informations reflect individual differences of the flash memories 26. The storage of the first information enables to handle any product variability of the operating power and speed (due to manufacturing specs and production processes) as a simple command format with no actual current values (common standard irrespective of product types). The storage of the second information enables to use the processing speed in power control. As a result, the operating power (current load) of the external power supply can be predicted in a time-related manner, and power control in the memory system is thereby more accurate and sophisticated.

There are various operation modes; reading mode, writing mode, date-write verifying mode, erasing mode, data-erase verifying mode, and operation pause mode. The respective modes have parameters of power information such as current consumption and operating time (processing time). These parameters are outputted through dedicated terminals of the flash memories 26 and transferred to the flash memory controller 10.

By providing the operation pause mode, a smallest power load can be defined. As a result, an adjustable range of the operating power (current) load of the power supply circuit 20 is increased. Another advantage is that the operations of the flash memories can be paused whenever the state of power supply of the power supply circuit 20 is destabilized, thereby preventing any of the flash memories 26 from malfunctioning.

To set the operation pause mode, a control terminal is further provided to designate the power level during the operation pause mode in each of the flash memories 26 (corresponding to the flash memory pause signal or pause control input illustrated in FIG. 83, 86). Then, the operation of the flash memory 26 can be speedily paused based on the designated power level by timings asynchronous with command accesses by using the control terminal for designating the power level of the operation pause mode as a dedicated pin, in which case the operation of the flash memory can be speedily restarted as well. When the operation pause mode is set, the internal controller 33 allows accesses to a power register 1133 and an internal operating state register 1132 of the currently pausing flash memory 26 during the operation pause mode. To allow the accesses, structural element such as control logic 1114, internal controller 33, command register 34, status register 1122, address register 1120, input/output circuit 1112, and data register 1109 are operable during the operation pause mode. When the operation of the flash memory 26 is paused, therefore, not only the power level after the pause is released (set by the power register 1133) but also arbitrary states of the registers after the pause is released can be set. As a result, a period of time during the pause can be efficiently used, and a processing time necessary for the settings can be reduced.

The internal controller 33 is a controller in charge of controlling the internal operations of the flash memories and transmitting and receiving various signals to and from the flash memory controller 10. The internal controller 33 is provided with an internal operating state register and a power register (register according to the invention). In the internal operating state register are stored operating states during the operation modes such as data writing and reading associated with commands from the flash memory controller 10. In the power register are stored the power levels consumed by the flash memories 26 during the operation modes. The internal controller 33 transfers the parameters read from the nonvolatile memory area 36 to the internal operating state register and the power register to be stored therein. In the internal operating stage register are further stored information related to actual operations such as the power level, number of times of writing, and pulse widths of an ongoing operation, predicted values of the power level, number of times of writing, and pulse widths of operations thereafter, and also number of times of retrying and failed bit number.

The internal controller 33 notifies the flash memory controller 10 of such information as a bias-related voltage level and voltage application time of the flash memory 26 to control any required voltage and current of the power supply circuit 20. Such relevant power-related information such as current consumption and operation time are read from the nonvolatile memory area 36 of the flash memory 26 and stored in the internal operating state register and also transferred to the flash memory controller 10. Alternatively, the internal operating state register may be accessed through the IO terminal to fetch information of the internal operation and information of changes.

The operation of a flash memory is divided in mode operations distinguished by user commands, and micro sequences constituting the mode operations. The micro sequences are hierarchically defined. During the data writing/erasing and data-write/erase verifying executed in the flash memory, a sequence of processes are executed by each of micro sequences based on operation clocks under the control by the internal controller 33; micro sequences such as command input, setup of internal power supply, program verifying, program pulse application, data-erase verifying, and erasing pulse application.

FIG. 79 is an illustration of an example in which a micro sequence of power mode change is inserted in a program sequence to control power of a program operation. The micro sequence of power mode change is inserted at three positions; program (writing), before verifying (between command input and program verifying, and between program counter incrementing and program verifying), and before program pulse application (between program counter resetting and program pulse application for writing).

The program verifying includes setup PV (Program Verifying) including circuit configuration changes and preparation of internal potentials necessary for the program verifying and micro sequences hierarchically lower than actual program verifying (Vt margin read). The program pulse application includes setup PU (PULse) including circuit configuration changes and preparation of internal potentials necessary for the program pulse application and micro sequences of the actual program pulse application.

Figure 80:
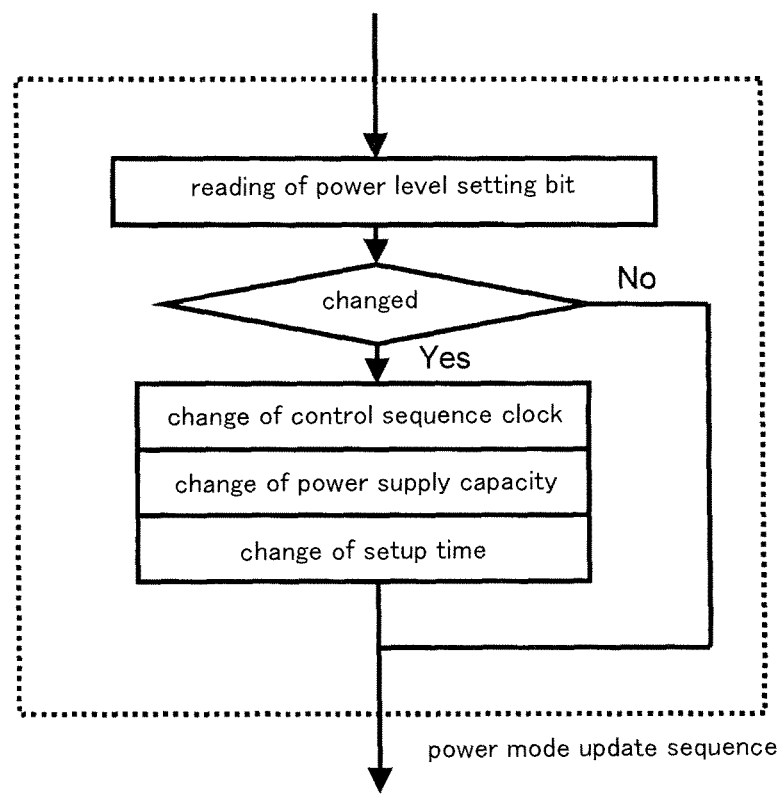
FIG. 80 illustrates in detail power mode update in the flash memory according to the working examples of the invention.

Each step illustrated in FIG. 79 corresponds to a micro sequence. It is the technical feature to be emphasized to update the power mode per micro sequence. FIG. 80 is an illustration of a detailed power mode update sequence. When the power mode update sequence is invoked, power level setting bits are read. In the case of any change of the read power level setting bits, power parameters prepared in advance for each micro sequence for power control are adjusted and set in accordance with the changed power level setting bits. In the illustration of FIG. 79, three power parameters are adjusted; control sequence clock change, power supply capacity, power supply setup time. An operation for reducing power, for example, is discussed below. When a clock frequency of the control sequence is lowered, an operation per unit time lessens, reducing current consumption. When booster circuits, such as charging pumps, are used to supply power, number of rows of booster circuits and a clock frequency for boosting are reduced to lower a current driving capacity. As a result, power consumption is reduced. The lower current driving capacity makes it necessary to lengthen charging and setup times in internal power supply nodes. Generally, it needs a longer processing time to operate a circuit with low power.

The power parameters are not necessarily limited as far as they are power-changeable parameters, for example, bit number processable at once by a program, bit number readable at once by a program, programs executable in parallel by a process or an apparatus, and bit number readable in parallel by a process or an apparatus. The technical feature of control discussed here is to prepare power parameters in advance for each micro sequence for power control in response to power level setting bits. When these parameters, though settable by a control logic circuit, are stored in the nonvolatile memory area, such a complicated power control can be accomplished in a smaller circuit area. In the case of a reading speed not fast enough in the nonvolatile memory area, the power parameters are stored in a nonvolatile memory such as RAM when the power supply starts, so that the insertion of the power mode update sequence does not slow down the processing speed.

Referring to FIGS. 81A to 81C is described an example in which the power level is set when a command-requested process is executed. In the example, the power level is handled as current consumption Ipp of Vpp. FIGS. 81A to 81C are current consumption profiles schematically illustrating changes with time of the current consumption Ipp when program commands are executed with particular power levels differently set (in data-erase command, program pulse is erasing pulse, and program verifying is data-erase verifying). Cmd is a command input, SetUp is a setup operation of a power supply set in the program mode, Pulse is program pulse application, VerifyRD is program verifying, and RDSTBY is standby for reading. In the current consumption profiles illustrated in FIGS. 81A, 81B, and 81C, the program commands are executed with larger power in the mentioned order, wherein larger values of the power level represent larger current consumption. However, the larger power levels may represent smaller current consumption or values of the current level may be simply used as indices of a range of current consumption. The operation clock frequency in the memory is lengthened, and execution of the command needs more time as the command consumes less current, however, the driving capacity needed for power supply is controlled.

Figure 82A:
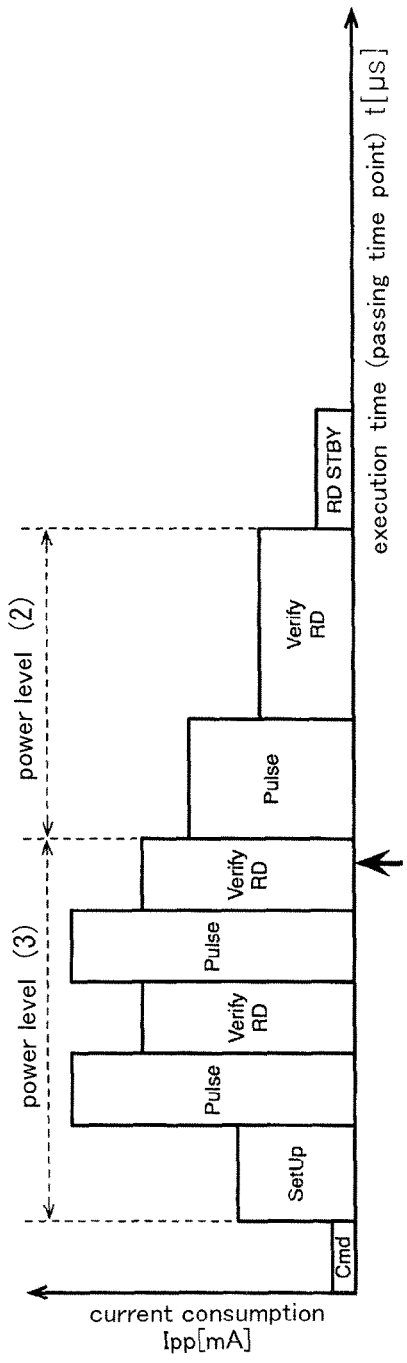
FIG. 82A illustrates a first example of power level change during command execution in the flash memory according to the working examples of the invention.
Figure 82B:
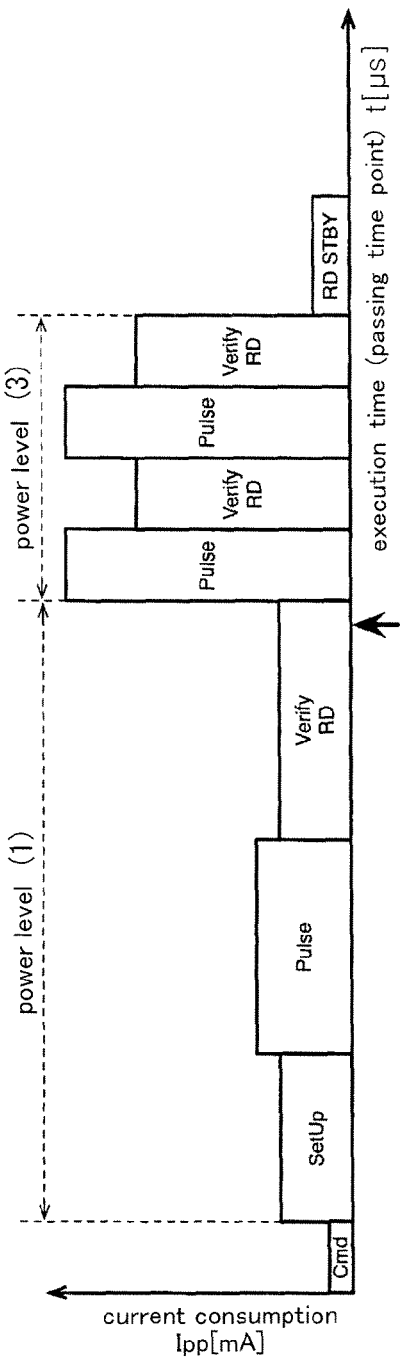
FIG. 82B illustrates a second example of power level change during command execution in the flash memory according to the working examples of the invention.

Referring to FIGS. 82A and 82B is described an example in which the power level is changed while a command-requested process is in execution, wherein arrows directed upward denote timings of updating the power parameters. FIG. 82A is a current consumption profile when high power consumption focusing on higher processing speeds is shifted to low power consumption focusing on power reduction. FIG. 82B is a current consumption profile when low power consumption focusing on power reduction is shifted back to high power consumption focusing on higher processing speeds.

In any of the illustrations of FIGS. 81A to 81C, 82A, and 82B, the power level is changed per micro sequence. By properly subdividing the micro sequences for adequate power control, power-saving control is accomplished in a manner suitable for circuit characteristics and variability of the characteristics of the flash memories to be accessed.

Referring to FIG. 83 is described a specific example of the flash memory 26. The flash memory 26 has a memory cell array 1102 as a data storage. The memory cell array 1102 has nonvolatile memory cells aligned in an array and stores therein information by changing threshold values of the memory cells. The threshold values of the memory cells may be set to larger values during the program operation and set to smaller values during the erasing operation. During the reading and program operations for the memory cell array 1102, accesses are made per page. During the erasing operation, accesses are made per block.

A page is specified by a particular word line selected by the row decoder 1104. Describing the reading operation, data stored in the memory cells on the specified page is determined by the sense amplifier 1108 and transferred to the data register 1109. The data transferred to the data register 1109 is read at a start point specified by the column decoder 1106 into the input/output circuit 1112, and then outputted to the IO terminal which is an input/output terminal.

Describing the writing operation, the data inputted through the IO terminal is fetched by a serial data input mode from a start point specified by the column decoder 1106 into the data register 1109 and transferred to a specified page by an auto program mode.

To erase data in the memory cell array 1102, an erasing voltage is applied to a block specified by a plurality of word lines selected by the row decoder 1104 to set the memory cells in the block as a data-erase target.

The operations in the flash memories 26 such as the program operation and erasing operation are set by operation commands inputted through the IO terminal. The flash memory 26 has a VCC voltage terminal of, for example, 3V supplied to the logic circuit and sense amplifier 1108 and high voltage power supply terminals of VPP1, VPP2, and VPP3 (VPP[1:3]) for receiving voltages higher than VCC. To the high voltage power supply terminals VPP1, VPP2, and VPP3 are applied, for example, a voltage for program/erasing, a voltage for verifying, and a voltage for reading.

The circuit blocks of the flash memory 26 are operated by voltages supplied to the high voltage power supply terminals VPP1, VPP2, and VPP3 or operated by voltages generated by a voltage generator circuit 1130 based on the voltages supplied to high voltage power supply terminals VPP1, VPP2, and VPP3.

An internal state operation register 1132 retains operating states in the operation modes such as writing and reading associated with commands from the flash memory controller 10. The operating state indicates a current status of sequence execution when the controller 1116 executes a program or erasing sequence in the flash memory 26 in response to an auto program or an auto block erasing command.

In the internal operating state register 1132 is set information such as an operation mode currently in execution, number of times of voltage application when the auto program or the auto block erasing sequence is executed (number of times of verifying), applied voltage value, voltage application pulse widths and intervals, and error bit number during verifying.

As illustrated in FIG. 84, the power register 1133 includes digital bits for designating the power levels. The power level means a level of power consumed by the flash memory 26 in each operation mode. Describing an example of the power level illustrated in FIG. 84, set bits (00, 01, 10, 11) associated with the power levels (0, 1, 2, 3) are further associated with maximum current consumptions (0 mA, 30 mA, 60 mA, 120 mA), which respectively correspond to the micro sequences. Any micro sequence currently in execution may be set in the internal operating state register 1132.

In response to an operation execution command, the internal controller 33 can generate the internal operating state and power level (values of the internal operating state register 1132 and power register 1133) in the flash memory 26 in which the operation sequence is executed by the internal controller 33 and notify the devices outside of the flash memory of the internal operating state and power level. Accordingly, in the storage system provided with the flash memory controller 10 and the power supply circuit (high voltage generator circuit) 20, the power supply circuit (high voltage generator circuit) can be controlled depending on the internal operating state of the flash memory. By activating the voltage generator circuit needed for the internal operation of the flash memory alone (any other power supply circuits unnecessary for the internal operation remain inactive, any useless current consumption is reduced to lessen power consumption of the system. Further, the voltages generated by the high voltage generator circuit outside of the flash memory can be controlled depending on the operation mode of the flash memory 26, and power consumption of the storage system can thereby reduced.

In the example of the flash memory 26 illustrated in FIG. 83, the internal operating state register 1132 and the power register 1133 may be provided with IO terminals to input therethrough commands and addresses and input/output data, so that the internal operating state (information register value) and power level can be outputted outside of the flash memory without increasing the terminals. In any storage systems provided with a large number of flash memories, low power consumption can be accomplished without increasing wirings between the flash memory controller and the flash memories.

Figure 86:
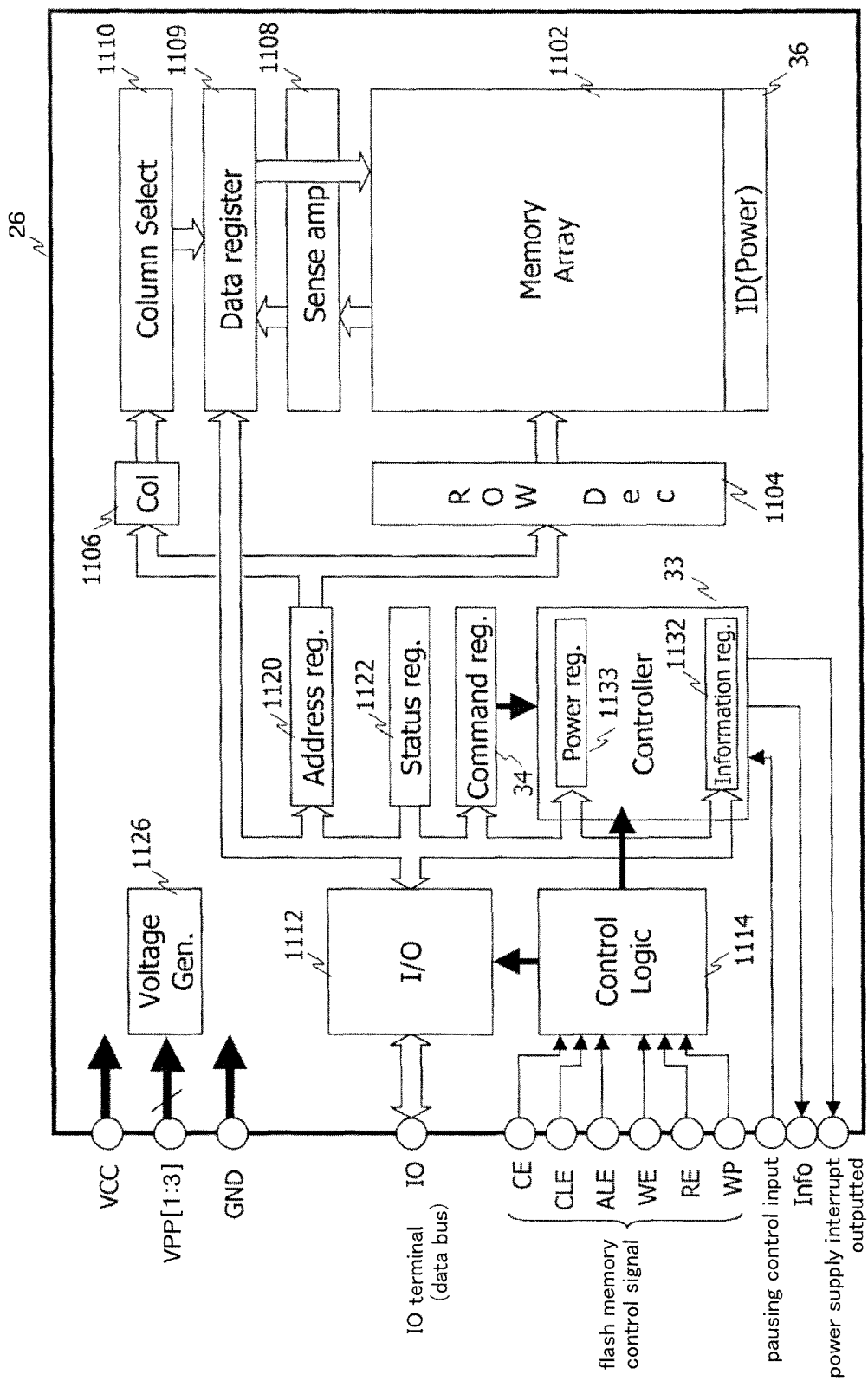
FIG. 86 is a structural example of a flash memory according to another working example of the invention.

As illustrated in FIG. 86, the flash memory 26 may be provided with a dedicated readout terminal Info so that contents of the internal operating state register 1132 and the power register 1133 can be read regardless of the status of use of the IO terminal. Then, the contents of the internal operating state register 1132 and the power register 1133 can be read from outside of the flash memory irrespective of the internal operation of the flash memory. This loosens timing restrictions for reading the internal operating state (values of the internal operating state register 1132 and the power register 1133) from outside of the flash memory. The flash memory controller outside of the flash memory 10 can read the contents of the internal operating state register 1132 and the power register 1133 not only when the information register variation notifying signal CHI, which indicates any change of contents, changed (similar to the power supply interrupt output illustrated in FIGS. 83 and 86) but also whenever the flash memory controller 10 is required to read the contents for controlling the standby state of the power supply circuit. This enables to reduce power consumption during the operation.

Because of that, there are no timing restrictions for the internal operating state of the flash memory (information register value) to be read from the internal operating state register 1132 or the power level to be read from the power register 1133, thereby increasing a degree of freedom in controlling the high voltage generator circuit.

The flash memory controller 10 can control the voltage generator circuit in the respective operation modes depending on the flash memory 26 to be used, making the system operable with less power consumption. Further, program characteristics are improved by controlling the number of flash memories 26 in which the program is concurrently run depending on power consumption characteristics of the flash memories 26.

Though the internal controller 33 checks the power level indicated by the power register 1133 in the working example, the internal controller 33 may check a signal inputted to the flash memory 26 from outside of the flash memory. Then, the power level is changeable by timings asynchronous with command accesses (for example, by level designation).

According to the working examples of the invention described so far, the processes of the flash memories can be properly executed based on the power supply state information that the flash memory controller receives from the power supply circuit. Therefore, an operational instability and/or system crash is prevented from happening in the nonvolatile storage system, and the data reliability is thereby improved. Further, any useless power consumption in the system can be avoided because no overly high power supply is necessary to ensure an operational stability.

The principal structural element of the flash memory controller produced by a miniaturized technology of semiconductor production is a large-scale logic integrated circuit. To ensure a good reliability of transistors constituting the logic circuit, a low operating voltage is employed, for example, the operating voltage is set to 1.2V in the case where a minimum pattern dimension in the production is 45 nanometers.

The nonvolatile memory is a part used in a wide variety of systems. To take the advantage of the versatility of the nonvolatile memory, relatively high voltages, such as 3V or 5V, are used for input/output signal amplitudes. Therefore, a circuit which generates 3V or 5V is used as a system power supply.

Therefore, the flash memory controller is provided with an input/output circuit that uses a relatively high VDD voltage such as 3V or 5V for amplitudes of signals inputted thereto from outside and outputted therefrom, and a decreased voltage generator circuit that generates an internal operating voltage VDDI relatively low, such as 1.2V, supplied to a signal processing block having a logic circuit as a principal structural element.

A conventional example of the decreased voltage generator circuit formed on the same silicon as the large scale logic integrated circuit is a regulator that can be easily produced. Because the regulator releases the voltage to be decreased as Joule heat, a relatively low operating voltage is usable to operate the signal processing block which consumes a large amount of operating current when operating at a high speed. However, the flash memory controller still consumes a larger amount of power on the whole.

Figure 87:
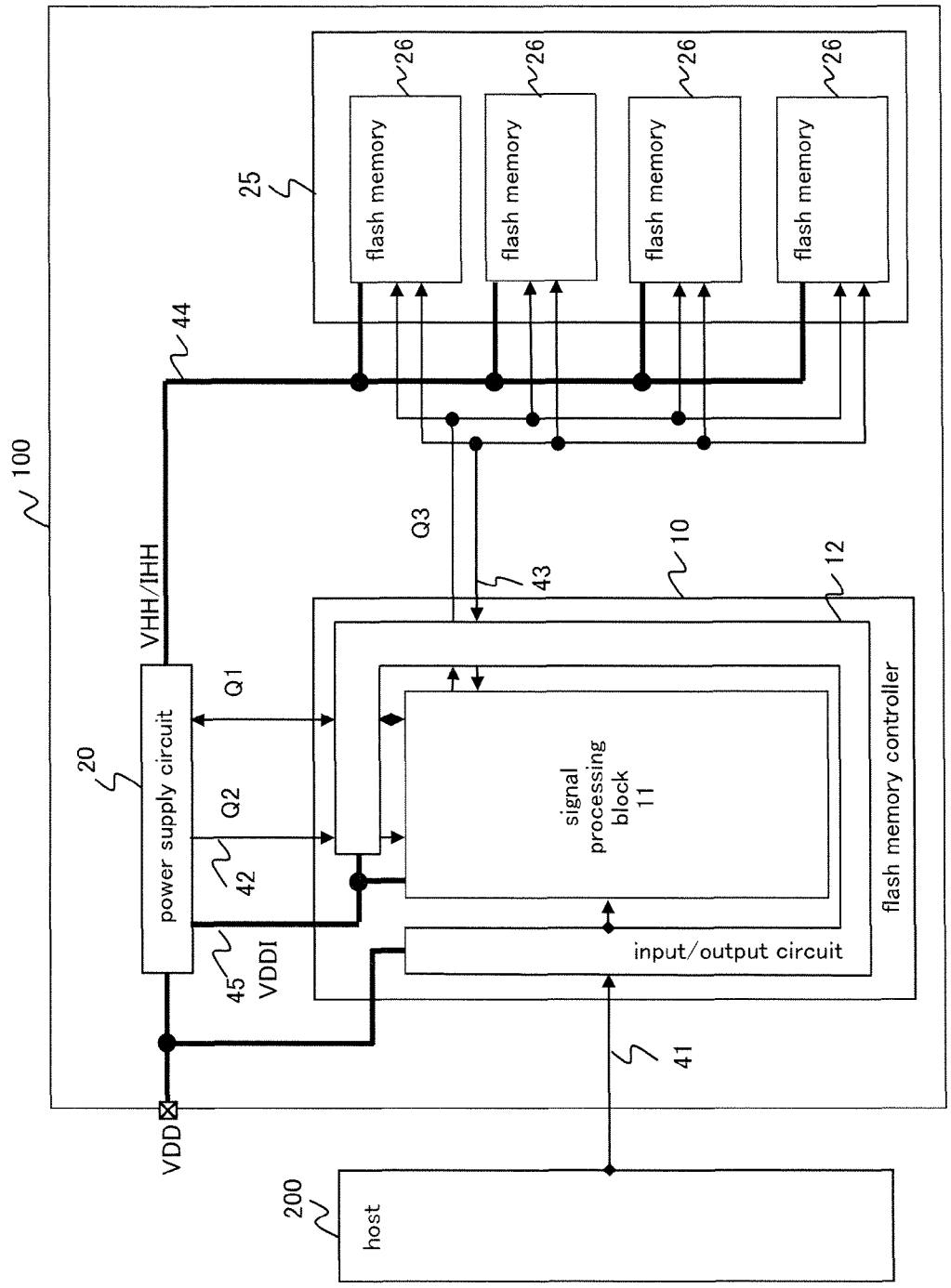
FIG. 87 is an illustration of a command register according to another working example of the invention.

FIG. 87 is a block diagram illustrating structural characteristics of a nonvolatile storage system 100 according to another working example of the invention. Similarly to the working example 1 illustrated in FIG. 1, the nonvolatile storage system 100 has a flash memory controller 10, a power supply circuit 20, and a memory block 25 including a plurality of flash memories 26.

The flash memory controller 10 has an input/output circuit 12 for inputting and outputting signals in VDD voltage amplitudes to and from outside, and a signal processing block circuit 11 for processing the signals at an internal voltage VDDI.

The power supply circuit 20 has an increased voltage generator for generating VHH used in the flash memory 26 from the inputted VDD voltage, and a high voltage generator for generating VDDI used in the signal processing block of the flash memory controller 10. The power supply circuit 20 is connected to the flash memories 32 by a power supply line 44 and also connected to the flash memory controller 10 by a power supply line 45 to feed the signal processing block 11 with the VDDI power supply.

To feed power to the signal processing block 11 of the flash memory controller 10, a device most suitable for voltage decrease may constitute the decreased voltage generator provided in the power supply circuit 20. Accordingly, it is unnecessary that the decreased voltage generator of the power supply circuit 20 be mounted mixedly with the large-scale logic integrated circuit. The decreased voltage generator thus configured achieves a high efficiency.

The working example illustrated in FIG. 87 makes it unnecessary to generate Joule heat to generate the VDDI voltage for the signal processing block 11, thereby reducing power consumption of the nonvolatile storage system.

Figure 88:
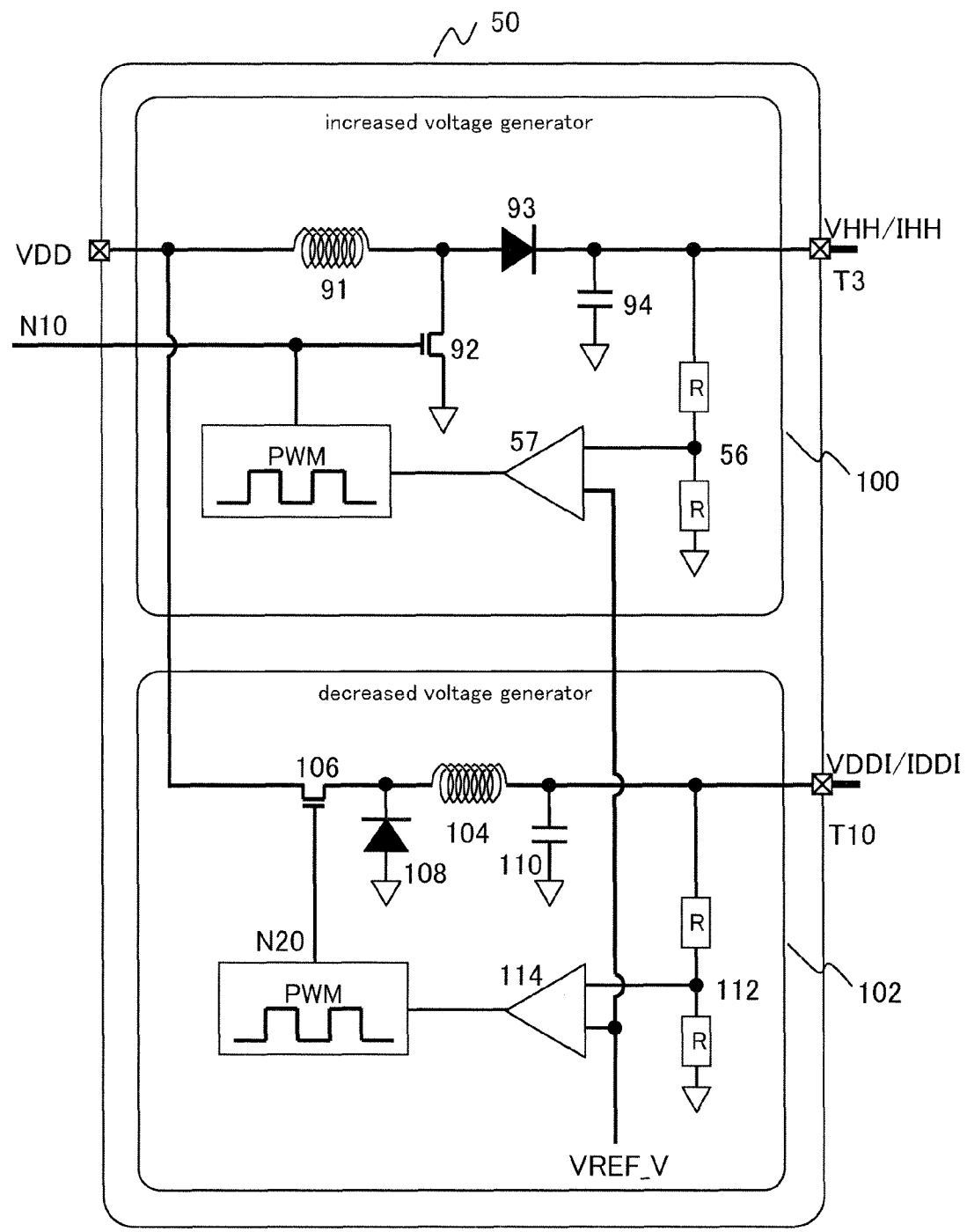
FIG. 88 is a structural example of a flash memory according to still another working example of the invention.

FIG. 88 is a block diagram illustrating structural characteristics of a voltage generator of a power supply circuit used in a nonvolatile storage system according to still another working example of the invention. A voltage generating unit 50 has an increased voltage generator 100 which is identical to the voltage generator illustrated in FIG. 57 and a decreased voltage generator 102. DC-DC converters constitute the increased voltage generator 100 and the decreased voltage generator 102.

A switching element 106 is switched on and off based on a power supply voltage variation signal N20 which is a PWM (pulse width modulation) signal from a comparator circuit 114. While the switching element 106 is ON, a direct-current power supply voltage VDD is outputted to an output terminal VDDI, however, the power supply voltage VDD is decreased by self-induction of a choke coil 104, and the decreased voltage is outputted as VDDI. While the switching element 106 is OFF, the VDDI voltage is retained by reduction current of a capacitor 110 and a diode 108.

As described earlier, the comparator circuit 114 compares an outputted resistor-divided voltage 112 to a reference voltage VREF_V and outputs a comparison result as the power supply voltage variation signal N20. The switching element 106 is switched on and off based on the comparison result (power supply voltage variation signal N20) of the comparator circuit 114. Accordingly, the VDDI output voltage is controlled and decided by a feedback loop driven by the power supply voltage variation signal N20. According to the working example wherein the VDDI is thus set, the VDDI output voltage is reliably set.

The working example, wherein the voltage is converted by switching the electric current flowing through the choke coil, can reduce any power loss, thereby achieving a higher power efficiency than the regulator from which the voltage to be decreased is released as Joule heat.

By supplying the output of the decreased voltage generator 102 of the voltage generating unit 50 as the VDDI power supply of the flash memory controller 10 illustrated in FIG. 87, the nonvolatile storage system can succeed in reducing power consumption.

INDUSTRIAL APPLICABILITY

The nonvolatile storage system according to the invention provides a very advantageous technology for effectuating a large reduction of power consumption in any nonvolatile storage systems having a large storage capacity and capable of a high processing speed, such as SSD (Solid State Drive), used in an operating environment where running states of processes in a plurality of flash memories are dynamically changing.

According to the technology provided by the invention, a power supply can be realistically and dynamically controlled in a fine-tuned manner by a feedback/feedforward performed repeatedly irrespective of types of operations constantly changing, changing running states of processes requested by commands, changing internal state of a power supply circuit, and individual differences among flash memories in a nonvolatile storage system where a plurality of flash memories, such as SSD (Solid State Drive), are used. As a result, an operational instability and/or system crash resulting from such problems as overload is prevented from happening. The technology thus advantageous can minimize any useless power consumption in the system (an overly high power supply capacity is unnecessary to ensure an operational stability), while accomplishing an improved data reliability.

DESCRIPTION OF REFERENCE SYMBOLS

2010 memory block
2012 flash memory
2014 information register
2020 flash memory power supply circuit
2021 power supply circuit for writing/erasing
2022 power supply circuit for reading
2023 power supply circuit for verifying
2030 flash memory controller
2032 flash memory internal state management table
2033 applied voltage information storage
2034 applied voltage control circuit
2035 voltage application time information storage
2036 power supply control circuit
1100, 1700, 1800 flash memory
1102 memory cell array
1104 row decoder
1106 column decoder
1108 sense amplifier
1109 data register
1110 column selector circuit
1112 input/output circuit
1114 control logic
1116 controller
1118 command register
1120 address register
1122 status register
1130 voltage generator circuit
1132 information register
1802 power information storage region
10 flash memory controller
12 flash memory operation management table
14 data controller
16 power supply controller
30 power supply circuit for memory system
24 overload register
25 memory block
26 flash memory
27 internal controller
40 parameter setting unit
50 voltage generating unit
51 voltage generating unit for logic
52 voltage generating unit for reading
53 voltage generating unit for writing/erasing
54 oscillator circuit
55 booster circuit
56 voltage detector
57 comparator circuit
60 voltage state monitoring unit
61 voltage state monitoring unit for logic
62 voltage state monitoring unit for reading
63 voltage state monitoring unit for writing/erasing
66 delay circuit
67 integrator circuit
68 comparator circuit
69 status register
70 counter circuit
72 table converter circuit
73 state transition detector circuit
74 overload detector
80 setting register
81 logic comparator circuit
100 nonvolatile storage system (storage device)
T1 terminal for writing/erasing
T2 terminal for reading
T3 terminal for verifying
T4 output terminal for internal state notifying signal
T5 input terminal for flash memory internal operation control signal
T6 output terminal for applied voltage notifying signal
T7 output terminal for verifying number-of-times notifying signal
T8 output terminal for pulse width/interval notifying signal
T9 output terminal for load power notifying signal
T10 output terminal for failed bit number signal

The invention claimed is:

1. A nonvolatile storage system, including:
a memory block having a plurality of flash memories;
a flash memory power supply circuit provided outside of the memory block; and
a flash memory controller for controlling the flash memory power supply circuit and the flash memories, wherein
the flash memory power supply circuit includes a plurality of types of power supply circuits for process execution for generating a plurality of different voltage levels necessary to enable to execute a plurality of different processes in the flash memories to feed the flash memories with power,
the flash memories each has an internal state notifying terminal for outputting a signal notifying a change in the internal state of the flash memories and notify the change in the internal state of the flash memories of the flash memory controller through an exclusive bus connected between the internal state notifying terminal and the flash memory controller for an internal state notification,
the flash memory controller communicates with each of the flash memories to monitor a variation of an internal state of the flash memory to control the operations of the power supply circuits for process execution of the flash memory power supply circuit and processes of the flash memory based on the internal state of the flash memory notified from the flash memories,
the plurality of types of power supply circuits for process execution are configured to change output electric energies thereof,
the flash memories each notifies the flash memory controller of a load power information indicating a load power needed in each of the power supply circuits for process execution specific to the flash memories, and
the flash memory controller includes a power supply control circuit for controlling based on the received load power information the output electric energy of the power supply circuit for process execution corresponding to the received load power information.

2. The non-volatile storage system as claimed in claim 1, wherein when the power supply control circuit obtains the load power information of one of the power supply circuits for process execution from a plurality of ones of the flash memories, the power supply control circuit controls the one of the power supply circuits for process execution so that an electric energy equal to or larger than a total of a plurality of the load powers indicated by the obtained load power information is supplied to the one of the power supply circuits for process execution.

3. The non-volatile storage system as claimed in claim 1, wherein
the flash memory controller further includes a load power information storage used as a storage for the load power information received from the plurality of ones of the flash memories, and
the flash memory controller selects an arbitrary one of the flash memories by referring to the load power information stored in the load power information storage.

4. The non-volatile storage system as claimed in claim 3, wherein when a plurality of candidates of the access-target flash memories have an enough vacant memory space exist in the plurality of the access-target flash memories, the flash memory controller selects the flash memory having a smallest load power by referring to the load power information stored in the load power information storage.

5. The non-volatile storage system as claimed in claim 4, wherein when a plurality of ones of the flash memories are accessed at once in parallel, the flash memory controller selects preferentially the flash memories having a smaller load power in total in priority to the other flash memories as the flash memories to be power-supplied by same one of the power supply circuits for process execution by referring to the load power information stored in the load power information storage.

6. The non-volatile storage system as claimed in claim 4, wherein when a plurality of ones of the flash memories are accessed at once in parallel and a load lower in total of the plurality of ones of the flash memories exceeds a power supply capacity of the power supply circuit for process execution, the flash memory controller controls the plurality of ones of the flash memories in a manner that timings of executing the processes in the plurality of ones of the flash memories are not overlapped with each other by referring to the load power information stored in the load power information storage.

* * * * *